United States Patent [19]

(12) United States Patent
Szyperski

(10) Patent No.: US 7,141,432 B2
(45) Date of Patent: Nov. 28, 2006

(54) METHOD OF USING REDUCED DIMENSIONALITY NUCLEAR MAGNETIC RESONANCE SPECTROSCOPY FOR RAPID CHEMICAL SHIFT ASSIGNMENT AND SECONDARY STRUCTURE DETERMINATION OF PROTEINS

(75) Inventor: Thomas A. Szyperski, Amherst, NY (US)

(73) Assignee: The Research Foundation of State University of New York, Amherst, NY (US)

( * ) Notice: Subject to any disclaimer, the term of this patent is extended or adjusted under 35 U.S.C. 154(b) by 456 days.

(21) Appl. No.: 09/897,583

(22) Filed: Jun. 29, 2001

(65) Prior Publication Data

US 2003/0012733 A9   Jan. 16, 2003

Related U.S. Application Data

(60) Provisional application No. 60/215,649, filed on Jun. 30, 2000.

(51) Int. Cl.
   *G01N 24/00*   (2006.01)
   *G01N 33/00*   (2006.01)

(52) U.S. Cl. .......................... 436/173; 436/86

(58) Field of Classification Search ................. 436/173
   See application file for complete search history.

(56) References Cited

U.S. PATENT DOCUMENTS

2004/0061497 A1   4/2004   Szyperski et al.
2004/0095140 A1   5/2004   Szyperski et al.

OTHER PUBLICATIONS

CABM Standard Data Collection Procedure for Protein Structure Determination, http://www-nmr.cabm.rutgers.edu/labdocuments/nmrprotocols/nmrdatacollect.html, 1998.*
"Protein NMR. NMR Experiments for Proteins", http://202.113.228.226:8000/guide/eNMR/proteins/explist.html. 1998.*
Accelrys "Basic Assign Functionalities" http://www.accelrys.com/support/life/felix/felix230/assign.html.*
Kuo-Bin Li, "Development of an Integrated Software Environment for the Sequential Assignment", http://www.bii.a-star.edu.sg/~kuobin/thesis/html/chapter5/node1.html., 1996.*
Cell Cycle/Gene Regulation http://www/biochem.ucl.ac.uk/cgi-bin/cath/GetHEADER.pl?pdb=2nmb Oct. 29, 1998.*

(Continued)

*Primary Examiner*—Yelena Gakh
(74) *Attorney, Agent, or Firm*—Nixon Peabody LLP

(57) ABSTRACT

The present invention discloses eight new reduced dimensionality (RD) triple resonance nuclear magnetic resonance (NMR) experiments for measuring chemical shift values of certain nuclei in a protein molecule. The RD 3D H̲A̲,C̲A̲,(CO),N,HN NMR experiment and the RD 3D H̲,C̲,(C-TOCSY—CO),N,HN NMR experiment are designed to yield "sequential" connectivities, while the RD 3D $\underline{H}^{\alpha\beta}$,$\underline{C}^{\alpha\beta}$,CO,HA NMR experiment and the RD 3D $\underline{H}^{\alpha\beta}$,$\underline{C}^{\alpha\beta}$,N,HN NMR experiment provide "intraresidue" connectivities. The RD 3D H̲,C̲,C,H—COSY NMR experiment, the RD 3D H̲,C̲,C,H-TOCSY NMR experiment, and the RD 2D H̲,C̲,H—COSY NMR experiment allow one to obtain assignments for aliphatic and aromatic side chain chemical shifts, while the RD 2D H̲B̲,C̲B̲,(CG,CD),HD NMR experiment provide information for the aromatic side chain chemical shifts. In addition, a method of conducting suites of RD triple resonance NMR experiments for high-throughput resonance assignment of proteins and identification of the location of secondary structure elements are disclosed.

42 Claims, 27 Drawing Sheets

OTHER PUBLICATIONS

Nietlispach et al.An Approach to the Structure Determination of Larger Proteins Using Triple-Resonance NMR Experiments in Conju nction with Random Fractional Deuteration. J. Am. Chem. Soc.,1996, 118(2), 407-415.*

EMBO Practical Course, Sep. 12-19, 2001 "Heteronuclear NMR Experiments for the Structure Determiantion of Proteins" http://www.embl-heidelberg.de/nmr/sattler/teaching/teaching_pdf/nmr_basic_triplepp.pdf; (Prog. NMR Spectrosc. 1999, 34, pp. 93-158).*

Kanelis et al. "Multidimensional NMR methods for protein structure determination" http://www.nd.edu/~aostafin/CHEG498598/BIOMAT/reading/4.pdf, 2001.*

Fernandez et al. "NMR with 13C, 15N-doubly-labeled DNA", J. Biomol. NMR, 1998, v. 12, pp. 25-37.*

Gehring et al. "H(C)CH-COSY and (H)CCH-COSY Experiments for 13C-Labeled Proteins in H2O Solution", J. Magn. Reson., 1998, v. 135, No. 1, pp. 185-193.*

Yamazaki et al. "Two-Dimensional NMR Experiments for Correlating 13Cβ and 1Hδ/ε Chemical Shifts of Aromatic Residues in 13C-labeled Proteins via Scalar Couplings", J. Am. Chem., Soc., 1993, v. 115, pp. 11054-11055.*

Schirra "Three Dimensional NMR Spectroscopy" http://www.cryst.bbk.ac.uk/PPS2/projects/schirra/html/3dnmr.htm, Nov. 28, 1996.*

"Cell Cycle/Gene Regulation": http://daisy.bio.nagoya-u.ac.jp/golab/pdb/pdb2nmb.txt, Oct. 29, 1998.*

Szyperski et al., "Reduced Dimensionality in Triple-Resonance NMR Experiments," *J. Am. Chem. Soc.*, 115:9307-9308 (1993).

Szyperski et al., "3D $^{13}$C-$^{15}$N-Heteronuclear Two-Spin Coherence Spectroscopy for Polypeptide Backbone Assignments in $^{13}$C-$^{15}$N-Double-Labeled Proteins," *J. Biomol. NMR*, 3:127-132 (1993).

Szyperski et al., 3D $H^{\alpha/\beta}C^{\alpha/\beta}$(CO)NHN, a Projected 4D NMR Experiment for Sequential Correlation of Polypeptide $^{1}H^{\alpha/\beta}$, $^{13}C^{\alpha/\beta}$ and Backbone $^{15}$N and $^{1}H^{N}$ Chemical Shifts, *J. Magn. Reson.*, B105:188-191 (1994).

Szyperski et al., "A Novel Reduced-Dimensionality Triple-Resonance Experiment for Efficient Polypeptide Backbone Assignment, 3D *CO HN N CA*," *J. Magn. Reson.*, B108:197-203 (1995).

Szyperski et al., "Useful Information from Axial Peak Magnetization in Projected NMR Experiments," *J. Am. Chem. Soc.*, 118:8146-8147 (1996).

Szyperski et al., "Two-Dimensional *cl-HC*(C)H-COSY for Resonance Assignment of Smaller $^{13}$C-Labeled Biomolecules," *J. Magn. Reson.*, 128:228-232 (1997).

Szyperski et al., "Sequential Resonance Assignment of Medium-Sized $^{15}$N/ $^{13}$C-Labeled Proteins with Projected 4D Triple Resonance NMR Experiments," *J. Biomol. NMR*, 11:387-405 (1998).

Boucher et al., "Four-Dimensional Heteronuclear Triple Resonance NMR Methods for the Assignment of Backbone Nuclei in Proteins," *J. Am. Chem. Soc.*, 114:2262-2264 (1992).

Pang et al., "High-Resolution Detection of Five Frequencies in a Single 3D Spectrum: HNHCACO—A Bidirectional Coherence Transfer Experiment," *Journal of Biomolecular NMR* 11:185-1990 (1998).

Gardner et al., "The Use of $^{2}$H, $^{13}$C, $^{15}$N Multidimensional NMR to Study the Structure and Dynamics of Proteins," *Annu. Rev. Biophys. Biomol. Struct.* 27:357-406 (1998).

Sattler et al., "Triple Resonance Pulse Programs for $^{13}$C, $^{15}$N Labeled Proteins," [Retrieved from the Internet at http://www/embl-heidelberg.de/nmr/sattler/PP/pulseprograms.html] (2001).

Tugarinov et al., "Four-Dimensional NMR Spectroscopy of a 723-Residue Protein: Chemical Shift Assignments and Secondary Structure of Malate Synthase G," *J. Am. Chem. Soc.* 124:10025-10035 (2002).

Kennedy et al., "Role for NMR in Structural Genomics," *Journal of Structural and Functional Genomics* 2:155-169 (2002).

Liu et al., "NMR Experiments for Resonance Assignments of $^{13}$C, $^{15}$N Doubly-Labeled Flexible Polypeptides: Application to Human Prion Protein hPrP(23-230)," *J. Biomol. NMR*, 16:127-138 (2000).

Yamazaki et al., "Assignments of Backbone $^{1}$H, $^{13}$C, and $^{15}$N Resonances and Secondary Structure of Ribonuclease H from *Escherichia coli* by Heteronuclear Three-Dimensional NMR Spectroscopy," *Biochemistry*, 30:6036-6047 (1991).

* cited by examiner

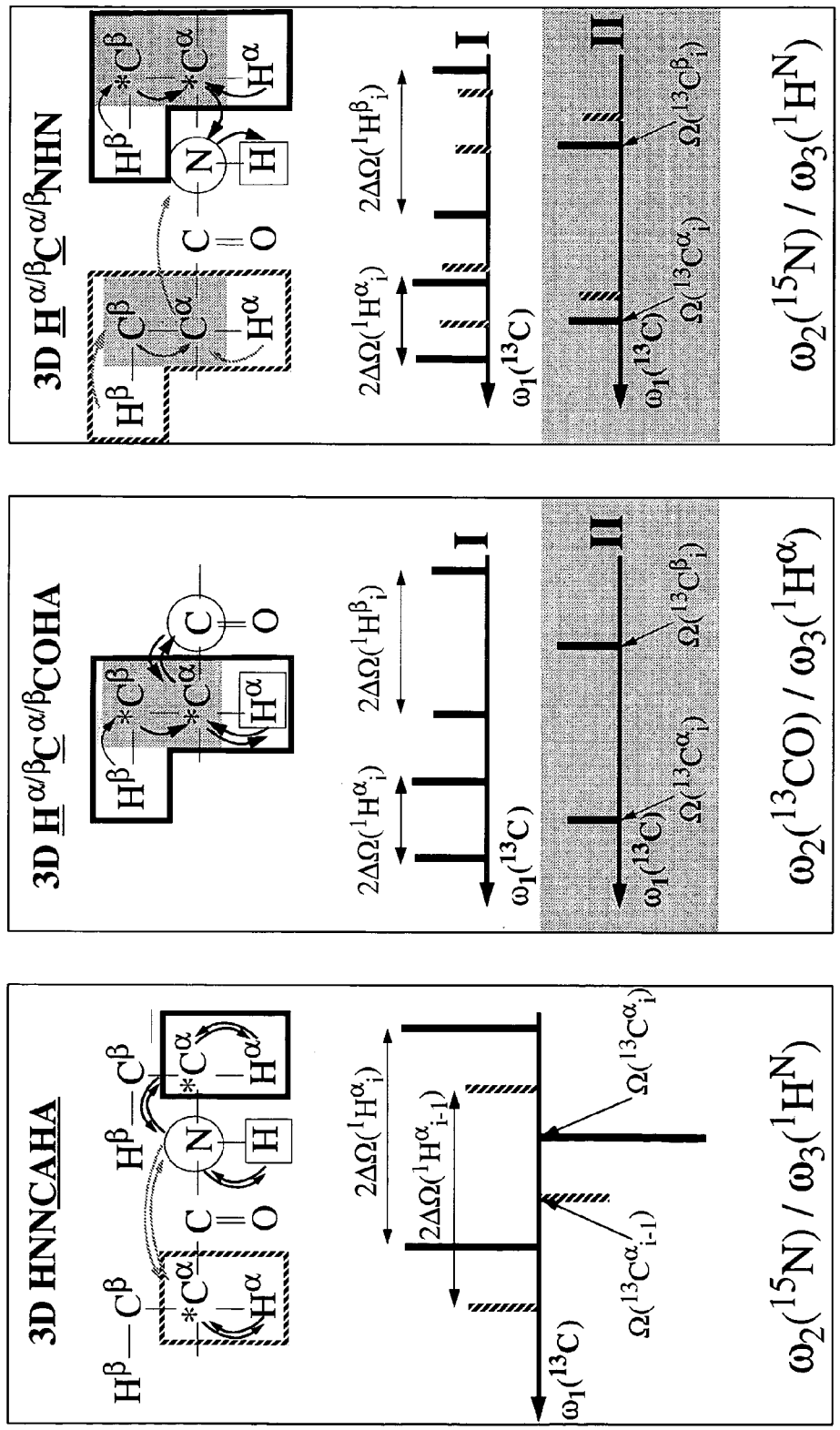

a: 3D $\underline{H}^{\alpha/\beta}\underline{C}^{\alpha/\beta}COHA$   b: 3D $\underline{H}^{\alpha/\beta}\underline{C}^{\alpha/\beta}(CO)NHN$

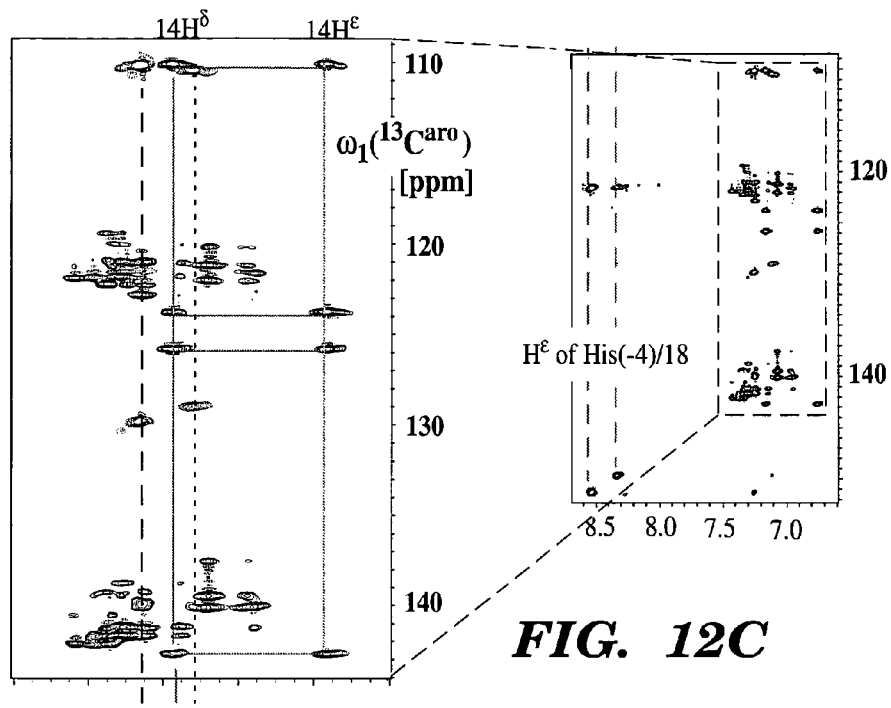
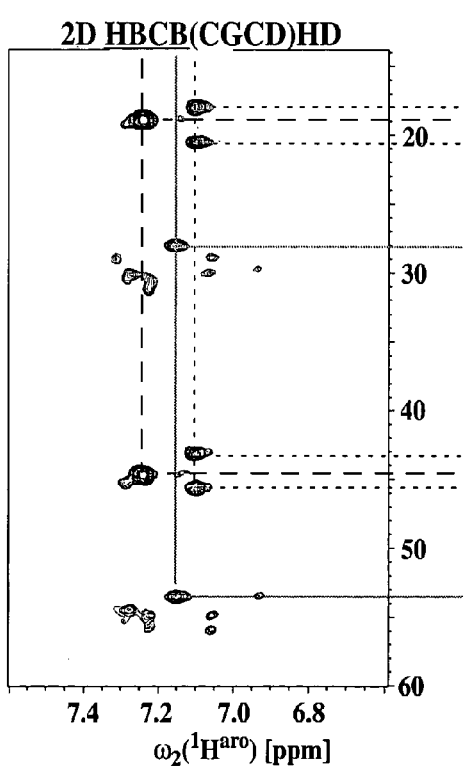
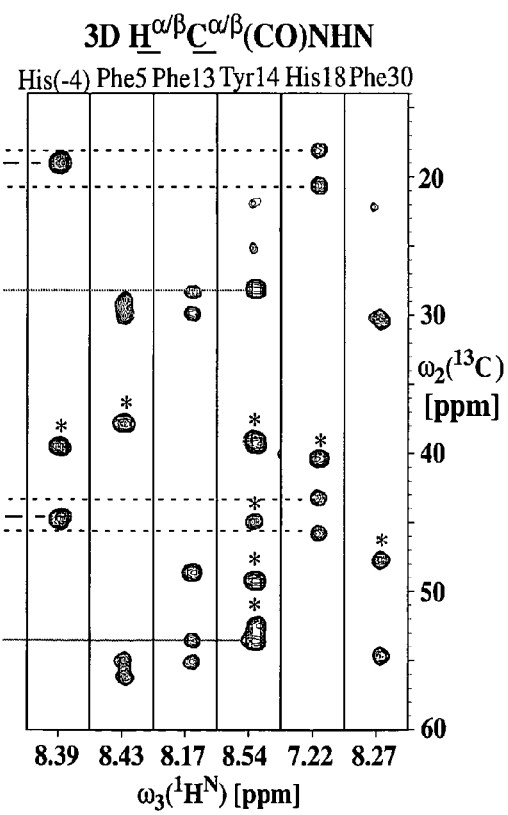
FIG. 12C
FIG. 12B
FIG. 12A

METHOD OF USING REDUCED DIMENSIONALITY NUCLEAR MAGNETIC RESONANCE SPECTROSCOPY FOR RAPID CHEMICAL SHIFT ASSIGNMENT AND SECONDARY STRUCTURE DETERMINATION OF PROTEINS

The present invention claims the benefit of U.S. Provisional Patent Application Ser. No. 60/215,649, filed Jun. 30, 2000, which is hereby incorporated by reference in its entirety.

FIELD OF THE INVENTION

The present invention relates to methods of using reduced dimensionality nuclear magnetic resonance (NMR) spectroscopy for obtaining chemical shift assignment and structure determination of proteins.

BACKGROUND OF THE INVENTION

The use of triple resonance (TR) nuclear magnetic resonance (NMR) experiments for the resonance assignment of polypeptide chains via heteronuclear scalar connectivities (Montelione et al., *J. Am Chem. Soc.*, 111:5474–5475 (1989); Montelione et al., *J. Magn. Reson.*, 87:183–188 (1989); Kay et al., *J. Magn. Reson.*, 89:496–514 (1990); Ikura et al., *Biochemistry*, 29:4659–8979 (1990); Edison et al., *Methods Enzymol.*, 239:3–79 (1994)) is a standard approach which neatly complements the assignment protocol based on $^1H$—$^1H$ nuclear Overhauser effects (NOE) (Wüthrich, *NMR of Proteins and Nucleic Acids*, Wiley, New York (1986)). In addition, triple resonance NMR spectra are highly amenable to a fast automated analysis (Friedrichs et al., *J. Biomol. NMR*, 4:703–726 (1994); Zimmerman et al., *J. Biomol. NMR*, 4:241–256 (1994); Bartels et al., *J. Biomol. NMR*, 7:207–213 (1996); Morelle et al., *J. Biomol. NMR*, 5:154–160 (1995); Buchler et al., *J. Magn. Reson.*, 125:34–42 (1997); Lukin et al., *J. Biomol. NMR*, 9:151–166 (1997)), yielding the $^{13}C^{\alpha/\beta}$ chemical shifts at an early stage of the assignment procedure. This enables both, the identification of regular secondary structure elements without reference to NOEs (Spera et al., *J. Am. Chem. Soc.*, 113:5490–5491 (1991)) and the derivation of ($\phi,\psi$)-angle constraints which serve to reduce the number of cycles consisting of nuclear Overhauser enhancement spectroscopy (NOESY) peak assignment and structure calculation (Luginbühl et al., *J. Magn. Reson.*, B 109:229–233 (1995)).

NMR assignments are prerequisite for NMR-based structural biology (Wüthrich, *NMR of Proteins and Nucleic Acid*, Wiley:New York (1986)) and, thus, for high-throughput (HTP) structure determination in structural genomics (Rost, *Structure*, 6:259–263 (1998); Montelione et al., *Nature Struct. Biol.*, 6:11–12. (1999); Burley, *Nature Struc Biol.*, 7:932–934 (2000)) and for exploring structure-activity relationships (SAR) by NMR for drug discovery (Shuker et al., *Science*, 274:1531–1534 (1996)). The aims of structural genomics are to (i) explore the naturally occurring "protein fold space" and (ii) contribute to the characterization of function through the assignment of atomic resolution three-dimensional (3D) structures to proteins. It is now generally acknowledged that NMR will play an important role in structural genomics (Montelione et al., *Nature Struc. Biol.*, 7:982–984 (2000)). The resulting demand for HTP structure determination requires fast and automated NMR data collection and analysis protocols (Moseley et al., *Curr. Opin. Struct. Biol.*, 9:635–642 (1999)).

The establishment of a HTP NMR structural genomics pipeline requires two key objectives in data collection. Firstly, the measurement time should be minimized in order to (i) lower the cost per structure and (ii) relax the constraint that NMR samples need to be stable over a long period of measurement time. The recent introduction of commercial cryogenic probes (Styles et al., *J. Magn. Reson.*, 60:397–404 (1984); Flynn et al., *J. Am Chem. Soc.*, 122:4823–4824 (2000)) promises to reduce measurement times by about a factor of ten or more, and will greatly impact the realization of this first objective. Secondly, reliable automated spectral analysis requires recording of a "redundant" set of multidimensional NMR experiments each affording good resolution (which requires appropriately long maximal evolution times in all indirect dimensions). Concomitantly, it is desirable to keep the total number of NMR spectra small in order to minimize "interspectral" variations of chemical shift measurements, which may impede automated spectral analysis. Straightforward consideration of this second objective would suggest increasing the dimensionality of the spectra, preferably by implementing a suite of four- or even higher-dimensional NMR experiments. Importantly, however, the joint realization of the first and second objectives is tightly limited by the rather large lower bounds of higher-dimensional TR NMR measurement times if appropriately long maximal evolution times are chosen.

Hence, "sampling limited" and "sensitivity limited" data collection regimes are distinguished, depending on whether the sampling of the indirect dimensions or the sensitivity of the multidimensional NMR experiments "per se" determines the minimally achievable measurement time. As a matter of fact, the ever increasing performance of NMR spectrometers will soon lead to the situation where, for many protein samples, the sensitivity of the NMR spectrometers do not constitute the prime bottleneck determining minimal measurement times. Instead, the minimal measurement times encountered for recording conventional higher-dimensional NMR schemes will be "sampling limited," particularly as high sensitivity cryoprobes become generally available. As structure determinations of proteins rely on nearly complete assignment of chemical shifts, which are obtained using multidimensional $^{13}C$, $^{15}N$, $^1H$-TR NMR experiments (Montelione et al., *J. Am Chem. Soc.*, 111:5474–5475 (1989); Montelione, et al., *J. Magn. Reson.*, 87:183–188 (1989); Ikura et al., *Biochemistry*, 29:4659–8979 (1990)), the development of TR NMR techniques that avoid the sampling limited regime represents a key challenge for future biomolecular NMR methods development.

Reduced dimensionality (RD) TR NMR experiments (Szyperski et al., *J. Biomol. NMR*, 3:127–132 (1993); Szyperski et al., *J. Am. Chem. Soc.*, 115:9307–9308 (1993); Szyperski et al., *J. Magn. Reson.*, B 105:188–191 (1994); Brutscher et al., *J. Magn. Reson.*, B 105:77–82 (1994); Szyperski et al., *J. Magn. Reson.*, B 108: 197–203 (1995); Brutscher et al., *J. Biomol. NMR*, 5:202–206 (1995); Löhr et al., *J. Biomol. NMR*, 6:189–197 (1995); Szyperski et al., *J. Am. Chem. Soc.*, 118:8146–8147 (1996); Szyperski et al., *J. Magn. Reson.*, 28:228–232 (1997); Bracken et al., *J. Biomol. NMR*, 9:94–100 (1997); Sklenar et al., *J. Magn. Reson.*, 130:119–124 (1998); Szyperski et al., *J. Biomol. NMR*, 11:387–405 (1998)), designed for simultaneous frequency labeling of two spin types in a single indirect dimension, offer a viable strategy to circumvent recording NMR spectra in a sampling limited fashion. RD NMR is based on a projection technique for reducing the spectral dimensionality of TR experiments: the chemical shifts of the projected dimension give rise to a cosine-modulation of the transfer amplitude, yielding peak doublets encoding n chemical shifts in a n−1 dimensional spectrum (Szyperski et al., *J. Biomol. NMR*, 3:127–132 (1993); Szyperski et al., *J. Am. Chem. Soc.*, 115:9307–9308 (1993)). As a key result, this allows recording projected four-dimensional (4D) NMR experiments with maximal evolution times typically achieved in the corresponding conventional 3D NMR experiments (Szyperski et al., *J. Biomol. NMR*, 3:127–132 (1993); Szyperski et al., *J. Am. Chem. Soc.*, 115:9307–9308 (1993); Szyperski et al., *J. Magn. Reson.* B 105:188–191 (1994); Szyperski et al., *J. Magn. Reson.*, B 108: 197–203 (1995); Szyperski et al., *J. Am. Chem. Soc.*, 118:8146–8147 (1996); Szyperski et al., *J. Magn. Reson.*, 28:228–232 (1997); Bracken et al., *J. Biomol. NMR*, 9:94–100 (1997); Sklenar et al., *J. Magn. Reson.*, 130:119–124 (1998); Szyperski et al., *J. Biomol. NMR*, 11:387–405 (1998)). Furthermore, axial coherences, arising from either incomplete insensitive nuclei enhanced by polarization transfer (INEPT) or heteronuclear magnetization, can be observed as peaks located at the center of the doublets (Szyperski et al., *J. Am. Chem. Soc.*, 118:8146–8147 (1996)). This allows both the unambiguous assignment of multiple doublets with degenerate chemical shifts in the other dimensions and the identification of cross peak pairs by symmetrization of spectral strips about the position of the central peak (Szyperski et al., *J. Am. Chem. Soc.*, 118:8146–8147 (1996); Szyperski et al., *J. Biomol. NMR*, 11:387–405 (1998)). Hence, observation of central peaks not only restores the dispersion of the parent, higher-dimensional experiment, but also provides access to reservoir of axial peak magnetization (Szyperski et al., *J. Am. Chem. Soc.*, 118:8146–8147 (1996)). Historically, RD NMR experiments were first designed to simultaneously recruit both $^1$H and heteronuclear magnetization (Szyperski et al., *J. Am. Chem. Soc.*, 118:8146–8147 (1996)) for signal detection, a feature that has also gained interest for improving transverse relaxation-optimized spectroscopy (TROSY) pulse schemes (Pervushin et al., *Proc. Natl. Acad. Sci. USA*, 94:12366–12371 (1997); Salzmann et al., *J. Am. Chem. Soc.*, 121:844–848 (1999); Pervushin et al., *J. Biomol. NMR*, 12:345–348, (1998)). Moreover, RD two-spin coherence NMR spectroscopy (Szyperski et al., *J. Biomol. NMR*, 3:127–132 (1993)) subsequently also called zero-quantum/double-quantum (ZQ/DQ) NMR spectroscopy (Rexroth et al., *J. Am. Chem. Soc.*, 17:10389–10390 (1995)), served as a valuable radio-frequency (r.f.) pulse module for measurement of scalar coupling constants (Rexroth et al., *J. Am. Chem. Soc.*, 17: 10389–10390 (1995)) and cross-correlated heteronuclear relaxation (Reif et al., *Science*, 276:1230–1233 (1997); Yang et al., *J. Am. Chem. Soc.*, 121:3555–3556 (1999); Chiarparin et al., *J. Am. Chem. Soc.*, 122:1758–1761 (2000); Brutscher et al., *J. Magn. Reson.*, 130:346–351 (1998); Brutscher, *Concepts Magn. Reson.*, 122:207–229 (2000)).

The present invention is directed to overcoming the deficiencies in the art.

SUMMARY OF THE INVENTION

The present invention relates to a method of conducting a reduced dimensionality three-dimensional (3D) HA, CA,(CO),N,HN nuclear magnetic resonance (NMR) experiment by measuring the chemical shift values for the following nuclei of a protein molecule having two consecutive amino acid residues, i−1 and i: (1) an α-proton of amino acid residue i−1, $^1H^\alpha_{i-1}$; (2) an α-carbon of amino acid residue i−1, $^{13}C^\alpha_{i-1}$; (3) a polypeptide backbone amide nitrogen of amino acid residue i, $^{15}N_i$; and (4) a polypeptide backbone amide proton of amino acid residue i, $^1H^N_i$. The method involves providing a protein sample and applying radiofrequency pulses to the protein sample which effect a nuclear spin polarization transfer where the chemical shift evolutions of $^1H^\alpha_{i-1}$ and $^{13}C^\alpha_{i-1}$ of amino acid residue i−1 are connected to the chemical shift evolutions of $^{15}N_i$ and $^1H^N_i$ of amino acid residue i, under conditions effective (1) to generate NMR signals encoding the chemical shift values of $^{13}C^\alpha_{i-1}$ and $^{15}N_i$ in a phase sensitive manner in two indirect time domain dimensions, $t_1(^{13}C^\alpha)$ and $t_2(^{15}N)$, respectively, and the chemical shift value of $^1H^N_i$ in a direct time domain dimension, $t_3(^1H^N)$, and (2) to cosine modulate the $^{13}C^\alpha_{i-1}$ chemical shift evolution in $t_1(^{13}C^\alpha)$ with the chemical shift evolution of $^1H^\alpha_{i-1}$. Then, the NMR signals are processed to generate a 3D NMR spectrum with a primary peak pair derived from the cosine modulating, where (1) the chemical shift values of $^{15}N_i$ and $^1H^N_i$ are measured in two frequency domain dimensions, $\omega_2(^{15}N)$ and $\omega_3(^1H^N)$, respectively, and (2) the chemical shift values of $^1H^\alpha_{i-1}$ and $^{13}C^\alpha_{i-1}$ are measured in a frequency domain dimension, $\omega_1(^{13}C^\alpha)$, by the frequency difference between the two peaks forming the primary peak pair and the frequency at the center of the two peaks, respectively.

The present invention also relates to a method of conducting a reduced dimensionality three-dimensional (3D) H, C,(C-TOCSY—CO),N,HN nuclear magnetic resonance (NMR) experiment by measuring the chemical shift values for the following nuclei of a protein molecule having two consecutive amino acid residues, i−1 and i: (1) aliphatic protons of amino acid residue i−1, $^1H^{ali}_{i-1}$; (2) aliphatic carbons of amino acid residue i−1, $^{13}C^{ali}_{i-1}$; (3) a polypeptide backbone amide nitrogen of amino acid residue i, $^{15}N_i$; and (4) a polypeptide backbone amide proton of amino acid residue i, $^1H^N_i$. The method involves providing a protein sample and applying radiofrequency pulses to the protein sample which effect a nuclear spin polarization transfer where the chemical shift evolutions of $^1H^{ali}_{i-1}$ and $^{13}C^{ali}_{i-1}$ of amino acid residue i−1 are connected to the chemical shift evolutions of $^{15}N_i$ and $^1H^N_i$ of amino acid residue i, under conditions effective (1) to generate a NMR signal encoding the chemical shifts of $^{13}C^{ali}_{i-1}$ and $^{15}N_i$ in a phase sensitive manner in two indirect time domain dimensions, $t_1(^{13}C^{ali})$ and $t_2(^{15}N)$, respectively, and the chemical shift of $^1H^N_i$ in a direct time domain dimension, $t_3(^1H^N)$, and (2) to cosine modulate the chemical shift evolutions of $^{13}C^{ali}_{i-1}$ in $t_1(^{13}C^{ali})$ with the chemical shift evolutions of $^1H^{ali}_{i-1}$. Then, the NMR signals are processed to generate a 3D NMR spectrum with peak pairs derived from the cosine modulating where (1) the chemical shift values of $^{15}N_i$ and $^1H^N_i$ are measured in two frequency domain dimensions, $\omega_2(^{15}N)$ and $\omega_3(^1H^N)$, respectively, and (2) the chemical shift values of $^1H^{ali}_{i-1}$ and $^{13}C^{ali}_{i-1}$ are measured in a frequency domain dimension, $\omega_1(_{13}C^{ali})$, by the frequency differences between the two peaks forming the peak pairs and the frequencies at the center of the two peaks, respectively.

Another aspect of the present invention relates to a method of conducting a reduced dimensionality three-dimensional (3D) $H^{\alpha/\beta},C^{\alpha/\beta},CO,HA$ nuclear magnetic resonance (NMR) experiment by measuring the chemical shift values for the following nuclei of a protein molecule having an amino acid residue, i: (1) a β-proton of amino acid residue i, $^1H^\beta_i$; (2) a β-carbon of amino acid residue i, $^{13}C^\beta_i$; (3) an α-proton of amino acid residue i, $^1H^\alpha_i$; (4) an α-carbon of amino acid residue i, $^{13}C^\alpha_i$; and (5) a polypeptide backbone carbonyl carbon of amino acid residue i, $^{13}C'_i$. The method involves providing a protein sample and applying radiofrequency pulses to the protein sample which effect a nuclear spin polarization transfer where the chemical shift evolutions of $^1H^\alpha_i$, $^1H^\beta_i$, $^{13}C^\alpha_i$, and $^{13}C^\beta_i$ are connected to the chemical shift evolution of $^{13}C'_i$, under conditions effective (1) to generate NMR signals encoding the chemical shift values of $^{13}C^\alpha_i$, $^{13}C^\beta_i$ and $^{13}C'_i$ in a phase sensitive manner in two indirect time domain dimensions, $t_1(^{13}C^{\alpha/\beta})$ and $t_2(^{13}C')$, respectively, and the chemical shift value of $^1H^\alpha_i$ in a direct time domain dimension, $t_3(^1H^\alpha)$, and (2) to cosine modulate the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$, respectively. Then, the NMR signals are processed to generate a 3D NMR spectrum with peak pairs derived from the cosine modulating where (1) the chemical shift values of $^{13}C'_i$ and $^1H^\alpha_i$ are measured in two frequency domain dimensions, $\omega_2(^{13}C')$ and $\omega_3(^1H^\alpha)$, respectively, and (2) (i) the chemical shift values of $^1H^\alpha_i$ and $^1H^\beta_i$ are measured in a frequency domain dimension, $\omega_1(^{13}C^{\alpha/\beta})$, by the frequency differences between the two peaks forming the peak pairs, and (ii) the chemical shift values of $^{13}C^\alpha_i$, and $^{13}C^\beta_i$ are measured in a frequency domain dimension, $\omega_1(^{13}C^{\alpha/\beta})$, by the frequencies at the center of the two peaks forming the peak pairs.

A further aspect of the present invention relates to a method of conducting a reduced dimensionality three-dimensional (3D) $\underline{H}^{\alpha/\beta},\underline{C}^{\alpha/\beta},N,HN$ nuclear magnetic resonance (NMR) experiment by measuring the chemical shift values for the following nuclei of a protein molecule having an amino acid residue, i: (1) a β-proton of amino acid residue i, $^1H^\beta_i$; (2) a β-carbon of amino acid residue i, $^{13}C^\beta_i$; (3) an α-proton of amino acid residue i, $^1H^\alpha_i$; (4) an α-carbon of amino acid residue i, $^{13}C^\alpha_i$; (5) a polypeptide backbone amide nitrogen of amino acid residue i, $^{15}N_i$; and (6) a polypeptide backbone amide proton of amino acid residue i, $^1H^N_i$. The method involves providing a protein sample and applying radiofrequency pulses to the protein sample which effect a nuclear spin polarization transfer where the chemical shift evolutions of $^1H^\alpha_i$, $^1H^\beta_i$, $^{13}C^\alpha_i$, and $^{13}C^\beta_i$ are connected to the chemical shift evolutions of $^{15}N_i$ and $^1H^N_i$, under conditions effective (1) to generate NMR signals encoding the chemical shift values of $^{13}C^\alpha_i$, $^{13}C^\beta_i$ and $^{15}N_i$ in a phase sensitive manner in two indirect time domain dimensions, $t_1(^{13}C^{\alpha/\beta})$ and $t_2(^{15}N)$, respectively, and the chemical shift value of $^1H^N_i$ in a direct time domain dimension, $t_3(^1H^N)$, and (2) to cosine modulate the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$, respectively. Then, the NMR signals are processed to generate a 3D NMR spectrum with peak pairs derived from the cosine modulating where (1) the chemical shift values of $^{15}N_i$ and $^1H^N_i$ are measured in two frequency domain dimensions, $\omega_2(^{15}N)$ and $\omega_3(^1H^N)$, respectively, and (2) (i) the chemical shift values of $^1H^\alpha_i$ and $^1H^\beta_i$ are measured in a frequency domain dimension, $\omega_1(^{13}C^{\alpha/\beta})$, by the frequency differences between the two peaks forming the peak pairs, and (ii) the chemical shift values of $^{13}C^\alpha_i$, and $^{13}C^\beta_i$ are measured in a frequency domain dimension, $\omega_1(^{13}C^{\alpha/\beta})$, by the frequencies at the center of the two peaks forming the peak pairs.

The present invention also relates to a method of conducting a reduced dimensionality three-dimensional (3D) $\underline{H},\underline{C},C,H$—COSY nuclear magnetic resonance (NMR) experiment by measuring the chemical shift values for $^1H^m$, $^{13}C^m$, $^1H^n$, and $^{13}C^n$ of a protein molecule where m and n indicate atom numbers of two CH, CH$_2$ or CH$_3$ groups that are linked by a single covalent carbon—carbon bond in an amino acid residue. The method involves providing a protein sample and applying radiofrequency pulses to the protein sample which effects a nuclear spin polarization transfer where the chemical shift evolutions of $^1H^m$ and $^{13}C^m$ are connected to the chemical shift evolutions of $^1H^n$ and $^{13}C^n$, under conditions effective (1) to generate NMR signals encoding the chemical shift values of $^{13}C^m$ and $^{13}C^n$ in a phase sensitive manner in two indirect time domain dimensions, $t_1(^{13}C^m)$ and $t_2(^{13}C^n)$, respectively, and the chemical shift value of $^1H^n$ in a direct time domain dimension, $t_3(^1H^n)$, and (2) to cosine modulate the chemical shift evolution of $^{13}C^m$ in $t_1(^{13}C^m)$ with the chemical shift evolution of $^1H_m$. Then, the NMR signals are processed to generate a 3D NMR spectrum with peak pairs derived from the cosine modulating where (1) the chemical shift values of $^{13}C^n$ and $^1H^n$ are measured in two frequency domain dimensions, $\omega_2(^{13}C^n)$ and $\omega_3(^1H^n)$, respectively, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

Another aspect of the present invention relates to a method of conducting a reduced dimensionality three-dimensional (3D) $\underline{H},\underline{C},C,H$-TOCSY nuclear magnetic resonance (NMR) experiment by measuring the chemical shift values for $^1H^m$, $^{13}C^m$, $^1H^n$, and $^{13}C^n$ of a protein molecule where m and n indicate atom numbers of two CH, CH$_2$ or CH$_3$ groups that may or may not be directly linked by a single covalent carbon-carbon bond in an amino acid residue. The method involves providing a protein sample and applying radiofrequency pulses to the protein sample which effect a nuclear spin polarization transfer where the chemical shift evolutions of $^1H^m$ and $^{13}C^m$ are connected to the chemical shift evolutions of $^1H^n$ and $^{13}C^n$, under conditions effective (1) to generate NMR signals encoding the chemical shift values of $^{13}C^m$ and $^{13}C^n$ in a phase sensitive manner in two indirect time domain dimensions, $t_1(^{13}C^m)$ and $t_2(^{13}C^n)$, and the chemical shift value of $^1H^n$ in a direct time domain dimension, $t_3(^1H^n)$, and (2) to cosine modulate the chemical shift evolution of $^{13}C^m$ in $t_1(^{13}C^m)$ with the chemical shift evolution of $^1H^m$. Then, the NMR signals are processed to generate a 3D NMR spectrum with peak pairs derived from the cosine modulating where (1) the chemical shift values of $^{13}C^n$ and $^1H^n$ are measured in two frequency domain dimensions, $\omega_2(^{13}C^n)$ and $\omega_3(^1H^n)$, respectively, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

A further aspect of the present invention relates to a method of conducting a reduced dimensionality two-dimensional (2D) $\underline{HB},\underline{CB},(CG,CD),HD$ nuclear magnetic resonance (NMR) experiment by measuring the chemical shift values for the following nuclei of a protein molecule: (1) a β-proton of an amino acid residue with an aromatic side chain, $^1H^\beta$; (2) a β-carbon of an amino acid residue with an aromatic side chain, $^{13}C^\beta$; and (3) a δ-proton of an amino acid residue with an aromatic side chain, $^1H^\delta$. The method involves providing a protein sample and applying radiofrequency pulses to the protein sample which effect a nuclear spin polarization transfer where the chemical shift evolutions of $^1H^\beta$ and $^{13}C^\beta$ are connected to the chemical shift evolution of $^1H^\delta$, under conditions effective (1) to generate NMR signals encoding the chemical shift value of $^{13}C^\beta$ in a phase sensitive manner in an indirect time domain dimension, $t_1(^{13}C^\beta)$, and the chemical shift value of $^1H^\delta$ in a direct time domain dimension, $t_2(^1H^\delta)$, and (2) to cosine modulate the chemical shift evolution of $^{13}C^\beta$ in $t_1(^{13}C^\beta)$ with the chemical shift evolution of $^1H^\beta$. Then, the NMR signals are processed to generate a 2D NMR spectrum with a peak pair derived from the cosine modulating where (1) the chemical shift value of $^1H^\delta$ is measured in a frequency domain dimension, $\omega_2(^1H^\delta)$, and (2) the chemical shift values of $^1H^\beta$ and $^{13}C^\beta$ are measured in a frequency domain dimension, $\omega_1(^{13}C^\beta)$, by the frequency difference between the two peaks forming the peak pair and the frequency at the center of the two peaks, respectively.

The present invention also relates to a method of conducting a reduced dimensionality two-dimensional (2D) $\underline{H}$, $\underline{C}$,H—COSY nuclear magnetic resonance (NMR) experiment by measuring the chemical shift values for $^1H^m$, $^{13}C^m$, and $^1H^n$ of a protein molecule where m and n indicate atom numbers of two CH, $CH_2$ or $CH_3$ groups in an amino acid residue. The method involves providing a protein sample and applying radiofrequency pulses to the protein sample which effect a nuclear spin polarization transfer where the chemical shift evolutions of $^1H^m$ and $^{13}C^m$ are connected to the chemical shift evolution of $^1H^n$, under conditions effective (1) to generate NMR signals encoding the chemical shift value of $^{13}C^m$ in a phase sensitive manner in an indirect time domain dimension, $t_1(^{13}C^m)$, and the chemical shift value of $^1H^n$ in a direct time domain dimension, $t_2(^1H^n)$, and (2) to cosine modulate the chemical shift evolution of $^{13}C^m$ in $t_1(^{13}C^m)$ with the chemical shift evolution of $^1H^m$. Then, the NMR signals are processed to generate a 2D NMR spectrum with peak pairs derived from the cosine modulating where (1) the chemical shift value of $^1H^n$ is measured in a frequency domain dimension, $\omega_2(^1H^n)$, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

Another aspect of the present invention relates to a method for sequentially assigning chemical shift values of an α-proton, $^1H^\alpha$, an α-carbon, $^{13}C^\alpha$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample including: (1) a RD three-dimensional (3D) $\underline{HA},\underline{CA},(CO),N,HN$ NMR experiment to measure and connect chemical shift values of the α-proton of amino acid residue i–1, $^1H^\alpha_{i-1}$, the α-carbon of amino acid residue i–1, $^{13}C^\alpha_{i-1}$, the polypeptide backbone amide nitrogen of amino acid residue i, $^{15}N_i$, and the polypeptide backbone amide proton of amino acid residue i, $^1H^N_i$ and (2) a RD 3D HNN$\underline{CAHA}$ NMR experiment to measure and connect the chemical shift values of the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^\alpha$, $^{13}C^\alpha$, $^{15}N$, and $^1H^N$ are obtained by (i) matching the chemical shift values of $^1H^\alpha_{i-1}$ and $^{13}C^\alpha_{i-1}$ with the chemical shift values of $^1H^\alpha_i$ and $^{13}C^\alpha_i$, (ii) using the chemical shift values of $^1H^\alpha_{i-1}$ and $^{13}C^\alpha_{i-1}$ to identify the type of amino acid residue i–1, and (iii) mapping sets of sequentially connected chemical shift values to the amino acid sequence of the polypeptide chain and using the chemical shift values to locate secondary structure elements within the polypeptide chain.

Yet another aspect of the present invention relates to a method for sequentially assigning chemical shift values of a β-proton, $^1H^\beta$, a β-carbon, $^{13}C^\beta$, an α-proton, $^1H^\alpha$, an α-carbon, $^{13}C^\alpha$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample including: (1) a RD 3D $\underline{H}^{\alpha/\beta},\underline{C}^{\alpha/\beta}(CO)NHN$ NMR experiment to measure and connect the chemical shift values of the β-proton of amino acid residue i–1, $^1H^\beta_{i-1}$, the β-carbon of amino acid residue i–1, $^{13}C^\beta_{i-1}$, the α-proton of amino acid residue i–1, $^1H^\alpha_{i-1}$, the α-carbon of amino acid residue i–1, $^{13}C^\beta_{i-1}$, the polypeptide backbone amide nitrogen of amino acid residue i, $^{15}N_i$, and the polypeptide backbone amide proton of amino acid residue i, $^1H^N_i$ and (2) a RD 3D $\underline{H}^{\alpha/\beta},\underline{C}^{\alpha/\beta},N,HN$ NMR experiment to measure and connect the chemical shift values of the β-proton of amino acid residue i, $^1H^\beta_i$, the β-carbon of amino acid residue i, $^{13}C^\beta_i$, the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^\beta$, $^{13}C^\beta$, $^1H^\alpha$, $^{13}C^\alpha$, $^{15}N$, and $^1H^N$ are obtained by (i) matching the chemical shift values of the α- and β-protons of amino acid residue i–1, $^1H^{\alpha/\beta}_{i-1}$, and the α- and β-carbons of amino acid residue i–1, $^{13}C^{\alpha/\beta}_{i-1}$, with the chemical shift values of $^1H^{\alpha/\beta}_i$ and $^{13}C^{\alpha/\beta}_i$, (ii) using the chemical shift values of $^1H^{\alpha/\beta}_{i-1}$ and $^{13}C^{\alpha/\beta}_{i-1}$ to identify the type of amino acid residue i–1, and (iii) mapping sets of sequentially connected chemical shift values to the amino acid sequence of the polypeptide chain and using the chemical shift values to locate secondary structure elements within the polypeptide chain.

A further aspect of the present invention involves a method for sequentially assigning chemical shift values of aliphatic protons, $^1H^{ali}$, aliphatic carbons, $^{13}C^{ali}$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample including: (1) a RD 3D $\underline{H},\underline{C},(C\text{-}TOCSY\text{-}CO),N,HN$ NMR experiment to measure and connect the chemical shift values of the aliphatic protons of amino acid residue i–1, $^1H^{ali}_{i-1}$, the aliphatic carbons of amino acid residue i–1, $^{13}C^{ali}_{i-1}$, the polypeptide backbone amide nitrogen of amino acid residue i, $^{15}N_i$, and the polypeptide backbone amide proton of amino acid residue i, $^1H^N_i$ and (2) a RD 3D $\underline{H}^{\alpha/\beta},\underline{C}^{\alpha/\beta},N,HN$ NMR experiment to measure and connect the chemical shift values of the β-proton of amino acid residue i, $^1H^\beta_i$, the β-carbon of amino acid residue i, $^{13}C^\beta_i$, the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^{ali}$, $^{13}C^{ali}$, $^{15}N$, and $^1H^N$ are obtained by (i) matching the chemical shift values of the α- and β-protons of amino acid residue i–1, $^1H^{\alpha/\beta}_{i-1}$, and the α- and β-carbons of amino acid residue i–1, $^{13}C^{\alpha/\beta}_{i-1}$, with the chemical shift values of $^1H^{\alpha/\beta}_i$ and $^{13}C^{\alpha/\beta}_i$ of amino acid residue i, (ii) using the chemical shift values of $^1H^{ali}_{i-1}$ and $^{13}C^{ali}_{i-1}$ to identify the type of amino acid residue i–1, and (iii) mapping sets of sequentially connected chemical shift values to the amino acid sequence of the polypeptide chain and using the chemical shift values to locate secondary structure elements within the polypeptide chain.

The present invention also relates to a method for sequentially assigning chemical shift values of aliphatic protons, $^1H^{ali}$, aliphatic carbons, $^{13}C^{ali}$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample including: (1) a RD 3D $\underline{H},\underline{C},(C\text{-}TOCSY—CO),N,HN$ NMR experiment to measure and connect the chemical shift values of the aliphatic protons of amino acid residue i−1, $^1H^{ali}_{i-1}$, the aliphatic carbons of amino acid residue i−1, $^{13}C^{ali}_{i-1}$, the polypeptide backbone amide nitrogen of amino acid residue i, $^{15}N_i$, and the polypeptide backbone amide proton of amino acid residue i, $^1H^N_i$ and (2) a RD 3D HNN<u>CAHA</u> NMR experiment to measure and connect the chemical shift values of the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^{ali}$, $^{13}C^{ali}$, $^{15}N$, and $^1H^N$ are obtained by (i) matching the chemical shift values of the α-proton of amino acid residue i−1, $^1H^{\alpha,i-1}$, and the α-carbon of amino acid residue i−1, $^{13}C^\alpha_{i-1}$, with the chemical shift values of $^1H^\alpha_i$ and $^{13}C^\alpha_i$, (ii) using the chemical shift values of $^1H^{ali}_{i-1}$ and $^{13}C^{ali}_{i-1}$ to identify the type of amino acid residue i−1, and (iii) mapping sets of sequentially connected chemical shift values to the amino acid sequence of the polypeptide chain and using the chemical shift values to locate secondary structure elements within the polypeptide chain.

Another aspect of the present invention involves a method for obtaining assignments of chemical shift values of $^1H$, $^{13}C$ and $^{15}N$ of a protein molecule. The method involves providing a protein sample and conducting four reduced dimensionality (RD) nuclear magnetic resonance (NMR) experiments on the protein sample, where (1) a first experiment is selected from the group consisting of a RD 3D $\underline{H}^{\alpha/\beta}\underline{C}^{\alpha/\beta}$(CO)NHN NMR experiment, a RD 3D <u>HA</u>, <u>CA</u>,(CO),N,HN NMR experiment, and a RD 3D <u>H</u>, <u>C</u>,(C-TOCSY—CO),N,HN NMR experiment for obtaining sequential correlations of chemical shift values; (2) a second experiment is selected from the group consisting of a RD 3D HNN<u>CAHA</u> NMR experiment, a RD 3D $\underline{H}^{\alpha/\beta}$,$\underline{C}^{\alpha/\beta}$,N,HN NMR experiment, and a RD 3D HNN<<u>CO</u>,<u>CA</u>> NMR experiment for obtaining intraresidue correlations of chemical shift values; (3) a third experiment is a RD 3D <u>H</u>, <u>C</u>,C,H—COSY NMR experiment for obtaining assignments of sidechain chemical shift values; and (4) a fourth experiment is a RD 2D <u>HB</u>,<u>CB</u>,(CG,CD),HD NMR experiment for obtaining assignments of aromatic sidechain chemical shift values.

The present invention discloses eight new RD TR NMR experiments and different combinations of those eight experiments as well as three other RD TR NMR experiments which allows one to obtain sequential backbone chemical shift assignments for determining the secondary structure of a protein molecule and nearly complete assignments of chemical shift values for a protein molecule including aliphatic and aromatic sidechain spin systems.

RD NMR spectroscopy is a powerful approach to avoid recording TR NMR data for resonance assignment in the "sampling limited data acquisition regime." The set of NMR experiments for HTP structure determination as claimed in the present invention allows one to effectively adapt measurement times to sensitivity requirements. This is of outstanding value in view of HTP protein resonance assignment efforts in the forthcoming era of commercially available cryogenic probes. In particular, the rapid determination of a protein's secondary structure can greatly support fold prediction and thus protein target selection required for structural genomics (Montelione et al., *Nature Struc. Biol.*, 7:982–984 (2000), which is hereby incorporated by reference in its entirety).

In addition, the present invention which discloses the sensitivity analysis of a suite of TR NMR experiments providing nearly complete assignments of chemical shift values of $^1H$, $^{13}C$ and $^{15}N$ of a protein molecule is unique and, thus, of general interest for the application of TR NMR schemes. The key insights obtained from this analysis are (i) that the sensitivity of the individual NMR experiments constituting the standard set derived here is comparable or better than the 3D HNNCACB NMR experiment, which has so far been routinely employed for proteins up to about 35 kDa, (Mer et al., *J. Biomol. NMR*, 17:179–180 (2000), which is hereby incorporated by reference in its entirety) and (ii) that data acquisition for most samples of proteins below 20 kDa will be in the undesired sampling limited regime when using conventional NMR schemes and cryogenic probes. (For 800 MHz systems, such probes today already offer a sensitivity of 6200:1 for a standard 0.1% ethylbenzene sample (Anderson, "High Q Normal Metal NMR Probe Coils," *42nd Experimental NMR Conference*, Orlando, Fla. (2001), which is hereby incorporated by reference in its entirety).) Moreover, the sweep widths of all indirect dimensions of a multidimensional NMR experiment increase with increasing magnetic field strength (which implies increasing minimal measurement times). Hence, in view of this concomitant increase of sensitivity and sweep widths at highest magnetic fields and particularly considering the anticipated widespread use of cryogenic probes, a "change in paradigm" in biological NMR spectroscopy is expected with a new focus on research addressing the caveat of sampling limitation. This will foreseeably include development and application of data processing protocols that allow one to reduce the number of data points in the indirect dimensions without concomitantly sacrificing spectral resolution, i.e., linear prediction and maximum entropy methods (Stephenson, *Prog. NMR Spectrosc.*, 20:515–626 (1988), which is hereby incorporated by reference in its entirety), approaches for non-linear sampling (Schmieder et al., *J. Biomol. NMR*, 4:483–490 (1994); Hoch, et al., *NMR Data Processing*, Wiley-Liss:New York, (1996), which are hereby incorporated by reference in their entirety), and the recently introduced filter diagonalization method (Wall et al., *J. Chem. Phys.*, 102:8011–8022 (1995); Wall et al., *Chem. Phys. Lett.*, 291:465–470 (1998); Hu et al., *J. Magn. Reson.*, 134: 76–87 (1998), which are hereby incorporated by reference in their entirety).

Considering also random fractional deuteration of proteins for sensitivity enhancement, it is envisioned that the majority of protein structure determinations can possibly by accelerated by the application of RD NMR spectroscopy. In 2000, there were about eighty 750/800 MHz and three-hundred 600 MHz spectrometers in operation worldwide, which represent a commercial value of about $350 million (Cross, *High Field NMR: a baseline study.*, National High Magnetic Field Laboratory, Tallahassee, Fla. (2000), which is hereby incorporated by reference in its entirety). Assuming that about 50% of the instrument time is used for NMR structure determination, it is anticipated that the application of RD NMR technology promises to greatly impact on the optimized use of the large capital invested for NMR-based structural biology.

BRIEF DESCRIPTION OF THE DRAWINGS

FIGS. 1A–K show the polarization transfer pathways (top) and stick diagrams of the peak pattern observed along $\omega_1(^{13}C)$ (bottom) for the RD NMR experiments implemented for the present invention (the 3D $\underline{H}^{\alpha/\beta}\underline{C}^{\alpha/\beta}$(CO)NHN experiment, the 3D H<u>ACA</u>(CO)NHN experiment, the 3D <u>HC</u>(C-TOCSY—CO)NHN experiment, the 3D HNN<u>CAHA</u> experiment, the 3D $\underline{H}^{\alpha/\beta}\underline{C}^{\alpha/\beta}$COHA experiment, the 3D $H^{\alpha/\beta}C^{\alpha/\beta}$NHN experiment, the 3D HNN<<u>CO</u>,<u>CA</u>> experiment, the 3D <u>HC</u>CH—COSY experiment, the 3D HCCH-TOCSY experiment, the 2D HBCB(CGCD)HD experiment, and the 2D $^1$H-TOCSY-relayed-HCH—COSY experiment, respectively). The boxes comprise nuclei whose chemical shifts are measured in the common dimension $\omega_1$, and the nuclei which are detected in quadrature in $t_1$ are marked with an asterisk. Bold solid and hatched boxes indicate intraresidue and sequential connectivities, respectively, and the resulting signals sketched in the stick diagrams are represented accordingly. Those $^{13}$C nuclei whose magnetization is used to detect central peaks (Szyperski et al., *J. Am. Chem. Soc.*, 118:8146–8147 (1996), which is hereby incorporated by reference in its entirety), as well as the resulting subspectrum II shown at the bottom, are highlighted in grey. The magnetization is frequency labeled with single-quantum coherence of the encircled nuclei during $t_2$ and detected on the boxed protons. Except for FIG. 1G, the in-phase splittings $2\Delta\Omega(^1H)$ are equal to $2\kappa \cdot \delta\Omega(^1H)[\gamma(^1H)/\gamma(^{13}C)]$, where $\kappa$, $\delta\Omega(^1H)$ and $\gamma(X)$ denote the scaling factor applied for $^1$H chemical shift evolution (set to 1.0 for the present study), the chemical shift difference with respect to the apparent $^1$H carrier position, and the gyromagnetic ratio of nucleus X, respectively. In FIG. 1G, the in-phase splittings $2\Delta\Omega(^{13}C^\alpha)$ are equal to $2\kappa \cdot \delta\Omega(^{13}C^\alpha)$, where $\kappa$ and $\delta\Omega(^{13}C^\alpha)$ are the scaling factor applied for $^{13}C^\alpha$ chemical shift evolution$^{13}$ (set to 0.5 for the present study) and the chemical shift difference with respect to the apparent $^{13}C^\alpha$ carrier position, respectively.

FIGS. 4A–C show the cross sections along $\omega_1$($^{13}$C) taken from the subspectra I, which exhibit peak pairs arising from $^1$H chemical shift evolution, of 3D H̲ACA(CO)NHN (FIG. 4A), 3D H̲$^{\alpha/\beta}$C̲$^{\alpha/\beta}$(CO)NHN (FIG. 4B) and 3D H̲C(C-TOCSY—CO)NHN (FIG. 4C) (21 ms mixing time). The in-phase splittings encoding the $^1$H$^\alpha$ (FIG. 4A), $^1$H$^\beta$ (FIG. 4B) and $^1$H$^\gamma$ (FIG. 4C) chemical shifts of Gln 26 are indicated. FIGS. 4D—F show the corresponding cross sections taken from subspectra II, which exhibit central peaks. The signals arising from $^{13}$C$^\alpha$ (FIG. 4A), $^{13}$C$^\beta$ (FIG. 4B) and $^{13}$C$^\gamma$ (FIG. 4C) of Gln 26 are indicated. Chemical shifts are given relative to 2,2-dimethyl-2-silapentane-5-sulfonate (DSS).

FIG. 9). This key role is further evidenced when employing 3D H̲$^{\alpha/\beta}$C̲$^{\alpha/\beta}$(CO)NHN also for assigning aliphatic (H̲CCH—COSY/TOCSY; FIGS. 9 and 10) and aromatic side chains (H̲BCB(CGCD)HD and $^1$H-TOCSY-relayed H̲CH—COSY; FIG. 12). Black double-headed arrows indicate connectivities which are established based on matching of peak patterns along $\omega_1$($^{13}$C) of the spectra, and grey arrows indicate that the combined use of the two spectra connected by the arrow requires the conversion of in-phase splittings into chemical shifts. Each box shows the peak patterns expected along $\omega_1$, and the chemical shifts that are measured in the other dimensions are given above the corresponding boxes. Two cross sections are sketched for RD NMR experiments which yield two subspectra labeled with I and II, which comprise peak pairs and central peaks, respectively.

FIG. 8 shows the sequential resonance assignment from 3D H̲$^{\alpha/\beta}$C̲$^{\alpha/\beta}$(CO)NHN/3D HNNC̲AHA. Contour plot of [$\omega_1$($^{13}$C), $\omega_3$($^1$H$^N$)]-strips taken from subspectrum I (strips labeled with AI) and subspectrum II (strips labeled with AII) of 3D H̲$^{\alpha/\beta}$C̲$^{\alpha/\beta}$(CO)NHN, and from 3D HNNC̲AHA (strips labeled with B) are shown. The strips were taken at the $^{15}$N chemical shifts (indicated at the top) of residues 51 to 55 and are centered about their $^1$H$^N$ chemical shift. The sequence-specific resonance assignments of the amide chemical shifts are given at the top of each strip and are referred to as i. $\Omega(^1$H$^{\alpha/\beta}_{i-1})$ and $\Omega(^{13}$C$^{\alpha/\beta}_{i-1})$ obtained from 3D H̲$^{\alpha/\beta}$C̲$^{\alpha/\beta}$(CO)NHN are given in the strips AI and AII of residue i. Corresponding peak pairs in AI and central peaks in AII are connected by dashed lines, and sequential connectivities are indicated by solid lines for both peak pairs and central peaks. Dashed and solid contour lines represent negative and positive peaks, respectively, and sequential connectivities established via the central peaks and via the peak pairs are indicated by solid and dotted lines, respectively. Note, that the near-degeneracy of $^{13}$C$^\alpha$ chemical shifts in the polypeptide segment Asn 52-Asp 53-Ala 54 is neatly resolved by the measurement of $^1$H$^\alpha$ chemical shifts encoded in the in-phase splittings of the peak pairs. Chemical shifts are relative to DSS.

FIG. 9A shows the matching of $\omega_1$($^{13}$C$^{\alpha/\beta}$) peak patterns in 3D H̲$^{\alpha/\beta}$C̲$^{\alpha/\beta}$COHA (strips labeled with "a") and 3D H̲$^{\alpha/\beta}$C̲$^{\alpha/\beta}$(CO)NHN ("b") yields putative intraresidue $^1$H$^{\alpha/\beta}$/$^{13}$C$^{\alpha/\beta}$—$^{13}$C=O correlations: on the strips taken from 3D H̲$^{\alpha/\beta}$C̲$^{\alpha/\beta}$COHA the $^{13}$C=O chemical shift is indicated. 3D HNN<C̲A,C̲O> yields the sequential $^{13}$C=O—$^{13}$C$^\alpha$ correlations (FIG. 9B): the carbonyl chemical shifts have to match those shown in FIG. 9A, and are indicated on the left of the figure. Proton and carbon chemical shifts are given in ppm and are relative to DSS.

from 3D $\underline{H}^{\alpha/\beta}\underline{C}^{\alpha/\beta}$(CO)NHN (FIG. 10A) and subspectrum I of 3D $\underline{HC}$CH—COSY (FIG. 10B) are shown. The signals in 3D $\underline{H}^{\alpha/\beta}\underline{C}^{\alpha/\beta}$(CO)NHN were detected on the backbone amid proton of the succeeding residue Phe 5 (the $^{15}$N and $^{1}$H$^{N}$ chemical shifts are indicated on the right). The cross sections taken from $\underline{HC}$CH—COSY exhibit signals which were detected on $^{1}$H$^{\alpha}$, $^{1}$H$^{\beta}$, $^{1}$H$^{\gamma}$ and $^{1}$H$^{\delta}$ of Lys 4, respectively (from the bottom to the top). The in-phase splittings encode the $^{1}$H$^{\beta}$, $^{1}$H$^{\gamma}$, $^{1}$H$^{\delta}$ and $^{1}$H$^{\epsilon}$ chemical shifts and serve to obtain the desired correlations as indicated by dashed vertical lines. Note that the peak signs vary because of aliasing along $\omega_2(^{13}C)$. In FIG. 10C, a $\omega_1(^{13}C)$ cross section from 3D $\underline{HC}$CH-TOCSY is shown. The signal was detected on $^{1}$H$^{\gamma}$ of Lys 4, and the crucial $^{\alpha}$CH-$^{\gamma}$CH relay connectivity is indicated (see also FIG. 9). Proton and carbon chemical shifts are relative to DSS.

FIGS. 12A–C show the assignment of aromatic side chains exemplified for His(–4) and His 18, and Tyr 14. A composite plot of $[\omega_1(^{13}C),\omega_3(^{1}H^{N})]$-strips taken from 3D $\underline{H}^{\alpha/\beta}\underline{C}^{\alpha/\beta}$(CO)NHN comprising the $\omega_1(^{13}C)$ peaks of all aromatic side chains in the polypeptide segment (–5)-58 of Z-domain, the 2D $\underline{HBC}$B(CGCD)HD spectrum (FIG. 12B) as well as a spectral region taken from 2D $^{1}$H-TOCSY-relayed $\underline{HC}$H—COSY (FIG. 12C) are shown. The entire 2D $^{1}$H-TOCSY-relayed $\underline{HC}$H—COSY spectrum, which also contains cross peaks arising from $^{\epsilon}$CH of the histidinyl residues, is shown in the upper right of the figure. Correlations belonging to His(–4), His 18, and Tyr 14 are connected with long-dashed, dashed and grey solid lines, respectively. In FIG. 12C, peaks arising from $^{\alpha}$CH moieties (which are not required for connecting the aromatic spin systems) are labeled with an asterisk.

DETAILED DESCRIPTION OF THE INVENTION

Figures 1A, 1B, 1C:
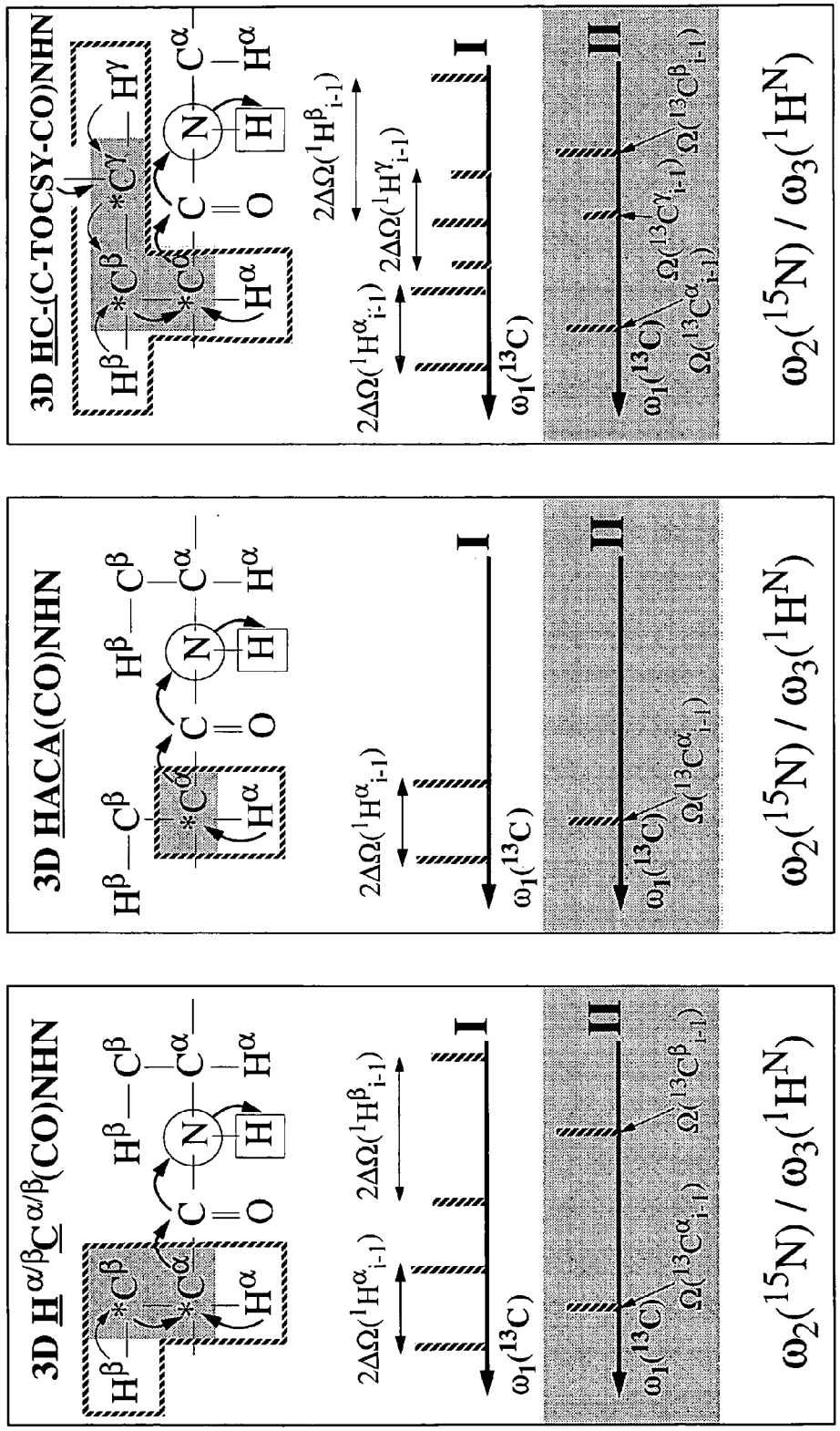

The present invention discloses eight new RD TR NMR experiments and different combinations of those eight experiments as well as three other RD TR NMR experiments which allows one to obtain sequential backbone chemical shift assignments for determining the secondary structure of a protein molecule and nearly complete assignments of chemical shift values for a protein molecule including aliphatic and aromatic sidechain spin systems. FIG. 1 provides a survey of (i) the names, (ii) the magnetization transfer pathways and (iii) the peak patterns observed in the projected dimension of specific embodiments of the 8 new RD NMR experiments disclosed by the present invention as well as 3 other RD NMR experiments that have previously been published. The group comprising the first three experiments are designed to yield "sequential" connectivities via one-bond scalar couplings: 3D $\underline{H}^{\alpha/\beta}\underline{C}^{\alpha/\beta}$(CO)NHN (FIG. 1A; Szyperski et al., *J. Magn. Reson.*, B 105: 188–191 (1994), which is hereby incorporated by reference in its entirety), 3D $\underline{HAC}$A(CO)NHN (FIG. 1B), and 3D HC(C-TOCSY—CO)NHN (FIG. 1C). The following three experiments provide "intraresidual" connectivities via one-bond scalar couplings: 3D HNN$\underline{CAH}$A (FIG. 1D; Szyperski et al., *J. Biomol. NMR*, 11:387–405 (1998), which is hereby incorporated by reference in its entirety), 3D $\underline{H}^{\alpha/\beta}\underline{C}^{\alpha/\beta}$COHA (FIG. 1E), and 3D $\underline{H}^{\alpha/\beta}\underline{C}^{\alpha/\beta}$NHN (FIG. 1F). 3D HNN<$\underline{CO}$, $\underline{CA}$> (FIG. 1G; Szyperski et al., *J. Magn. Reson.*, B 108: 197–203 (1995); Szyperski et al., *J. Am. Chem. Soc.*, 118: 8146–8147 (1996), which are hereby incorporated by reference in their entirety) offers both intraresidual $^{1}$H$^{N}$—$^{13}$C$^{\alpha}$ and sequential $^{1}$H$^{N}$—$^{13}$C$^{\prime}$ connectivities. Although 3D HNN $\underline{CAH}$A (FIG. 1D), 3D $\underline{H}^{\alpha/\beta}\underline{C}^{\alpha/\beta}$NHN (FIG. 1F) and 3D HNN<$\underline{CO,CA}$> (FIG. 1G) also provide sequential connectivities via two-bond $^{13}$C$^{\alpha}_{i-1}$—$^{15}$N$_i$ scalar couplings, those are usually smaller than the one-bond couplings (Cavanagh et al., *Protein NMR Spectroscopy*, Academic Press, San Diego, (1996), which is hereby incorporated by reference in its entirety), and obtaining complete backbone resonance assignments critically depends on experiments designed to provide sequential connectivities via one-bond couplings (FIGS. 1D–F). 3D $\underline{HC}$CH—COSY (FIG. 1H) and 3D $\underline{HC}$CH-TOCSY (FIG. 1I) allow one to obtain assignments for the "aliphatic" side chain spin systems, while 2D $\underline{HBC}$B(CDCG)HD (FIG. 1J) and 2D $^{1}$H-TOCSY-relayed $\underline{HC}$H—COSY (FIG. 1K) provide the corresponding information for the "aromatic" spin systems.

The RD NMR experiments are grouped accordingly in Table 1, which lists for each experiment (i) the nuclei for which the chemical shifts are measured, (ii) if and how the central peaks are acquired and (iii) additional notable technical features. State-of-the art implementations (Cavanagh et al., *Protein NMR Spectroscopy*, Academic Press, San Diego, (1996); Kay, *J. Am. Chem. Soc.*, 115:2055–2057 (1993); Grzesiek et al., *J. Magn. Reson.*, 99:201–207 (1992); Montelione et al., *J. Am. Chem. Soc.*, 114:10974–10975 (1992); Boucher et al., *J. Biomol. NMR*, 2:631–637 (1992); Yamazaki et al., *J. Am. Chem. Soc.*, 115:11054–11055 (1993); Zerbe et al., *J. Biomol. NMR*, 7:99–106 (1996); Grzesiek et al., *J. Biomol. NMR*, 3:185–204 (1993), which are hereby incorporated by reference in their entirety) making use of pulsed field z-gradients for coherence selection and/or rejection, and sensitivity enhancement (Cavanagh et al., *Protein NMR Spectroscopy*, Academic Press, San Diego, (1996), which is hereby incorporated by reference in its entirety) were chosen, which allow executing these experiments with a single transient per acquired free induction decay (FID). Semi (Grzesiek et al., *J. Biomol. NMR*, 3:185–204 (1993), which is hereby incorporated by reference in its entirety) constant-time (Cavanagh et al., *Protein NMR Spectroscopy*, Academic Press, San Diego, (1996), which is hereby incorporated by reference in its entirety) chemical shift frequency-labeling modules were used throughout in the indirect dimensions in order to minimize losses arising from transverse nuclear spin relaxation. FIGS. 2A–2K provide comprehensive descriptions of the RD NMR r.f. pulse sequences used in the 11 RD NMR experiments including eight previously unpublished RD NMR r.f. pulse schemes.

TABLE 1

Reduced Dimensionality NMR Experiments for HTP Resonance Assignment

| Experiment (see FIG. 1) | Nuclei for which the chemical shifts are correlated[a,b] | Acquisition of central peaks[c] |
|---|---|---|
| *3D spectra for sequential backbone connectivities:* | | |
| (A) H$^{\alpha/\beta}$C$^{\alpha/\beta}$(CO)NHN | $^1$H$^\beta_{i-1}$, $^{13}$C$^\beta_{i-1}$, $^1$H$^\alpha_{i-1}$, $^{13}$C$^\alpha_{i-1}$, $^{15}$N$_i$, $^1$H$^N_i$ | $^{13}$C |
| (B) HACA(CO)NHN | $^1$H$^\alpha_{i-1}$, $^{13}$C$^\alpha_{i-1}$, $^{15}$N$_i$, $^1$H$^N_i$ | $^{13}$C |
| (C) HC(C-TOCSY-CO)NHN | $^1$H$^{ali}_{i-1}$, $^{13}$C$^{ali}_{i-1}$, $^{15}$N$_i$, $^1$H$^N_i$ | $^{13}$C |
| *3D spectra for intraresidual backbone connectivities:* | | |
| (D) HNNCAHA[b,d] | $^1$H$^\alpha_i$, $^{13}$C$^\alpha_i$, $^{15}$N$_i$, $^1$H$^N_i$ | INEPT |
| (E) H$^{\alpha/\beta}$C$^{\alpha/\beta}$COHA | $^1$H$^\beta_i$, $^{13}$C$^\beta_i$, $^1$H$^\alpha_i$, $^{13}$C$^\alpha_i$, $^{13}$C=O$_i$ | $^{13}$C |
| (F) H$^{\alpha/\beta}$C$^{\alpha/\beta}$NH | $^1$H$^\beta_i$, $^{13}$C$^\beta_i$, $^1$H$^\alpha_i$, $^{13}$C$^\alpha_i$, $^{15}$N$_i$, $^1$H$^N_i$ | $^{13}$C |
| *3D spectrum for intra- and sequential backbone connectivities:* | | |
| (G) HNN<CO,CA>[b] | $^{13}$C=O$_{i-1}$, $^{13}$C$^\alpha_i$, $^{15}$N$_i$, $^1$H$^N_i$ | INEPT |
| *3D spectra for assignment of aliphatic resonances:[c]* | | |
| (H) HCCH-COSY | $^1$H$_m$, $^{13}$C$_m$, $^1$H$_n$, $^{13}$C$_n$ | $^{13}$C |
| (I) HCCH-TOCSY | $^1$H$_m$, $^{13}$C$_m$, $^1$H$_n$, $^{13}$C$_n$, $^1$H$_p$, $^{13}$C$_p$ | $^{13}$C |
| *2D spectra for assignment of aromatic resonances:[c]* | | |
| (J) HBCB(CGCD)HD | $^1$H$^\beta$, $^{13}$C$^\beta$, $^1$H$^\delta$ | $^{13}$C |
| (K) $^1$H-TOCSY-HCH-COSY | $^1$H$_m$, $^{13}$C$_m$, $^1$H$_n$ | none[f] |

[a] i−1, i: numbers of two sequentially located amino acid residues.
[b] Sequential connectivities via two-bond $^{13}$C$^\alpha_{i-1}$-$^{15}$N, scalar couplings are not considered in this table.
[c] approach-1 (Szyperski et al., *J. Am. Chem. Soc.*, 118:8146–8147 (1996), which is hereby incorporated by reference in its entirety): use of incomplete INEPT (rows labeled with "INEPT"); approach-2 (Szyperski et al., *J. Am. Chem. Soc.*, 118:8146–8147 (1996), which is hereby incorporated by reference in its entirety): use of $^{13}$C steady state magnetization (rows labeled with "$^{13}$C").
[d] adiabatic $^{13}$C$^\beta$-decoupling (Kupce et al., *J. Magn. Reson.*, A 115:273–277 (1995); Matsuo et al., *J. Magn. Reson.* B 113:190–194 (1996), which are hereby incorporated by reference in their entirety) is employed during delays with transverse $^{13}$C$^\alpha$magnetization.
[e] m, n, p: atom numbers in neighboring CH, CH$_2$ or CH$_3$ groups.
[f] acquisition of central peaks is prevented by the use of spin-lock purge pulses (flanking the total correlation relay) to obtain pure phases.

The 3D HA,CA,(CO),N,HN Experiment

The present invention relates to a method of conducting a reduced dimensionality (RD) three-dimensional (3D) HA, CA,(CO),N,HN nuclear magnetic resonance (NMR) experiment by measuring the chemical shift values for the following nuclei of a protein molecule having two consecutive amino acid residues, i−1 and i: (1) an α-proton of amino acid residue i−1, $^1$H$^\alpha_{i-1}$; (2) an α-carbon of amino acid residue i−1, $^{13}$C$^\alpha_{i-1}$; (3) a polypeptide backbone amide nitrogen of amino acid residue i, $^{15}$N$_i$; and (4) a polypeptide backbone amide proton of amino acid residue i, $^1$H$^N_i$. The method involves providing a protein sample and applying radiofrequency pulses to the protein sample which effect a nuclear spin polarization transfer where the chemical shift evolutions of $^1$H$^\alpha_{i-1}$ and $^{13}$C$^\alpha_{i-1}$ of amino acid residue i−1 are connected to the chemical shift evolutions of $^{15}$N$_i$ and $^1$H$^N_i$ of amino acid residue i, under conditions effective (1) to generate NMR signals encoding the chemical shift values of $^{13}$C$^\alpha_{i-1}$ and $^{15}$N$_i$ in a phase sensitive manner in two indirect time domain dimensions, t$_1$($^{13}$C$^\alpha$) and t$_2$($^{15}$N), respectively, and the chemical shift value of $^1$H$^N_i$ in a direct time domain dimension, t$_3$($^1$H$^N$), and (2) to cosine modulate the $^{13}$C$^\alpha_{i-1}$ chemical shift evolution in t$_1$($^{13}$C$^\alpha$) with the chemical shift evolution of $^1$H$^\alpha_{i-1}$. Then, the NMR signals are processed to generate a 3D NMR spectrum with a primary peak pair derived from the cosine modulating, where (1) the chemical shift values of $^{15}$N$_i$ and $^1$H$^N_i$ are measured in two frequency domain dimensions, ω$_2$($^{15}$N) and ω$_3$($^1$H$^N$), respectively, and (2) the chemical shift values of $^1$H$^\alpha_{i-1}$ and $^{13}$C$^\alpha_{i-1}$ are measured in a frequency domain dimension, ω$_1$($^{13}$C$^\alpha$), by the frequency difference between the two peaks forming the primary peak pair and the frequency at the center of the two peaks, respectively.

In addition, the method of conducting a RD 3D HA, CA,(CO),N,HN NMR experiment can involve applying radiofrequency pulses under conditions effective (1) to generate an additional NMR signal encoding the chemical shift values of $^{13}$C$^\alpha_{i-1}$ and $^{15}$N$_i$ in a phase sensitive manner in t$_1$($^{13}$C$^\alpha$) and t$_2$($^{15}$N) and the chemical shift value of $^1$H$^N_i$ in t$_3$($^1$H$^N$), and (2) to avoid cosine modulating the $^{13}$C$^\alpha_{i-1}$ chemical shift evolution in t$_1$($^{13}$C$^\alpha$) with the chemical shift evolution of $^1$H$^\alpha_{i-1}$ for the additional NMR signal. Then, the NMR signals and the additional NMR signal are processed to generate a 3D NMR spectrum with an additional peak located centrally between two peaks forming the primary peak pair which measures the chemical shift value of $^{13}$C$^\alpha_{i-1}$ along ω$_1$($^{13}$C$^\alpha$). That additional peak can be derived from $^{13}$C$^\alpha$ nuclear spin polarization. One specific embodiment (3D HACA(CO)NHN) of this method is illustrated in FIG. 1B, where the applying radiofrequency pulses effects a nuclear spin polarization transfer where a radiofrequency pulse is used to create transverse $^1$H$^\alpha_{i-1}$ magnetization, which is transferred to $^{13}$C$^\alpha_{i-1}$, to $^{15}$N$_i$, and to $^1$H$^N_i$, to generate the NMR signal. Another specific embodiment of this method involves applying radiofrequency pulses by (1) applying a first set of radiofrequency pulses according to the scheme shown in FIG. 2B to generate a first NMR signal, and (2) applying a second set of radiofrequency pulses according to the scheme shown in FIG. 2B, where phase $\phi_1$ of the first $^1$H pulse is altered by 180° to generate a second NMR signal. Then, prior to the processing, the first NMR signal and the second NMR signal are added and subtracted whereby the NMR signals are processed to generate a first NMR subspectrum derived from the subtracting which contains the primary peak pair and a second NMR subspectrum derived from the adding which contains the additional peak located centrally between the two peaks forming the primary peak pair.

In addition, the method of conducting a RD 3D H̲A̲, C̲A̲,(CO),N,HN NMR experiment can involve applying radiofrequency pulses under conditions effective to additionally cosine modulate the $^{13}C^\alpha_{i-1}$ chemical shift evolution in $t_1(^{13}C^\alpha)$ with the chemical shift evolution of a polypeptide backbone carbonyl carbon of amino acid residue i–1, $^{13}C'_{i-1}$. Then, the NMR signals are processed to generate a 3D NMR spectrum with two secondary peak pairs where (1) each of the secondary peak pairs is derived from a different one of the peaks of the primary peak pair, and (2) the chemical shift value of $^{13}C'_{i-1}$ is measured along $\omega_1(^{13}C^\alpha)$ by the frequency difference between the two peaks forming one of the secondary peak pairs. This method can further involve applying radiofrequency pulses under conditions effective (1) to generate an additional NMR signal encoding the chemical shift values of $^{13}C^\alpha_{i-1}$ and $^{15}N_i$ in a phase sensitive manner in $t_1(^{13}C^\alpha)$ and $t_2(^{15}N)$ and the chemical shift value of $^1H^N_i$ in $t_3(^1H^N)$, (2) to cosine modulate the $^{13}C^\alpha_{i-1}$ chemical shift evolution in $t_1(^{13}C^\alpha)$ with the chemical shift evolution of $^{13}C'_{i-1}$, and (3) to avoid cosine modulating the $^{13}C^\alpha_{i-1}$ chemical shift evolution in $t_1(^{13}C^\alpha)$ with the chemical shift evolution of $^1H^\alpha_{i-1}$. Then, the NMR signals and the additional NMR signal are processed to generate a 3D NMR spectrum with an additional secondary peak pair located between the two secondary peak pairs which measures the chemical shift values of $^{13}C'_{i-1}$ and $^{13}C^\alpha_{i-1}$ along $\omega_1(^{13}C^\alpha)$, by the frequency difference between the two peaks forming the additional secondary peak pair and the frequency at the center of the two peaks, respectively. That additional secondary peak pair can be derived from $^{13}C^\alpha$ nuclear spin polarization. One specific embodiment (3D H̲A̲C̲A̲(CO)NHN) of this method is illustrated in FIG. 1B, where the applying radiofrequency pulses effects a nuclear spin polarization transfer where a radiofrequency pulse is used to create transverse $^1H^\alpha_{i-1}$ magnetization, which is transferred to $^{13}C^\alpha_{i-1}$, to $^{15}N_i$, and to $^1H^N_i$, to generate the NMR signal. Another specific embodiment of this method involves applying radiofrequency pulses by (1) applying a first set of radiofrequency pulses according to the scheme shown in FIG. 2B to generate a first NMR signal, and (2) applying a second set of radiofrequency pulses according to the scheme shown in FIG. 2B, where phase $\phi_1$ of the first $^1$H pulse is altered by 180° to generate a second NMR signal. Then, prior to the processing, the first NMR signal and the second NMR signal are added and subtracted whereby the NMR signals are processed to generate a first NMR subspectrum derived from the subtracting which contains the two secondary peak pairs and a second NMR subspectrum derived from the adding which contains the additional peak located centrally between the primary peak pair.

In an alternate embodiment, the RD 3D H̲A̲, C̲A̲,(CO),N,HN NMR experiment can be modified to a RD 2D H̲A̲,C̲A̲,(CO,N),HN NMR experiment which involves applying radiofrequency pulses so that the chemical shift evolution of $^{15}N_i$ does not occur. Then, the NMR signals are processed to generate a two dimensional (2D) NMR spectrum with a peak pair where (1) the chemical shift value of $^1H^N_i$ is measured in a frequency domain dimension, $\omega_2(^1H^N)$, and (2) the chemical shift values of $^1H^\alpha_{i-1}$ and $^{13}C^\alpha_{i-1}$ are measured in a frequency domain dimension, $\omega_1(^{13}C^\alpha)$, by the frequency difference between the two peaks forming the primary peak pair and the frequency at the center of the two peaks, respectively.

In an alternate embodiment, the RD 3D H̲A̲, C̲A̲,(CO),N,UN NMR experiment can be modified to a RD 4D H̲A̲,C̲A̲,CO,N,HN NMR experiment which involves applying radiofrequency pulses so that the chemical shift evolution of a polypeptide backbone carbonyl carbon of amino acid residue i–1, $^{13}C'_{i-1}$, occurs under conditions effective to generate NMR signals encoding the chemical shift value of $^{13}C'_{i-1}$ in a phase sensitive manner in an indirect time domain dimension, $t_4(^{13}C')$. Then, the NMR signals are processed to generate a four dimensional (4D) NMR spectrum with a peak pair where (1) the chemical shift values of $^{15}N_i$, $^1H^N_i$ and $^{13}C'_{i-1}$ are measured in three frequency domain dimensions, $\omega_2(^{15}N)$, $\omega_3(^1H^N)$, and $\omega_4(^{13}C')$, respectively, and (2) the chemical shift values of $^1H^\alpha_{i-1}$ and $^{13}C^\alpha_{i-1}$ are measured in a frequency domain dimension, $\omega_1(^{13}C^\alpha)$, by the frequency difference between the two peaks forming the peak pair and the frequency at the center of the two peaks, respectively.

The 3D H̲,C̲,(C-TOCSY-CO),N,HN Experiment

The present invention also relates to a method of conducting a reduced dimensionality (RD) three-dimensional (3D) H̲,C̲,(C-TOCSY—CO),N,HN nuclear magnetic resonance (NMR) experiment by measuring the chemical shift values for the following nuclei of a protein molecule having two consecutive amino acid residues, i–1 and i: (1) aliphatic protons of amino acid residue i–1, $^1H^{ali}_{i-1}$; (2) aliphatic carbons of amino acid residue i–1, $^{13}C^{ali}_{i-1}$; (3) a polypeptide backbone amide nitrogen of amino acid residue i, $^{15}N_i$; and (4) a polypeptide backbone amide proton of amino acid residue i, $^1H^N_i$. The method involves providing a protein sample and applying radiofrequency pulses to the protein sample which effect a nuclear spin polarization transfer where the chemical shift evolutions of $^1H^{ali}_{i-1}$ and $^{13}C^{ali}_{i-1}$ of amino acid residue i–1 are connected to the chemical shift evolutions of $^{15}N_i$ and $^1H^N_i$ of amino acid residue i, under conditions effective (1) to generate a NMR signal encoding the chemical shifts of $^{13}C^{ali}_{i-1}$ and $^{15}N_i$ in a phase sensitive manner in two indirect time domain dimensions, $t_1(^{13}C^{ali})$ and $t_2(^{15}N)$, respectively, and the chemical shift of $^1H^N_i$ in a direct time domain dimension, $t_3(^1H^N)$, and (2) to cosine modulate the chemical shift evolutions of $^{13}C^{ali}_{i-1}$ in $t_1(^{13}C^{ali})$ with the chemical shift evolutions of $^1H^{ali}_{i-1}$. Then, the NMR signals are processed to generate a 3D NMR spectrum with peak pairs derived from the cosine modulating where (1) the chemical shift values of $^{15}N_i$ and $^1H^N_i$ are measured in two frequency domain dimensions, $\omega_2(^{15}N)$ and $\omega_3(^1H^N)$, respectively, and (2) the chemical shift values of $^1H^{ali}_{i-1}$ and $^{13}C^{ali}_{i-1}$ are measured in a frequency domain dimension, $\omega_1(^{13}C^{ali})$, by the frequency differences between the two peaks forming the peak pairs and the frequencies at the center of the two peaks, respectively.

In addition, the method of conducting a RD 3D H̲, C̲,(C-TOCSY—CO),N,HN NMR experiment can involve applying radiofrequency pulses under conditions effective (1) to generate an additional NMR signal encoding the chemical shift values of $^{13}C^{ali}_{i-1}$ and $^{15}N_i$ in a phase sensitive manner in $t_1(^{13}C^{ali})$ and $t_2(^{15}N)$ and the chemical shift value of $^1H^N_i$ in $t_3(^1H^N)$, and (2) to avoid cosine modulating the chemical shift evolutions of $^{13}C^{ali}_{i-1}$ in $t_1(^{13}C^{ali})$ with the chemical shift evolution of $^1H^\alpha_{i-1}$ for the additional NMR signal. Then, the NMR signals and the additional NMR signal are processed to generate a 3D NMR spectrum with additional peaks located centrally between two peaks forming the peak pairs which measure the chemical shift values of $^{13}C^{ali}_{i-1}$ along $\omega_1(^{13}C^{ali})$. Those additional peaks can be derived from $^{13}C^{ali}$ nuclear spin polarization. One specific embodiment (3D HC-(C-TOCSY—CO)NHN) of this method is illustrated in FIG. 1C, where the applying radiofrequency pulses effects a nuclear spin polarization transfer, where a radiofrequency pulse is used to create transverse $^1H^{ali}_{i-1}$ magnetization, and $^1H^{ali}_{i-1}$ magnetization is transferred to $^{13}C^{ali}_{i-1}$, to $^{13}C^\alpha_{i-1}$, to $^{13}C'_{i-1}$, to $^{15}N_i$, and to $^1H^N_i$, where the NMR signal is detected. Another specific embodiment of this method involves applying radiofrequency pulses by (1) applying a first set of radiofrequency pulses according to the scheme shown in FIG. 2C to generate a first NMR signal, and (2) applying a second set of radiofrequency pulses according to the scheme shown in FIG. 2C, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D H,C,(C-TOCSY—CO),N,HN NMR experiment can be modified to a RD 2D H,C,(C-TOCSY—CO,N),HN NMR experiment, which involves applying radiofrequency pulses so that the chemical shift evolution of $^{15}N_i$ does not occur. Then, the NMR signals are processed to generate a two dimensional (2D) NMR spectrum with peak pairs where (1) the chemical shift value of $^1H^N_i$ is measured in a frequency domain dimension, $\omega_2(^1H^N)$, and (2) the chemical shift values of $^1H^{ali}_{i-1}$ and $^{13}C^{ali}_{i-1}$ are measured in a frequency domain dimension, $\omega_1(^{13}C^{ali})$, by the frequency differences between the two peaks forming the peak pairs and the frequencies at the center of the two peaks, respectively.

In an alternate embodiment, the RD 3D H,C,(C-TOCSY—CO),N,HN NMR experiment can be modified to a RD 4D H,C,(C-TOCSY),CO,N,HN NMR experiment which involves applying radiofrequency pulses so that the chemical shift evolution of a polypeptide backbone carbonyl carbon of amino acid residue i-1, $^{13}C'_{i-1}$, occurs under conditions effective to generate NMR signals encoding the chemical shift value of $^{13}C'_{i-1}$ in a phase sensitive manner in an indirect time domain dimension, $t_4(^{13}C')$. Then, the NMR signals are processed to generate a four dimensional (4D) NMR spectrum with variant peak pairs where (1) the chemical shift values of $^{15}N_i$, $^1H^N_i$ and $^{13}C'_{i-1}$ are measured in three frequency domain dimensions, $\omega_2(^{15}N)$, $\omega_3(^1H^N)$, and $\omega_4(^{13}C')$, respectively, and (2) the chemical shift values of $^1H^{ali}_{i-1}$ and $^{13}C^{ali}_{i-1}$ are measured in a frequency domain dimension, $\omega_1(^{13}C^{ali})$, by the frequency differences between the two peaks forming the variant peak pairs and the frequencies at the center of the two peaks, respectively.

The 3D $\underline{H}^{\alpha/\beta},\underline{C}^{\alpha/\beta}$,CO,HA Experiment Another aspect of the present invention relates to a method of conducting a reduced dimensionality (RD) three-dimensional (3D) $\underline{H}^{\alpha/\beta},\underline{C}^{\alpha/\beta}$,CO,HA nuclear magnetic resonance (NMR) experiment by measuring the chemical shift values for the following nuclei of a protein molecule having an amino acid residue, i: (1) a β-proton of amino acid residue i, $^1H^\beta_i$; (2) a β-carbon of amino acid residue i, $^{13}C^\beta_i$; (3) an α-proton of amino acid residue i, $^1H^\alpha_i$; (4) an α-carbon of amino acid residue i, $^{13}C^\alpha_i$; and (5) a polypeptide backbone carbonyl carbon of amino acid residue i, $^{13}C'_i$. The method involves providing a protein sample and applying radiofrequency pulses to the protein sample which effect a nuclear spin polarization transfer where the chemical shift evolutions of $^1H^\alpha_i$, $^1H^\beta_i$, $^{13}C^\alpha_i$, and $^{13}C^\beta_i$ are connected to the chemical shift evolution of $^{13}C'_i$, under conditions effective (1) to generate NMR signals encoding the chemical shift values of $^{13}C^\alpha_i$, $^{13}C^\beta_i$ and $^{13}C'_i$ in a phase sensitive manner in two indirect time domain dimensions, $t_1(^{13}C^{\alpha/\beta})$ and $t_2(^{13}C')$, respectively, and the chemical shift value of $^1H^\alpha_i$ in a direct time domain dimension, $t_3(^1H^\alpha)$, and (2) to cosine modulate the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$, respectively. Then, the NMR signals are processed to generate a 3D NMR spectrum with peak pairs derived from the cosine modulating where (1) the chemical shift values of $^{13}C'_i$ and $^1H^\alpha_i$ are measured in two frequency domain dimensions, $\omega_2(^{13}C')$ and $\omega_3(^1H^\alpha)$, respectively, and (2) (i) the chemical shift values of $^1H^\alpha_i$ and $^1H^\beta_i$ are measured in a frequency domain dimension, $\omega_1(^{13}C^{\alpha/\beta})$, by the frequency differences between the two peaks forming the peak pairs, and (ii) the chemical shift values of $^{13}C^\alpha_i$, and $^{13}C^\beta_i$ are measured in a frequency domain dimension, $\omega_1(^{13}C^{\alpha/\beta})$, by the frequencies at the center of the two peaks forming the peak pairs.

In addition, the method of conducting a RD 3D $\underline{H}^{\alpha/\beta}$,$\underline{C}^{\alpha/\beta}$,CO,HA NMR experiment can involve applying radiofrequency pulses under conditions effective (1) to generate an additional NMR signal encoding the chemical shift values of $^{13}C^\alpha_i$, $^{13}C^\beta_i$ and $^{15}N_i$ in a phase sensitive manner in $t_1(^{13}C^{\alpha/\beta})$ and $t_2(^{15}N)$ and the chemical shift value of $^1H^\alpha_i$ in $t_3(^1H^\alpha)$, and (2) to avoid cosine modulating the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$ for the additional NMR signal. Then, the NMR signals and the additional NMR signal are processed to generate a 3D NMR spectrum with additional peaks located centrally between two peaks forming the peak pairs which measure the chemical shift values of $^{13}C^\alpha_i$ and $^{13}C^\beta_i$ along $\omega_1(^{13}C^{\alpha/\beta})$. Those additional peaks can be derived from $^{13}C^\alpha$ and $^{13}C^\beta$ nuclear spin polarization. One specific embodiment (3D $\underline{H}^{\alpha/\beta}\underline{C}^{\alpha/\beta}$COHA) of this method is illustrated in FIG. 1E, where the applying radiofrequency pulses effects a nuclear spin polarization transfer, where a radiofrequency pulse is used to create transverse $^1H^\alpha_i$ and $^1H^\beta_i$ magnetization, and $^1H^\alpha_i$ and $^1H^\beta_i$ polarization is transferred to $^{13}C^\alpha_i$ and $^{13}C^\beta_i$, to $^{13}C'_i$, and back to $^1H^\alpha_i$, where the NMR signal is detected. Another specific embodiment of this method involves applying radiofrequency pulses by (1) applying a first set of radiofrequency pulses according to the scheme shown in FIG. 2E to generate a first NMR signal, and (2) applying a second set of radiofrequency pulses according to the scheme shown in FIG. 2E, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D $\underline{H}^{\alpha/\beta},\underline{C}^{\alpha/\beta}$,CO,HA NMR experiment can be modified to a RD 2D $\underline{H}^{\alpha/\beta}$, $\underline{C}^{\alpha/\beta}$,(CO),HA NMR experiment, which involves applying radiofrequency pulses so that the chemical shift evolution of $^{13}C'_i$ does not occur. Then, the NMR signals are processed to generate a two dimensional (2D) NMR spectrum with peak pairs where (1) the chemical shift value of $^1H^\alpha_i$ is measured in a frequency domain dimension, $\omega_2(^1H^\alpha)$, and (2) (i) the chemical shift values of $^1H^\alpha_i$ and $^1H^\beta_i$ are measured in a frequency domain dimension, $\omega_1(^{13}C^{\alpha/\beta})$, by the frequency differences between two peaks forming the peak pairs, respectively, and (ii) the chemical shift values of $^{13}C^\alpha_i$, and $^{13}C^\beta_i$ are measured in a frequency domain dimension, $\omega_1(^{13}C^{\alpha/\beta})$, by the frequencies at the center of the two peaks forming the peak pairs.

The 3D $\underline{H}^{\alpha/\beta},\underline{C}^{\alpha/\beta}$,N,HN Experiment A further aspect of the present invention relates to a method of conducting a reduced dimensionality (RD) three-dimensional (3D) $\underline{H}^{\alpha/\beta},\underline{C}^{\alpha/\beta}$,N,HN nuclear magnetic resonance (NMR) experiment by measuring the chemical shift values for the following nuclei of a protein molecule having an amino acid residue, i: (1) a β-proton of amino acid residue i, $^1H^\beta_i$; (2) a β-carbon of amino acid residue i, $^{13}C^\beta_i$; (3) an α-proton of amino acid residue i, $^1H^\alpha_i$; (4) an α-carbon of amino acid residue i, $^{13}C^\alpha_i$; (5) a polypeptide backbone amide nitrogen of amino acid residue i, $^{15}N_i$; and (6) a polypeptide backbone amide proton of amino acid residue i, $^1H^N_i$. The method involves providing a protein sample and applying radiofrequency pulses to the protein sample which effect a nuclear spin polarization transfer where the chemical shift evolutions of $^1H^\alpha_i$, $^1H^\beta_i$, $^{13}C^\alpha_i$, and $^{13}C^\beta_i$ are connected to the chemical shift evolutions of $^{15}N_i$ and $^1H^N_i$, under conditions effective (1) to generate NMR signals encoding the chemical shift values of $^{13}C^\alpha_i$, $^{13}C^\beta_i$ and $^{15}N_i$ in a phase sensitive manner in two indirect time domain dimensions, $t_1(^{13}C^{\alpha/\beta})$ and $t_2(^{15}N)$, respectively, and the chemical shift value of $^1H^N_i$ in a direct time domain dimension, $t_3(^1H^N)$, and (2) to cosine modulate the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$, respectively. Then, the NMR signals are processed to generate a 3D NMR spectrum with peak pairs derived from the cosine modulating where (1) the chemical shift values of $^{15}N_i$ and $^1H^N_i$ are measured in two frequency domain dimensions, $\omega_2(^{15}N)$ and $\omega_3(^1H^N)$, respectively, and (2) (i) the chemical shift values of $^1H^\alpha_i$ and $^1H^\beta_i$ are measured in a frequency domain dimension, $\omega_1(^{13}C^{\alpha/\beta})$, by the frequency differences between the two peaks forming the peak pairs, and (ii) the chemical shift values of $^{13}C^\alpha_i$, and $^{13}C^\beta_i$ are measured in a frequency domain dimension, $\omega_1(^{13}C^{\alpha/\beta})$, by the frequencies at the center of the two peaks forming the peak pairs.

In addition, the method of conducting a RD 3D $\underline{H}^{\alpha/\beta}$, $\underline{C}^{\alpha/\beta}$,N,HN NMR experiment can involve applying radiofrequency pulses under conditions effective (1) to generate an additional NMR signal encoding the chemical shift values of $^{13}C^\alpha_i$, $^{13}C^\beta_i$ and $^{15}N_i$ in a phase sensitive manner in $t_1(^{13}C^{\alpha/\beta})$ and $t_2(^{15}N)$ and the chemical shift value of $^1H^N_i$ in $t_3(^1H^N)$, and (2) to avoid cosine modulating the chemical shift evolutions of $^{13}C^\alpha_i$ and $^{13}C^\beta_i$ in $t_1(^{13}C^{\alpha/\beta})$ with the chemical shift evolutions of $^1H^\alpha_i$ and $^1H^\beta_i$ for the additional NMR signal. Then, the NMR signals and the additional NMR signal are processed to generate a 3D NMR spectrum with additional peaks located centrally between two peaks forming the peak pairs which measure the chemical shift values of $^{13}C^\alpha_i$ and $^{13}C^\beta_i$ along $\omega_1(^{13}C^{\alpha/\beta})$. Those additional peaks can be derived from $^{13}C^\alpha$ and $^{13}C^\beta$ nuclear spin polarization. One specific embodiment (3D $\underline{H}^{\alpha/\beta}\underline{C}^{\alpha/\beta}$NHN) of this method is illustrated in FIG. 1F, where the applying radiofrequency pulses effects a nuclear spin polarization transfer where a radiofrequency pulse is used to create transverse $^1H^\alpha_i$ and $^1H^\beta_i$ magnetization, and $^1H^\alpha_i$ and $^1H^\beta_i$ magnetization is transferred to $^{13}C^\alpha_i$ and $^{13}C^\beta_i$, to $^{15}N_i$, and to $^1H^N_i$, where the NMR signal is detected. Another specific embodiment of this method involves applying radiofrequency pulses by (1) applying a first set of radiofrequency pulses according to the scheme shown in FIG. 2F to generate a first NMR signal, and (2) applying a second set of radiofrequency pulses according to the scheme shown in FIG. 2F, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D $\underline{H}^{\alpha/\beta},\underline{C}^{\alpha/\beta}$,N,HN NMR experiment can be modified to a RD 2D $\underline{H}^{\alpha/\beta}$, $\underline{C}^{\alpha/\beta}$,(N),HN NMR experiment which involves applying radiofrequency pulses so that the chemical shift evolution of $^{15}N_i$ does not occur. Then, the NMR signals are processed to generate a two dimensional (2D) NMR spectrum with peak pairs where (1) the chemical shift value of $^1H^N_i$ is measured in a frequency domain dimension, $\omega_2(^1H^N)$, and (2) (i) the chemical shift values of $^1H^\alpha_i$ and $^1H^\beta_i$ are measured in a frequency domain dimension, $\omega_1(^{13}C^{\alpha/\beta})$, by the frequency differences between the two peaks forming the peak pairs, and (ii) the chemical shift values of $^{13}C^\alpha_i$, and $^{13}C^\beta_i$ are measured in a frequency domain dimension, $\omega_1(^{13}C^{\alpha/\beta})$, by the frequencies at the center of the two peaks forming the peak pairs.

The 3D $\underline{H},\underline{C}$,C,H—COSY Experiment

The present invention also relates to a method of conducting a reduced dimensionality (RD) three-dimensional (3D) $\underline{H},\underline{C}$,C,H—COSY nuclear magnetic resonance (NMR) experiment by measuring the chemical shift values for $^1H^m$, $^{13}C^m$, $^1H^n$, and $^{13}C^n$ of a protein molecule where m and n indicate atom numbers of two CH, $CH_2$ or $CH_3$ groups that are linked by a single covalent carbon—carbon bond in an amino acid residue. The method involves providing a protein sample and applying radiofrequency pulses to the protein sample which effect a nuclear spin polarization transfer where the chemical shift evolutions of $^1H^m$ and $^{13}C^m$ are connected to the chemical shift evolutions of $^1H^n$ and $^{13}C^n$, under conditions effective (1) to generate NMR signals encoding the chemical shift values of $^{13}C^m$ and $^{13}C^n$ in a phase sensitive manner in two indirect time domain dimensions, $t_1(^{13}C^m)$ and $t_2(^{13}C^n)$, respectively, and the chemical shift value of $^1H^n$ in a direct time domain dimension, $t_3(^1H^n)$, and (2) to cosine modulate the chemical shift evolution of $^{13}C^m$ in $t_1(^{13}C^m)$ with the chemical shift evolution of $^1H_m$. Then, the NMR signals are processed to generate a 3D NMR spectrum with peak pairs derived from the cosine modulating where (1) the chemical shift values of $^{13}C^n$ and $^1H^n$ are measured in two frequency domain dimensions, $\omega_2(^{13}C^n)$ and $\omega_3(^1H^n)$, respectively, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

Figures 1G, 1H, 1I:
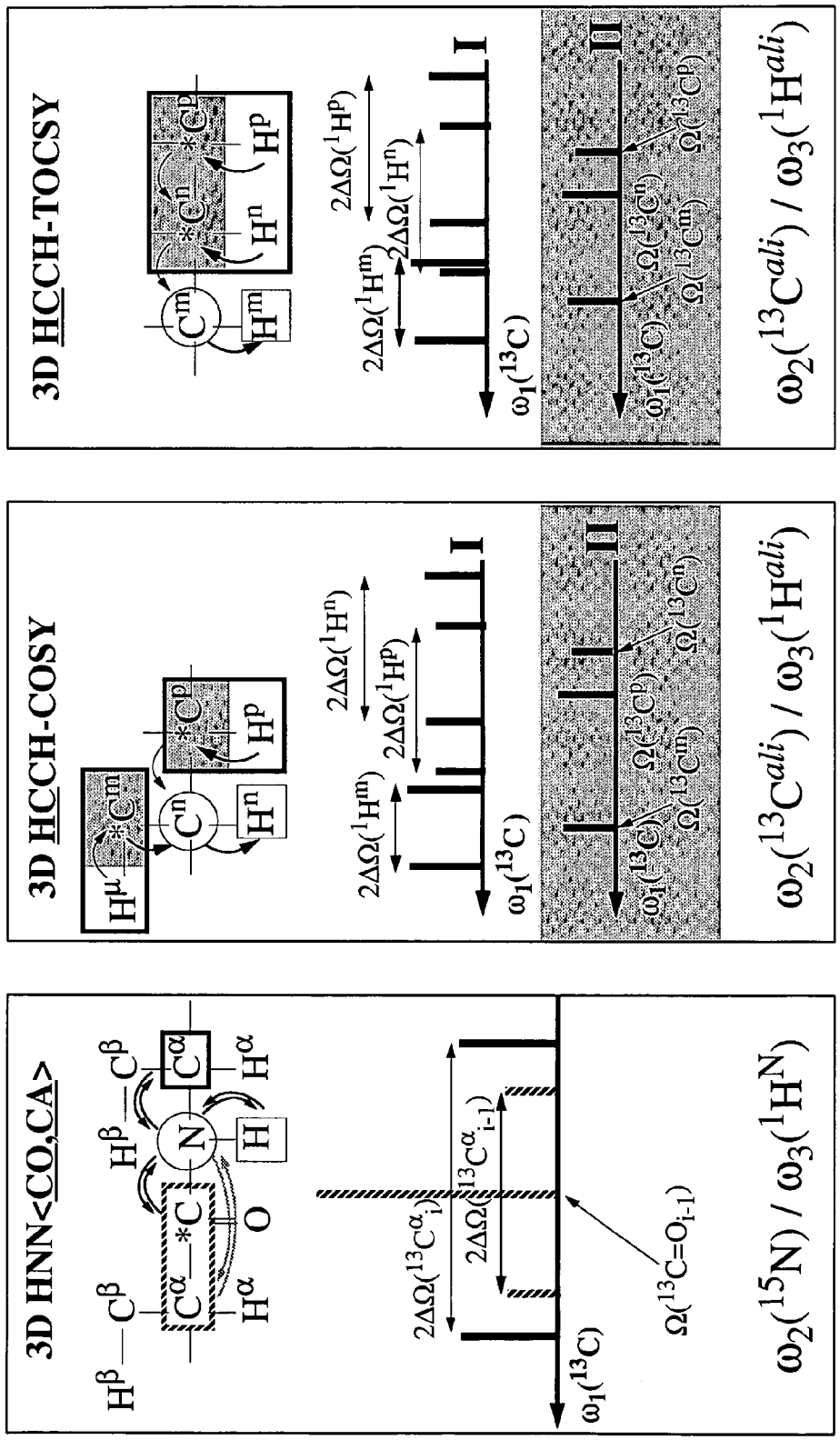

In addition, the method of conducting a RD 3D H̲,C̲,C,H—COSY NMR experiment can involve applying radiofrequency pulses under conditions effective (1) to generate an additional NMR signal encoding the chemical shift values of $^{13}C^m$ and $^{13}C^n$ in a phase sensitive manner in $t_1(^{13}C^m)$ and $t_2(^{13}C^n)$ and the chemical shift value of $^1H^n$ in $t_3(^1H)$, and (2) to avoid cosine modulating the chemical shift evolution of $^{13}C^m$ in $t_1(^{13}C^m)$ with the chemical shift evolution of $^1H^m$ for the additional NMR signal. Then, the NMR signals and the additional NMR signal are processed to generate a 3D NMR spectrum with additional peaks located centrally between two peaks forming the peak pairs which measure the chemical shift value of $^{13}C^m$ along $\omega_1(^{13}C^m)$. Those additional peaks can be derived from $^{13}C^m$ nuclear spin polarization. One specific embodiment (3D H̲C̲CH—COSY) of this method is illustrated in FIG. 1H, where the applying radiofrequency pulses effects a nuclear spin polarization transfer according to FIG. 1H, where a radiofrequency pulse is used to create transverse $^1H^m$ magnetization, and $^1H^m$ magnetization is transferred to $^{13}C^m$, to $^{13}C^n$, and to $^1H^n$, where the NMR signal is detected. Another specific embodiment of this method involves applying radiofrequency pulses by (1) applying a first set of radiofrequency pulses according to the scheme shown in FIG. 2H to generate a first NMR signal, and (2) applying a second set of radiofrequency pulses according to the scheme shown in FIG. 2H, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D H̲,C̲,C,H—COSY NMR experiment can be modified to a RD 2D H̲,C̲,(C),H—COSY NMR experiment which involves applying radiofrequency pulses so that the chemical shift evolution of $^{13}C^n$ does not occur. Then, the NMR signals are processed to generate a two dimensional (2D) NMR spectrum with peak pairs where (1) the chemical shift value of $^1H^n$ is measured in a frequency domain dimension, $\omega_2(^1H^n)$, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

The 3D H̲,C̲,C,H-TOCSY Experiment

Another aspect of the present invention relates to a method of conducting a reduced dimensionality (RD) three-dimensional (3D) H̲,C̲,C,H-TOCSY nuclear magnetic resonance (NMR) experiment by measuring the chemical shift values for $^1H^m$, $^{13}C^m$, $^1H^n$, and $^{13}C^n$ of a protein molecule where m and n indicate atom numbers of two CH, $CH_2$ or $CH_3$ groups that may or may not be linked by a single covalent carbon-carbon bond in an amino acid residue. The method involves providing a protein sample and applying radiofrequency pulses to the protein sample which effect a nuclear spin polarization transfer where the chemical shift evolutions of $^1H^m$ and $^{13}C^m$ are connected to the chemical shift evolutions of $^1H^n$ and $^{13}C^n$, under conditions effective (1) to generate NMR signals encoding the chemical shift values of $^{13}C^m$ and $^{13}C^n$ in a phase sensitive manner in two indirect time domain dimensions, $t_1(^{13}C^m)$ and $t_2(^{13}C^n)$, and the chemical shift value of $^1H^n$ in a direct time domain dimension, $t_3(^1H^n)$, and (2) to cosine modulate the chemical shift evolution of $^{13}C^m$ in $t_1(^{13}C^m)$ with the chemical shift evolution of $^1H^m$. Then, the NMR signals are processed to generate a 3D NMR spectrum with peak pairs derived from the cosine modulating where (1) the chemical shift values of $^{13}C^n$ and $^1H^n$ are measured in two frequency domain dimensions, $\omega_2(^{13}C^n)$ and $\omega_3(^1H^n)$, respectively, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

In addition, the method of conducting a RD 3D H̲,C̲,C,H-TOCSY NMR can involve applying radiofrequency pulses under conditions effective (1) to generate an additional NMR signal encoding the chemical shift values of $^{13}C^m$ and $^{13}C^n$ in a phase sensitive manner in $t_1(^{13}C^m)$ and $t_2(^{13}C^n)$ and the chemical shift value of $^1H^n$ in $t_3(^1H^n)$, and (2) to avoid cosine modulating the chemical shift evolution of $^{13}C^m$ in $t_1(^{13}C_m)$ with the chemical shift evolution of $^1H^m$ for the additional NMR signal. Then, the NMR signals and the additional NMR signal are processed to generate a 3D NMR spectrum with additional peaks located centrally between the peak pairs which measure the chemical shift value of $^{13}C^m$ along $\omega_1(^{13}C^m)$. Those additional peaks can be derived from $^{13}C^m$ nuclear spin polarization. One specific embodiment (3D H̲C̲CH-TOCSY) of this method is illustrated in FIG. 1I, where the applying radiofrequency pulses effects a nuclear spin polarization transfer where a radiofrequency pulse is used to create transverse $^1H^m$ magnetization, and $^1H^m$ magnetization is transferred to $^{13}C^m$, to $^{13}C^n$, and to $^1H^n$, where the NMR signal is detected. Another specific embodiment of this method involves applying radiofrequency pulses by (1) applying a first set of radiofrequency pulses according to the scheme shown in FIG. 2I to generate a first NMR signal, and (2) applying a second set of radiofrequency pulses according to the scheme shown in FIG. 2I, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pairs, and a second NMR subspectrum derived from the adding which contains the additional peaks located centrally between the two peaks forming the peak pairs.

In an alternate embodiment, the RD 3D H̲,C̲,C,H-TOCSY NMR experiment can be modified to a RD 2D H̲,C̲,(C),H-TOCSY NMR experiment which involves applying radiofrequency pulses so that the chemical shift evolution of $^{13}C^n$ does not occur. Then, the NMR signals are processed to generate a two dimensional (2D) NMR spectrum with peak pairs where (1) the chemical shift value of $^1H^n$ is measured in a frequency domain dimension, $\omega_2(^1H^n)$, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

The 2D H̲B̲,C̲B̲,(CG,CD),HD Experiment

A further aspect of the present invention relates to a method of conducting a reduced dimensionality (RD) two-dimensional (2D) H̲B̲,C̲B̲,(CG,CD),HD nuclear magnetic resonance (NMR) experiment by measuring the chemical shift values for the following nuclei of a protein molecule: (1) a β-proton of an amino acid residue with an aromatic side chain, $^1H^\beta$; (2) β-carbon of an amino acid residue with an aromatic side chain, $^{13}C^\beta$; and (3) a δ-proton of an amino acid residue with an aromatic side chain, $^1H^\delta$. The method involves providing a protein sample and applying radiofrequency pulses to the protein sample which effect a nuclear spin polarization transfer where the chemical shift evolutions of $^1H^\beta$ and $^{13}C^\beta$ are connected to the chemical shift evolution of $^1H^\delta$, under conditions effective (1) to generate NMR signals encoding the chemical shift value of $^{13}C^\beta$ in a phase sensitive manner in an indirect time domain dimension, $t_1(^{13}C^\beta)$, and the chemical shift value of $^1H^\delta$ in a direct time domain dimension, $t_2(^1H^\delta)$, and (2) to cosine modulate the chemical shift evolution of $^{13}C^\beta$ in $t_1(^{13}C^\beta)$ with the chemical shift evolution of $^1H^\beta$. Then, the NMR signals are processed to generate a 2D NMR spectrum with a peak pair derived from the cosine modulating where (1) the chemical shift value of $^1H^\delta$ is measured in a frequency domain dimension, $\omega_2(^1H^\delta)$, and (2) the chemical shift values of $^1H^\beta$ and $^{13}C^\beta$ are measured in a frequency domain dimension, $\omega_1(^{13}C^\beta)$, by the frequency difference between the two peaks forming the peak pair and the frequency at the center of the two peaks, respectively.

In addition, the method of conducting a RD 2D HB,CB,(CG,CD),HD NMR experiment can involve applying radiofrequency pulses under conditions effective (1) to generate an additional NMR signal encoding the chemical shift value of $^{13}C^\beta$ in a phase sensitive manner in $t_1(^{13}C^\beta)$ and the chemical shift value of $^1H^\delta$ in $t_2(^1H^\delta)$, and (2) to avoid cosine modulating the chemical shift evolution of $^{13}C^\beta$ in $t_1(^{13}C^\beta)$ with the chemical shift evolution of $^1H^\beta$ for the additional NMR signal. Then, the NMR signals and the additional NMR signal are processed to generate a 2D NMR spectrum with an additional peak located centrally between the two peaks forming the peak pair which measure the chemical shift value of $^{13}C^\beta$ along $\omega_1(^{13}C)$. That additional peak can be derived from $^{13}C^\beta$ nuclear spin polarization. One specific embodiment (2D HBCB(CGCD)HD) of this method is illustrated in FIG. 1J, where the applying radiofrequency pulses effects a nuclear spin polarization transfer where a radiofrequency pulse is used to create transverse $^1H^\beta$ magnetization, and $^1H^\beta$ magnetization is transferred to $^{13}C^\beta$, to $^{13}C^\delta$, and to $^1H^\delta$, where the NMR signal is detected. Another specific embodiment of this method involves applying radiofrequency pulses by (1) applying a first set of radiofrequency pulses according to the scheme shown in FIG. 2J to generate a first NMR signal, and (2) applying a second set of radiofrequency pulses according to the scheme shown in FIG. 2J, where phase $\phi_1$ of the first $^1H$ pulse is altered by 180° to generate a second NMR signal. Then, prior to the processing, the first NMR signal and the second NMR signal are added and subtracted, whereby the NMR signals are processed to generate a first NMR subspectrum derived from the subtracting which contains the peak pair, and a second NMR subspectrum derived from the adding which contains the additional peak located centrally between the two peaks forming the peak pair.

In an alternate embodiment, the RD 2D HB,CB,(CG,CD),HD NMR experiment can be modified to a RD 3D HB,CB,(CG),CD,HD NMR experiment which involves applying radiofrequency pulses so that the chemical shift evolution of a δ-carbon of an amino acid residue with an aromatic side chain, $^{13}C^\delta$ occurs under conditions effective to generate NMR signals encoding the chemical shift value of $^{13}C^\delta$ in a phase sensitive manner in an indirect time domain dimension, $t_3(^{13}C^\delta)$. Then, the NMR signals are processed to generate a three dimensional (3D) NMR spectrum with a peak pair where (1) the chemical shift values of $^1H^\delta$ and $^{13}C^\delta$ are measured in two frequency domain dimensions, $\omega_2(^1H^\delta)$ and $\omega_3(^{13}C^\delta)$, respectively, and (2) the chemical shift values of $^1H^\beta$ and $^{13}C^\beta$ are measured in a frequency domain dimension, $\omega_1(^{13}C^\beta)$, by the frequency difference between the two peaks forming the peak pair and the frequency at the center of the two peaks, respectively.

In an alternate embodiment, the RD 2D HB,CB,(CG,CD),HD NMR experiment can be modified to a RD 3D HB,CB,CG,(CD),HD NMR experiment which involves applying radiofrequency pulses so that the chemical shift evolution of a γ-carbon of an amino acid residue with an aromatic side chain, $^{13}C^\gamma$ occurs under conditions effective to generate NMR signals encoding the chemical shift value of $^{13}C^\gamma$ in a phase sensitive manner in an indirect time domain dimension, $t_3(^{13}C^\gamma)$, and said processing the NMR signals generates a three dimensional (3D) NMR spectrum with a peak pair wherein (1) the chemical shift values of $^1H^\delta$ and $^{13}C^\gamma$ are measured in two frequency domain dimensions, $\omega_2(^1H^\delta)$ and $\omega_3(^{13}C^\gamma)$, respectively, and (2) the chemical shift values of $^1H^\beta$ and $^{13}C^\beta$ are measured in a frequency domain dimension, $\omega_1(^{13}C^\beta)$, by the frequency difference between the two peaks forming said peak pair and the frequency at the center of the two peaks, respectively.

The 2D H,C,H—COSY Experiment

The present invention also relates to a method of conducting a reduced dimensionality (RD) two-dimensional (2D) H,C,H—COSY nuclear magnetic resonance (NMR) experiment by measuring the chemical shift values for $^1H^m$, $^{13}C^m$, and $^1H^n$ of a protein molecule where m and n indicate atom numbers of two CH, $CH_2$ or $CH_3$ groups in an amino acid residue. The method involves providing a protein sample and applying radiofrequency pulses to the protein sample which effect a nuclear spin polarization transfer where the chemical shift evolutions of $^1H^m$ and $^{13}C^m$ are connected to the chemical shift evolution of $^1H^n$, under conditions effective (1) to generate NMR signals encoding the chemical shift value of $^{13}C^m$ in a phase sensitive manner in an indirect time domain dimension, $t_1(^{13}C^m)$, and the chemical shift value of $^1H^n$ in a direct time domain dimension, $t_2(^1H^n)$, and (2) to cosine modulate the chemical shift evolution of $^{13}C^m$ in $t_1(^{13}C^m)$ with the chemical shift evolution of $^1H^m$. Then, the NMR signals are processed to generate a 2D NMR spectrum with peak pairs derived from the cosine modulating where (1) the chemical shift value of $^1H^n$ is measured in a frequency domain dimension, $\omega_2(^1H^n)$, and (2) the chemical shift values of $^1H^m$ and $^{13}C^m$ are measured in a frequency domain dimension, $\omega_1(^{13}C^m)$, by the frequency differences between the two peaks forming the peak pairs and the frequencies at the center of the two peaks, respectively.

Figure 1K:
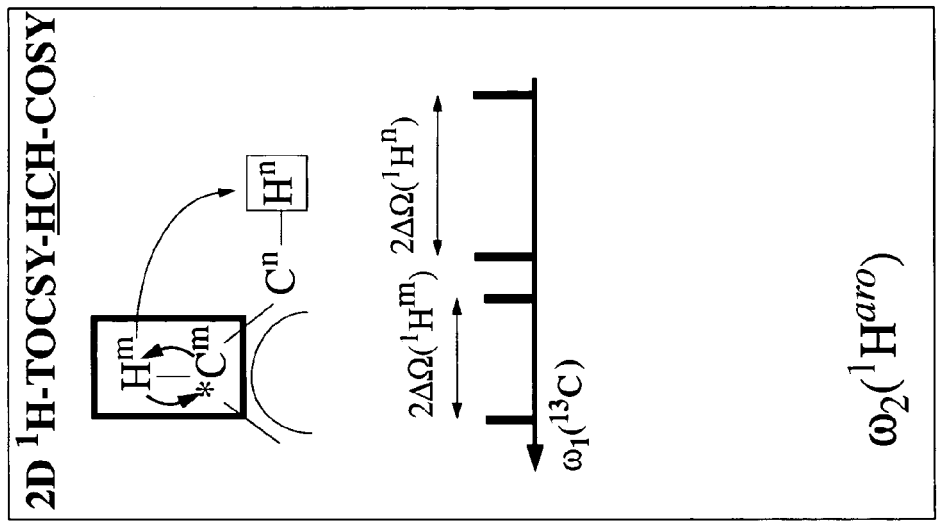
Figure 1J:
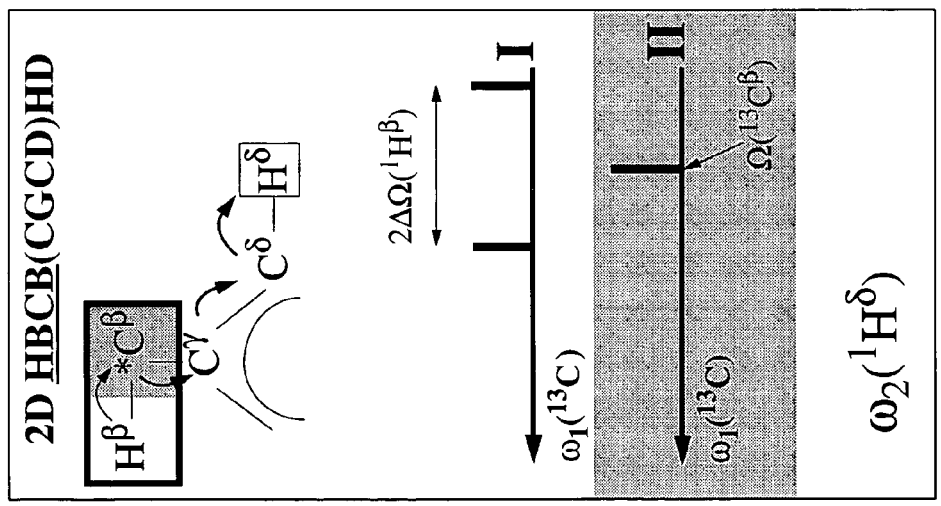
Figure 2A:
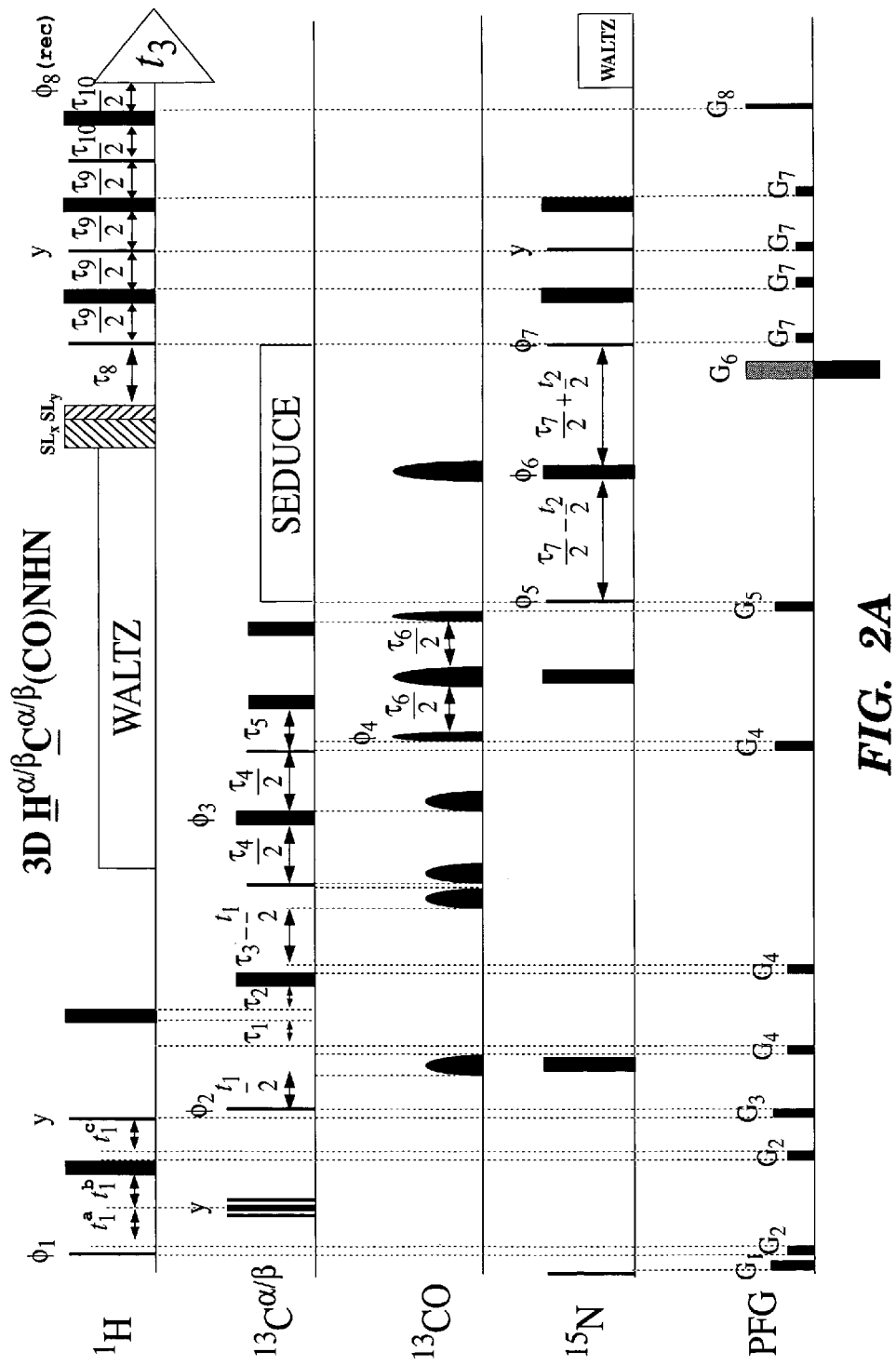
FIG. 2A illustrates the experimental scheme for the 3D $H^{\alpha/\beta}C^{\alpha/\beta}$(CO)NHN experiment. Rectangular 90° and 180° pulses are indicated thin and thick vertical bars, respectively, and phases are indicated above the pulses. Where no radio-frequency (r.f.) phase is marked, the pulse is applied along x. The scaling factor $\kappa$ for $^1$H chemical shift evolution during $t_1$ is set to 1.0. The high-power 90° pulse lengths were: 5.9 μs for $^1$H, 15.4 μs for $^{13}$C, and 38 μs for $^{15}$N. Pulses on $^{13}$C prior to $t_1(^{13}C)$ are applied at high power, and $^{13}$C decoupling during $t_1(^1H)$ is achieved using a $(90_x\text{-}180_y\text{-}90_x)$ composite pulse. Subsequently, the 90° and 180° pulse lengths applied for $^{13}C^{\alpha/\beta}$ are adjusted to 47.5 μs and 42.5 μs, respectively, to minimize perturbation of the $^{13}$CO spins. The width of the 90° pulse applied on $^{13}$CO pulse is 52 μs and the corresponding 180° pulses are applied with same power. A SEDUCE 180° pulse with a length of 200 μs is used to decouple $^{13}$CO during $t_1$ and $\tau_4$. The length of the spin-lock purge pulses $SL_x$ and $SL_y$ are 1.2 ms and 0.6 ms, respectively. WALTZ16 is employed to decouple $^1$H (r.f. field strength=9.2 kHz) during the heteronuclear magnetization transfers as well as to decouple $^{15}$N during acquisition (r.f.=1.78 kHz). The SEDUCE sequence is used for decoupling of $^{13}C^\alpha$ during $^{15}$N evolution period (r.f.=1.0 kHz). The $^1$H r.f. carrier is placed at 0 ppm before the start of the semi constant time $^1$H chemical shift evolution period, and then switched to the water line at 4.78 ppm after the second 90° $^1$H pulse. Initially, the $^{13}$C and $^{15}$N r.f. carriers are set to 43 ppm and 120.9 ppm, respectively. The $^{13}$C carrier is set to 56 ppm during the second $\tau_4/2$ delay. The duration and strengths of the pulsed z-field gradients (PFGs) are: G1 (1 ms, 24 G/cm); G2 (100 μs, 16 G/cm); G3 (250 μs, 29.5 G/cm); G4 (250 μs, 30 G/cm); G5 (1.5 ms, 20 G/cm); G6 (1.25 ms, 30 G/cm); G7 (500 μs, 8 G/cm); G8 (125 μs, 29.5 G/cm). All PFG pulses are of rectangular shape. A recovery delay of at least 100 μs duration is inserted between a PFG pulse and an r.f. pulse. The delays are: $\tau_1$=800 μs, $\tau_2$=3.1 ms, $\tau_3$=3.6 ms, $\tau_4$=7.2 ms, $\tau_5$=4.4 ms, $\tau_6$=24.8 ms, $\tau_7$=24.8 ms, $\tau_8$=5.5 ms, $\tau_9$=4.6 ms, $\tau_{10}$=1.0 ms. $^1$H-frequency labeling is achieved in a semi constant-time fashion with $t_1^a$ (0)=1.7 ms, $t_1^b$ (0)=1 μs, $t_1^c$ (0)=1.701 ms, $\Delta t_1^a$=33.3 μs, $\Delta t_1^b$=19.3 μs, $\Delta t_1^c$=-14 μs. Hence, the fractional increase of the semi constant-time period with $t_1$ equals to $\lambda=1+\Delta t_1^c/\Delta t_1^a$=0.58. Phase cycling: $\phi_1$=x; $\phi_2$=x,x,-x,-x; $\phi_3$=x, -x; $\phi_4$=x, -x; $\phi_5$=x; $\phi_6$=x, x, -x, -x; $\phi_7$=x; $\phi_8$(receiver)=x, -x, -x, x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of $G_6$ is inverted in concert with a 180° shift of $\phi_7$. Quadrature detection in $t_1(^{13}C)$ and $t_2(^{15}N)$ is accomplished by altering the phases $\phi_2$ and $\phi_5$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}$C steady state magnetization, a second data set with $\phi_1$=-x is collected. The sum and the difference of the two resulting data sets generate subspectra II and I, respectively, containing the central peaks and peak pairs.
Figure 2B:
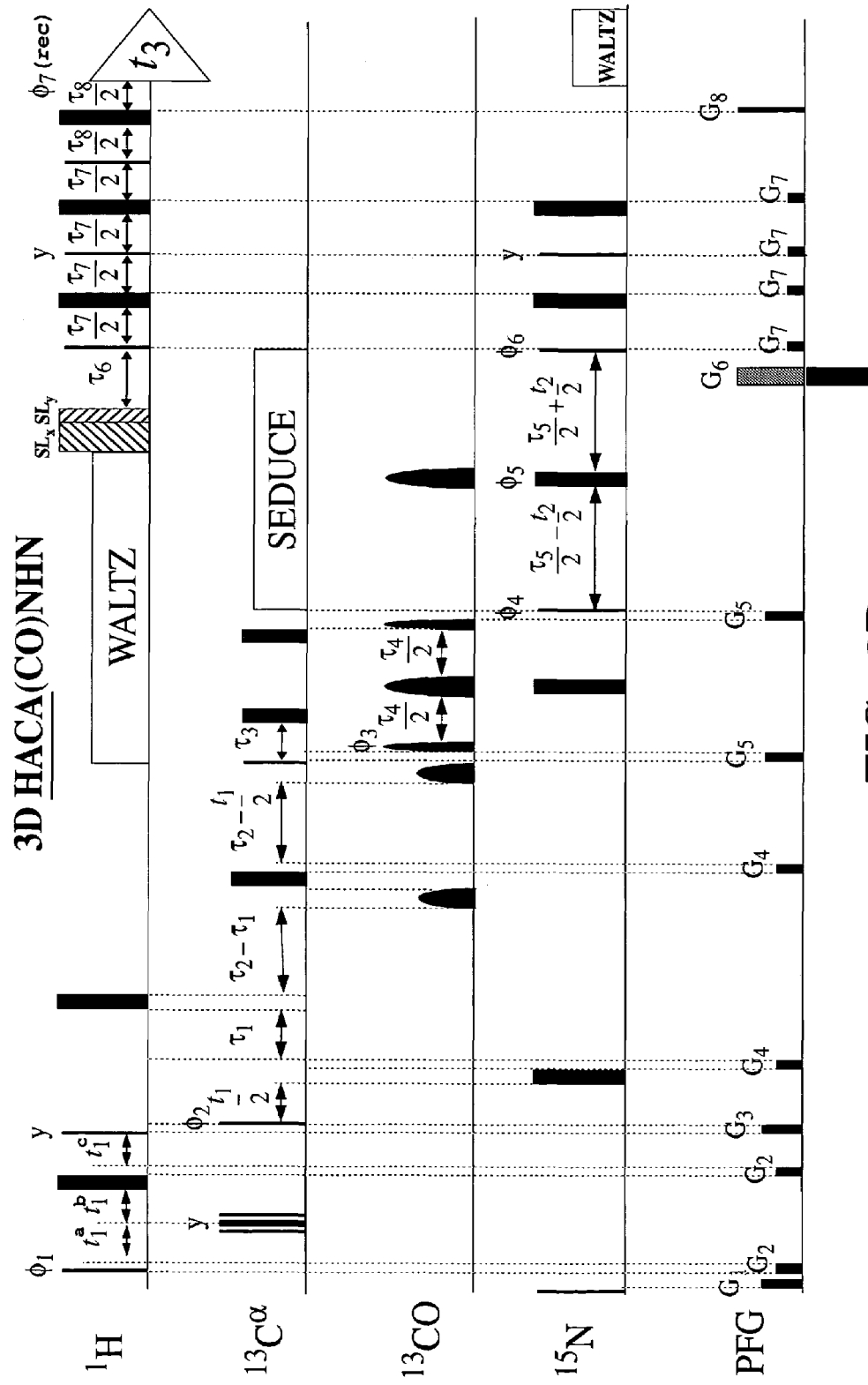
FIG. 2B illustrates the experimental scheme for the 3D HACA(CO)NHN experiment. Rectangular 90° and 180° pulses are indicated by thin and thick vertical bars, respectively, and phases are indicated above the pulses. Where no radio-frequency (r.f.) phase is marked, the pulse is applied along x. The scaling factor $\kappa$ for $^1$H chemical shift evolution during $t_1$ is set to 1.0. The high power 90° pulse lengths were: 5.8 μs for $^1$H and 15.4 μs for $^{13}$C, and 38 μs for $^{15}$N. Pulses on $^{13}$C prior to $t_1(^{13}C)$ are applied at high power, and $^{13}$C decoupling during $t_1(^1H)$ is achieved using a $(90_x\text{-}180_y\text{-}90_x)$ composite pulse. Subsequently, the 90° and 180° pulse lengths of $^{13}C^\alpha$ are adjusted to 51.5 μs and 46 μs, respectively, to minimize perturbation of the $^{13}$CO spins. The width of the 90° pulses applied to $^{13}$CO pulse is 52 μs and the corresponding 180° pulses are applied with same power. A SEDUCE 180° pulse with a length 252 μs is used to decouple $^{13}$CO during $t_1$. The length of the spin-lock purge pulses $SL_x$ and $SL_y$ are 2.5 ms and 1 ms, respectively. WALTZ16 is employed to decouple $^1$H (r.f. field strength=9.2 kHz) during the heteronuclear magnetization transfers as well as to decouple $^{15}$N during acquisition (r.f.=1.78 kHz). The SEDUCE sequence is used for decoupling of $^{13}C^\alpha$ during the $^{15}$N chemical shift evolution period (r.f.=1.0 kHz). The $^1$H r.f. carrier is placed at 0 ppm before the start of the semi constant time $^1$H evolution period, and then switched to the water line at 4.78 ppm after the second 90° $^1$H pulse. The $^{13}C^\alpha$ and $^{15}$N r.f. carriers are set to 56.1 ppm and 120.9 ppm, respectively. The duration and strengths of the pulsed z-field gradients (PFGs) are: G1 (1 ms, 24 G/cm); G2 (100 μs, 16 G/cm); G3 (1 ms, 24 G/cm); G4 (250 μs, 30 G/cm); G5 (1.5 ms, 20 G/cm); G6 (1.25 ms, 30 G/cm); G7 (500 μs, 8 G/cm); G8 (125 μs, 29.5 G/cm). All PFG pulses are of rectangular shape. A recovery delay of at least 100 μs duration is inserted between a PFG pulse and an r.f. pulse. The delays are: $\tau_1$=1.6 ms, $\tau_2$=3.6 ms, $\tau_3$=4.4 ms, $\tau_4$=$\tau_5$=24.8 ms, $\tau_6$=5.5 ms, $\tau_7$=4.6 ms, $\tau_8$=1 ms. $^1$H-frequency labeling is achieved in a semi constant-time fashion with $t_1^a$ (0)=1.7 ms, $t_1^b$ (0)=1 μs, $t_1^c$ (0)=1.701 ms, $\Delta t_1^a$=60 μs, $\Delta t_1^b$=35.4 μs, $\Delta t_1^c$=-24.6 μs. Hence, the fractional increase of the semi constant-time period with $t_1$ equals to $\lambda=1+\Delta t_1^c/\Delta t_1^a$=0.58. Phase cycling: $\phi_1$ =x; $\phi_2$=x, x, -x, -x; $\phi_3$=x, -x; $\phi_4$=x; $\phi_5$=x, x, -x, -x; $\phi_6$=x; $\phi_7$(receiver)=x, -x, -x, x. The sensitivity enhancement scheme of Kay (Cavanagh et al., *Protein NMR Spectroscopy*, Academic Press, San Diego, (1996), which is hereby incorporated by reference in its entirety) is employed., i.e., the sign of G6 is inverted in concert with a 180° shift of $\Omega_6$. Quadrature detection in $t_1(^{13}C)$ and $t_2(^{15}N)$ is accomplished by altering the phases $\phi_2$ and $\phi_4$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}C$ steady state magnetization, a second data set with $\phi_1=-x$ is collected. The sum and the difference of the two resulting data sets generate subspectra II and I, respectively, containing the central peaks and peak pairs.
Figure 2C:
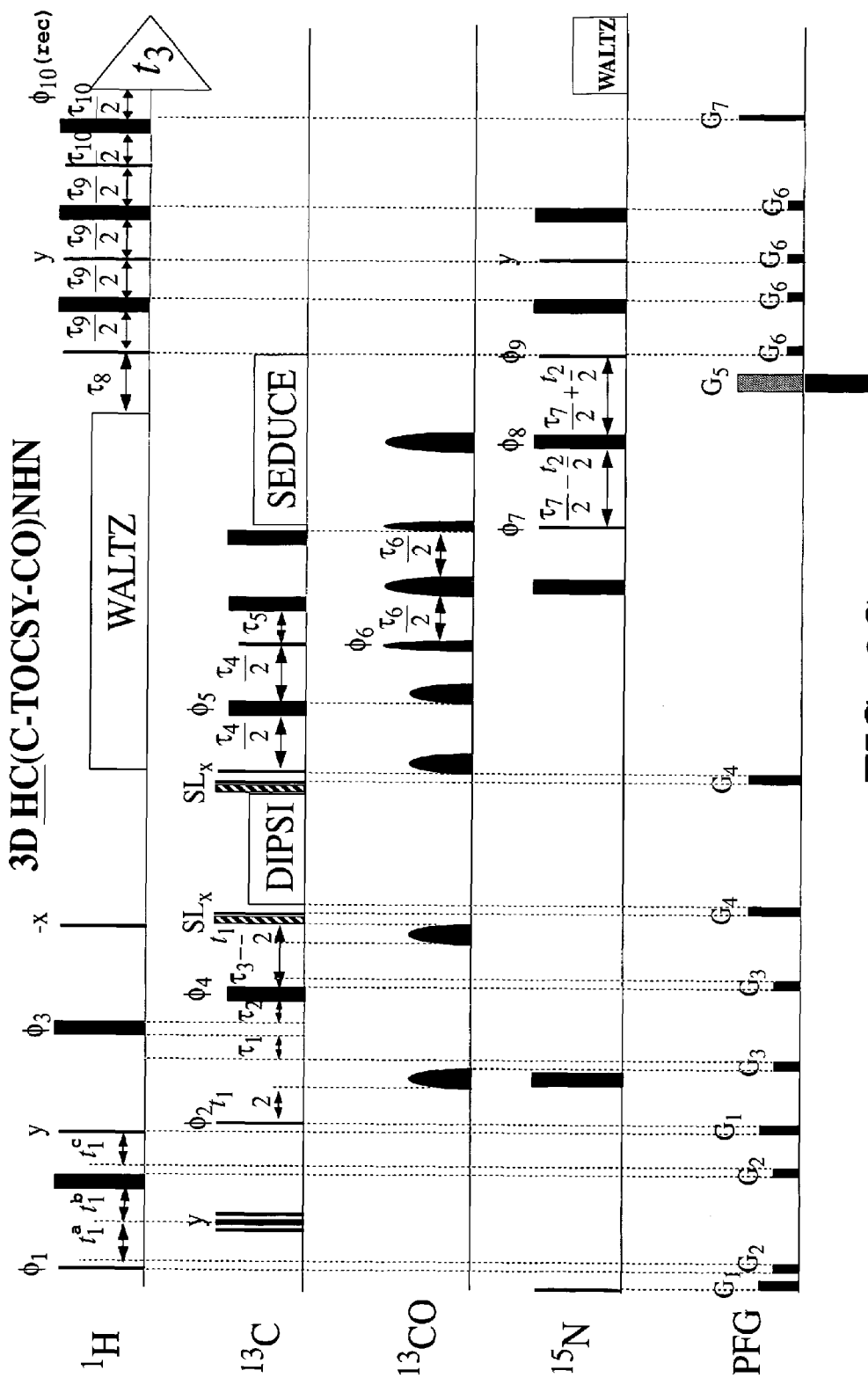
FIG. 2C illustrates the experimental scheme for the 3D HC(C-TOCSY—CO)NHN experiment. Rectangular 90° and 180° pulses are indicated by thin and thick vertical bars, respectively, and phases are indicated above the pulses. Where no radio-frequency (r.f.) phase is marked, the pulse is applied along x. The scaling factor κ for $^1H$ chemical shift evolution during $t_1$ is set to 1.0. The high power 90° pulse lengths were: 5.8 μs for $^1H$ and 15.5 μs for $^{13}C$, and 38 μs for $^{15}N$. Pulses on $^{13}C$ prior to $t_1(^{13}C)$ are applied at high power, and $^{13}C$ decoupling during $t_1(^1H)$ is achieved using a $(90_x\text{-}180_y\text{-}90_x)$ composite pulse. Subsequently, the 90° and 180° pulse lengths applied for $^{13}C$ are adjusted to 47.0 μs and 42.5 μs, respectively, to minimize perturbation of $^{13}CO$ spins. The width of the 90° pulses applied to $^{13}CO$ pulse is 52 μs and the corresponding 180μ pulses are applied with same power. A SEDUCE 180° pulse with a length 200 μs is used to decouple $^{13}CO$ during $t_1$ and $\tau_4$ period. WALTZ16 is employed to decouple $^1H$ (r.f. field strength=9.2 kHz) during the heteronuclear magnetization transfers as well as to decouple $^{15}N$ during acquisition (r.f.=1.78 kHz). The SEDUCE sequence is used for decoupling of $^{13}C^\alpha$ during the $^{15}N$ chemical shift evolution period (r.f.=1.0 kHz). The $^1H$ r.f. carrier is placed at 0 ppm before the start of the semi constant time $^1H$ evolution period, and then switched to the water line at 4.78 ppm after the second 90° $^1H$ pulse. The $^{13}C$ and $^{15}N$ r.f. carriers are set to 43 ppm and 120.9 ppm, respectively. The lengths of the $^{13}C$ spin-lock purge pulses, $SL_x$, are 2.5 ms and 1.25 ms, respectively, before and after the carbon—carbon total correlation spectroscopy (TOCSY) relay. $^{13}C$ isotropic mixing is accomplished using DIPSI-2 scheme with a r.f. field strength of 8.5 kHz. The duration and strengths of the pulsed z-field gradients (PFGs) are: G1 (2 ms, 30 G/cm); G2 (100 μs, 8 G/cm); G3 (200 μs, 4 G/cm); G4 (2 ms, 30 G/cm); G5(1.25 ms, 30 G/cm); G6 (500 μs, 5 G/cm); G7 (125 μs, 29.5 G/cm). All PFG pulses are of rectangular shape. A recovery delay of at least 100 μs duration is inserted between a PFG pulse and an r.f. pulse. The delays are: $\tau_1$=950 μs, $\tau_2$=3.1 ms, $\tau_3$=3.6 ms, $\tau_4$=7.2 ms, $\tau_5$=4.45 ms, $\tau_6$=24.8 ms, $\tau_7$=24.8 ms, $\tau_8$=5.5 ms, $\tau_9$=4.8 ms, $\tau_{10}$=1 ms. $^1H$-frequency labeling is achieved in a semi constant-time fashion with $t_1^a(0)$ =1.7 ms, $t_1^b(0)$=1 μs, $t_1^c(0)$=1.701 ms, $\Delta t_1^a$=33.3 μs, $\Delta t_1^b$=19.3 μs, $\Delta t_1^c$=−14 μs. Hence, the fractional increase of the semi constant-time period with $t_1$ equals to $\lambda=1+\Delta t_1^c/\Delta t_1^a$=0.58. Phase cycling: $\phi_1$=x; $\phi_2$=x, −x; $\phi_3$=x, x, −x, −x; $\phi_4$=x, −x; $\phi_5$=x, x, −x, −x; $\phi_6$=x, x, −x, −x; $\phi_7$=x; $\phi_8$=4x,4(−x); $\phi_9$=x; $\phi_{10}$(receiver)=x, −x, −x, x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of G5 is inverted in concert with a 180° shift of $\phi_9$. Quadrature detection in $t_1(^{13}C)$ and $t_2(^{15}N)$ is accomplished by altering the phases $\phi_2$ and $\phi_7$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}C$ steady state magnetization, a second data set with $\phi_1=-x$ is collected. The sum and the difference of the two resulting data sets generate subspectra II and I, respectively, containing the central peaks and peak pairs.
Figure 2D:
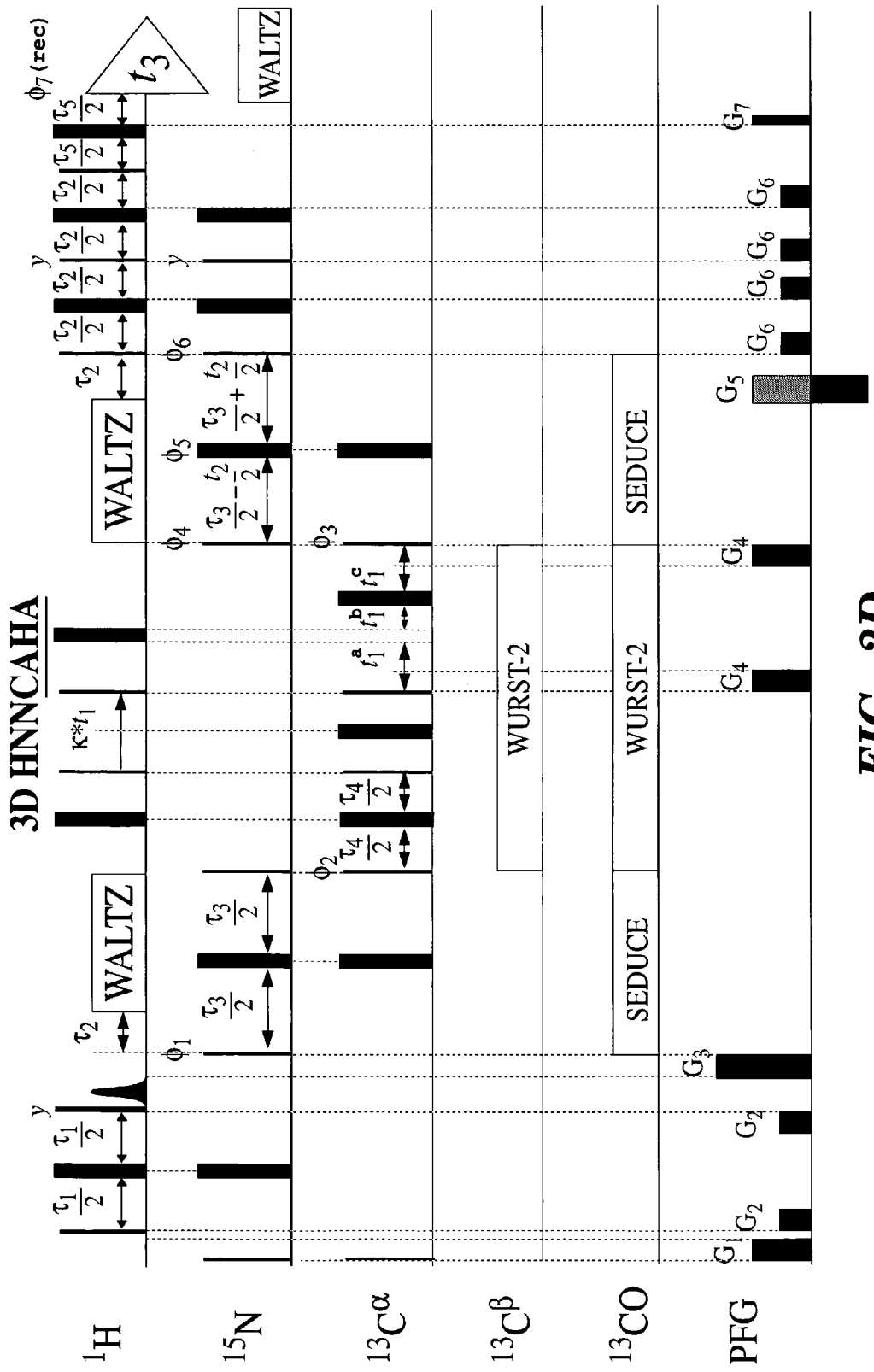
FIG. 2D illustrates the experimental scheme for the 3D HNNCAHA experiment. Rectangular 90° and 180° pulses are indicated by thin and thick vertical bars, respectively, and phases are indicated above the pulses. Where no radio-frequency (r.f.) phase is marked, the pulse is applied along x. The scaling factor κ for $^1H$ chemical shift evolution during $t_1$ is set to 1.0. The 90° pulse lengths were: 5.8 μs for $^1H$ and 21.6 μs for $^{13}C^\alpha$, and 38 μs for $^{15}N$, where the 90° pulse width for $^{13}C^\alpha$ is adjusted to generate a null of excitation in the center of the CO chemical shift range. The selective 90° $^1H$ pulse used to flip back the water magnetization is applied for the 1.8 ms with the SEDUCE-1 profile. WALTZ16 is employed to decouple $^1H$ (r.f. field strength=9.2 kHz) during the heteronuclear magnetization transfers as well as to decouple of $^{15}N$ (r.f. =1.78 kHz) during acquisition. SEDUCE is used for decoupling of $^{13}CO$ (max. r.f.=3.0 kHz). WURST-2 is used for simultaneous band selective decoupling of $^{13}CO$ and $^{13}C^\beta$ during $\tau_4$ and the $^1H$ and $^{13}C$ chemical shift evolution during $t_1$. 3.0 kHz sweeps at 176 ppm and 30 ppm, respectively, are used for decoupling of $^{13}CO$ and $^{13}C^\beta$ (except for Ser, Thr, Ala). A sweep of 600 Hz is used at 14 ppm to decouple $^{13}C^\beta$ of Ala. The $^1H$ r.f. carrier is placed at the position of the solvent line at 4.78 ppm for the first three $^1H$ pulses and the first WALTZ period, then switched to 0 ppm during the first delay $\tau_4/2$, and subsequently switched back to the water line at 4.78 ppm during $t_1^c$. The $^{13}C^\alpha$ and $^{15}N$ carriers are set to 56.1 ppm and 120.9 ppm, respectively. The duration and strengths of the pulsed z-field gradients (PFGs) are: G1 (500 μs, 8 G/cm); G2 (500 μs, 4 G/cm); G3 (1 ms, 30 G/cm); G4 (150 μs, 25 G/cm); G5 (1.25 ms, 30 G/cm); G6 (500 μs, 8 G/cm); G7 (125 μs, 29.57 G/cm). All PFG pulses are of rectangular shape. A recovery delay of at least 100 μs duration is inserted between a PFG pulse and an r.f. pulse. The delays have the following values: $\tau_1$=4.6 ms, $\tau_2$=5.5 ms, $\tau_3$=24 ms, $\tau_4$=2.0 ms, $\tau_5$=500 ms. $^{13}$C-frequency labeling is achieved in a semi constant-time fashion with $t_1^a(0)$=1.065 ms, $t_1^b(0)$=49 μs, $t_1^c(0)$=984 μs, $\Delta t_1^a$=65 μs, $\Delta t_1^b$=49 μs, $\Delta t_1^c$=−16 μs. Hence, the fractional increase of the semi constant-time period with $t_1$ equals to $\lambda=1+\Delta t_1^c/\Delta t_1^a$=0.76. Note that the acquisition starts with the second complex point in $t_1$, while the first one is obtained by linear prediction. This ensures that a zero first-order phase correction is achieved along $\omega_1$. Phase cycling: $\phi_1$=x, −x; $\phi_2$=x, x, −x, −x; $\phi_3$=x, −x, −x, x; $\phi_4$=x, $\phi_5$=4(x), 4(−x); $\phi_6$=x; $\phi_7$(receiver)=x, −x, −x, x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of G5 is inverted in concert with a 180° shift of $\phi_6$. Quadrature detection in $t_1(^{13}C)$ and $t_2(^{15}N)$ is accomplished by altering the phases $\phi_2$ and $\phi_4$ according to States-TPPI (Cavanagh et al., *Protein NMR Spectroscopy*, Academic Press, San Diego, (1996), which is hereby incorporated by reference in its entirety).
Figure 2E:
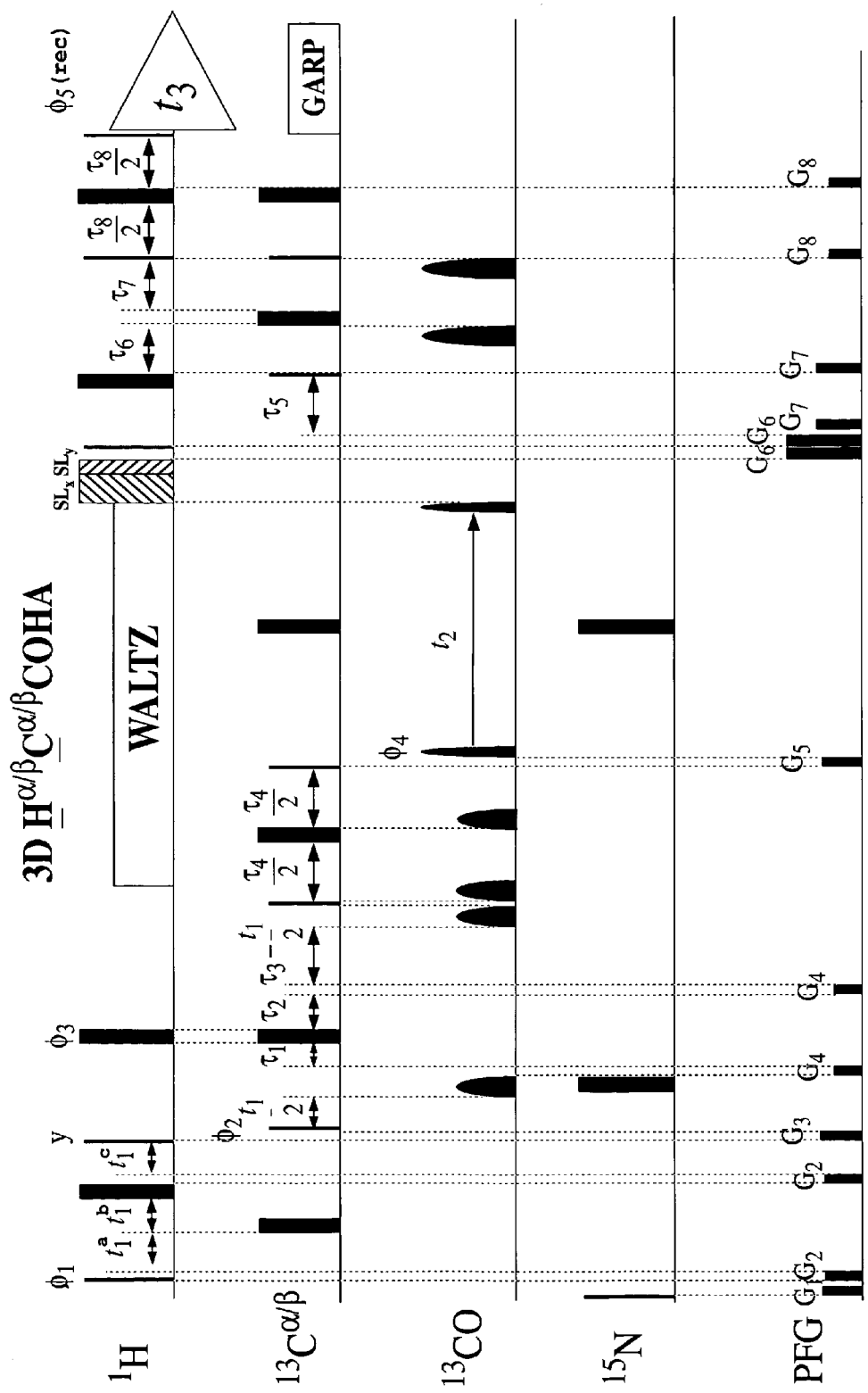
FIG. 2E illustrates the experimental scheme for the 3D $H^{\alpha/\beta}C^{\alpha/\beta}$COHA experiment. Rectangular 90° and 180° pulses are indicated by thin and thick vertical bars, respectively, and phases are indicated above the pulses. Where no radio-frequency (r.f.) phase is marked, the pulse is applied along x. The scaling factor κ for the $^1H$ chemical shift evolution during $t_1$ is set to 1.0. The high power 90° pulse lengths were: 5.9 μs for $^1H$, 15.4 μs for $^{13}C$, and 38.2 μs for $^{15}N$. The 90° and 180° pulse lengths of $^{13}C^{\alpha/\beta}$ were adjusted to 47.4 μs and 42.4 μs, respectively, to minimize perturbation of $^{13}CO$ spins. A 200 μs 180° pulse with SEDUCE profile is used to selectively invert $^{13}CO$ magnetization prior to the start of $t_1$. The 90° and 180° pulses employed for excitation of $^{13}CO$ and subsequent magnetization transfer back to $^{13}C^\alpha$ are of rectangular shape and 52 μs and 103 μs duration, respectively. The length of the spin-lock purge pulses $SL_x$ and $SL_y$ are 2.5 ms and 1 ms, respectively. WALTZ16 is employed to decouple $^1H$ (r.f. field strength=9.2 kHz) during the heteronuclear magnetization transfers, and for decoupling of $^{15}N$ (r.f.=1.78 kHz) during acquisition. GARP is used for decoupling of $^{13}C^\alpha$ (r.f.=2.5 kHz). The $^1H$ r.f. carrier is placed at the position of the solvent line at 0 ppm before the start of the first semi constant time $^1H$ evolution period and then switched to the water line at 4.78 ppm after the second 90° $^1H$ pulse. Initially, the $^{13}C$ and $^{15}N$ r.f. carriers are set to 43 ppm and 120.9 ppm, respectively. The duration and strengths of the pulsed z-field gradients (PFGs) are: G1=G2 (100 μs, 15 G/cm); G3 (2 ms, 25 G/cm); G4 (100 μs, 10 G/cm); G5 (1 ms, 27 G/cm); G6 (3 ms, 30 G/cm); G7 (1.3 ms, 20 G/cm); G8 (130 μs, 14 G/cm). All PFG pulses are of rectangular shape. A recovery delay of at least 100 μs duration is inserted between a PFG pulse and an r.f. pulse. The delays are: $\tau_1$=800 μs, $\tau_2$=2.8 ms, $\tau_3$=3.6 ms, $\tau_4$=6.5 ms, $\tau_5$=1.8 ms, $\tau_6$=1 ms, $\tau_7$=2.8 ms, $\tau_8$=3.6 ms. $^1H$-frequency labeling is achieved in a semi constant-time fashion with $t_1^a$ (0)=1.7 ms, $t_1^b$ (0)=1 μs, $t_1^c$ (0)=1.701 ms, $\Delta t_1^a$=33.3 μs, $\Delta t_1^b$=19.3 μs, $\Delta t_1^c$=−14 μs. Hence, the fractional increase of the semi constant-time period with $t_1$ equals to $\lambda=1+\Delta t_1^c/\Delta t_1^a$=0.58. Phase cycling: $\phi_1$=x; $\phi_x$=x, −x; $\phi_3$=x, −x, x, −x; $\phi_4$=x; $\phi_5$(receiver)=x, −x. Quadrature detection in $t_1(^{13}C)$ and $t_2(^{15}N)$ is accomplished by altering the phases $\phi_2$ and $\phi_4$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}C$ steady state magnetization, a second data set with $\phi_1$=−x is collected. The sum and the difference of the two resulting data sets generate subspectra II and I, respectively, containing the central peaks and peak pairs (Szyperski et al., *J. Am. Chem. Soc.*, 118:8146–8147 (1996), which is hereby incorporated by reference in its entirety).
Figure 2F:
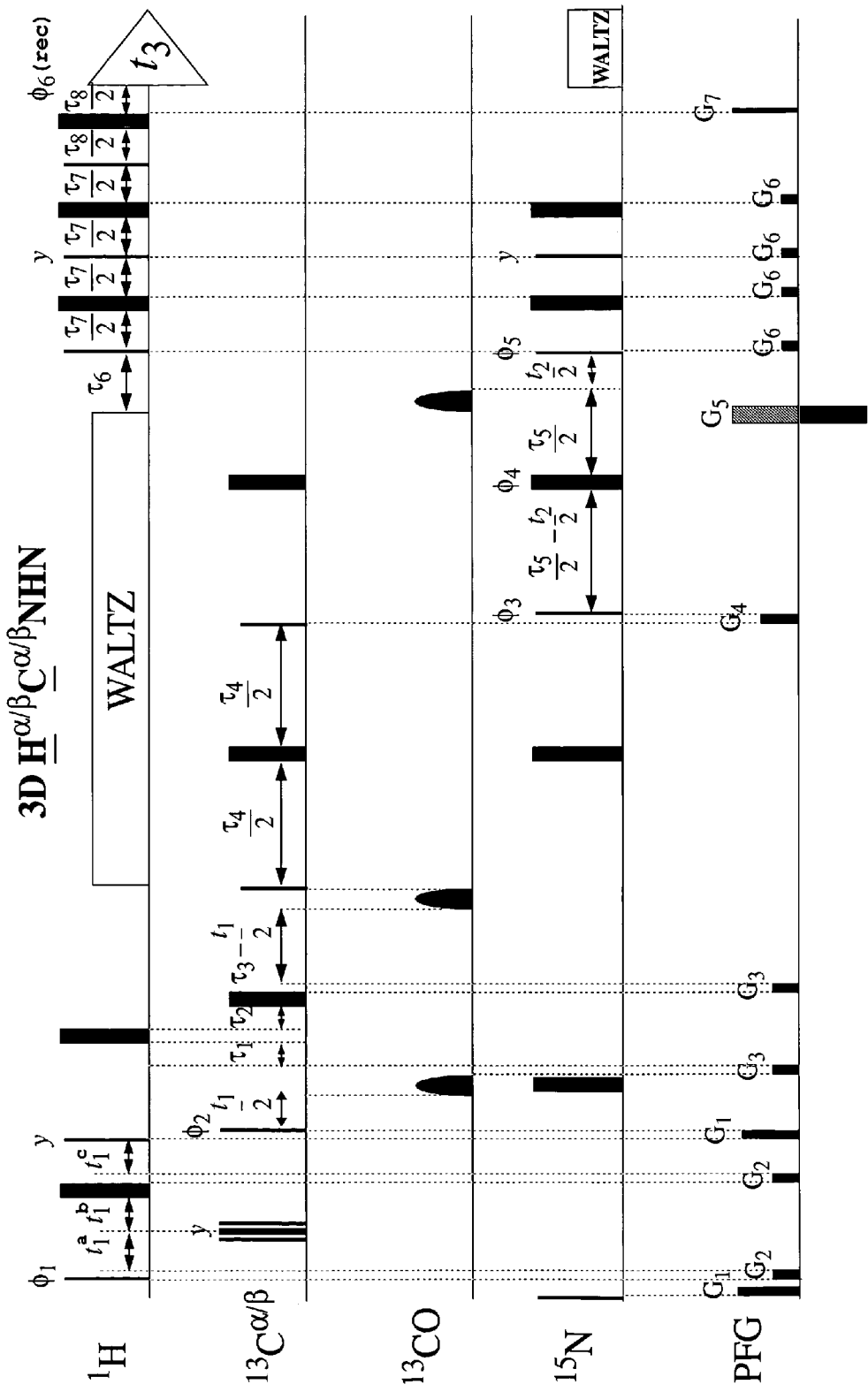
FIG. 2F illustrates the experimental scheme for the 3D $H^{\alpha/\beta}C^{\alpha/\beta}NHN$ experiment. Rectangular 90° and 180° pulses are indicated by thin and thick vertical bars, respectively, and phases are indicated above the pulses. Where no radio-frequency (r.f.) phase is marked, the pulse is applied along x. The scaling factor κ for the $^1H$ chemical shift evolution during $t_1$ is set to 1.0. The high power 90° pulse lengths were: 5.9 μs for $^1H$ and 15.4 μs for $^{13}C$, and 38 μs for $^{15}N$. Pulses on $^{13}C$ prior to $t_1(^{13}C)$ are applied at high power, and $^{13}C$ decoupling during $t_1(^1H)$ is achieved using a (90$_x$-180$_y$-90$_x$) composite pulse. Subsequently, the 90° and 180° pulse lengths of $^{13}C^{\alpha/\beta}$ are adjusted to 49 μs and 43.8 μs to minimize perturbation of $^{13}CO$ spins. SEDUCE 180° pulses of 200 μs pulse length are used to decouple $^{13}CO$. WALTZ16 is employed to decouple $^1H$ (r.f. field strength=9.2 kHz) during the heteronuclear magnetization transfers, as well as to decouple $^{15}N$ (r.f.=1.78 kHz). The $^1H$ carrier is placed at the position of the solvent line at 0 ppm during the first semi constant time $^1H$ evolution period, and then switched to the water line 4.78 ppm after the second 90° $^1H$ pulse. The $^{13}C$ and $^{15}N$ r.f. carriers are set to 43 ppm and 120.9 ppm, respectively. The duration and strengths of the pulsed z-field gradients (PFGs) are: G1 (1 ms, 24 G/cm); G2 (500 μs, 8 G/cm); G3 (250 μs, 15 G/cm); G4 (1 ms, 11 G/cm); G5 (500 μs, 20 G/cm); G6 (500 μs, 4 G/cm); G7 (125 μs, 29.5 G/cm). All PFG pulses are of rectangular shape. The delays are: $\tau_1$=800 μs, $\tau_2$=2.8 ms, $\tau_3$=3.3 ms, $\tau_4$=7.2 ms, $\tau_5$=24 ms, $\tau_6$=5.4 ms, $\tau_7$=4.8 ms, $\tau_8$=1 ms. $^1H$-frequency labeling is achieved in a semi constant-time fashion with $t_1^a$ (0)=1.7 ms, $t_1^b$ (0)=1 μs, $t_1^c$ (0)=1.701 ms, $\Delta t_1^a$=33.3 μs, $\Delta t_1^b$=19.3 μs, $\Delta t_1^c$=−14 μs. Hence, the fractional increase of the semi constant-time period with $t_1$ equals to $\lambda=1+\Delta t_1^c/\Delta t_1^a$=0.58. Phase cycling: $\phi_1$=x; $\phi_2$=x; $\phi_3$=x,−x; $\phi_4$=x, x, −x, −x; $\phi_5$=x; $\phi_6$(receiver)=x, −x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of G5 is inverted in concert with a 180° shift of $\phi_5$. Quadrature detection in $t_1(^{13}C)$ and $t_2(^{15}N)$ is accomplished by altering the phases $\phi_2$ and $\phi_3$, respectively, according to States-TPPI. For acquisition of central peaks derived from $^{13}C$ steady state magnetization, a second data set with $\phi_1$=−x is collected. The sum and the difference of the two resulting data sets generate subspectra II and I, respectively, containing the central peaks and peak pairs.
Figure 2G:
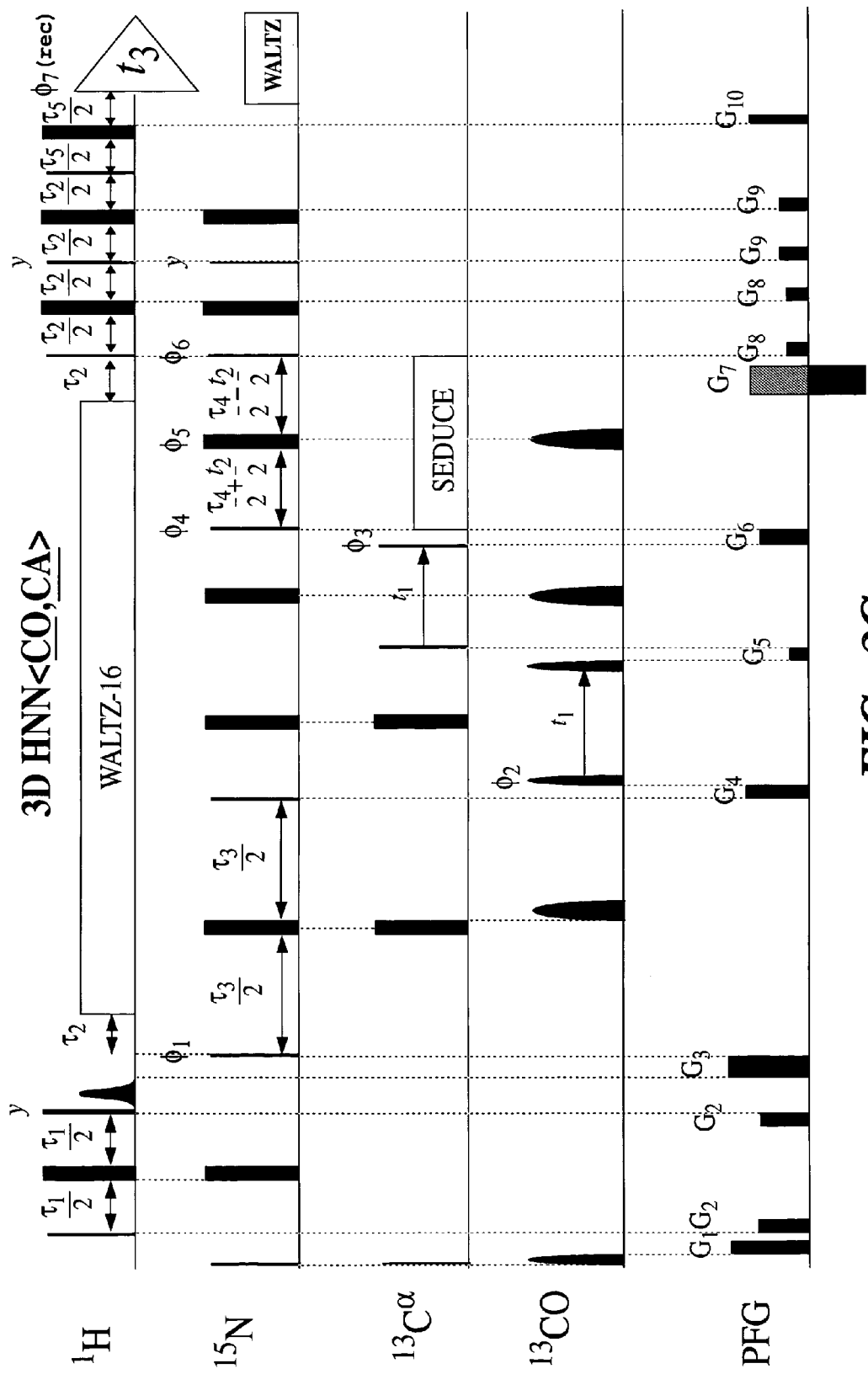
FIG. 2G illustrates the experimental scheme for the 3D HNN<CO,CA> experiment. Rectangular 90° and 180° pulses are indicated by thin and thick vertical bars, respectively, and phases are indicated above the pulses. Where no radio-frequency (r.f.) phase is marked, the pulse is applied along x. The scaling factor κ for $^{13}C^\alpha$ chemical shift evolution during $t_2$ is set to 0.5. The high power 90° pulse lengths were: 5.8 μs for $^1H$ and 38.5 μs for $^{15}N$. The 90° and 180° pulse lengths of $^{13}C^\alpha$ were adjusted 54 μs and 48.8 μs to minimize perturbation of $^{13}CO$ spins. The length of the 90° pulses applied on $^{13}CO$ are 102 μs, and they possess the shape of a sinc center lobe. The corresponding 180° pulses are applied with same power and shape. The selective $^1H$ 90° pulse used for flip-back of water magnetization is applied for 1.8 ms with the SEDUCE-1 profile. WALTZ16 is employed to decouple $^1H$ (r.f. field strength =9.2 kHz) during the heteronuclear magnetization transfers as well as to decouple $^{15}N$ during acquisition (r.f.=1.78 kHz). The SEDUCE sequence is used for decoupling of $^{13}C^\alpha$ during $^{15}N$ evolution period (r.f.=0.9 kHz). The $^{13}C^\alpha$ and $^{15}N$ r.f. carriers are set to 176.5 ppm and 120.9 ppm, respectively. The duration and strengths of the pulsed z-field gradients (PFGs) are: G1 (500 μs, 30 G/cm); G2 (500 μs, 5 G/cm); G3 (2 ms, 13 G/cm); G4 (750 μs, 20 G/cm); G5 (200 μs, 5 G/cm); G6 (100 μs, 12 G/cm); G7 (1.25 ms, 30 G/cm); G8 (300 μs, 5 G/cm); G9 (200 μs, 10 G/cm); G10 (125 μs, 29.5 G/cm). All PFG pulses are of rectangular shape. A recovery delay of at least 100 μs duration is inserted between a PFG pulse and an r.f. pulse. The delays are: $\tau_1$=4.6 ms, $\tau_2$=5.5 ms, $\tau_3$=$\tau_4$=28 ms, $\tau_5$=1 ms. Phase cycling: $\phi_1$=x, x, −x, −x; $\phi_2$=x, −x; $\phi_3$=x; $\phi_4$=x; $\phi_5$=4(x), 4(−x); $\phi_6$=x; $\phi_7$(receiver)=x, −x, −x, x. The sensitivity enhancement scheme of Kay (Cavanagh et al., *Protein NMR Spectroscopy*, Academic Press, San Diego, (1996), which is hereby incorporated by reference in its entirety) is employed, i.e., the sign of G5 is inverted in concert with a 180° shift of $\phi_6$. Quadrature detection in $t_1(^{13}C)$ and $t_2(^{15}N)$ is accomplished by altering the phases $\phi_2$ and $\phi_4$, respectively, according to States-TPPI (Cavanagh et al., *Protein NMR Spectroscopy*, Academic Press, San Diego, (1996), which is hereby incorporated by reference in its entirety). To shift the apparent $^{13}C^\alpha$ carrier position to 82.65 ppm, i.e., downfield to all $^{13}C^\alpha$ resonances, $\phi_3$ is incremented in 60° steps according to TPPI. Note, that the acquisition was started with the ninth complex point and the first eight complex points along $\omega_1(^{13}CO)$ were obtained by linear prediction. This ensures that a zero first-order phase correction is achieved along $\omega_1$ (Szyperski et al., *J. Magn. Reson.*, B 108: 197–203 (1995), which is hereby incorporated by reference in its entirety).
Figure 2H:
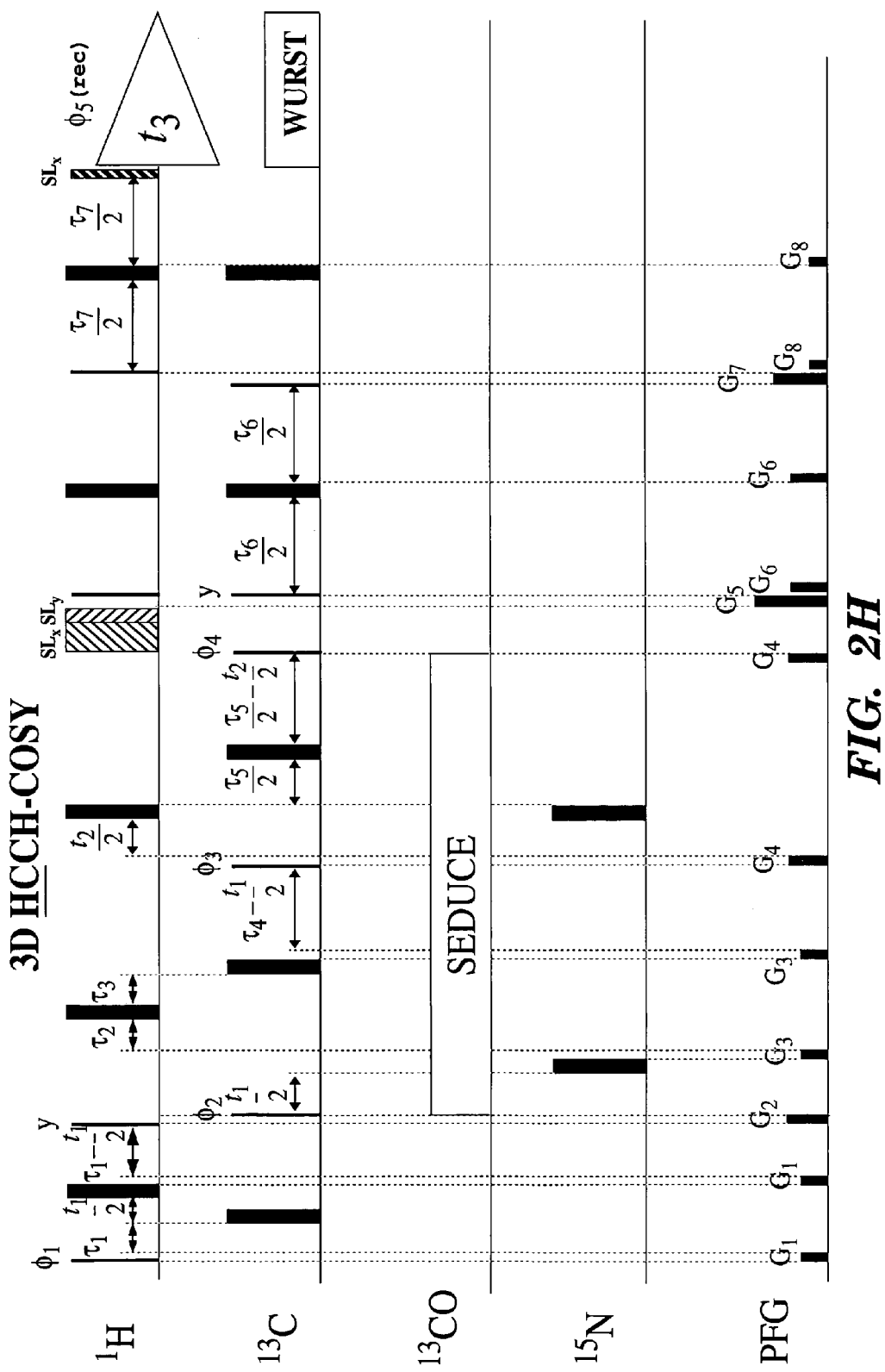
FIG. 2H illustrates the experimental scheme for the 3D HCCH—COSY experiment. Rectangular 90° and 180° pulses are indicated by thin and thick vertical bars, respectively, and phases are indicated above the pulses. Where no radio-frequency (r.f.) phase is marked, the pulse is applied along x. The scaling factor κ for $^1H$ chemical shift evolution during $t_1$ is set to 1.0. The high power 90° pulse lengths were: 5.8 μs for $^1H$ and 15.4 μs for $^{13}C$, and 38 μs for $^{15}N$. The lengths of the $^1H$ spin-lock purge pulses are: first $SL_x$, 2.8 ms; second $SL_x$, 1.7 ms; $SL_y$: 4.9 ms. SEDUCE is used for decoupling of $^{13}CO$ during $t_1$ and $t_2$ (r.f. field strength=1 kHz). WURST is used for decoupling of $^{13}C$ during acquisition. The $^1H$ carrier is placed at the position of the solvent line at 0 ppm before the start of the first semi constant time $^1H$ evolution period, and then switched to the water line at 4.78 ppm after the second 90° $^1H$ pulse. The $^{13}C$ and $^{15}N$ r.f. carriers are set to 38 ppm and 120.9 ppm, respectively. The duration and strengths of the pulsed z-field gradients (PFGs) are: G1 (500 μs, 6 G/cm); G2 (500 μs, 7 G/cm); G3 (100 μs, 12 G/cm); G4 (100 μs, 12.5 G/cm); G5 (2 ms, 9 G/cm); G6 (500 μs, 5 G/cm); G7 (1.5 ms, 8 G/cm); G8 (400 μs, 6 G/cm). All gradients are applied along z-axis and are of rectangular shape. All PFG pulses are of rectangular shape. A recovery delay of at least 100 μs duration is inserted between a PFG pulse and an r.f. pulse. The delays are: $\tau_1$=1.6 ms, $\tau_2$=850 μs, $\tau_3$=2.65 ms, $\tau_4$=3.5 ms, $\tau_5$=7 ms, $\tau_6$=1.6 ms, $\tau_7$=3.2 ms. Phase cycling: $\phi_1$=x; $\phi_2$=x, −x; $\phi_3$=x, −x; $\phi_4$=x; $\phi_5$(receiver)=x, −x. Quadrature detection in $t_1(^{13}C)$ and $t_2(^{13}C)$ is accomplished by altering the phases $\phi_2$ and $\phi_3$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}C$ steady state magnetization, a second data set with $\phi_1$=−x is collected. The sum and the difference of the two resulting data sets generate subspectra II and I, respectively, containing the central peaks and peak pairs.
Figure 2I:
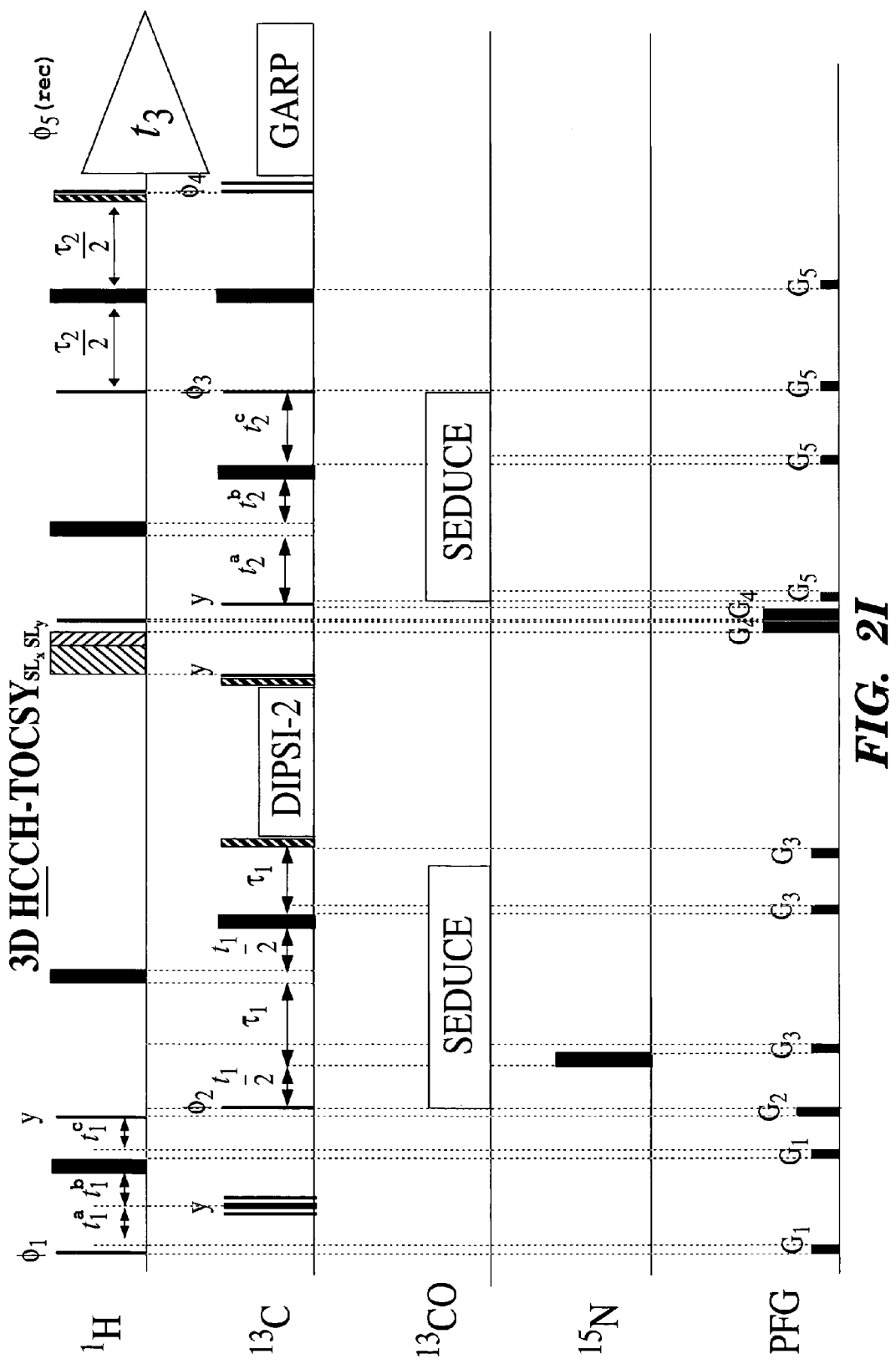
FIG. 2I illustrates the experimental scheme for the 3D HCCH-TOCSY experiment. Rectangular 90° and 180° pulses are indicated by thin and thick vertical bars, respectively, and phases are indicated above the pulses. Where no radio-frequency (r.f.) phase is marked, the pulse is applied along x. The scaling factor κ for $^1H$ chemical shift evolution during $t_1$ is set to 1.0. The high power 90° pulse lengths were: 5.8 μs for $^1H$ and 15.4 μs for $^{13}C$, and 38 μs for $^{15}N$. $^{13}C$ decoupling during $t_1(^1H)$ is achieved using a ($90_x$-$180_y$-$90_x$) composite pulse. The lengths of the $^1H$ spin-lock purge pulses are: first $SL_x$, 5.7 ms; second $SL_x$, 0.9 ms; $SL_y$, 4.3 ms. SEDUCE is used for decoupling of $^{13}CO$ during $t_1$ and $t_2$ (r.f. field strength=1 kHz), and GARP is employed for decoupling of $^{13}C$ during acquisition (r.f.=2.5 kHz). The $^1H$ r.f. carrier is placed at the position of the solvent line at 0 ppm before the start of the first semi constant time $^1H$ evolution period, and then switched to the water line at 4.78 ppm after the second 90° $^1H$ pulse. The $^{13}C^\alpha$ and $^{15}N$ r.f. carriers are set to 38 ppm and 120.9 ppm, respectively. The length of $^{13}C$ spin-lock purge pulses denoted $SL_x$ are of 2 ms duration. $^{13}C$ isotropic mixing is accomplished using the DIPSI-2 scheme (r.f.=8.5 kHz). The duration and strengths of the pulsed z-field gradients (PFGs) are: G1 (100 μs, 16 G/cm); G2 (2 ms, 15 G/cm); G3 (300 μs, 8 G/cm); G4 (500 μs, 30 G/cm); G5 (100 μs, 16 G/cm). All PFG pulses are of rectangular shape. A recovery delay of at least 100 μs duration is inserted between a PFG pulse and an r.f. pulse. The delays are: $\tau_1$=850 μs, $\tau_2$=3.2 ms. $^1H$-frequency labeling in $t_1$ is achieved in a semi constant-time fashion with $t_1^a$ (0)=1.7 ms, $t_1^b$ (0)=1 μs, $t_1^c$ (0) =1.701 ms, $\Delta t_1^a$=33.3 μs, $\Delta t_1^b$=19.3 μs, $\Delta t_1^c$=−14 μs. $^{13}C$-frequency labeling in $t_2$ is achieved in a semi constant-time fashion with $t_2^a$ (0)=1120 μs, $t_2^b$ (0)=62.5 μs, $t_2^c$ (0)=995 μs, $\Delta t_2^a$=160 μs, $\Delta t_2^b$=125 μs, $\Delta t_2^c$=−35 μs. These delays ensure that a 90° first-order phase correction is obtained along $\omega_2(^{13}C)$. The fractional increases of the semi constant-time period in $t_1$ equals to $\lambda=1+\Delta t_2^c/\Delta t_2^a$=0.58, and in $t_2$ equals to $\lambda=1+\Delta t_2^c/\Delta t_2^a$=0.78. Phase cycling: $\phi_1$=x; $\phi_2$=x, −x; $\phi_3$=x; $\phi_4$=2(x), 2(−x); $\phi_5$(receiver)=x,−x. Quadrature detection in $t_1(^{13}C)$ and $t_2(^{13}C)$ is accomplished by altering the phases $\phi_2$ and $\phi_3$, respectively, according to States-TPPI (Cavanagh et al., *Protein NMR Spectroscopy*, Academic Press, San Diego, (1996), which is hereby incorporated by reference in its entirety). For acquisition of central peaks derived from $^{13}C$ steady state magnetization, a second data set with $\phi_1$=−x is collected. The sum and the difference of the two resulting data sets generate subspectra II and I, respectively, containing the central peaks and peak pairs.
Figure 2J:
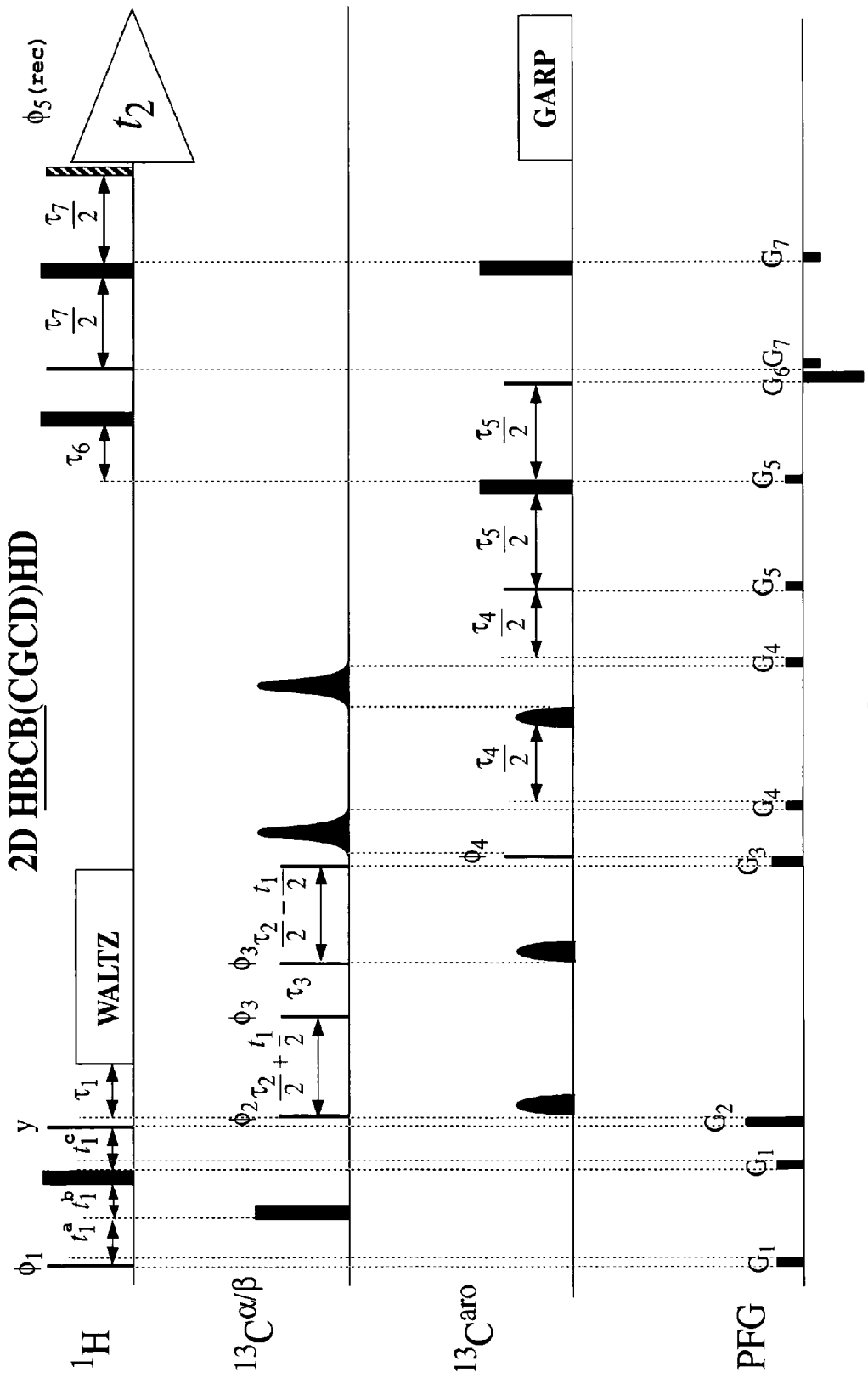
FIG. 2J illustrates the experimental scheme for the 2D HBCB(CGCD)HD experiment. Rectangular 90° and 180° pulses are indicated by thin and thick vertical bars, respectively, and phases are indicated above the pulses. Where no radio-frequency (r.f.) phase is marked, the pulse is applied along x. The scaling factor κ for $^1H$ chemical shift evolution during $t_1$ is set to 1.0. The high power 90° pulse lengths were: 5.8 μs for $^1H$ and 15.4 μs for $^{13}C$. The first 180° pulse on $^{13}C$ prior to $t_1(^{13}C)$ is applied at high power. Subsequently, the 90° pulse lengths of $^{13}C^\beta$ is adjusted to 66 μs. The 180° $^{13}C^\beta$ and $^{13}C^{aro}$ pulses are of gaussian-3 shape and 375 μs duration. WALTZ16 is used for decoupling of $^1H$ (r.f. field strength=4.5 kHz) during the magnetization transfer from $^{13}C^\alpha$ to $^{13}C^{aro}$, and GARP is employed to decouple $^{13}C^{aro}$ (r.f.=2.5 kHz) during acquisition. The $^1H$ r.f. carrier is placed at 0 ppm before the start of the semi constant time $^1H$ evolution period, and then switched to the water line at 4.78 ppm after the second 90° $^1H$ pulse. The $^{13}C$ r.f. carrier is set to 38 ppm during $\omega_1(^{13}C^\beta)$ and then switched to 131 ppm before the first 90° pulse on $^{13}C^{aro}$ (pulse labeled with $\phi_4$). The duration and strengths of the pulsed z-field gradients (PFGs) are: G1 (500 μs, 2 G/cm); G2 (1 ms, 22 G/cm); G3 (2 ms, 10 G/cm); G4 (1 ms, 5 G/cm); G5 (500 μs, 4 G/cm); G6 (1 ms, −14 G/cm); G7 (500 μs, −2 G/cm). All PFG pulses are of rectangular shape. A recovery delay of at least 100 μs duration is inserted between a PFG pulse and an r.f. pulse. The delays are: $\tau_1$=1.8 ms, $\tau_2$=8.8 ms, $\tau_3$=71 μs, $\tau_4$=5.4 ms, $\tau_5$=4.2 ms, $\tau_6$=710 μs, $\tau_7$=2.5 ms. $^1H$-frequency labeling is achieved in a semi constant-time fashion with $t_1^a$ (0)=1.7 ms, $t_1^b$ (0)=1 μs, $t_1^c$ (0)=1.701 ms, $\Delta t_1^a$=33.3 μs, $\Delta t_1^b$=19.3 μs, $\Delta t_1^c$=−14 μs. Hence, the fractional increase of the semi constant-time period with $t_1$ equals to $\lambda=1+\Delta t_1^c/\Delta t_1^a$=0.58. Phase cycling: $\phi_1$=x; $\phi_2$=x; $\phi_3$=x, y, −x, −y; $\phi_4$=4(x), 4(−x); $\phi_5$(receiver)=x, −x, x, −x, −x, x, −x, x. Quadrature detection in $t_1(^{13}C)$ is accomplished by altering the phases $\phi_2$ respectively, according to States-TPPI. For acquisition of central peaks derived from $^{13}C$ steady state magnetization, a second data set with $\phi_1$=−x is collected. The sum and the difference of the two resulting data sets generate subspectra II and I, respectively, containing the central peaks and peak pairs.
Figure 2K:
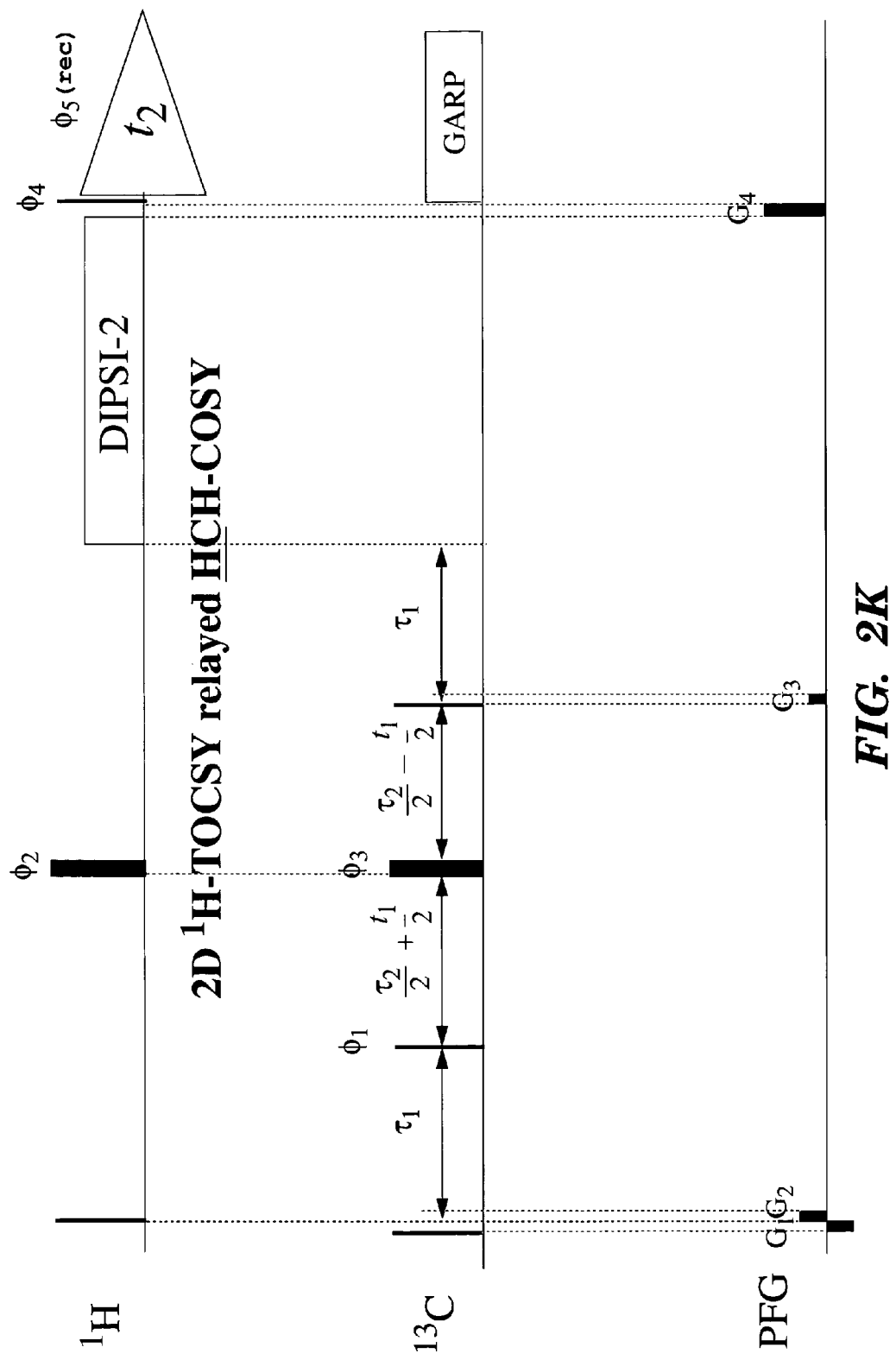
FIG. 2K illustrates the experimental scheme for the 2D $^1H$-TOCSY-relayed-HCH—COSY experiment. Rectangular 90° and 180° pulses are indicated by thin and thick vertical bars, respectively, and phases are indicated above the pulses. Where no radio-frequency (r.f.) phase is marked, the pulse is applied along x. The high-power 90° pulse lengths were: 5.9 μs for $^1H$ and 15.4 μs for $^{13}C$. The $^1H$ r.f. carrier is placed at the position of the solvent line at 4.78 ppm, and the $^{13}C$ carrier is set to 131 ppm. GARP is used for $^{13}$C decoupling during acquisition (r.f. field strength=2.5 kHz), and $^1$H isotropic mixing is accomplished using the DIPSI-2 scheme (r.f.=16 kHz). The duration and strengths of the pulsed z-field gradients (PFGs) are: G1 (1 ms, –10 G/cm); G2 (500 μs, 6 G/cm); G3 (500 μs, 7.5 G/cm); G4 (1 ms, 22 G/cm). All PFG pulses are of rectangular shape. A recovery delay of at least 100 μs duration is inserted between a PFG pulse and an r.f. pulse. The delays are: $\tau_1$=3.0 ms, $\tau_2$=15.38 ms. Phase cycling: $\phi_1$=x, –x; $\phi_2$=x, x, y, y, –x, –x, –y, –y; $\phi_3$=4(x), 4(y), 4(–x), 4(–y); $\phi_4$=x, x, –x, –x; $\phi_5$(receiver)=x, –x, x, –x, –x, x, –x, x. Quadrature detection in $t_1$($^{13}$C) is accomplished by altering the phase $\phi_1$ according to States-TPPI.

One specific embodiment (2D $^1$H-TOCSY—HCH—COSY) of this method is illustrated in FIG. 1K, where the applying radiofrequency pulses effects a nuclear spin polarization transfer where a radiofrequency pulse is used to create transverse $^1H^m$ magnetization, and $^1H^m$ polarization is transferred to $^{13}C^m$, to $^1H^m$, and to $^1H^n$, where the NMR signal is detected. Although the specific embodiment illustrated in FIG. 1K shows this method applied to an amino acid residue with an aromatic side chain, this method also applies to amino acid residues with aliphatic side chains. Another specific embodiment of this method involves applying radiofrequency pulses according to the scheme shown in FIG. 2K.

Figure 3:
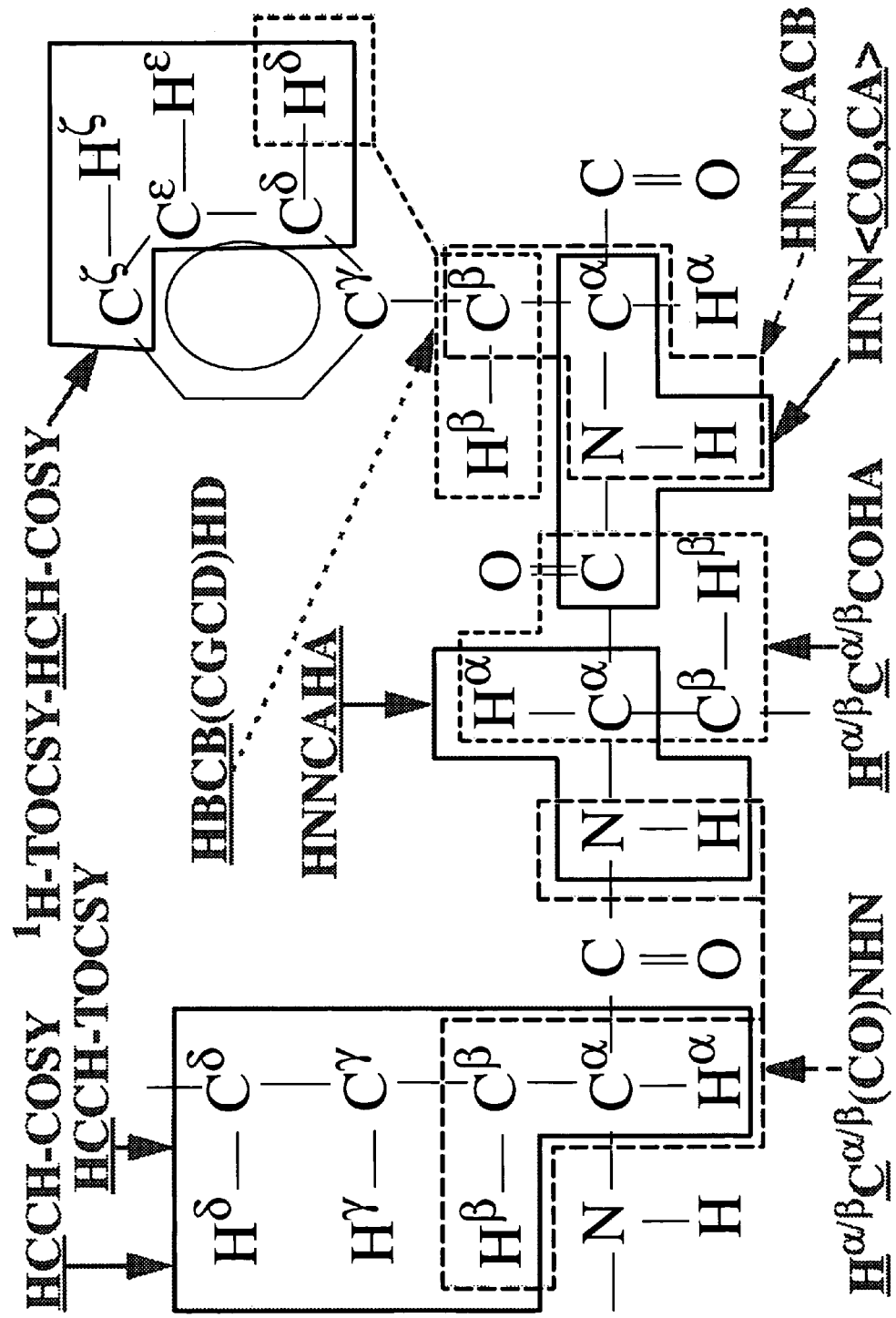
FIG. 3 illustrates the polypeptide chemical shifts correlated by the various spectra constituting the "standard set" of TR NMR experiments identified for efficient HTP resonance assignment of proteins. The nuclei for which the chemical shifts are obtained from a given experiment are boxed and labeled accordingly.
Figure 4A:
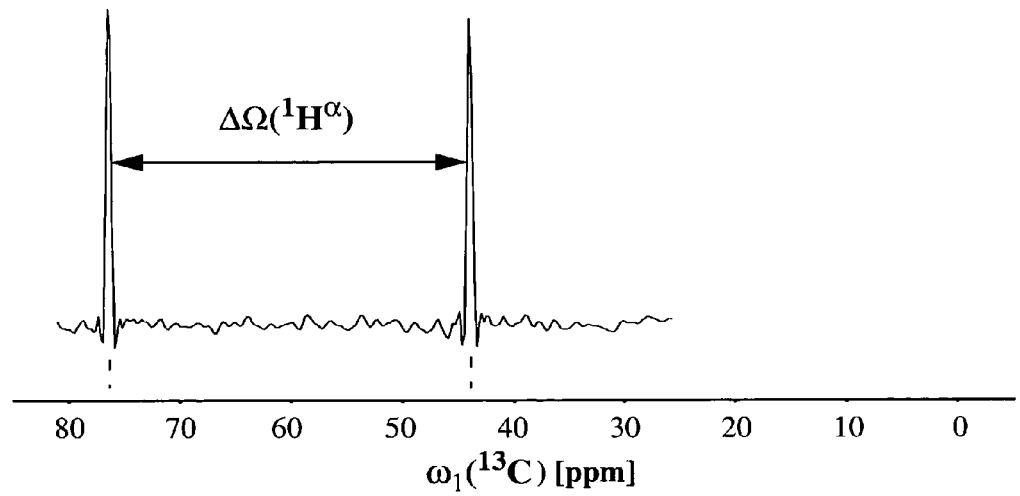
FIGS. 4A–F illustrate the sequential connectivities in RD NMR spectra.
Figure 4B:
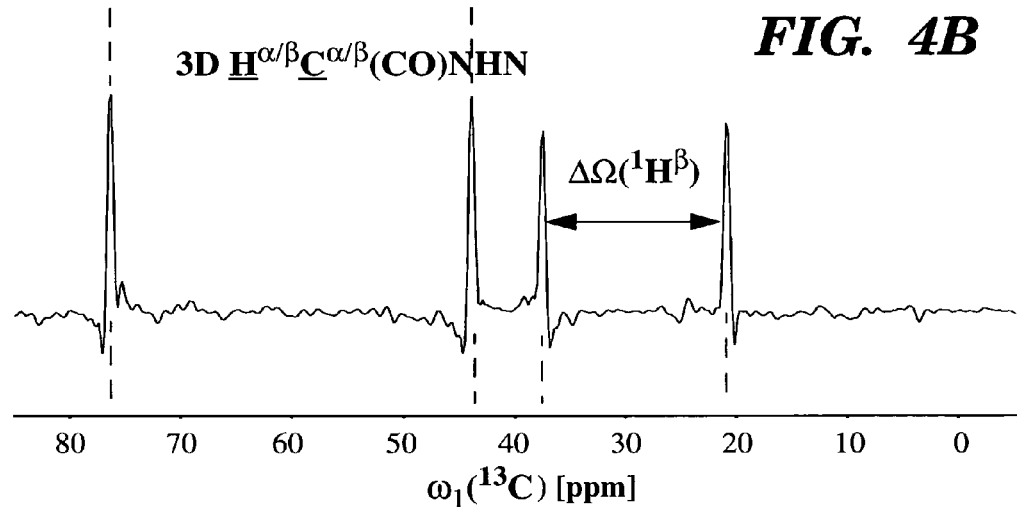
Figure 4C:
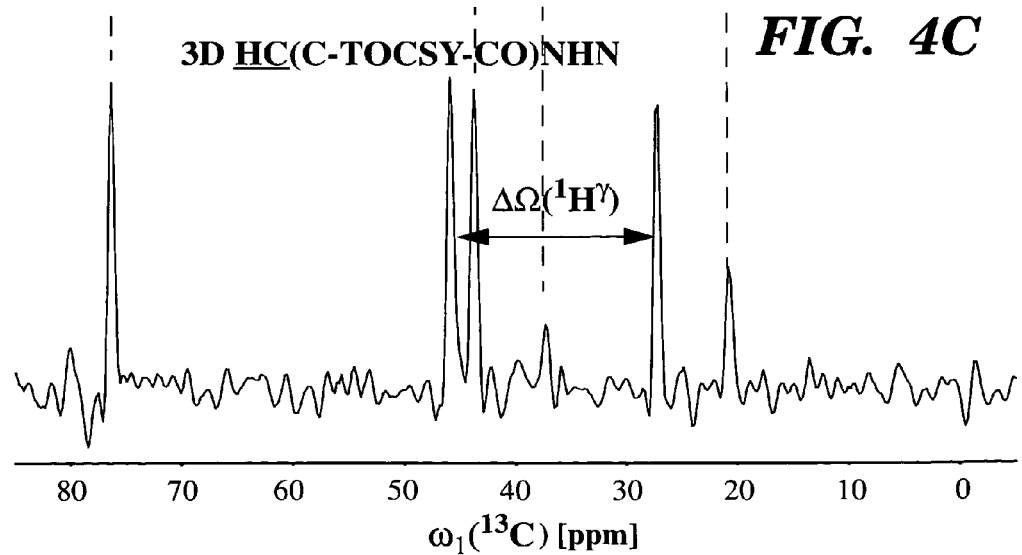
Figure 4D:
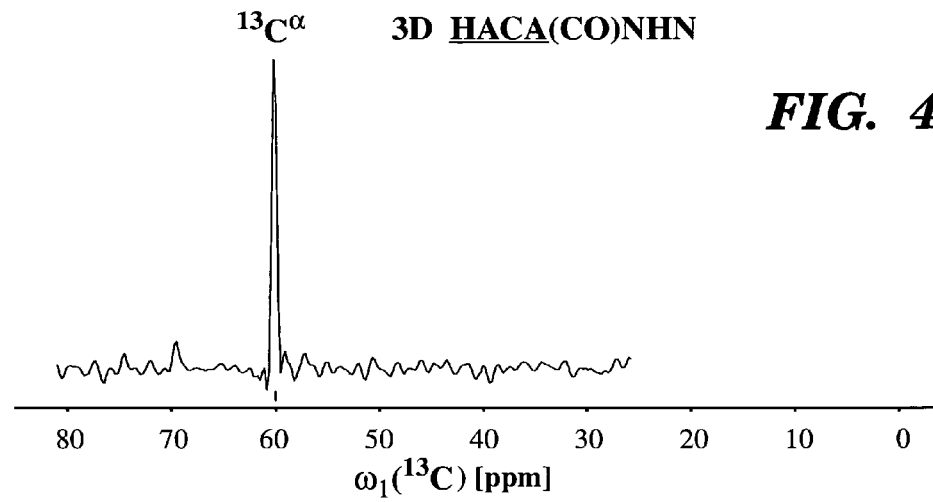
Figure 4E:
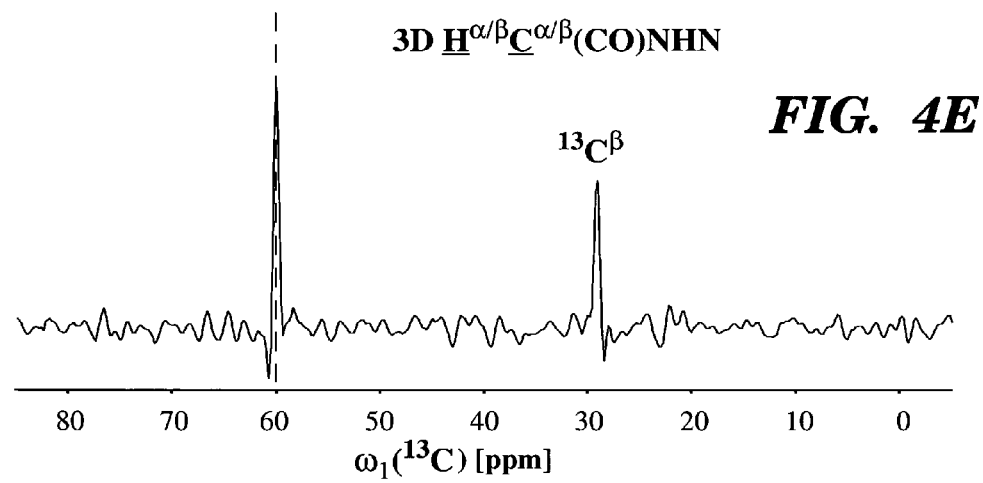
Figure 4F:
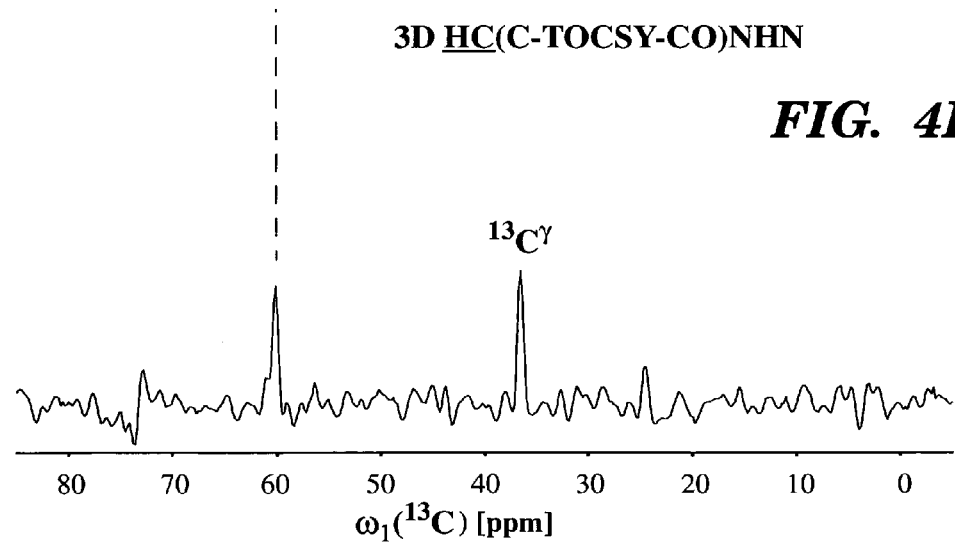

FIG. 3 outlines which chemical shifts are correlated in the various NMR experiments described above.

Combinations of RD NMR Experiments

Accordingly, a suite of multidimensional RD NMR experiments enables one to devise strategies for RD NMR-based HTP resonance assignment of proteins.

Thus, another aspect of the present invention relates to a method for sequentially assigning chemical shift values of an α-proton, $^1H^α$, an α-carbon, $^{13}C^α$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample including: (1) a RD 3D H̲A̲,C̲A̲,(CO),N,HN NMR experiment to measure and connect chemical shift values of the α-proton of amino acid residue i−1, $^1H^α_{i−1}$, the α-carbon of amino acid residue i−1, $^{13}C^α_{i−1}$, the polypeptide backbone amide nitrogen of amino acid residue i, $^{15}N_i$, and the polypeptide backbone amide proton of amino acid residue i, $^1H^N_i$ and (2) a RD 3D HNNC̲A̲H̲A̲ NMR experiment to measure and connect the chemical shift values of the α-proton of amino acid residue i, $^1H^α_i$, the α-carbon of amino acid residue i, $^{13}C^α_i$, $^{15}N_i$, and $^1H^N_i$. Then, sequential assignments of the chemical shift values of $^1H^α$, $^{13}C^α$, $^{15}N$, and $^1H^N$ are obtained by (i) matching the chemical shift values of $^1H^α_{i−1}$ and $^{13}C^α_{i−1}$ with the chemical shift values of $^1H^α_i$ and $^{13}C^α_i$, (ii) using the chemical shift values of $^1H^α_{i−1}$ and $^{13}C^α_{i−1}$ to identify the type of amino acid residue i−1 (Wüthrich, *NMR of Proteins and Nucleic Acids*, Wiley, New York (1986); Grzesiek et al., *J. Biomol. NMR*, 3: 185–204 (1993), which are hereby incorporated by reference in their entirety), and (iii) mapping sets of sequentially connected chemical shift values to the amino acid sequence of the polypeptide chain and using the chemical shift values to locate secondary structure elements (such as α-helices and β-sheets) within the polypeptide chain (Spera et al., *J. Am. Chem. Soc.*, 113: 5490–5492 (1991); Wishart et al., Biochemistry, 31:1647–1651, which are hereby incorporated by reference in their entirety).

In one embodiment, the protein sample could, in addition to the RD 3D H̲A̲,C̲A̲,(CO),N,HN NMR experiment and the RD 3D HNNC̲A̲H̲A̲ NMR experiment, be further subjected to a RD 3D HNN<C̲O̲,C̲A̲> NMR experiment to measure and connect the chemical shift values of a polypeptide backbone carbonyl carbon of amino acid residue i−1, $^{13}C'_{i−1}$, $^{13}C^α_i$, $^{15}N_i$, and $^1H^N_i$. Then, sequential assignments of the chemical shift value of $^{13}C'_{i−1}$, are obtained by matching the chemical shift value of $^{13}C^α_i$ measured by the RD 3D HNN<C̲O̲,C̲A̲> NMR experiment with the sequentially assigned chemical shift values of $^{13}C^α$, $^{15}N$, and $^1H^N$ measured by the RD 3D H̲A̲,C̲A̲,(CO),N,HN NMR experiment and the RD 3D HNNC̲A̲H̲A̲ NMR experiment.

In another embodiment, the protein sample could, in addition to the RD 3D H̲A̲,C̲A̲,(CO),N,HN NMR experiment and the RD 3D HNNC̲A̲H̲A̲ NMR experiment, be further subjected to (i) a RD 3D H̲$^{α/β}$,C̲$^{α/β}$,CO,HA NMR experiment to measure and connect the chemical shift values of the β-proton of amino acid residue i, $^1H^β_i$, the β-carbon of amino acid residue i, $^{13}C^β_i$, the α-proton of amino acid residue i, $^1H^α_i$, the α-carbon of amino acid residue i, $^{13}C^α_i$, and a polypeptide backbone carbonyl carbon of amino acid residue i, $^{13}C'_i$, and (ii) a RD 3D HNN<C̲O̲,C̲A̲> NMR experiment to measure and connect the chemical shift values of $^{13}C'_i$, the α-carbon of amino acid residue i+1, $^{13}C^α_{i+1}$, the polypeptide backbone amide nitrogen of amino acid residue i+1, $^{15}N_{i+1}$, and the polypeptide backbone amide proton of amino acid residue i+1, $^1H^N_{i+1}$. Then, sequential assignments are obtained by matching the chemical shift value of $^{13}C'_i$, measured by the RD 3D HNN<C̲O̲,C̲A̲> NMR experiment with the chemical shift value of $^{13}C'_i$ measured by the RD 3D H̲$^{α/β}$,C̲$^{α/β}$,CO,HA NMR experiment.

In another embodiment, the protein sample could, in addition to the RD 3D H̲A̲,C̲A̲,(CO),N,HN NMR experiment and the RD 3D HNNC̲A̲H̲A̲ NMR experiment, be further subjected to a RD 3D H̲,C̲,(C-TOCSY—CO),N,HN NMR experiment to measure and connect the chemical shift values of aliphatic protons (including α-, β-, and γ-protons) of amino acid residue i−1, $^1H^{ali}_{i−1}$, aliphatic carbons (including α-, β-, and γ-carbons) of amino acid residue i−1, $^{13}C^{ali}_{i−1}$, $^{15}N_i$, and $^1H^N_i$. Then, sequential assignments of the chemical shift values of $^1H^{ali}_{i−1}$ and $^{13}C^{ali}_{i−1}$ for amino acid residues i having unique pairs of $^{15}N_i$ and $_1H^N_i$ chemical shift values are obtained by matching the chemical shift values of $^1H^α$ and $^{13}C^α$ measured by said RD 3D HNNC̲A̲H̲A̲ NMR experiment and RD 3D H̲A̲,C̲A̲,(CO),N,HN NMR experiment with the chemical shift values of $^1H^α_{i−1}$ and $^{13}C^α_{i−1}$ measured by said RD 3D H̲,C̲,(C-TOCSY—CO),N,HN NMR experiment and using the $^1H^{ali}_{i−1}$ and $^{13}C^{ali}_{i−1}$ chemical shift values to identify the type of amino acid residue i−1.

In another embodiment, the protein sample could, in addition to the RD 3D H̲A̲,C̲A̲,(CO),N,HN NMR experiment and the RD 3D HNNC̲A̲H̲A̲ NMR experiment, be further subjected to a RD 3D H̲,C̲,C,H—COSY NMR experiment or a RD 3D H̲,C̲,C,H-TOCSY NMR experiment to measure and connect the chemical shift values of $^1H^{ali}_i$ and $^{13}C^{ali}_i$ of amino acid residue i. Then, sequential assignments of the chemical shift values of $^1H^{ali}_i$ and $^{13}C^{ali}_i$, the chemical shift values of a γ-proton, $^1H^γ_i$, and a γ-carbon, $^{13}C^γ_i$, in particular, are obtained by (i) matching the chemical shift values of $^1H^α_i$ and $^{13}C^α_i$ measured using the RD 3D H̲,C̲,C,H—COSY NMR experiment or the RD 3D H̲,C̲,C,H-TOCSY RD NMR experiment with the chemical shift values of $^1H^α_i$ and $^{13}C^α$ measured by the RD 3D H̲A̲,C̲A̲,(CO),N,HN NMR experiment, the RD 3D HNNC̲A̲H̲A̲ NMR experiment, and the RD 3D H̲$^{α/β}$C̲$^{α/β}$(CO)NHN NMR experiment and (ii) using the chemical shift values of $^1H^{ali}$ and $^{13}C^{ali}$, the chemical shift values of $^1H^γ_i$ and $^{13}C^γ_i$ in particular, to identify the type of amino acid residue i.

In yet another embodiment, this method involves, in addition to the RD 3D H̲A̲,C̲A̲,(CO),N,HN NMR experiment and the RD 3D HNNC̲A̲H̲A̲ NMR experiment, further subjecting the protein sample to a RD 3D H̲$^{α/β}$C̲$^{α/β}$(CO)NHN NMR experiment to measure and connect the chemical shift values of the β-proton of amino acid residue i−1, $^1H^β_{i−1}$, the β-carbon of amino acid residue i−1, $^{13}C^β_{i−1}$, $^1H^α_{i−1}$, $^{13}C^α_{i−1}$, $^{15}N_i$, and $^1H^N_i$. Then, sequential assignments of the chemical shift values of $^1H^β$ and $^{13}C^β$ are obtained by using the chemical shift values of $^1H^β_{i−1}$ and $^{13}C^β_{i−1}$ to identify the type of amino acid residue i−1.

In another embodiment, the protein sample could, in addition to the RD 3D H̲A̲,C̲A̲,(CO),N,HN NMR experiment, the RD 3D HNNC̲A̲H̲A̲ NMR experiment, and the RD 3D H̲$^{α/β}$C̲$^{α/β}$(CO)NHN NMR experiment, be further subjected to a RD 3D H$^{α/β}$, C$^{α/β}$,CO,HA NMR experiment to measure and connect the chemical shift values of the β-proton of amino acid residue i, $^1H^β_i$, the β-carbon of amino acid residue i, $^{13}C^β_i$, $^1H^α_i$, $^{13}C^α_i$, and a polypeptide backbone carbonyl carbon of amino acid residue i, $^{13}C'_i$. Then, sequential assignments of the chemical shift value of $^{13}C'_i$ are obtained by matching the chemical shift values of $^1H^β_i$, $^{13}C^β_i$, $^1H^α_i$, and $^{13}C^α_i$ measured by the RD 3D H̲$^{α/β}$, C̲$^{α/β}$,CO,HA NMR experiment with the sequentially assigned chemical shift values of $^1H^β$, $^{13}C^β$, $^1H^α$, $^{13}C^α$, $^{15}N$, and $^1H^N$ measured by the RD 3D H̲A̲,C̲A̲,(CO),N,HN NMR experiment, the RD 3D HNN$\underline{\text{CAHA}}$ NMR experiment, and the RD 3D $\underline{\text{H}}^{\alpha/\beta}\underline{\text{C}}^{\alpha/\beta}$(CO)NHN NMR experiment.

In another embodiment, the protein sample could, in addition to the RD 3D $\underline{\text{HA}},\underline{\text{CA}}$,(CO),N,HN NMR experiment, the RD 3D HNN$\underline{\text{CAHA}}$ NMR experiment, and the RD 3D $\underline{\text{H}}^{\alpha/\beta}\underline{\text{C}}^{\alpha/\beta}$(CO)NHN NMR experiment, be further subjected to a RD 3D $\underline{\text{H}}^{\alpha/\beta},\underline{\text{C}}^{\alpha/\beta}$,N,HN NMR experiment to measure and connect the chemical shift values of $^1\text{H}^\beta_i$, $^{13}\text{C}^\beta_i$, $^1\text{H}^\alpha_i$, $^{13}\text{C}^\alpha_i$, $^{15}\text{N}_i$, and $^1\text{H}^N_i$. Then, sequential assignments are obtained by matching the chemical shift values of $^1\text{H}^\beta_i$, $^{13}\text{C}^\beta_i$, $^1\text{H}^\alpha_i$, and $^{13}\text{C}^\alpha_i$ with the chemical shift values of $^1\text{H}^\beta_{i-1}$, $^{13}\text{C}^\beta_{i-1}$, $^1\text{H}^\alpha_{i-1}$, and $^{13}\text{C}^\alpha_{i-1}$ measured by the RD 3D $\underline{\text{H}}^{\alpha/\beta}\underline{\text{C}}^{\alpha/\beta}$(CO)NHN NMR experiment.

In another embodiment, the protein sample could, in addition to the RD 3D $\underline{\text{HA}},\underline{\text{CA}}$,(CO),N,HN NMR experiment, the RD 3D HNN$\underline{\text{CAHA}}$ NMR experiment, and the RD 3D $\underline{\text{H}}^{\alpha/\beta}\underline{\text{C}}^{\alpha/\beta}$(CO)NHN NMR experiment, be further subjected to a 3D HNNCACB NMR experiment to measure and connect the chemical shift value of $^{13}\text{C}^\beta_i$, $^{13}\text{C}^\alpha_i$, $^{15}\text{N}_i$, and $^1\text{H}^N_i$. Then, sequential assignments are obtained by matching the chemical shift values of $^{13}\text{C}^\beta_i$ and $^{13}\text{C}^\alpha_i$ measured by said 3D HNNCACB NMR experiment with the chemical shift values of $^{13}\text{C}^\beta_{i-1}$ and $^{13}\text{C}^\alpha_{i-1}$ measured by the RD 3D $\underline{\text{H}}^{\alpha/\beta}\underline{\text{C}}^{\alpha/\beta}$(CO)NHN NMR experiment.

In another embodiment, the protein sample could, in addition to the RD 3D $\underline{\text{HA}},\underline{\text{CA}}$,(CO),N,HN NMR experiment, the RD 3D HNN$\underline{\text{CAHA}}$ NMR experiment, and the RD 3D $\underline{\text{H}}^{\alpha/\beta}\underline{\text{C}}^{\alpha/\beta}$(CO)NHN NMR experiment, be further subjected to a RD 2D $\underline{\text{HB}},\underline{\text{CB}}$,(CG,CD),HD NMR experiment to measure and connect the chemical shift values of $^1\text{H}^\beta_{i-1}$, $^{13}\text{C}^\beta_{i-1}$, and a δ-proton of amino acid residue I−1 with an aromatic side chain, $^1\text{H}^\delta_{i-1}$. Then, sequential assignments are obtained by matching (i) the chemical shift values of $^1\text{H}^\beta_{i-1}$ and $^{13}\text{C}^\beta_{i-1}$ measured by said RD 2D $\underline{\text{HB}},\underline{\text{CB}}$,(CG,CD),HD NMR experiment with the chemical shift values of $^1\text{H}^\beta$ and $^{13}\text{C}^\beta$ measured by the RD 3D $\underline{\text{H}}^{\alpha/\beta}\underline{\text{C}}^{\alpha/\beta}$(CO)NHN NMR experiment, (ii) using the chemical shift values to identify amino acid residue i as having an aromatic side chain, and (iii) mapping sets of sequentially connected chemical shift values to the amino acid sequence of the polypeptide chain and locating amino acid residues with aromatic side chains along the polypeptide chain.

In another embodiment, the protein sample could, in addition to the RD 3D $\underline{\text{HA}},\underline{\text{CA}}$,(CO),N,HN NMR experiment, the RD 3D HNN$\underline{\text{CAHA}}$ NMR experiment, and the RD 3D $\underline{\text{H}}^{\alpha/\beta}\underline{\text{C}}^{\alpha/\beta}$(CO)NHN NMR experiment, be further subjected to a RD 3D $\underline{\text{H}}$,C,C,H—COSY NMR experiment or a RD 3D $\underline{\text{H}}$,C,C,H-TOCSY NMR experiment to measure and connect the chemical shift values of aliphatic protons (including α-, β-, and γ-protons) of amino acid residue i, $^1\text{H}^{ali}_i$, and aliphatic carbons (including α-, β-, and γ-carbons) of amino acid residue i, $^{13}\text{C}^{ali}_i$, of amino acid residue i. Then, sequential assignments of the chemical shift values of $^1\text{H}^{ali}_i$ and $^{13}\text{C}^{ali}_i$, the chemical shift values of a γ-proton, $^1\text{H}^\gamma$, and a γ-carbon, $^{13}\text{C}^\gamma$, in particular, are obtained by (i) matching the chemical shift values of $^1\text{H}^\beta_i$, $^{13}\text{C}^\beta_i$, $^1\text{H}^\alpha_i$, and $^{13}\text{C}^\alpha_i$ measured using the RD 3D $\underline{\text{H}}$,C,C,H—COSY NMR experiment or the RD 3D $\underline{\text{H}}$,C,C,H-TOCSY RD NMR experiment with the chemical shift values of $^1\text{H}^\beta_i$, $^{13}\text{C}^\beta_i$, $^1\text{H}^\alpha_i$, and $^{13}\text{C}^\alpha_i$ measured by the RD 3D $\underline{\text{HA}},\underline{\text{CA}}$,(CO),N,HN NMR experiment, the RD 3D HNN$\underline{\text{CAHA}}$ NMR experiment, and the RD 3D $\underline{\text{H}}^{\alpha/\beta}\underline{\text{C}}^{\alpha/\beta}$(CO)NHN NMR experiment and (ii) using the chemical shift values of $^1\text{H}^{ali}$ and $^{13}\text{C}^{ali}$, the chemical shift values of $^1\text{H}^\gamma$ and $^{13}\text{C}^\gamma$ in particular, to identify the type of amino acid residue i.

Yet another aspect of the present invention relates to a method for sequentially assigning chemical shift values of a β-proton, $^1\text{H}^\beta$, a β-carbon, $^{13}\text{C}^\beta$, an α-proton, $^1\text{H}^\alpha$, an α-carbon, $^{13}\text{C}^\alpha$, a polypeptide backbone amide nitrogen, $^{15}\text{N}$, and a polypeptide backbone amide proton, $^1\text{H}^N_i$, of a protein molecule. The method involves providing a protein sample and conducting a set of reduced dimensionality (RD) nuclear magnetic resonance (NMR) experiments on the protein sample including: (1) a RD 3D $\underline{\text{H}}^{\alpha/\beta}\underline{\text{C}}^{\alpha/\beta}$(CO)NHN NMR experiment to measure and connect the chemical shift values of the β-proton of amino acid residue i−1, $^1\text{H}^\beta_{i-1}$, the β-carbon of amino acid residue i−1, $^{13}\text{C}^\beta_{i-1}$, the α-proton of amino acid residue i−1, $^1\text{H}^\alpha_{i-1}$, the α-carbon of amino acid residue i−1, $^{13}\text{C}^\alpha_{i-1}$, the polypeptide backbone amide nitrogen of amino acid residue i, $^{15}\text{N}_i$, and the polypeptide backbone amide proton of amino acid residue i, $^1\text{H}^N_i$, and (2) a RD 3D $\underline{\text{H}}^{\alpha/\beta},\underline{\text{C}}^{\alpha/\beta}$,N,HN NMR experiment to measure and connect the chemical shift values of the β-proton of amino acid residue i, $^1\text{H}^\beta_i$, the β-carbon of amino acid residue i, $^{13}\text{C}^\beta_i$, the α-proton of amino acid residue i, $^1\text{H}^\alpha_i$, the α-carbon of amino acid residue i, $^{13}\text{C}^\alpha_i$, $^{15}\text{N}_i$, and $^1\text{H}^N_i$. Then, sequential assignments of the chemical shift values of $^1\text{H}^\beta$, $^{13}\text{C}^\beta$, $^1\text{H}^\alpha$, $^{13}\text{C}^\alpha$, $^{15}\text{N}$, and $^1\text{H}^N$ are obtained by (i) matching the chemical shift values of the α- and β-protons of amino acid residue i−1, $^1\text{H}^{\alpha/\beta}_{i-1}$, and the chemical shift values of the α- and β-carbons of amino acid residue i−1, $^{13}\text{C}^{\alpha/\beta}_{i-1}$, with $^1\text{H}^{\alpha/\beta}_i$ and $^{13}\text{C}^{\alpha/\beta}_i$, (ii) using $^1\text{H}^{\alpha/\beta}_{i-1}$ and $^{13}\text{C}^{\alpha/\beta}_{i-1}$ to identify the type of amino acid residue i−1 (Wüthrich, *NMR of Proteins and Nucleic Acids*, Wiley, New York (1986); Grzesiek et al., *J. Biomol. NMR*, 3: 185–204 (1993), which are hereby incorporated by reference in their entirety), (iii) mapping sets of sequentially connected chemical shift values to the amino acid sequence of the polypeptide chain and using the chemical shift values to locate secondary structure elements within the polypeptide chain (Spera et al., *J. Am. Chem. Soc.*, 113:5490–5492 (1991); Wishart et al., Biochemistry, 31:1647–1651, which are hereby incorporated by reference in their entirety).

In one embodiment, the protein sample could, in addition to the RD 3D $\underline{\text{H}}^{\alpha/\beta}\underline{\text{C}}^{\alpha/\beta}$(CO)NHN NMR experiment and the RD 3D $\underline{\text{H}}^{\alpha/\beta},\underline{\text{C}}^{\alpha\beta}$, N,HN NMR experiment, be further subjected to a RD 3D $\underline{\text{HA}},\underline{\text{CA}}$,(CO),N,HN NMR experiment (i) to measure and connect chemical shift values of $^1\text{H}^\alpha_{i-1}$, $^{13}\text{C}^\alpha_{i-1}$, $^{15}\text{N}_i$, and $^1\text{H}^N_i$ and (ii) to distinguish between NMR signals for $^1\text{H}^\alpha/^{13}\text{C}^\alpha$ and $^1\text{H}^\beta/^{13}\text{C}^\beta$ measured in the RD 3D $\underline{\text{H}}^{\alpha/\beta}\underline{\text{C}}^{\alpha/\beta}$(CO)NHN NMR experiment and the RD 3D $\underline{\text{H}}^{\alpha/\beta}$,$\underline{\text{C}}^{\alpha/\beta}$N,HN NMR experiment.

In another embodiment, the protein sample could, in addition to the RD 3D $\underline{\text{H}}^{\alpha/\beta}\underline{\text{C}}^{\alpha/\beta}$(CO)NHN NMR experiment and the RD 3D $\underline{\text{H}}^{\alpha/\beta}$, $\underline{\text{C}}^{\alpha/\beta}$,N,HN NMR experiment, be further subjected to a RD 3D $\underline{\text{H}}^{\alpha/\beta},\underline{\text{C}}^{\alpha/\beta}$,CO,HA NMR experiment to measure and connect the chemical shift values of $^1\text{H}^\beta_i$, $^{13}\text{C}^\beta_i$, $^1\text{H}^\alpha_i$, $^{13}\text{C}^\alpha_i$, and a polypeptide backbone carbonyl carbon of amino acid residue i, $^{13}\text{C}'_i$. Then, sequential assignments of the chemical shift value of $^{13}\text{C}'_i$ are obtained by matching the chemical shift values of $^1\text{H}^\beta_i$, $^{13}\text{C}^\beta_i$, $^1\text{H}^\alpha_i$, and $^{13}\text{C}^\alpha_i$ measured by the RD 3D $\underline{\text{H}}^{\alpha/\beta}$,$\underline{\text{C}}^{\alpha/\beta}$,CO,HA NMR experiment with the sequentially assigned chemical shift values of $^1\text{H}^\beta$, $^{13}\text{C}^\beta$, $^1\text{H}^\alpha$, $^{13}\text{C}^\alpha$, $^{15}\text{N}$, and $^1\text{H}^N$ measured by the RD 3D $\underline{\text{H}}^{\alpha/\beta}\underline{\text{C}}^{\alpha/\beta}$(CO)NHN NMR experiment and the RD 3D $\underline{\text{H}}^{\alpha/\beta},\underline{\text{C}}^{\alpha/\beta}$,N,HN NMR experiment.

In another embodiment, the protein sample could, in addition to the RD 3D $\underline{\text{H}}^{\alpha/\beta}\underline{\text{C}}^{\alpha/\beta}$(CO)NHN NMR experiment and the RD 3D $\underline{\text{H}}^{\alpha/\beta}$, $\underline{\text{C}}^{\alpha/\beta}$,N,HN NMR experiment, be further subjected to a RD 3D HNN<$\underline{\text{CO}},\underline{\text{CA}}$> NMR experiment to measure and connect the chemical shift values of a polypeptide backbone carbonyl carbon of amino acid residue i−1, $^{13}\text{C}'_{i-1}$, $^{13}\text{C}^\alpha_i$, $^{15}\text{N}_i$, and $^1\text{H}^N_i$. Then, sequential assignments of the chemical shift value of $^{13}C'_{i-1}$ are obtained by matching the chemical shift value of $^{13}C^{\alpha}_{i}$ measured by the RD 3D HNN<$\underline{CO},\underline{CA}$> NMR experiment with the sequentially assigned chemical shift values of $^{13}C^{\alpha}_{i}$, $^{15}N$, and $^{1}H^{N}$ measured by the RD 3D $\underline{H}^{\alpha/\beta}\underline{C}^{\alpha/\beta}(CO)NHN$ NMR experiment and RD 3D $\underline{H}^{\alpha/\beta},\underline{C}^{\alpha/\beta},N,HN$ NMR experiment.

In another embodiment, the protein sample could, in addition to the RD 3D $\underline{H}^{\alpha/\beta}\underline{C}^{\alpha/\beta}(CO)NHN$ NMR experiment and the RD 3D $\underline{H}^{\alpha/\beta}$, $\underline{C}^{\alpha\beta},N,HN$ NMR experiment, be further subjected to (i) a RD 3D $\underline{H}^{\alpha/\beta},\underline{C}^{\alpha/\beta},CO,HA$ NMR experiment to measure and connect the chemical shift values of $^{1}H^{\beta}_{i}$, $^{13}C^{\beta}_{i}$, $^{1}H^{\alpha}_{i}$, $^{13}C^{\alpha}_{i}$, and a polypeptide backbone carbonyl carbon of amino acid residue i, $^{13}C'_{i}$ and (ii) a RD 3D HNN<$\underline{CO},\underline{CA}$> NMR experiment to measure and connect the chemical shift values of $^{13}C'_{i}$, the α-carbon of amino acid residue i+1, $^{13}C^{\alpha}_{i+1}$, the polypeptide backbone amide nitrogen of amino acid residue i+1, $^{15}N_{i+1}$, and the polypeptide backbone amide proton of amino acid residue i+1, $^{1}H^{N}_{i+1}$. Then, sequential assignments are obtained by matching the chemical shift value of $^{13}C'_{i}$ measured by said RD 3D HNN<$\underline{CO},\underline{CA}$> NMR experiment with the chemical shift value of $^{13}C'_{i}$ measured by the RD 3D $\underline{H}^{\alpha/\beta},\underline{C}^{\alpha/\beta},CO,HA$ NMR experiment.

In another embodiment, the protein sample could, in addition to the RD 3D $\underline{H}^{\alpha/\beta}\underline{C}^{\alpha/\beta}(CO)NHN$ NMR experiment and the RD 3D $\underline{H}^{\alpha/\beta}$, $\underline{C}^{\alpha\beta},N,HN$ NMR experiment, be further subjected to a RD 3D $\underline{H},\underline{C},(C-TOCSY—CO),N,HN$ NMR experiment to measure and connect the chemical shift values of $^{1}H^{ali}_{i-1}$, $^{13}C^{ali}_{i-1}$, $^{15}N_{i}$, and $^{1}H^{N}_{i}$. Then, sequential assignments of the chemical shift values of $^{1}H^{ali}_{i-1}$ and $^{13}C^{ali}_{i-1}$ for amino acid residues i having unique pairs of $^{15}N_{i}$ and $^{1}H^{N}_{i}$ chemical shift values are obtained by matching the chemical shift values of $^{1}H^{\beta}$, $^{13}C^{\beta}$, $^{1}H^{\alpha}$, and $^{13}C^{\alpha}$ measured by the RD 3D $\underline{H}^{\alpha/\beta}\underline{C}^{\alpha/\beta}(C))NHN$ NMR experiment and RD 3D $\underline{H}^{\alpha/\beta},\underline{C}^{\alpha/\beta},N,HN$ NMR experiment with the chemical shift values of $^{1}H^{\beta}_{i-1}$, $^{13}C^{\beta}_{i-1}$, $^{1}H^{\alpha}_{i-1}$, and $^{13}C^{\alpha}_{i-1}$ measured by the RD 3D $\underline{H},\underline{C},(C-TOCSY—CO),N,HN$ NMR experiment and using the $^{1}H^{ali}_{i-1}$, and $^{13}C^{ali}_{i-1}$ chemical shift values to identify the type of amino acid residue i–1.

In another embodiment, the protein sample could, in addition to the RD 3D $\underline{H}^{\alpha/\beta}\underline{C}^{\alpha/\beta}(CO)NHN$ NMR experiment and the RD 3D $\underline{H}^{\alpha/\beta}$, $\underline{C}^{\alpha\beta},N,HN$ NMR experiment, be further subjected to a 3D HNNCACB NMR experiment to measure and connect the chemical shift value of $^{13}C^{\beta}_{i}$, $^{13}C^{\alpha}_{i}$, $^{15}N_{i}$, and $^{1}H^{N}_{i}$. Then, sequential assignments are obtained by matching the chemical shift values of $^{13}C^{\beta}_{i}$ and $^{13}C^{\alpha}_{i}$ measured by said 3D HNNCACB NMR experiment with the chemical shift values of $^{13}C^{\beta}_{i-1}$ and $^{13}C^{\alpha}_{i-1}$ measured by the RD 3D $\underline{H}^{\alpha/\beta}\underline{C}^{\alpha/\beta}(CO)NHN$ NMR experiment.

In another embodiment, the protein sample could, in addition to the RD 3D $\underline{H}^{\alpha/\beta}\underline{C}^{\alpha/\beta}(CO)NHN$ NMR experiment and the RD 3D $\underline{H}^{\alpha/\beta}$, $\underline{C}^{\alpha\beta},N,HN$ NMR experiment, be further subjected to a RD 2D $\underline{HB},\underline{CB},(CG,CD),HD$ NMR experiment to measure and connect the chemical shift values of $^{1}H^{\beta}_{i}$, $^{13}C^{\beta}_{i}$, and a δ-proton of amino acid residue i with an aromatic side chain, $^{1}H^{\delta}_{i}$. Then, sequential assignments are obtained by (i) matching the chemical shift values of $^{1}H^{\beta}_{i}$ and $^{13}C^{\beta}_{i}$ measured by said RD 2D $\underline{HB},\underline{CB},(CG,CD),HD$ NMR experiment with the chemical shift values of $^{1}H^{\beta}$ and $^{13}C^{\beta}$ measured by the RD 3D $\underline{H}^{\alpha/\beta}\underline{C}^{\alpha/\beta}(CO)NHN$ NMR experiment and the RD 3D $\underline{H}^{\alpha/\beta},\underline{C}^{\alpha/\beta},N,HN$ NMR experiment, (ii) using the chemical shift values to identify amino acid residue i as having an aromatic side chain, and (iii) mapping sets of sequentially connected chemical shift values to the amino acid sequence of the polypeptide chain and locating amino acid residues with aromatic side chains along the polypeptide chain (Spera et al., *J. Am. Chem. Soc.*, 113:5490–5492 (1991); Wishart et al., Biochemistry, 31:1647–1651, which are hereby incorporated by reference in their entirety).

In another embodiment, the protein sample could, in addition to the RD 3D $\underline{H}^{\alpha/\beta}\underline{C}^{\alpha/\beta}(CO)NHN$ NMR experiment and the RD 3D $\underline{H}^{\alpha/\beta}$, $\underline{C}^{\alpha\beta},N,HN$ NMR experiment, be further subjected to a RD 3D $\underline{H},\underline{C},C,H—COSY$ NMR experiment or a RD 3D $\underline{H},\underline{C},C,H-TOCSY$ NMR experiment to measure and connect the chemical shift values of aliphatic protons of amino acid residue i, $^{1}H^{ali}_{i}$, and aliphatic carbons of amino acid residue i, $^{13}C^{ali}_{i}$, of amino acid residue i. Then, sequential assignments of the chemical shift values of $^{1}H^{ali}_{i}$ and $^{13}C^{ali}_{i}$, the chemical shift values of a γ-proton, $^{1}H^{\gamma}_{i}$, and a γ-carbon, $^{13}C^{\gamma}_{i}$, in particular, are obtained by (i) matching the chemical shift values of $^{1}H^{\beta}_{i}$, $^{13}C^{\beta}_{i}$, $^{1}H^{\alpha}_{i}$, and $^{13}C^{\alpha}_{i}$ measured using the RD 3D $\underline{H},\underline{C},C,H—COSY$ NMR experiment or the RD 3D $\underline{H},\underline{C},C,H-TOCSY$ RD NMR experiment with the chemical shift values of $^{1}H^{\beta}$, $^{13}C^{\beta}$, $^{1}H^{\alpha}$, and $^{13}C^{\alpha}$ measured by the RD 3D $\underline{H}^{\alpha/\beta}\underline{C}^{\alpha/\beta}(CO)NHN$ NMR experiment and the RD 3D $\underline{H}^{\alpha/\beta},\underline{C}^{\alpha/\beta},N,HN$ NMR experiment, and (ii) using the chemical shift values of $^{1}H^{ali}_{i}$ and $^{13}C^{ali}_{i}$, the chemical shift values of $^{1}H^{\gamma}_{i}$ and $^{13}C^{\gamma}_{i}$ in particular, to identify the type of amino acid residue i.

A further aspect of the present invention involves a method for sequentially assigning the chemical shift values of aliphatic protons, $^{1}H^{ali}$, aliphatic carbons, $^{13}C^{ali}$, a polypeptide backbone amide nitrogen, $^{15}N$, and a polypeptide backbone amide proton, $^{1}H^{N}$, of a protein molecule. The method involves providing a protein sample and conducting a set of reduced dimensionality (RD) nuclear magnetic resonance (NMR) experiments on the protein sample including: (1) a RD 3D $\underline{H},\underline{C},(C-TOCSY—CO),N,HN$ NMR experiment to measure and connect the chemical shift values of the aliphatic protons of amino acid residue i–1, $^{1}H^{ali}_{i-1}$, the aliphatic carbons of amino acid residue i–1, $^{13}C^{ali}_{i-1}$, the polypeptide backbone amide nitrogen of amino acid residue i, $^{15}N_{i}$, and the polypeptide backbone amide proton of amino acid residue i, $^{1}H^{N}_{i}$ and (2) a RD 3D $\underline{H}^{\alpha/\beta},\underline{C}^{\alpha/\beta},N,HN$ NMR experiment to measure the chemical shift values of the β-proton of amino acid residue i, $^{1}H^{\beta}_{i}$, the β-carbon of amino acid residue i, $^{13}C^{\beta}_{i}$, the α-proton of amino acid residue i, $^{1}H^{\alpha}_{i}$, the α-carbon of amino acid residue i, $^{13}C^{\alpha}_{i}$, $^{15}N_{i}$, and $^{1}H^{N}_{i}$. Then, sequential assignments of the chemical shift values of $^{1}H^{ali}$, $^{13}C^{ali}$, $^{15}N$, and $^{1}H^{N}$ are obtained by (i) matching the chemical shift values of the α- and β-protons of amino acid residue i–1, $^{1}H^{\alpha/\beta}_{i-1}$ and the α- and β-carbons of amino acid residue i–1, $^{13}C^{\alpha/\beta}_{i-1}$ with the chemical shift values of $^{1}H^{\alpha/\beta}_{i}$ and $^{13}C^{\alpha/\beta}_{i}$ of amino acid residue i, (ii) using the chemical shift values of $^{1}H^{ali}_{i-1}$ and $^{13}C^{ali}_{i-1}$ to identify the type of amino acid residue i–1 (Wüthrich, *NMR of Proteins and Nucleic Acids*, Wiley, New York (1986); Grzesiek et al., *J. Biomol. NMR*, 3: 185–204 (1993), which are hereby incorporated by reference in their entirety), and (iii) mapping sets of sequentially connected chemical shift values to the amino acid sequence of the polypeptide chain and using the chemical shift values to locate secondary structure elements within the polypeptide chain (Spera et al., *J. Am. Chem. Soc.*, 113:5490–5492 (1991); Wishart et al., Biochemistry, 31:1647–1651, which are hereby incorporated by reference in their entirety).

In one embodiment, the protein sample could, in addition to the RD 3D $\underline{H},\underline{C},(C-TOCSY—CO),N,HN$ NMR experiment and the RD 3D $\underline{H}^{\alpha/\beta},\underline{C}^{\alpha/\beta},N,HN$ NMR experiment, be further subjected to a RD 3D $\underline{H}^{\alpha/\beta},\underline{C}^{\alpha/\beta},CO,HA$ NMR experiment to measure and connect the chemical shift values of $^1H^\beta_i$, $^{13}C^\beta_i$, $^1H^\alpha_i$, $^{13}C^\alpha_i$, and a polypeptide backbone carbonyl carbon of amino acid residue i, $^{13}C'_i$. Then, sequential assignments of the chemical shift value of $^{13}C'_i$ are obtained by matching the chemical shift values of $^1H^\beta_i$, $^{13}C^\beta_i$, $^1H^\alpha_i$, and $^{13}C^\alpha_i$ measured by the RD 3D $\underline{H}^{\alpha/\beta},\underline{C}^{\alpha/\beta}$,CO,HA NMR experiment with the sequentially assigned chemical shift values of $^1H^\beta$, $^{13}C^\beta$, $^1H^\alpha$, $^{13}C^\alpha$, $^{15}N$, and $^1H^N$ measured by the RD 3D $\underline{H},\underline{C}$,(C-TOCSY—CO),N,HN NMR experiment and the RD 3D $\underline{H}^{\alpha/\beta},\underline{C}^{\alpha/\beta}$,N,HN NMR experiment.

In another embodiment, the protein sample could, in addition to the RD 3D $\underline{H},\underline{C}$, (C-TOCSY—CO),N,HN NMR experiment and the RD 3D $\underline{H}^{\alpha/\beta}$,N,HN,NMR experiment, be further subjected to a RD 3D HNN<$\underline{CO,CA}$> NMR experiment to measure and connect the chemical shift values of a polypeptide backbone carbonyl carbon of amino acid residue i–1, $^{13}C'_{-1}$, $^{13}C^\alpha_i$, $^{15}N_i$, and $^iH^N_i$. Then, sequentail assignments of the chemical shift value of $^{13}C'_{i-1}$ are obtained by matching the chemical shift value of $^{13}C^\alpha_i$ measured by the RD 3D HNN<$\underline{CO,CA}$> NMR experiment with the sequentially assigned chemical shift values of $^{13}C^\alpha$, $^{15}N$, and $^1H^N$ measured by the RD 3D $\underline{H},\underline{C}$, (C-TOCSY—CO),N,HN NMR experiment and the RD 3D $\underline{H}^{\alpha/\beta},\underline{C}^{\alpha/\beta}$,N,HN NMR experiment.

In another embodiment, the protein sample could, in addition to the RD 3D $\underline{H},\underline{C}$,(C-TOCSY—CO),N,HN NMR experiment and the RD 3D $\underline{H}^{\alpha/\beta}$, $\underline{C}^{\alpha/\beta}$,N,HN NMR experimnet, be further subjected to (i) a RD 3D $\underline{H}^{\alpha/\beta},\underline{C}^{\alpha/\beta}$,CO,HA NMR experiment to measure and connect the chemical shift values of $^1H^\beta_i$, $^{13}C^\beta_i$, $^1H^\alpha_i$, $^{13}C^\alpha_i$, and a polypeptide backbone carbonyl carbon of amino acid residue i, $^{13}C'_i$, and (ii) a RD 3D HNN<$\underline{CO,CA}$> NMR experiment to measure and connect the chemical shift values of $^{13}C'_i$, the α-carbon of amino acid residue i+1, $^{13}C^\alpha_{i+1}$, the polypeptide backbone amide nitrogen of amino acid residue i+1, $^{15}N_{i+1}$, and the polypeptide backbone amide proton of amino acid residue i+1, $^1H^N_{i+1}$. Then, sequential assignments are obtained by matching the chemical shift value of $^{13}C'_i$ measured by the RD 3D HNN<$\underline{CO,CA}$> NMR experiment with the chemical shift value of $^{13}C'_i$ measured by the RD 3D $\underline{H}^{\alpha/\beta},\underline{C}^{\alpha/\beta}$,CO,HA NMR experiment.

In another embodiment, the protein sample could, in addition to the RD 3D $\underline{H},\underline{C}$,(C-TOCSY—CO),N,HN NMR experiment and the RD 3D $\underline{H}^{\alpha/\beta},\underline{C}^{\alpha/\beta}$,N,HN NMR experiment, be further subjected to a RD 3D $\underline{H}^{\alpha/\beta}\underline{C}^{\alpha/\beta}$(CO)NHN NMR experiment (i) to measure and connect the chemical shift values of $^1H^{\alpha/\beta}_{i-1}$, $^{13}C^{\alpha/\beta}_{i-1}$, $^{15}N_i$, and $^1H^N_i$, and (ii) to identify NMR signals for $^1H^{\alpha/\beta}_{i-1}$, $^{13}C^{\alpha/\beta}_{i-1}$, $^{15}N_i$, and $^1H^N_i$ in the RD 3D $\underline{H},\underline{C}$,(C-TOCSY—CO),N,HN NMR experiment.

In another embodiment, the protein sample could, in addition to the RD 3D $\underline{H},\underline{C}$,(C-TOCSY—CO),N,HN NMR experiment and the RD 3D $\underline{H}^{\alpha/\beta},\underline{C}^{\alpha/\beta}$,N,HN NMR experiment, be further subjected to a RD 3D $\underline{HA,CA}$,(CO),N,HN NMR experiment (i) to measure and connect chemical shift values of $^1H^\alpha_{i-1}$, $^{13}C^\alpha_{i-1}$, $^{15}N_i$, and $^1H^N_i$ and (ii) to identify NMR signals for $^1H^\alpha$ and $^{13}C^\alpha$ in the RD 3D $\underline{H},\underline{C}$,(C-TOCSY—CO),N,HN NMR experiment and the RD 3D $\underline{H}^{\alpha/\beta},\underline{C}^{\alpha/\beta}$,N,HN NMR experiment.

In another embodiment, the protein sample could, in addition to the RD 3D $\underline{H},\underline{C}$,(C-TOCSY—CO),N,HN NMR experiment and the RD 3D $\underline{H}^{\alpha/\beta},\underline{C}^{\alpha/\beta}$,N,HN NMR experiment, be further subjected to a 3D HNNCACB NMR experiment to measure and connect the chemical shift value of $^{13}C^\beta_i$, $^{13}C^\alpha_i$, $^{15}N_i$, and $^1H^N_i$. Then, sequential assignments are obtained by matching the chemical shift values of $^{13}C^\beta_i$ and $^{13}C^\alpha_i$ measured by said 3D HNNCACB NMR experiment with the chemical shift values of $^{13}C^\beta_{i-1}$ and $^{13}C^\alpha_{i-1}$ measured by the RD 3D $\underline{H},\underline{C}$,(C-TOCSY—CO),N,HN NMR experiment.

In another embodiment, the protein sample could, in addition to the RD 3D $\underline{H},\underline{C}$,(C-TOCSY—CO),N,HN NMR experiment and the RD 3D $\underline{H}^{\alpha/\beta},\underline{C}^{\alpha/\beta}$,N,HN NMR experiment, be further subjected to a RD 2D $\underline{HB,CB}$,(CG,CD),HD NMR experiment to measure and connect the chemical shift values of $^1H^\beta_i$, $^{13}C^\beta_i$, and a δ-proton of amino acid residue i with an aromatic side chain, $^1H^\delta_i$. Then, sequential assignments are obtained by matching the chemical shift values of $^1H^\beta_i$ and $^{13}C^\beta_i$ measured by said RD 2D $\underline{HB,CB}$,(CG,CD)ND NMR experiment with the chemical shift values of $^1H^\beta$ and $^{13}C^\beta$ measured by the RD 3D $\underline{H}^{\alpha/\beta},\underline{C}^{\alpha/\beta}$,N,HN NMR experiment and the RD 3D $\underline{H},\underline{C}$,(C-TOCSY—CO),N,HN NMR experiment, using the chemical shift values to identify amino acid residue i as having an aromatic side chain, and mapping sets of sequentially connected chemical shift values to the amino acid sequence of the polypeptide chain and locating amino acid residues with aromatic side chains along the polypeptide chain.

In another embodiment, the protein sample could, in addition to the RD 3D $\underline{H},\underline{C}$,(C-TOCSY—CO),N,HN NMR experiment and the RD 3D $\underline{H}^{\alpha/\beta},\underline{C}^{\alpha/\beta}$,N,HN NMR experiment, be further subjected to a RD 3D $\underline{H},\underline{C}$, C,H—COSY NMR experiment or a RD 3D $\underline{H},\underline{C}$,C,H-TOCSY NMR experiment to measure and connect the chemical shift values of aliphatic protons of amino acid residue i, $^1H^{ali}_i$, and aliphatic carbons of amino acid residue i, $^{13}C^{ali}_i$. Then, sequential assignments of the chemical shift values of $^1H^{ali}_i$ and $^{13}C^{ali}_i$, the chemical shift values of a γ-proton, $^1H^\gamma_i$, and a γ-carbon, $^{13}C^\gamma_i$, in particular, are obtained by (i) matching the chemical shift values of $^1H^{ali}_i$ and $^{13}C^{ali}_i$ measured using the RD 3D $\underline{H},\underline{C}$,C,H—COSY NMR experiment or the RD 3D $\underline{H},\underline{C}$,C,H-TOCSY NMR experiment with the chemical shift values of $^1H^{ali}$ and $^{13}C^{ali}$ measured by the RD 3D $\underline{H},\underline{C}$,(C-TOCSY—CO),N,HN NMR experiment and RD 3D $\underline{H}^{\alpha/\beta},\underline{C}^{\alpha/\beta}$,N,HN NMR experiment, and (ii) using the chemical shift values of $^1H^{ali}_i$ and $^{13}C^{ali}_i$, the chemical shift values of $^1H^\gamma_i$ and $^{13}C^\gamma_i$ in particular, to identify the type of amino acid residue i.

The present invention also relates to a method for sequentially assigning chemical shift values of aliphatic protons, $^1H^{ali}$, aliphatic carbons, $^{13}C^{ali}$, a polypeptide backbone amide nitrogen, $^{15}N$, and a polypeptide backbone amide proton, $^1H^N$, of a protein molecule. The method involves providing a protein sample and conducting a set of reduced dimensionality (RD) nuclear magnetic resonance (NMR) experiments on the protein sample including: (1) a RD 3D $\underline{H},\underline{C}$,(C-TOCSY—CO),N,HN NMR experiment to measure and connect the chemical shift values of the aliphatic protons of amino acid residue i–1, $^1H^{ali}_{i-1}$, the aliphatic carbons of amino acid residue i–1, $^{13}C^{ali}_{i-1}$, the polypeptide backbone amide nitrogen of amino acid residue i, $^{15}N_i$, and the polypeptide backbone amide proton of amino acid residue i, $^1H^N_i$ and (2) a RD 3D HNN$\underline{CAHA}$ NMR experiment to measure and connect the chemical shift values of the α-proton of amino acid residue i, $^1H^\alpha_i$, the α-carbon of amino acid residue i, $^{13}C^\alpha_i$, $^{15}N_i$, and $^1H^N_i$. Then, sequential assignments of the chemical shift values of $^1H^{ali}$, $^{13}C^{ali}$, $^{15}N$, and $^1H^N$ are obtained by (i) matching the chemical shift values of the α-proton of amino acid residue i–1, $^1H^\alpha_{i-1}$ and the α-carbon of amino acid residue i–1, $^{13}C^\alpha_{i-1}$ with the chemical shift values of $^1H^\alpha$ and $^{13}C^\alpha$, (ii) using the chemical shift values of $^1H^{ali}_{i-1}$ and $^{13}C^{ali}_{i-1}$ to identify the type of amino acid residue i–1 (Wüthrich, *NMR of Proteins*

*and Nucleic Acids*, Wiley, New York (1986); Grzesiek et al., *J. Biomol. NMR*, 3: 185–204 (1993), which are hereby incorporated by reference in their entirety), and (iii) mapping sets of sequentially connected chemical shift values to the amino acid sequence of the polypeptide chain and using the chemical shift values to locate secondary structure elements within the polypeptide chain (Spera et al., *J. Am. Chem. Soc.*, 113:5490–5492 (1991); Wishart et al., Biochemistry, 31:1647–1651, which are hereby incorporated by reference in their entirety).

In one embodiment, the protein sample could, in addition to the RD 3D $\underline{H},\underline{C}$,(C-TOCSY—CO),N,HN NMR experiment and the RD 3D HNN$\underline{CAHA}$ NMR experiment, be further subjected to a RD 3D $\underline{H}^{\alpha/\beta},\underline{C}^{\alpha/\beta}$,CO,HA NMR experiment to measure and connect the chemical shift values of a β-proton of amino acid residue i, $^1H^\beta_i$, a β-carbon of amino acid residue i, $^{13}C^\beta_i$, $^1H^\alpha_i$, $^{13}C^\alpha_i$, and a polypeptide backbone carbonyl carbon of amino acid residue i, $^{13}C'_i$. Then, sequential assignments of the chemical shift value of $^{13}C'_i$ are obtained by matching the chemical shift values of $^1H^\beta_i$, $^{13}C^\beta_i$, $^1H^\alpha_i$, and $^{13}C^\alpha_i$ measured by the RD 3D $\underline{H}^{\alpha/\beta}$, $\underline{C}^{\alpha/\beta}$,CO,HA NMR experiment with the sequentially assigned chemical shift values of $^1H^\beta$, $^{13}C^\beta$, $^1H^\alpha$, $^{13}C^\alpha$, $^{15}N$, and $^1H^N$ measured by the RD 3D $\underline{H},\underline{C}$,(C-TOCSY—CO),N,HN NMR experiment and the RD 3D HNN$\underline{CAHA}$ NMR experiment.

In another embodiment, the protein sample could, in addition to the RD 3D $\underline{H},\underline{C}$,(C-TOCSY—CO),N,HN NMR experiment and the RD 3D HNN$\underline{CAHA}$ NMR experiment, be further subjected to a RD 3D HNN<$\underline{CO,CA}$> NMR experiment to measure and connect the chemical shift values of a polypeptide backbone carbonyl carbon of amino acid residue i–1, $^{13}C'_{i-1}$, $^{13}C^\alpha_i$, $^{15}N_i$, and $^1H^N_i$. Then, sequential assignments of the chemical shift value of $^{13}C'_{i-1}$ are obtained by matching the chemical shift value of $^{13}C^\alpha_i$ measured by the RD 3D HNN<$\underline{CO,CA}$> NMR experiment with the sequentially assigned chemical shift values of $^{13}C^\alpha$, $^{15}N$, and $^1H^N$ measured by the RD 3D $\underline{H},\underline{C}$,(C-TOCSY—CO),N,HN NMR experiment and the RD 3D HNN$\underline{CAHA}$ NMR experiment.

In another embodiment, the protein sample could, in addition to the RD 3D $\underline{H},\underline{C}$,(C-TOCSY—CO),N,HN NMR experiment and the RD 3D HNN$\underline{CAHA}$ NMR experiment, be further subjected to (i) a RD 3D $\underline{H}^{\alpha/\beta},\underline{C}^{\alpha/\beta}$,CO,HA NMR experiment to measure and connect the chemical shift values of a β-proton of amino acid residue i, $^1H^\beta_i$, a β-carbon of amino acid residue i, $^{13}C^\beta_i$, the α-proton of amino acid residue i, $^1H^\alpha_i$, the α-carbon of amino acid residue i, $^{13}C^\alpha_i$, and a polypeptide backbone carbonyl carbon of amino acid residue i, $^{13}C'_i$, and (ii) a RD 3D HNN<$\underline{CO,CA}$> NMR experiment to measure and connect the chemical shift values of $^{13}C'_i$, an α-carbon of amino acid residue i+1, $^{13}C^\alpha_{i+1}$, a polypeptide backbone amide nitrogen of amino acid residue i+1, $^{15}N_{i+1}$, and the polypeptide backbone amide proton of amino acid residue i+1, $^1H^N_{i+1}$. Then, sequential assignments are obtained by matching the chemical shift value of $^{13}C'_i$ measured by the RD 3D HNN<$\underline{CO,CA}$> NMR experiment with the chemical shift value of $^{13}C'_i$ measured by the RD 3D $\underline{H}^{\alpha/\beta},\underline{C}^{\alpha/\beta}$,CO,HA NMR experiment.

In another embodiment, the protein sample could, in addition to the RD 3D $\underline{H},\underline{C}$,(C-TOCSY—CO),N,HN NMR experiment and the RD 3D HNN$\underline{CAHA}$ NMR experiment, be further subjected to a RD 3D $H^{\alpha/\beta}C^{\alpha/\beta}$(CO)NHN NMR experiment (i) to measure and connect the chemical shift values of the α- and β-protons of amino acid residue i–1, $^1H^{\alpha/\beta}_{i-1}$, the α- and β-carbons of amino acid residue i–1, $^{13}C^{\alpha/\beta}_{i-1}$, $^{15}N_i$, and $^1H^N_i$, and (ii) to distinguish NMR signals for the chemical shift values of $^1H^\beta_{i-1}$, $^{13}C^\beta_{i-1}$, $^1H^\alpha_{i-1}$, and $^{13}C^\alpha_{i-1}$ measured by the RD 3D $\underline{H}^{\alpha/\beta\zeta\alpha/\beta}$(CO)NHN NMR experiment from NMR signals for the chemical shift values of $^1H^{ali}_{i-1}$ and $^{13}C^{ali}_{i-1}$ other than $^1H^{\alpha/\beta}_{i-1}$ and $^{13}C^{\alpha/\beta}_{i-1}$ measured by the RD 3D $\underline{H}$,$\underline{C}$,(C-TOCSY—CO),N,HN NMR experiment.

In another embodiment, the protein sample could, in addition to the RD 3D $\underline{H},\underline{C}$,(C-TOCSY—CO),N,HN NMR experiment and the RD 3D HNN$\underline{CAHA}$ NMR experiment, be further subjected to a RD 3D $\underline{H}^{\alpha/\beta},\underline{C}^{\alpha/\beta}$,N,HN NMR experiment to measure and connect the chemical shift values of $^1H^\beta_i$, $^{13}C^\beta_i$, $^1H^\alpha_i$, $^{13}C^\alpha_i$, $^{15}N_i$, and $^1H^N_i$. Then, sequential assignments are obtained by matching the chemical shift values of $^1H^\beta_i$, $^{13}C^\beta_i$, $^1H^\alpha_i$, and $^{13}C^\alpha_i$ measured by said RD 3D $\underline{H}^{\alpha/\beta},\underline{C}^{\alpha/\beta}$,N,HN NMR experiment with the chemical shift values of $^1H^\beta_{i-1}$, $^-C^\beta_{i-}$, $^1H^\alpha_{i-1}$, and $^{13}C^\alpha_{i-1}$ measured by the RD 3D $\underline{H}$, $\underline{C}$(C-TOCSY—CO),N,HN NMR experiment.

In another embodiment, the protein sample could, in addition to the RD 3D $\underline{H},\underline{C}$,(C-TOCSY—CO),N,HN NMR experiment and the RD 3D HNN$\underline{CAHA}$ NMR experiment, be further subjected to a 3D HNNCACB NMR experiment to measure and connect the chemical shift values of $^{13}C^\beta_i$, $^{13}C^\alpha_i$, $^{15}N_i$, and $^1H^N_i$. Then, sequential assignments are obtained by matching the chemical shift values of $^{13}C^\beta_i$ and $^{13}C^\alpha_i$ measured by said 3D HNNCACB NMR experiment with the chemical shift values of $^{13}C^\beta_{i-1}$ and $^{13}C^\alpha_{i-1}$ measured by the RD 3D $\underline{H},\underline{C}$,(C-TOCSY—CO),N,HN NMR experiment.

In another embodiment, the protein sample could, in addition to the RD 3D $\underline{H},\underline{C}$,(C-TOCSY—CO),N,HN NMR experiment and the RD 3D HNN$\underline{CAHA}$ NMR experiment, be further subjected to a RD 2D $\underline{HB},\underline{CB}$,(CG,CD),HD NMR experiment to measure and connect the chemical shift values of $^1H^\beta_i$, $^{13}C^\beta_i$, and a δ-proton of amino acid residue i with an aromatic side chain, $^1H^\delta_i$. Then, sequential assignments are obtained by matching the chemical shift values of $^1H^\beta_i$ and $^{13}C^\beta_i$ measured by said RD 2D $\underline{HB},\underline{CB}$,(CG,CD),HD NMR experiment with the chemical shift values of $^1H^\beta$ and $^{13}C^\beta$ measured by the RD 3D $\underline{H},\underline{C}$,(C-TOCSY—CO),N,HN NMR experiment, using the chemical shift values to identify amino acid residue i as having an aromatic side chain, and mapping sets of sequentially connected chemical shift values to the amino acid sequence of the polypeptide chain and by locating amino acid residues with aromatic side chains along the polypeptide chain.

In another embodiment, the protein sample could, in addition to the RD 3D $\underline{H},\underline{C}$,(C-TOCSY—CO),N,HN NMR experiment and the RD 3D HNN$\underline{CAHA}$ NMR experiment, be further subjected to a RD 3D $\underline{H},$C,C,H—COSY NMR experiment or a RD 3D $\underline{H},$C,C,H-TOCSY NMR experiment to measure and connect the chemical shift values of aliphatic protons of amino acid residue i, $^1H^{ali}_i$, and aliphatic carbons of amino acid residue i, $^{13}C^{ali}_i$. Then, sequential assignments of the chemical shift values of $^1H^{ali}_i$ and $^{13}C^{ali}_i$, the chemical shift values of a γ-proton, $^1H^\gamma_i$, and a γ-carbon, $^{13}C^\gamma_i$, in particular, are obtained by (i) matching the chemical shift values of $^1H^{ali}$ and $^{13}C^{ali}$ measured using the RD 3D $\underline{H}$, $\underline{C}$,C,H—COSY NMR experiment or the RD 3D $\underline{H}$, $\underline{C}$,C,H-TOCSY NMR experiment with the chemical shift values of $^1H^\beta_i$, $^{13}C^\beta_i$, $^1H^\alpha_i$, and $^{13}C^\alpha_i$ measured by the RD 3D $\underline{H},\underline{C}$,(C-TOCSY—CO),N,HN NMR experiment and the RD 3D HNN$\underline{CAHA}$ NMR experiment, and (ii) using the chemical shift values of $^1H^{ali}_i$ and $^{13}C^{ali}_i$, the chemical shift values of $^1H^\gamma_i$ and $^{13}C^{65}_i$ in particular, to identify the type of amino acid residue i.

Another aspect of the present invention involves a method for obtaining nearly complete assignments of chemical shift values of $^{1}$H, $^{13}$C and $^{15}$N of a protein molecule (excluding only chemical shift values of $^{13}$C$^{\delta}$ and $^{15}$N$^{\epsilon 2}$ of glutamines, of $^{13}$C$^{\gamma}$ and $^{15}$N$^{\delta 2}$ of asparagines, of $^{13}$C$^{\epsilon 3}$, $^{1}$H$^{\epsilon 3}$, $^{13}$C$^{\zeta 2}$, $^{1}$H$^{\zeta 2}$, $^{13}$C$^{\zeta 3}$, $^{1}$H$^{\zeta 3}$, $^{13}$C$^{\eta 2}$, and $^{1}$H$^{\eta 2}$ groups of tryptophans, of $^{13}$C$^{\epsilon}$ and $^{1}$H$^{\epsilon}$ of methionines, and of labile sidechain protons that exchange rapidly with the protons of the solvent water) (Yamazaki et al., *J. Am. Chem. Soc.*, 115:11054–11055 (1993), which is hereby incorporated by reference in its entirety), which are required for the determination of the tertiary structure of a protein in solution (Wüthrich, *NMR of Proteins and Nucleic Acids*, Wiley, New York (1986), which is hereby incorporated by reference in its entirety). The method involves providing a protein sample and conducting four reduced dimensionality (RD) nuclear magnetic resonance (NMR) experiments on the protein sample, where (1) a first experiment is selected from the group consisting of a RD three-dimensional (3D) H̱$^{\alpha/\beta}$C̱$^{\alpha/\beta}$(CO)NHN NMR experiment, a RD 3D H̱A,C̱A,(CO),N,HN NMR experiment, and a RD 3D H̱,C̱,(C-TOCSY—CO),N,HN NMR experiment for obtaining sequential correlations of chemical shift values; (2) a second experiment is selected from the group consisting of a RD 3D HNNC̱AH̱A NMR experiment, a RD 3D H̱$^{\alpha/\beta}$,C̱$^{\alpha/\beta}$,N,HN NMR experiment, and a RD 3D HNN<C̱O,C̱A experiment for obtaining intraresidue correlations of chemical shift values; (3) a third experiment is a RD 3D H̱,C̱,C,H—COSY NMR experiment for obtaining assignments of aliphatic and aromatic sidechain chemical shift values; and (4) a fourth experiment is a RD 2D H̱B, C̱B,(CG,CD),HD NMR experiment for obtaining assignments of aromatic sidechain chemical shift values.

In one embodiment of this method, the protein sample could be further subjected to a RD 2D H̱,C,H—COSY NMR experiment for obtaining assignments of aliphatic and aromatic sidechain chemical shift values.

In another embodiment of this method, the first experiment is the RD 3D H̱$^{\alpha/\beta}$C̱$^{\alpha/\beta}$(CO)NHN NMR experiment and the second experiment is the RD 3D HNNC̱AH̱A NMR experiment.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a RD 3D H̱A,C̱A,(CO),N,HN NMR experiment to distinguish between NMR signals for $^{1}$H$^{\alpha}$/$^{13}$C$^{\alpha}$ and $^{1}$H$^{\beta}$/$^{13}$C$^{\beta}$ from the RD 3D H̱$^{\alpha/\beta}$C̱$^{\alpha/\beta}$(CO)NHN NMR experiment.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a RD 3D H̱,C̱,(C-TOCSY—CO),N,HN NMR experiment to obtain assignments of chemical shift values of $^{1}$H$^{ali}$ and $^{13}$C$^{ali}$.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a RD 3D H̱$^{\alpha/\beta}$,C̱$^{\alpha/\beta}$,N,HN NMR experiment to obtain assignments of chemical shift values of $^{1}$H$^{\beta}$ and $^{13}$C$^{\beta}$.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a RD 3D HNN<C̱O,C̱A> NMR experiment to obtain assignments of chemical shift values of polypeptide backbone carbonyl carbons, $^{13}$C'.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a RD 3D H̱$^{\alpha/\beta}$,C̱$^{\alpha/\beta}$,CO,HA NMR experiment to obtain assignments of chemical shift values of polypeptide backbone carbonyl carbons, $^{13}$C'.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a RD 3D HNN<C̱O,C̱A> NMR experiment and a RD 3D H̱$^{\alpha/\beta}$,C̱$^{\alpha/\beta}$,CO,HA NMR experiment to obtain assignments of chemical shift values of $^{13}$C'.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a RD 3D H̱,C̱,C,H-TOCSY NMR experiment to obtain assignments of chemical shift values of $^{1}$H and $^{13}$C of aliphatic sidechains.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a RD 3D H̱,C̱,C,H-TOCSY NMR experiment to obtain assignments of chemical shift values of $^{1}$H and $^{13}$C of aromatic sidechains.

In another embodiment, the protein sample could, in addition to the RD 3D H̱$^{\alpha/\beta}$C̱$^{\alpha/\beta}$(CO)NHN NMR experiment, RD 3D HNNC̱AH̱A NMR experiment, RD 3D H̱, C̱,C,H—COSY NMR experiment, and RD 2D H̱B, C̱B,(CG,CD),HD NMR experiment, be further subjected to a 3D HNNCACB NMR experiment to obtain assignments of chemical shift values of $^{13}$C$^{\beta}$.

In yet another embodiment of this method, the first experiment is the RD 3D H̱,C̱,(C-TOCSY—CO),N,HN NMR experiment and the second experiment is the RD 3D HNNC̱AH̱A NMR experiment.

In another embodiment, the protein sample could, in addition to the RD 3D H̱,C̱,(C-TOCSY—CO),N,HN NMR experiment, RD 3D HNNC̱AH̱A NMR experiment, RD 3D H̱,C̱,C,H—COSY NMR experiment, and RD 2D H̱B, C̱B,(CG,CD),HD NMR experiment, be further subjected to a RD 3D H̱A,C̱A,(CO),N,HN NMR experiment to identify NMR signals for $^{1}$H$^{\alpha}$/$^{13}$C$^{\alpha}$ in the RD 3D H̱, C̱,(C-TOCSY—CO),N,HN NMR experiment.

In another embodiment, the protein sample could, in addition to the RD 3D H̱,C̱,(C-TOCSY—CO),N,HN NMR experiment, RD 3D HNNC̱AH̱A NMR experiment, RD 3D H̱,C̱,C,H—COSY NMR experiment, and RD 2D H̱B, C̱B,(CG,CD),HD NMR experiment, be further subjected to a RD 3D H̱$^{\alpha/\beta}$,C̱$^{\alpha/\beta}$,N,HN NMR experiment to obtain assignments of chemical shift values of $^{1}$H$^{\beta}$ and $^{13}$C$^{\beta}$.

In another embodiment, the protein sample could, in addition to the RD 3D H̱,C̱,(C-TOCSY—CO),N,HN NMR experiment, RD 3D HNNC̱AH̱A NMR experiment, RD 3D H̱,C̱,C,H—COSY NMR experiment, and RD 2D H̱B, CB,(CG,CD),HD NMR experiment, be further subjected to a RD 3D HNN<CO,CA> NMR experiment to obtain assignments of chemical shift values of polypeptide backbone carbonyl carbons, $^{13}C'$.

In another embodiment, the protein sample could, in addition to the RD 3D H,C,(C-TOCSY—CO),N,HN NMR experiment, RD 3D HNNCAHA NMR experiment, RD 3D H,C,C,H—COSY NMR experiment, and RD 2D HB, CB,(CG,CD),HD NMR experiment, be further subjected to a RD 3D $H^{\alpha/\beta},C^{\alpha/\beta}$,CO,HA NMR experiment to obtain assignments of chemical shift values of polypeptide backbone carbonyl carbons, $^{13}C'$.

In another embodiment, the protein sample could, in addition to the RD 3D H,C,(C-TOCSY—CO),N,HN NMR experiment, RD 3D HNNCAHA NMR experiment, RD 3D H,C,C,H—COSY NMR experiment, and RD 2D HB, CB,(CG,CD),HD NMR experiment, be further subjected to a RD 3D HNN<CO,CA> NMR experiment and a RD 3D $H^{\alpha\alpha},C^{\alpha/\beta}$,CO,HA NMR experiment to obtain assignments of chemical shift values of $^{13}C'$.

In another embodiment, the protein sample could, in addition to the RD 3D H,C,(C-TOCSY—CO),N,HN NMR experiment, RD 3D HNNCAHA NMR experiment, RD 3D H,C,C,H—COSY NMR experiment, and RD 2D HB, CB,(CG,CD),HD NMR experiment, be further subjected to a RD 3D H,C,C,H-TOCSY NMR experiment to obtain assignments of chemical shift values of $^1H$ and $^{13}C$ of aliphatic sidechains.

In another embodiment, the protein sample could, in addition to the RD 3D H,C,(C-TOCSY—CO),N,HN NMR experiment, RD 3D HNNCAHA NMR experiment, RD 3D H,C,C,H—COSY NMR experiment, and RD 2D HB, CB,(CG,CD),HD NMR experiment, be further subjected to a RD 3D H,C,C,H-TOCSY NMR experiment to obtain assignments of chemical shift values of $^1H$ and $^{13}C$ of aromatic sidechains.

In another embodiment, the protein sample could, in addition to the RD 3D H,C,(C-TOCSY—CO),N,HN NMR experiment, RD 3D HNNCAHA NMR experiment, RD 3D H,C,C,H—COSY NMR experiment, and RD 2D HB, CB,(CG,CD),HD NMR experiment, be further subjected to a 3D HNNCACB NMR experiment to obtain assignments of chemical shift values of $^{13}C^\beta$.

In yet another embodiment of this method, the first experiment is the RD 3D H,C,(C-TOCSY—CO),N,HN NMR experiment and the second experiment is the RD 3D $H^{\alpha/\beta},C^{\alpha/\beta}$,N,HN NMR experiment.

In another embodiment, the protein sample could, in addition to the RD 3D H,C,(C-TOCSY—CO),N,HN NMR experiment, RD 3D $H^{\alpha/\beta},C^{\alpha/\beta}$, N,HN NMR experiment, RD 3D H,C,C,H—COSY NMR experiment, and RD 2D HB, CB,(CG,CD),HD NMR experiment, be further subjected to a RD 3D HA,CA,(CO),N,HN NMR experiment to identify NMR signals for $^1H^\alpha$ and $^{13}C^\alpha$ in the RD 3D H, C,(C-TOCSY—CO),N,HN NMR experiment.

In another embodiment, the protein sample could, in addition to the RD 3D H,C,(C-TOCSY—CO),N,HN NMR experiment, RD 3D $H^{\alpha/\beta},C^{\alpha/\beta}$, N,HN NMR experiment, RD 3D H,C,C,H—COSY NMR experiment, and RD 2D HB, CB,(CG,CD),HD NMR experiment, be further subjected to a RD 3D $H^{\alpha/\beta}C^{\alpha/\beta}$(CO)NHN NMR experiment to identify NMR signals for $^1H^{\alpha/\beta}$ and $^{13}C^{\alpha/\beta}$ in the RD 3D H, C,(C-TOCSY—CO),N,HN NMR experiment.

In another embodiment, the protein sample could, in addition to the RD 3D H,C,(C-TOCSY—CO),N,HN NMR experiment, RD 3D $H^{\alpha/\beta},C^{\alpha/\beta}$,N,HN NMR experiment, RD 3D H,C,C,H—COSY NMR experiment, and RD 2D HB, CB,(CG,CD),HD NMR experiment, be further subjected to a RD 3D HNN<CO,CA> NMR experiment to obtain assignments of chemical shift values of polypeptide backbone carbonyl carbons, $^{13}C'$.

In another embodiment, the protein sample could, in addition to the RD 3D H,C,(C-TOCSY—CO),N,HN NMR experiment, RD 3D $H^{\alpha/\beta}, C^{\alpha/\beta}$,N,HN NMR experiment, RD 3D H,C,C,H—COSY NMR experiment, and RD 2D HB, CB,(CG,CD),HD NMR experiment, be further subjected to a RD 3D $H^{\alpha/\beta},C^{\alpha/\beta}$,CO,HA NMR experiment to obtain assignments of chemical shift values of polypeptide backbone carbonyl carbons, $^{13}C'$.

In another embodiment, the protein sample could, in addition to the RD 3D H,C,(C-TOCSY—CO),N,HN NMR experiment, RD 3D $H^{\alpha/\beta},C^{\alpha/\beta}$,N,HN NMR experiment, RD 3D H,C,C,H—COSY NMR experiment, and RD 2D HB, CB,(CG,CD),HD NMR experiment, be further subjected to a RD 3D HNN<CO,CA> NMR experiment and a RD 3D $H^{\alpha/\beta},C^{\alpha/\beta}$,CO,HA NMR experiment to obtain assignments of chemical shift values of $^{13}C'$.

In another embodiment, the protein sample could, in addition to the RD 3D H,C,(C-TOCSY—CO),N,HN NMR experiment, RD 3D $H^{\alpha/\beta},C^{\alpha/\beta}$,N,HN NMR experiment, RD 3D H,C,C,H—COSY NMR experiment, and RD 2D HB, CB,(CG,CD),HD NMR experiment, be further subjected to a RD 3D H,C,C,H-TOCSY NMR experiment to obtain assignments of chemical shift values of $^1H$ and $^{13}C$ of aliphatic sidechains.

In another embodiment, the protein sample could, in addition to the RD 3D H,C,(C-TOCSY—CO),N,HN NMR experiment, RD 3D $H^{\alpha/\beta},C^{\alpha/\beta}$,N,HN NMR experiment, RD 3D H,C,C,H—COSY NMR experiment, and RD 2D HB, CB,(CG,CD),HD NMR experiment, be further subjected to a RD 3D H,C,C,H-TOCSY NMR experiment to obtain assignments of chemical shift values of $^1H$ and $^{13}C$ of aromatic sidechains.

In another embodiment, the protein sample could, in addition to the RD 3D H,C,(C-TOCSY—CO),N,HN NMR experiment, RD 3D $H^{\alpha/\beta},C^{\alpha/\beta}$,N,HN NMR experiment, RD 3D H,C,C,H—COSY NMR experiment, and RD 2D HB, CB,(CG,CD),HD NMR experiment, be further subjected to a 3D HNNCACB NMR experiment to obtain assignments of chemical shift values of $^{13}C^\beta$.

In yet another embodiment of this method, the first experiment is the RD 3D H,C,(C-TOCSY—CO),N,HN NMR experiment and the second experiment is the RD 3D HNN<CO,CA> NMR experiment.

In another embodiment, the protein sample could, in addition to the RD 3D H,C,(C-TOCSY—CO),N,HN NMR experiment, RD 3D HNN<CO,CA> NMR experiment, RD 3D H,C,C,H—COSY NMR experiment, and RD 2D HB, CB,(CG,CD),HD NMR experiment, be further subjected to a RD 3D HA,CA,(CO),N,HN NMR experiment to identify NMR signals for $^1H^\alpha$ and $^{13}C^\alpha$ in the RD 3D H, C,(C-TOCSY—CO),N,HN NMR experiment.

In another embodiment, the protein sample could, in addition to the RD 3D H,C,(C-TOCSY—CO),N,HN NMR experiment, RD 3D HNN<CO,CA> NMR experiment, RD 3D H,C,C,H—COSY NMR experiment, and RD 2D HB, CB,(CG,CD),HD NMR experiment, be further subjected to a RD 3D $H^{\alpha/\beta}C^{\alpha/\beta}$(CO)NHN NMR experiment to identify NMR signals for $^1H^{\alpha/\beta}$ and $^{\alpha/\beta}$ in the RD 3D H, C,(C-TOCSY—CO),N,HN NMR experiment.

In another embodiment, the protein sample could, in addition to the RD 3D H,C,(C-TOCSY—CO),N,HN NMR experiment, RD 3D HNN<CO,CA> NMR experiment, RD 3D H,C,C,H—COSY NMR experiment, and RD 2D HB, CB,(CG,CD),HD NMR experiment, be further subjected to a RD 3D $\underline{H}^{\alpha/\beta},\underline{C}^{\alpha/\beta},CO,HA$ NMR experiment to obtain assignments of chemical shift values of polypeptide backbone carbonyl carbons, $^{13}C'$.

In another embodiment, the protein sample could, in addition to the RD 3D $\underline{H},\underline{C},(C\text{-TOCSY}—CO),N,HN$ NMR experiment, RD 3D HNN<$\underline{CO},\underline{CA}$> NMR experiment, RD 3D $\underline{H},\underline{C},C,H$—COSY NMR experiment, and RD 2D $\underline{HB},\underline{CB},(CG,CD),HD$ NMR experiment, be further subjected to a RD 3D $\underline{H},\underline{C},C,H$-TOCSY NMR experiment to obtain assignments of chemical shift values of $^1H$ and $^{13}C$ of aliphatic sidechains.

In another embodiment, the protein sample could, in addition to the RD 3D $\underline{H},\underline{C},(C\text{-TOCSY}—CO),N,HN$ NMR experiment, RD 3D HNN<$\underline{CO},\underline{CA}$> NMR experiment, RD 3D $\underline{H},\underline{C},C,H$—COSY NMR experiment, and RD 2D $\underline{HB},\underline{CB},(CG,CD),HD$ NMR experiment, be further subjected to a RD 3D $\underline{H},\underline{C},C,H$-TOCSY NMR experiment to obtain assignments of chemical shift values of $^1H$ and $^{13}C$ of aromatic sidechains.

In another embodiment, the protein sample could, in addition to the RD 3D $\underline{H},\underline{C},(C\text{-TOCSY}—CO),N,HN$ NMR experiment, RD 3D HNN<$\underline{CO},\underline{CA}$> NMR experiment, RD 3D $\underline{H},\underline{C},C,H$—COSY NMR experiment, and RD 2D $\underline{HB},\underline{CB},(CG,CD),HD$ NMR experiment, be further subjected to a 3D HNNCACB NMR experiment to obtain assignments of chemical shift values of $^{13}C^\beta$.

In addition, the above-described method for obtaining assignments of chemical shift values of $^1H$, $^{13}C$ and $^{15}N$ of a protein molecule can involve further subjecting the protein sample to nuclear Overhauser effect spectroscopy (NOESY) (Wüthrich, *NMR of Proteins and Nucleic Acids*, Wiley, New York (1986), which is hereby incorporated by reference in its entirety), to NMR experiments that measure scalar coupling constants (Eberstadt et al., *Angew. Chem. Int. Ed. Engl.*, 34:1671–1695 (1995); Cordier et al., *J. Am. Chem. Soc.*, 121:1601–1602 (1999), which are hereby incorporated by reference in their entirety), or to NMR experiments that measure residual dipolar coupling constants (Prestegard, *Nature Struct. Biol.*, 5:517–522 (1998); Tjandra et al., *Science*, 278:1111–1114 (1997), which are hereby incorporated by reference in their entirety), to deduce the tertiary fold or tertiary structure of the protein molecule.

A standard set of nine experiments (labeled with asterisks in Table 2) can be employed for obtaining nearly complete resonance assignments of proteins including aliphatic and aromatic side chain spin systems.

TABLE 2

NMR experiments acquired[a] for the 8.5 kDa protein "Z-domain"

| Experiment | Indirect[b] dimension(s) | $t_{max}$; Complex points [ms] | Measurement time [h] | Minimal[c] measurement time [h] with/without central peak |
|---|---|---|---|---|
| *3D spectra for sequential backbone connectivities:* | | | | |
| **$\underline{H}^{\alpha/\beta}\underline{C}^{\alpha/\beta}$(CO)NHN | $\omega_1(^{13}C^{\alpha/\beta})$ | 6.3; 95 | 9.2 | 4.6/2.3 |
| | $\omega_2(^{15}N)$ | 21.5; 28 | | |
| H$\underline{ACA}$(CO)NHN | $\omega_1(^{13}C^\alpha)$ | 6.5; 54 | 5.4/2.7[d] | 5.4/2.7 |
| | $\omega_2(^{15}N)$ | 21.5; 28 | | |
| $\underline{HC}$(C-TOCSY-CO)NHN[d] | $\omega_1(^{13}C^{\alpha/\beta})$ | 6.1; 90 | 17.9 | 4.5/2.3 |
| | $\omega_2(^{15}N)$ | 21.5; 28 | | |
| *3D spectra for intraresidual backbone connectivities:* | | | | |
| **HNN$\underline{CAHA}$ | $\omega_1(^{13}C^\alpha)$ | 6.6; 51 | 5.0 | 2.5/n.a. |
| | $\omega_2(^{15}N)$ | 21.5; 28 | | |
| *$\underline{H}^{\alpha/\beta}\underline{C}^{\alpha/\beta}$COHA | $\omega_1(^{13}C^{\alpha/\beta})$ | 6.3; 95 | 10.0 | 5.0/2.5 |
| | $\omega_2(^{13}C=O)$ | 17.8; 32 | | |
| $\underline{H}^{\alpha/\beta}\underline{C}^{\alpha/\beta}$NHN | $\omega_1(^{13}C^{\alpha/\beta})$ | 6.0; 90 | 17.1 | 4.3/2.2 |
| | $\omega_2(^{15}N)$ | 21.5; 28 | | |
| *HNNCACB | $\omega_1(^{13}C^{\alpha/\beta})$ | 6.6; 56 | 8.0 | n.a./2.0 |
| | $\omega_2(^{15}N)$ | 21.5; 28 | | |
| *3D spectrum for intra- and sequential backbone connectivities:* | | | | |
| *HNN<$\underline{CO},\underline{CA}$> | $\omega_1(^{13}C=O)$ | 8.0/16.0[e]; 54 | 5.5 | 2.8/n.a. |
| | $\omega_2(^{15}N)$ | 21.5; 28 | | |
| *3D spectra for assignment of aliphatic resonances:* | | | | |
| **$\underline{H}$CCH-COSY | $\omega_1(^{13}C)$ | 6.3; 95 | 6.2 | 3.1/1.6 |
| | $\omega_2(^{13}C)$ | 6.4; 20 | | |
| **$\underline{H}$CCH-TOCSY[f] | $\omega_1(^{13}C)$ | 6.3; 95 | 7.0 | 3.5/1.7 |
| | $\omega_2(^{13}C)$ | 6.4; 20 | | |
| *2D spectra for assignment of aromatic resonances:* | | | | |
| **H$\underline{BCB}$(CGCD)HD | $\omega_1(^{13}C)$ | 6.3; 95 | 5.3 | 0.1/0.05 |
| **$^1$H-TOCSY-$\underline{H}$CH-COSY[f] | $\omega_1(^{13}C)$ | 15; 150 | 3.4 | 0.2/n.a. |

[a]1 mM solution of "Z-domain" of *Staphylococcal* protein A[25] at T = 25° C. The $^1H$ carrier for $^1H$-frequency labeling in the projected "$\underline{HC}$"-dimensions was set to 0 ppm relative to DSS. $t_{max}$ denotes the maximal evolution time. Spectra forming a "standard set" that has been inferred from the present study (see text) are labeled with an asterisk (* or ), and those spectra which can be designated a "minimal" set are labeled with a double-asterisk ().
[b]Direct dimension: $t_{max}$ = 73 ms/512 complex points.

TABLE 2-continued

NMR experiments acquired[a] for the 8.5 kDa protein "Z-domain"

| Experiment | Indirect[b] dimension(s) | $t_{max}$; Complex points [ms] | Measurement time [h] | Minimal[c] measurement time [h] with/without central peak |
|---|---|---|---|---|

[c]The minimal measurement time (rounded) was calculated for the acquisition of a single transient per FID, either with (left number) or without (right number) acquisition of central peaks. Other spectral parameters were assumed to be unchanged. Note that central peak acquisition (Szyperski et al., *J. Am. Chem. Soc.*, 118:8146–8147 (1996), which is hereby incorporated by reference in its entirety) from $^{13}$C magnetization requires recording of two data sets that are added and subtracted to generate subspectra I and II.
[d]The mixing times for the $^{13}$C-TOCSY relay was set to 14 ms or 21 ms.
[e]The increment for $^{13}$C$^\alpha$ chemical shift evolution was scaled (Szyperski et al., *J. Am. Chem. Soc.*, 115:9307–9308 (1993); Szyperski et al., *J. Magn. Reson.*, B 108, 197–203 (1995), which are hereby incorporated by reference in their entirety) by a factor of 0.5 relative to the $^{13}$C=O evolution.
[f]The mixing time for the $^1$H-TOCSY relay was set to 25 ms.

For larger proteins, complementary recording of highly sensitive 3D H̲ACA(CO)NHN promises (i) to yield spin systems which escape detection in H̲$^{\alpha/\beta}$C̲$^{\alpha/\beta}$(CO)NHN, and (ii) to offer the distinction of α- and β-moiety resonances by comparison with H̲$^{\alpha/\beta}$C̲$^{\alpha/\beta}$(CO)NHN. Furthermore, employment of 50% random fractional protein deuteration (LeMaster, *Annu. Rev. Biophys. Biophys. Chem.*, 19:43–266 (1990); Nietlispach et al., *J. Am. Chem. Soc.*, 118:407–415 (1996); Shan et al., *J. Am. Chem. Soc.*, 118:6570–6579 (1996); Leiting et al., *Anal. Biochem.*, 265:351–355 (1998); Hochuli et al., *J. Biomol. NMR*, 17:33–42 (2000), which are hereby incorporated by reference in their entirety) in combination with the standard suite of NMR experiments (or transverse relaxation-optimized spectroscopy (TROSY) versions thereof) is attractive. The impact of deuteration for recording 4D H$^{\alpha/\beta}$C$^{\alpha/\beta}$(CO)NHN for proteins reorienting with correlation times up to around 20 ns (corresponding to a molecular weight around 30 kDa at ambient T) has been demonstrated (Nietlispach et al., *J. Am. Chem. Soc.*, 1 18:407–415 (1996), which is hereby incorporated by reference in its entirety). Accordingly, 3D H̲$^{\alpha/\beta}$C̲$^{\alpha/\beta}$(CO)NHN can be expected to maintain its pivotal role for obtaining complete resonance assignments (FIG. 4) for deuterated proteins at least up to about that size. Furthermore, protein deuteration offers the advantage that HNNCACB, which can be expected to become significantly less sensitive than HNN C̲AH̲A for larger non-deuterated systems, (Szyperski et al., *J. Biomol. NMR*, 11:387–405 (1998), which is hereby incorporated by reference in its entirety) can be kept to recruit $^{13}$C$^\beta$ chemical shifts for sequential assignment (Shan et al., *J. Am. Chem. Soc.*, 118:6570–6579 (1996), which is hereby incorporated by reference in its entirety).

If solely chemical shifts are considered, the unambiguous identification of peaks pairs is more involved whenever multiple peak pairs with degenerate chemical shifts in the other dimensions are present. The acquisition of the corresponding central peaks addresses this complication in a conceptually straightforward fashion. However, it is important to note that pairs of peaks generated by a chemical shift in-phase splitting have quite similar intensity. In contrast, peak pairs arising from different moieties, possible located in different amino acid residues, most often do not show similar intensity. This is because the nuclear spin relaxation times, which determine the peak intensities, vary within each residue as well as along the polypeptide chain. One may thus speak of a "nuclear spin relaxation time labeling" of peak pairs, which makes their identification an obvious task in most cases.

Using cryogenic probes can reduce NMR measurement times by about a factor of 10 or more (Flynn et al., *J. Am Chem. Soc.*, 122:4823–4824 (2000), which is hereby incorporated by reference in its entirety). Hence, the standard set of nine experiments (Table 2) could have been recorded with the same signal-to-noise ratios measured for the present study in about 6 hours using a cryogenic probe, i.e., the high sensitivity of cryogenic probes shifts even the recording of RD NMR experiments entirely into the sampling limited data acquisition regime. In view of this dramatic reduction in spectrometer time demand, minimally achievable RD NMR measurement times are of keen interest (Table 2) to be able to adapt the NMR measurement times to sensitivity requirements in future HTP endeavours.

If the standard set of experiments would have been recorded with a single transient per increment, 21.8 hours of spectrometer measurement time would have been required (Table 2). This is still about 3.5 times longer than the 6 hours alluded to above, which would be needed on a currently available cryogenic probe. To further reduce the measurement time, and in view of the aforementioned 'spin relaxation time labeling'of peak pairs', one may then decide to also discard the use of $^{13}$C-steady state magnetization for central peak detection. This would lead to a diminished requirement of 15.5 hours for the standard, or 8.1 hours for the minimal set of experiments (four projected 4D and two projected 3D spectra; Table 2). Hence, the measurement time of the minimal set of RD NMR experiments (which provides complete resonance assignments for Z-domain) could actually be neatly adjusted to the sensitivity requirements of a cryogenic probe.

Although RD NMR was proposed in 1993 (Szyperski et al., *J. Biomol. NMR*, 3:127–132 (1993); Szyperski et al., *J. Am. Chem. Soc.*, 115:9307–9308 (1993), which are hereby incorporated by reference in their entirety), its wide-spread use has been delayed by the more demanding spectral analysis when compared to conventional TR NMR. In particular, the necessity to extract chemical shifts from in-phase splittings suggests that strong computer support is key for employment of RD NMR on a routine basis. This can be readily addressed by using automated resonance assignment software for automated analysis of RD TR NMR data.

In conclusion, the joint employment of RD NMR spectroscopy, cryogenic probes, and automated backbone resonance assignment will allow one to determine a protein's backbone resonance assignments and secondary structure in a short time.

EXAMPLES

The following examples are provided to illustrate embodiments of the present invention but are by no means intended to limit its scope.

Example 1

Sample Preparation

NMR measurements were performed using a 1 mM solution of uniformly $^{13}C/^{15}N$ enriched "Z-domain" of the *Staphylococcal* protein A (Tashiro et al., *J. Mol. Biol.*, 272:573–590 (1997); Lyons et al., *Biochemistry*, 32:7839–7845 (1993), which are hereby incorporated by reference in their entirety) dissolved in 90% $D_2O$/10% $H_2O$ (20 mM K—$PO_4$) at pH=6.5.

Example 2

NMR Spectroscopy

Multidimensional NMR experiments (FIG. 1; Table 1) were recorded for a 1 mM solution of the 8.5 kDa protein "Z-domain" at a temperature of 25° C. The spectra (Table 2) were assigned, and the chemical shifts obtained from RD NMR (Table 3) were in very good agreement with those previously determined at 30° C. using conventional triple resonance (TR) NMR spectroscopy (Tashiro et al., *J. Mol. Biol.*, 272:573–590 (1997); Lyons et al., *Biochemistry*, 32:7839–7845 (1993), which are hereby incorporated by reference in their entirety).

TABLE 3

Chemical shifts of the Z-domain (in ppm relative to DSS) determined at T = 25° C.

| Residue | CO | N | HN | Hα(Cα) | Hβ(Cβ) | others |
|---|---|---|---|---|---|---|
| Q (−5) | 175.70 | 120.71 | 8.32 | 4.27(56.41) | 2.03(29.64) | γ 2.34(34.09), Hε 7.56, 6.83 Nε 114.05 |
| H (−4) | 173.89 | 120.71 | 8.41 | 4.67(55.74) | 3.26, 3.17(29.55) | δ 7.23(120.03) ε 8.55(135.92) |
| D (−3) | 176.03 | 123.72 | 8.39 | 4.61(54.56) | 2.70, 2.61(41.49) | |
| E (−2) | 176.19 | 123.39 | 8.52 | 4.25(57.16) | 2.06, 1.94(30.38) | γ 2.29(36.31) |
| A (−1) | 177.93 | 125.73 | 8.27 | 4.28(53.01) | 1.38(19.41) | |
| V1 | 175.77 | 119.71 | 7.86 | 3.83(62.70) | 1.96(32.84) | γCH₃ 0.79(21.09) |
| D2 | 176.22 | 124.05 | 7.97 | 4.43(54.70) | 2.46(41.45) | |
| N3 | 175.18 | 120.71 | 8.14 | 4.53(54.10) | 2.59(39.05) | Hδ 7.49, 6.84 Hδ 114.20 |
| K4 | 176.55 | 121.04 | 8.20 | 4.17(57.02) | 1.69(32.57) | γ 1.25(24.88), δ 1.60(29.19), ε 2.94(42.30) |
| F5 | 176.72 | 120.38 | 7.85 | 5.05(55.43) | 3.38, 3.12(40.06) | δ 7.05(131.08) ε 7.05(130.34) ζ 7.27(128.84) |
| N6 | 175.64 | 122.05 | 8.43 | 4.74(52.14) | 3.34, 2.96(38.29) | Hδ 7.48, 6.91 Nδ 111.78 |
| K7 | 178.37 | 120.38 | 8.32 | 4.00(60.16) | 1.86(32.41) | γ 1.52(24.96), δ 1.71(29.28), ε 3.05(42.46) |
| E8 | 179.90 | 121.05 | 8.21 | 4.17(59.81) | 2.11(29.23) | γ 2.32(36.72) |
| Q9 | 177.58 | 123.05 | 8.51 | 3.92(58.92) | 2.49(27.33) | γ 1.56(33.95), Hε 7.25, 6.95 Nε 112.40 |
| Q10 | 178.22 | 120.71 | 8.75 | 3.96(59.28) | 2.17(28.80) | γ 2.42(33.87), Hε 7.23, 6.99 Nε 113.23 |
| N11 | 177.32 | 119.38 | 8.29 | 4.62(56.51) | 2.93(38.45) | Hδ 7.73, 7.04 Nδ 113.99 |
| A12 | 178.05 | 124.05 | 7.89 | 4.10(55.68) | 1.47(18.58) | |
| F13 | 176.01 | 119.38 | 8.14 | 3.80(61.32) | 3.32, 2.97(39.28) | δ 6.93(131.09) ε 7.22(131.92) |
| Y14 | 178.68 | 118.37 | 8.17 | 3.96(62.41) | 3.95(38.48) | δ 7.15(133.20) ε 6.73(117.95) |
| E15 | 180.29 | 120.71 | 8.54 | 4.02(60.50) | 2.15(30.03) | γ 2.46(36.87) |
| I16 | 177.82 | 121.05 | 8.41 | 3.40(65.92) | 1.78(37.76) | γ 1.78(30.59), γCH₃ 0.76(18.21), δCH₃ 0.53(12.90) |
| L17 | 176.92 | 119.04 | 7.88 | 3.70(57.52) | 1.13(42.28) | γ 1.33(26.62), γCH₃ 0.65(23.99), 0.55(24.91) |
| H18 | 174.46 | 113.36 | 7.22 | 4.52(55.86) | 3.47, 2.85(29.54) | δ 7.09(120.03) ε 8.30(135.54) |
| L19 | | 126.06 | 7.22 | 4.49(53.55) | 1.72, 1.38(40.50) | γ (26.62), γCH₃ 0.86(23.57), 0.67(27.29) |
| P20 | 177.98 | | | 4.22(65.41) | 2.02(32.83) | γ 2.04(27.59), δ 4.07,3.81(51.79) |
| N21 | 176.18 | 115.37 | 8.88 | 5.02(52.94) | 2.91(39.08) | Hδ 7.43, 6.87 Nδ 116.28 |
| L22 | 176.42 | 119.04 | 6.49 | 4.43(54.55) | 1.69, 1.62(43.35) | γ 1.69(27.57), γCH₃ 0.96(24.77), 0.88(22.60) |
| N23 | 175.70 | 120.71 | 8.53 | 4.92(51.58) | 3.28, 2.84(39.03) | Hδ 7.51, 7.43 Nδ 113.50 |
| E24 | 178.14 | 119.71 | 8.60 | 3.96(60.00) | 1.97(29.79) | γ 2.36(36.18) |
| E25 | 180.10 | 121.04 | 8.23 | 4.07(60.06) | 2.07(29.19) | γ 2.30(36.80) |
| Q26 | 178.35 | 121.38 | 8.49 | 3.99(58.18) | 2.48(29.42) | γ 2.34(34.26), Hε 8.26, 7.65 Nε 114.39 |
| R27 | 177.75 | 120.38 | 8.55 | 3.79(60.89) | 1.74(30.89) | γ 1.73, 1.48(26.92), 3.41, 3.23(43.15) Hε 7.63 |
| N28 | 177.64 | 116.70 | 8.46 | 4.40(56.14) | 2.79(38.13) | Hδ 7.59, 6.90 Nδ 114.23 |
| A29 | 180.88 | 124.72 | 7.85 | 4.18(55.42) | 1.34(18.11) | |
| F30 | 177.98 | 118.37 | 7.96 | 4.37(62.55) | 3.09, 2.99(40.05) | δ 7.27(131.76) ε 7.12(131.50) |
| I31 | 177.60 | 120.04 | 8.27 | 3.79(64.35) | 2.11(36.97) | γ 1.36(28.96), γCH₃ 0.98(17.98), δCH₃ 0.63(12.31) |
| Q32 | 178.23 | 121.05 | 8.39 | 3.96(58.92) | 2.22(28.52) | γ 2.52(34.04), Hε 7.84, 6.94 Nε 117.88 |
| S33 | 175.95 | 116.70 | 8.06 | 4.28(62.87) | 3.99(63.70) | |
| L34 | 177.34 | 125.73 | 8.10 | 3.77(58.02) | 1.92(42.63) | γ 1.64(27.41), δCH₃ 0.78(25.39) |
| K35 | 178.97 | 117.04 | 8.00 | 4.02(59.81) | 1.95(32.96) | γ 1.62(25.34), δ 1.70(29.84), ε 2.84(42.17) |
| D36 | 177.29 | 119.38 | 8.13 | 4.41(56.88) | 2.78, 2.71(41.18) | |
| D37 | | 115.37 | 7.57 | 4.92(51.87) | 2.58(40.38) | |
| P38 | 178.35 | | | 4.50(64.78) | 2.23, 1.97(32.22) | γ 2.24, 2.11(27.47), δ 3.87, 3.70(50.49) |
| S39 | 176.14 | 114.36 | 8.01 | 4.34(61.56) | 4.05(63.71) | |
| Q40 | 176.23 | 121.72 | 7.85 | 4.61(55.31) | 2.65(28.41) | γ 2.45, 2.32(33.92), Hε 7.59, 6.86 Nε 115.77 |
| S41 | 174.15 | 117.04 | 7.77 | 3.73(63.72) | 4.02(62.58) | |
| A42 | 180.94 | 124.72 | 8.46 | 4.16(55.83) | 1.43(18.38) | |
| N43 | 177.79 | 120.05 | 7.89 | 4.54(56.08) | 2.89(38.44) | Hδ 7.76, 7.00 Nδ 114.50 |
| L44 | 178.26 | 123.05 | 8.58 | 4.18(58.02) | 1.79, 1.26(42.71) | γ 1.87(27.41), δCH₃ 1.11(23.48), 0.78(26.24) |
| L45 | 177.86 | 120.38 | 8.41 | 3.85(58.08) | 1.90(42.24) | γ 1.53(25.34), δCH₃ 0.90(25.23)) |

TABLE 3-continued

Chemical shifts of the Z-domain (in ppm relative to DSS) determined at T = 25° C.

| Residue | CO | N | HN | Hα(Cα) | Hβ(Cβ) | others |
|---|---|---|---|---|---|---|
| A46 | 181.15 | 121.05 | 7.59 | 4.05(55.51) | 1.55(18.28) | |
| E47 | 178.88 | 120.71 | 8.05 | 4.04(59.25) | 2.71(29.77) | γ 2.50(35.93) |
| A48 | 179.50 | 125.39 | 8.45 | 3.48(55.56) | 0.50(17.74) | |
| K49 | 178.64 | 119.71 | 8.48 | 3.79(60.48) | 1.94(32.39) | γ 1.49(27.13), δ 1.67(30.24), ε 2.89(42.27) |
| K50 | 179.71 | 121.38 | 7.67 | 4.11(59.90) | 1.96(32.81) | γ 1.42(25.18), δ 1.73(29.78), ε 2.98(42.43) |
| L51 | 177.96 | 123.72 | 7.90 | 4.19(57.77) | 1.72(42.38) | γ 1.57(27.14), δCH$_3$ 1.01(25.15) |
| N52 | 177.46 | 118.37 | 8.55 | 3.97(58.07) | 3.11, 2.39(42.11) | Hδ 7.94, 6.85 Nδ 117.79 |
| D53 | 178.84 | 120.38 | 8.23 | 4.48(57.14) | 2.73(40.31) | |
| A54 | 179.27 | 124.39 | 8.00 | 4.24(54.56) | 1.61(18.81) | |
| Q55 | 174.02 | 116.37 | 7.52 | 4.40(55.23) | 1.82(28.58) | γ 2.65(36.08), Hε 8.74, 7.28 Nε 112.65 |
| A56 | | 126.06 | 7.10 | 4.36(51.14) | 1.45(17.92) | |
| P57 | 176.02 | | | 4.43(63.35) | 2.31, 1.97(32.16) | γ 2.08(27.72), δ 3.79, 3.65(50.86) |
| K58 | | 128.74 | 8.04 | 4.20(57.41) | 1.87(33.81) | γ 1, 46(24.94), δ 1.68(29.41), ε 3.02(42.11) |

NMR experiments were recorded at a temperature of 25° C. on a Varian Inova 600 spectrometer equipped with a new generation $^1$H{$^{13}$C, $^{15}$N} triple resonance probe which exhibits a signal-to-noise ratio of 1200:1 for a standard 0.1% ethylbenzene sample. At 25° C., the correlation time for the overall rotational reorientation of the Z-domain was 4.5 ns (as inferred from measurements of $T_{1\rho}/T_1$ polypeptide backbone $^{15}$N spin relaxation time ratios (Kay et al., Biochemistry, 28:8972–8979 (1989); Szyperski et al., J. Biomol. NMR, 3:151–164 (1993), which are hereby incorporated by reference in its entirety)). This value was well within the 3–10 ns range usually encountered for medium-sized proteins at ambient temperatures. Hence, the results obtained in the framework of the present study were representative for medium-sized systems in the molecular weight range from about 5 to 20 kDa. NMR spectra were processed and analyzed using the programs PROSA (Güntert et al., J. Biomol. NMR, 2:619–629 (1992), which is hereby incorporated by reference in its entirety) and XEASY (Bartels et al., J. Biomol. NMR, 6:1–10 (1995), which is hereby incorporated by reference in its entirety), respectively.

Specific embodiments of the 8 new RD NMR experiments disclosed by the present invention as well as 3 other RD NMR experiments that have previously been published, were implemented for the present study. FIG. 1 provides a survey of (i) the names, (ii) the magnetization transfer pathways and (iii) the peak patterns observed in the projected dimension of each of the 8 RD NMR experiments disclosed by the present invention as well as 3 other RD NMR experiments that have previously been published. The group comprising the first three experiments are designed to yield "sequential" connectivities via one-bond scalar couplings: 3D H$^{\alpha/\beta}$C$^{\alpha/\beta}$(CO)NHN (FIG. 1A; Szyperski et al., J. Magn. Reson., B 105: 188–191 (1994), which is hereby incorporated by reference in its entirety), 3D HACA(CO)NHN (FIG. 1B), and 3D HC(C-TOCSY—CO)NHN (FIG. 1C). The following three experiments provide "intraresidual" connectivities via one-bond scalar couplings: 3D HNNCAHA (FIG. 1D; Szyperski et al., J. Biomol. NMR, 11:387–405 (1998), which is hereby incorporated by reference in its entirety), 3D H$^{\alpha/\beta}$C$^{\alpha/\beta}$COHA (FIG. 1E), and 3D H$^{\alpha/\beta}$C$^{\alpha/\beta}$NHN (FIG. 1F). 3D HNN<CO,CA> (FIG. 1G; Szyperski et al., J. Magn. Reson., B 108: 197–203 (1995); Szyperski et al., J. Am. Chem. Soc., 118:8146–8147 (1996), which are hereby incorporated by reference in their entirety) offers both intraresidual $^1$H$^N$—$^{13}$C$^\alpha$ and sequential $^1$H$^N$—$^{13}$C' connectivities. Although 3D HNNCAHA (FIG. 1D), 3D H$^{\alpha/\beta}$C$^{\alpha/\beta}$NHN (FIG. 1F) and 3D HNN<CO,CA> (FIG. 1G) also provide sequential connectivities via two-bond $^{13}$C$^\alpha_{i-1}$—$^{15}$N$_i$ scalar couplings, those are usually smaller than the one-bond couplings (Cavanagh et al., Protein NMR Spectroscopy, Academic Press, San Diego, (1996), which is hereby incorporated by reference in its entirety), and obtaining complete backbone resonance assignments critically depends on experiments designed to provide sequential connectivities via one-bond couplings (FIGS. 1D–F). 3D HCCH—COSY (FIG. 1H) and 3D HCCH-TOCSY (FIG. 1I) allow one to obtain assignments for the "aliphatic" side chain spin systems, while 2D HBCB(CDCG)HD (FIG. 1J) and 2D $^1$H-TOCSY-relayed HCH—COSY (FIG. 1K) provide the corresponding information for the "aromatic" spin systems.

The RD NMR experiments are grouped accordingly in Table 1, which lists for each experiment (i) the nuclei for which the chemical shifts are measured, (ii) if and how the central peaks are acquired and (iii) additional notable technical features. State-of-the art implementations (Cavanagh et al., Protein NMR Spectroscopy, Academic Press, San Diego, (1996); Kay, J. Am. Chem. Soc., 115:2055–2057 (1993); Grzesiek et al., J. Magn. Reson., 99:201–207 (1992); Montelione et al., J. Am. Chem. Soc., 114:10974–10975 (1992); Boucher et al., J. Biomol. NMR, 2:631–637 (1992); Yamazaki et al., J. Am. Chem. Soc., 115:11054–11055 (1993); Zerbe et al., J. Biomol. NMR, 7:99–106 (1996); Grzesiek et al., J. Biomol. NMR, 3:185–204 (1993), which are hereby incorporated by reference in their entirety) making use of pulsed field z-gradients for coherence selection and/or rejection, and sensitivity enhancement (Cavanagh et al., Protein NMR Spectroscopy, Academic Press, San Diego, (1996), which is hereby incorporated by reference in its entirety) were chosen, which allow executing these experiments with a single transient per acquired free induction decay (FID). Semi (Grzesiek et al., J. Biomol. NMR, 3:185–204 (1993), which is hereby incorporated by reference in its entirety) constant-time (Cavanagh et al., Protein NMR Spectroscopy, Academic Press, San Diego, (1996), which is hereby incorporated by reference in its entirety) chemical shift frequency-labeling modules were used throughout in the indirect dimensions in order to minimize losses arising from transverse nuclear spin relaxation. FIGS. 2A–2K provide comprehensive descriptions of the RD NMR r.f. pulse sequences including eight previously unpublished RD NMR r.f. pulse schemes.

The maximal chemical shift evolution times, which largely determine the spectral resolution, as well as the measurement times invested for the present study (between 2.7 and 17.1 hours per spectrum) are given in Table 2. The S/N ratio achieved per unit of measurement time, i.e., the sensitivity, shows only little dependence on the relaxation delay between scans, $T_{del}$, provided that $0.7 \cdot T_1 < T_{del} < 1.5 \cdot T_1$ (Abragam, *Principles of Nuclear Magnetism.*, Clarendon Press:Oxford (1986); Ernst et al., *Principles of Nuclear Magnetic Resonance in One and Two Dimensions*, Clarendon Press:Oxford (1987), which are hereby incorporated by reference in their entirety). Hence, $T_{rel}$ was set to rather short values around 0.7 seconds. Furthermore, to ensure efficient comparison of peak patterns and shapes manifested along the projected dimension in the various spectra, the RD NMR experiments in which $^1H$ and $^{13}C$ are jointly observed in the projected dimension ("HC"-type experiments; FIG. 1) were acquired with virtually the same maximal evolution time in $t_1(^{13}C)$.

In total, fourteen RD TR NMR experiments were recorded: 3D HC(C-TOCSY—CO)NHN and 3D HCCH-TOCSY were acquired with two different mixing times (14 ms and 21 ms) each, and 3D HNNCAHA were acquired with and without adiabatic decoupling of $^{13}C^\beta$ resonances for comparison (Kupce et al., *J. Magn. Reson.*, A 115:273–277 (1995); Matsuo et al., *J. Magn. Reson.* B 113:190–194 (1996), which are hereby incorporated by reference in their entirety). Except for 3D HNNCAHA, 3D HNN<CO,CA> and 2D $^1$H-TOCSY-relayed HCH—COSY (FIG. 1), central peaks were derived from $^{13}C$ magnetization (FIG. 1; Table 1). Hence, two subspectra, I and II containing the peak pairs and central peaks respectively, were generated (Szyperski et al., *J. Am. Chem. Soc.*, 118:8146–8147 (1996); Szyperski et al., *J. Biomol. NMR*, 11:387–405 (1998), which are hereby incorporated by reference in their entirety) for eight of the RD NMR experiments (FIG. 1). Overall, twenty-four processed RD NMR (sub)spectra were thus obtained for a detailed exploration of relative sensitivities and data collection strategies. These were complemented with conventional 3D HNNCACB data (Table 2; Wittekind et al., *J. Magn. Reson.*, B 101:201–205 (1993), which is hereby incorporated by reference in its entirety).

Example 3

Adjustment of r.f Carrier Frequencies to Minimize Spectral Overlap

In view of potential peak overlap in spectra recorded for larger proteins, it is of central importance to properly set the r.f. carrier frequencies. An illustrative example is the 3D HNNCAHA experiment, where adjustments of the carrier frequencies allows one to place central peaks and upfield and downfield component of the peak pairs into three separated spectral regions (Szyperski et al., *J. Biomol. NMR*, 11:387–405 (1998), which is hereby incorporated by reference in its entirety). This is accomplished by choosing a $^1$H-carrier frequency that yields a minimal in-phase splitting exceeding the $^{13}C^\alpha$ chemical shift dispersion (Szyperski et al., *J. Biomol. NMR*, 11:387–405 (1998), which is hereby incorporated by reference in its entirety). As a consequence, the generation of peak pairs does not lead to increased spectral overlap. In fact, the increase in the number of peaks expected for 3D HNNCAHA relative to 3D HNNCA was comparable to the increase observed in widely used conventional 3D HNNCACB. 3D HNNCACB exhibited up to four peaks for each amino acid residue: (Wittekind et al., *J. Magn. Reson.*, B 101:201–205 (1993), which is hereby incorporated by reference in its entirety) an intraresidue and a sequential connectivity in each of the quite well separated spectral regions containing the $^{13}C^\alpha$ and $^{13}C^\beta$ resonances, respectively. Similarly, 3D HNNCAHA comprised the three separated regions each of which may exhibit one intraresidual and one sequential connectivity per amino acid residue (Szyperski et al., *J. Biomol. NMR*, 11:387–405 (1998), which is hereby incorporated by reference in its entirety).

Example 4

Sensitivity Analysis of RD NMR Experiments

Figure 5:
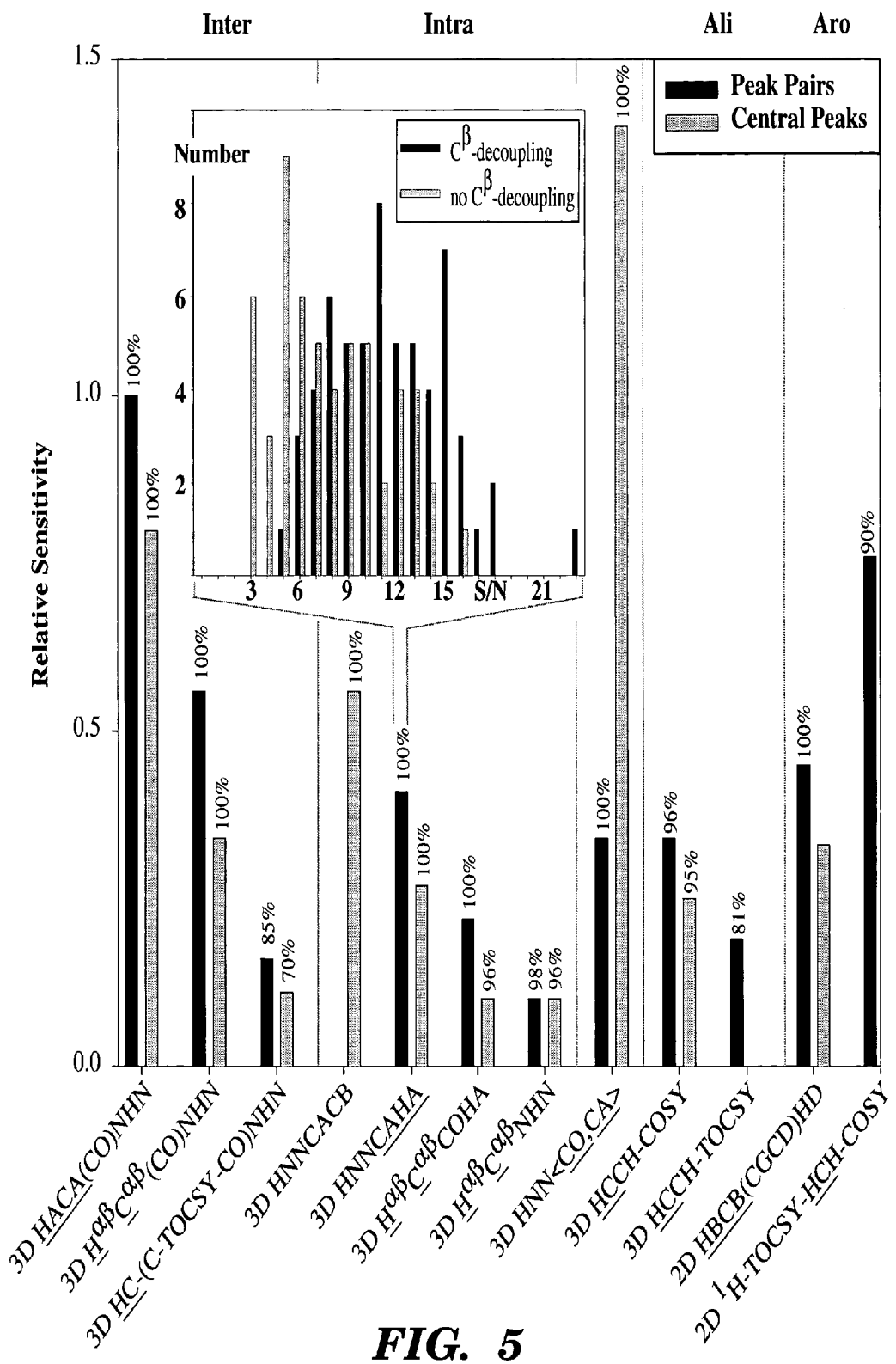
FIG. 5 illustrates the sensitivity of TR NMR experiments relative to peak pair detection in 3D H̲ACA(CO)NHN (left-most bar). As indicated on the top of the figure, the experiments are grouped according to providing interresidue ("inter"), intraresidue ("intra"), aliphatic side chain ("ali") and aromatic side chain ("aro") connectivities. For RD NMR experiments, the sensitivity of peak pair (black bars) and central peak (grey bars) detection was analyzed separately. The yield of peak detection (in percent) is indicated on the top of the bars. Note that only those peak categories encoding the prime information to be obtained from a given spectrum, i.e., intraresidual connectivities in HNNC̲AHA (FIG. 1D), H$^{\alpha/\beta}$C̲$^{\alpha/\beta}$COHA (FIG. 1E), H$^{\alpha/\beta}$C̲$^{\alpha/\beta}$NHN (FIG. 1F) and HNNCACB, correlation peaks in HCCH—COSY and relay connectivities in H̲CCH TOCSY, and only peaks exhibiting a S/N ratio larger than 3 were considered for this plot. For well-resolved RD peak pairs the averaged S/N ratio of the two individual peaks is given. In cases where only one of the two peaks is well resolved, only the value for the resolved peak was considered. As an example, the insert shows the S/N distributions obtained for the intraresidue peak pairs detected in 3D HNNC̲AHA. Black and grey bars correspond to spectra acquired with and without adiabatic $^{13}$C$^\beta$-decoupling, respectively (Abragam, *Principles of Nuclear Magnetism*, Clarendon Press:Oxford (1986); Ernst et al., *Principles of Nuclear Magnetic Resonance in One and Two Dimensions*, Clarendon Press:Oxford (1987), which are hereby incorporated by reference in their entirety).

Since a reduction of dimensionality in a NMR experiment preserves the relative sensitivity of the higher-dimensional parent experiments, evaluating the relative sensitivity of an entire set of multidimensional NMR experiments designed to provide complete resonance assignment for a protein is of general interest. The relative sensitivity of the RD NMR and 3D HNNCACB experiments were analyzed first, by determining the yield of peak detection, i.e., the ratio of observed peaks over the total number of expected peaks, and second, by separately assessing the S/N ratio distributions of peaks belonging to either RD peak pairs or central peaks. Moreover, distinct S/N distributions were then generated according to (i) the atom position involved (e.g., α- or β-moiety in $H^{\alpha/\beta}C^{\alpha/\beta}$(CO)NHN), (ii) the involvement of intraresidue or sequential connectivities (e.g., $^{13}C^\alpha_i$—$^1H^N_i$ and $^{13}C^\alpha_{i-1}$—$^1H^N_i$ connectivities in $H^{\alpha/\beta}C^{\alpha/\beta}$NHN) and (iii) the classification of COSY-type, relay and double-relay peaks in HCCH TOCSY. In total, 127 S/N distributions were thus analyzed (FIG. 5; Table 4). For 3D $H^{\alpha/\beta}C^{\alpha/\beta}$(CO)NHN (FIG. 1A) and 3D $H^{\alpha/\beta}C^{\alpha/\beta}$ COHA (FIG. 1E), there were 4 distributions each: α- and β-connectivities in subspectra I and II. For 3D HACA(CO)NHN (FIG. 1B) and 2D HBCB(CDCG)HD (FIG. 1J), there were 2 distributions each: connectivities in subspectra I and II. For 3D HC(C-TOCSY—CO)NHN (FIG. 1C) recorded with 14 and 21 ms mixing time, respectively, there were 10 distributions each: α-, β-, γ-, δ- and ε-connectivities in subspectra I and II. For 3D HNNCAHA (FIG. 1D), there were 8 distributions: intraresidual and sequential connectivities recorded with and without adiabatic $^{13}C^\beta$ decoupling. For 3D $H^{\alpha/\beta}$$C^{\alpha/\beta}$NHN (FIG. 1F), there were 8 distributions: intraresidual and sequential α- and β-connectivities in subspectra I and II. For 3D HNNCACB, there were 4 distributions: intraresidual and sequential α- and β-connectivities. For 3D HNN<CO, CA> (FIG. 1G), there were 2 distributions: peak pairs and central peaks. For 3D HCCH—COSY (FIG. 1H), there were 10 distributions: connectivities detected on α-, β-, γ-, δ- and ε-protons for subspectra I and II. For 3D HCCH-TOCSY (FIG. 1H) recorded with 14 and 21 ms mixing time, there were 30 distributions each: COSY-type, relay and double-relay connectivities detected on (α-, β-, γ-, δ- and ε-protons for subspectra I and II. For 2D $^1$H-TOCSY-relayed HCH—COSY (FIG. 1K), there were 3 distributions for connectivities detected on δ-, ε- and ζ-protons. In order to exclude a bias arising from longer transverse relaxation times in several highly disordered terminal residues (Tashiro et al., *J. Mol. Biol.*, 272:573–590 (1997); Lyons et al., *Biochemistry*, 32:7839–7845 (1993), which are hereby incorporated by reference in their entirety), the N-terminal octapeptide segment comprising residues "−13" to "−6" (in the numbering chosen in Tashiro et al., *J. Mol. Biol.*, 272:573–590 (1997) and Lyons et al., *Biochemistry*, 32:7839–7845 (1993), which are hereby incorporated by reference in their entirety) was not considered for the current sensitivity analyses. To rank the NMR experiments (Table 2)

according to relative sensitivity, focus was put on (i) the peak detection yield and (ii) the averaged S/N ratios of those peak categories encoding the prime information to be obtained from a given spectrum, i.e., intraresidual connectivities in HNNC$\underline{\text{AHA}}$ (FIG. 1D), $\underline{H}^{\alpha/\beta}\underline{C}^{\alpha/\beta}$COHA (FIG. 1E), $\underline{H}^{\alpha/\beta}\underline{C}^{\alpha/\beta}$NHN (FIG. 1F) and HNNCACB, correlation peaks in HCCH—COSY and relay connectivities in $\underline{\text{HCCH}}$ TOCSY. For comparison, these averaged S/N ratios were subsequently divided by the square-root of the NMR measurement time (Tables 2 and 4) and scaled relative to the most sensitive experiment, i.e., $\underline{\text{HACA}}$(CO)NHN (Table 4; FIG. 5).

TABLE 4

Signal-to-noise analysis of RD NMR spectra recorded for the Z-domain.[a]

| RD NMR experiment | type of correlation | detection yield | average S/N | average S/N $/\sqrt{t_{mean}}$ and sensitivity relative to 3D HACA(CO)NHN diff |
|---|---|---|---|---|
| 3D HNC$\underline{\text{AHA}}$ | $D_i$ | 60/60(100%)* | 13.19 ± 3.66 | |
| recorded with adiabatic | $D_{i-1}$ | 60/54(90%) | 4.16 ± 1.76 | |
| decoupling of C-β | $C_i$ | 60/60(100%) | 8.74 ± 2.99 | |
| | $C_{i-1}$ | 60/45(75%) | 3.90 ± 1.92 | |
| | all | 240/219(91%) | 7.84 | 3.51/0.25 |
| recorded without adiabatic | $D_i$ | 60/58(97%) | 7.81 ± 3.45 | |
| decoupling of C-β | $D_{i-1}$ | 60/45(75%) | 2.21 ± 1.34 | |
| | $C_i$ | 60/58(97%) | 6.10 ± 3.38 | |
| | $C_{i-1}$ | 60/37(62%) | 1.45 ± 1.09 | |
| | all | 240/198(83%) | 4.85 | 2.17/0.15 |
| 3D $\underline{H}^{\alpha/\beta}\underline{C}^{\alpha/\beta}$(CO)NHN sub II | α | 60/60(100%) | 13.74 ± 4.42 | |
| | β | 60/60(100%) | 10.20 ± 5.44 | |
| | all | 122/120(100%)* | 11.97 | 4.81/0.34* |
| sub I | α | 60/60(100%) | 26.41 ± 10.70 | |
| | β | 60/60(100%) | 22.29 ± 14.31 | |
| | all | 120/120(100%)* | 24.35 | 8.03/0.56* |
| 3D $\underline{\text{HACA}}$(CO)NHN sub II | α | 60/60(100%)* | 27.02 | 11.62/0.81* |
| sub I | α | 60/60(100%)* | 33.21 | 14.3/1.00* |
| no central peak acquisition | α | 60/60(100%) | 30.78 | 18.68/1.30 |
| 3D $\underline{H}^{\alpha/\beta}\underline{C}^{\alpha/\beta}$COHA sub II | α | 60/57(95%) | 5.27 ± 2.15 | |
| | β | 60/58(97%) | 4.31 ± 1.30 | |
| | all | 120/115(96%)* | 4.78 | 1.51/0.11 |
| sub I | α | 60/60(100%) | 10.41 ± 5.31 | |
| | β | 60/60(100%) | 9.45 ± 7.21 | |
| | all | 60/60(100%)* | 9.93 | 3.14/0.22 |
| 3D $\underline{H}^{\alpha/\beta}\underline{C}^{\alpha/\beta}$NHN sub II | $\alpha_i$ | 60/60(100%) | 8.34 ± 3.84 | |
| | $\alpha_i-1$ | 60/46(77%) | 3.12 ± 1.87 | |
| | $\beta i$ | 60/56(93%) | 3.67 ± 1.59 | |
| | $\beta i-1$ | 60/60(15%) | 2.08 ± 0.55 | |
| | all | 240/171(71%) | 3.24 | 0.78/0.05 |
| sub I | $\alpha_i$ | 60/60(100%) | 5.93 ± 2.95 | |
| | $\alpha_i-1$ | 60/51(85%) | 3.08 ± 1.96 | |
| | $\beta_i$ | 60/58(97%) | 5.35 ± 4.12 | |
| | $\beta_i-1$ | 60/21(35%) | 3.55 ± 1.98 | |
| | all | 240/190(79%) | 4.72 | 1.14/0.08 |
| 3D HNN<$\underline{\text{CO,CA}}$> | CO | 60/60(100%)* | 47.39 ± 13.44 | |
| | CA | 60/60(100%)* | 11.28 ± 3.46 | |
| | all | 120/120(100%) | 29.34 | 12.51/0.87 |
| 2D H$\underline{\text{BCB}}$(CGCD)HD sub II | δ | 7/7(100%)* | 10.81 | 4.70/0.33* |
| sub I | δ | 7/7(100%)* | 14.93 | 6.49/0.45* |
| 2D $^1$H-TOCSY-$\underline{\text{HCH}}$-COSY | δ | 7/7(100%) | 33.64 ± 27.03 | |
| | ε | 7/6(86%) | 10.75 ± 10.63 | |
| | ζ | 4/3(75%) | 6.51 ± 3.54 | |
| | all | 18/16(89%)* | 19.97 | 10.83/0.76* |
| 3D $\underline{\text{HC}}$-(C-TOCSY-CO)NHN | | | | |
| 2cyc sub II | α | 60/60(100%) | 8.95 ± 4.98 | |
| | β | 60/56(93%) | 5.69 ± 4.60 | |
| | γ | 29/15(52%) | 2.80 ± 1.51 | |
| | δ | 17/2(12%) | 1.40 ± 0.24 | |
| | ε | 6/0(0%) | | |
| | all | 172/133(77%) | 6.77 | 1.60/0.11 |
| 2cyc sub I | α | 60/60(100%) | 13.02 ± 7.46 | |
| | β | 60/55(92%) | 9.41 ± 9.42 | |
| | γ | 29/24(83%) | 4.58 ± 3.46 | |
| | δ | 17/8(47%) | 2.14 ± 1.05 | |
| | ε | 6/0(0%) | | |
| | all | 172/147(85%) | 9.70 | 2.29/0.16 |
| 3D $\underline{\text{HC}}$-(C-TOCSY-CO)NHN | | | | |
| 3cyc sub II | α | 60/58(97%) | 5.44 ± 2.84 | |
| | β | 60/42(70%) | 4.85 ± 3.51 | |
| | γ | 29/17(59%) | 2.82 ± 1.02 | |
| | δ | 17/4(24%) | 1.27 ± 0.25 | |

TABLE 4-continued

Signal-to-noise analysis of RD NMR spectra recorded for the Z-domain.[a]

| RD NMR experiment | type of correlation | detection yield | average S/N | average S/N $/\sqrt{t_{mean}}$ and sensitivity relative to 3D HACA(CO)NHN diff |
|---|---|---|---|---|
| | ε | 6/0(0%) | | |
| | all | 172/121(70%)* | 3.72 | 0.88/0.06* |
| 3cyc sub I | α | 60/59(98%) | 7.55 ± 4.49 | |
| | β | 60/44(73%) | 7.34 ± 6.67 | |
| | γ | 29/26(90%) | 4.11 ± 3.01 | |
| | δ | 17/14(82%) | 2.82 ± 1.55 | |
| | ε | 6/4(67%) | 1.89 ± 1.17 | |
| | all | 172/147(85%) | 6.27 | 1.48/0.10 |
| HCCH-COSY sub II | α | 74/70(95%) | 8.18 ± 8.27 | |
| | β | 98/94(96%) | 8.85 ± 5.29 | |
| | γ | 57/54(95%) | 8.70 ± 8.19 | |
| | δ | 22/21(95%) | 9.82 ± 10.51 | |
| | ε | 8/8(100%) | 18.38 ± 7.76 | |
| | all | 259/247(95%)* | 9.02 | 3.62/0.25* |
| HCCH-COSY sub I | α | 74/70(95%) | 9.44 ± 9.60 | |
| | β | 98/94(96%) | 11.30 ± 9.67 | |
| | γ | 57/54(95%) | 11.51 ± 9.02 | |
| | δ | 22/22(100%) | 20.50 ± 25.50 | |
| | ε | 8/8(100%) | 29.39 ± 19.61 | |
| | all | 259/248(96%)* | 12.22 | 4.90/0.34* |
| HCCH-TOCSY 2cyc sub I COSY-peaks | α | 74/68(92%) | 5.45 ± 5.22 | |
| | β | 98/71(72%) | 7.52 ± 6.70 | |
| | γ | 57/50(88%) | 5.22 ± 4.67 | |
| | δ | 22/17(77%) | 7.21 ± 7.47 | |
| | ε | 8/4(50%) | 7.82 ± 1.42 | |
| | all | 259/210(81%) | 6.28 | 2.37/0.17 |
| 2cyc sub I relay peaks | α | 30/21(70%) | 3.56 ± 4.96 | |
| | β | 22/18(82%) | 4.54 ± 2.25 | |
| | γ | 51/24(47%) | 6.11 ± 5.36 | |
| | δ | 18/12(67%) | 3.44 ± 1.22 | |
| | ε | 4/4(100%) | 6.92 ± 4.93 | |
| | all | 125/79(63%) | 4.23 | 1.60/0.11 |
| 2cyc sub I double relay peaks | α | 24/5(21%) | 1.47 ± 1.55 | |
| | β | 8/5(63%) | 9.02 ± 5.66 | |
| | γ | 0/0 | | |
| | δ | 30/6(20%) | 3.86 ± 3.59 | |
| | ε | 10/6(60%) | 5.97 ± 3.40 | |
| | all | 72/22(31%) | 5.62 | 2.12/0.15 |
| 2cyc sub II COSY peaks | α | 74/29(39%) | | |
| | β | 98/47(48%) | | |
| | γ | 57/20(35%) | | |
| | δ | 22/9(41%) | | |
| | ε | 8/4(50%) | | |
| | all | 259/105(41%) | | |
| 2cyc sub II relay peaks | α | 30/2(0.07%) | | |
| | β | 22/5(23%) | | |
| | γ | 51/7(14%) | | |
| | δ | 18/0(0%) | | |
| | ε | 4/2(50%) | | |
| | all | 125/16(13%) | | |
| 2cyc sub II double relay peaks | α | 24/0(0%) | | |
| | β | 8/0(0%) | | |
| | γ | 0/0(0%) | | |
| | δ | 30/0(0%) | | |
| | ε | 10/0(0%) | | |
| | all | 72(0%) | | |
| 3cyc sub I COSY-peaks | α | 74/58(78%) | 8.91 ± 8.61 | |
| | β | 98/81(83%) | 9.18 ± 9.62 | |
| | γ | 57/39(68%) | 7.79 ± 6.04 | |
| | δ | 22/16(73%) | 11.99 ± 10.41 | |
| | ε | 8/4(50%) | 16.08 ± 2.97 | |
| | all | 259/198(76%) | 9.18 | 3.47/0.25 |
| 3cyc sub I relay peaks | α | 30/25(83%) | 5.18 ± 5.08 | |
| | β | 22/18(82%) | 4.10 ± 2.00 | |
| | γ | 51/26(51%) | 5.51 ± 3.09 | |
| | δ | 18/13(72%) | 5.61 ± 4.56 | |
| | ε | 4/4(100%) | 6.82 ± 4.70 | |
| | all | 125/86(69%) | 5.20 | 1.97/0.14 |
| 3cyc sub I double relay peaks | α | 24/20(83%) | 3.34 ± 1.95 | |
| | β | 8/4(50%) | 15.76 ± 15.28 | |

TABLE 4-continued

Signal-to-noise analysis of RD NMR spectra recorded for the Z-domain.[a]

| RD NMR experiment | type of correlation | detection yield | average S/N | average S/N /$\sqrt{t_{mean}}$ and sensitivity relative to 3D HACA(CO)NHN diff |
|---|---|---|---|---|
| | γ | 0/0 | | |
| | δ | 30/24(80%) | 4.13 ± 1.94 | |
| | ε | 10/10(100%) | 10.06 ± 6.86 | |
| | all | 72/58(81%)* | 7.32 | 2.77/0.19* |
| 3cyc sub II COSY peaks | α | 74/36(49%) | | |
| | β | 98/48(49%) | | |
| | γ | 57/19(33%) | | |
| | δ | 22/5(23%) | | |
| | ε | 8/3(38%) | | |
| | all | 259/111(43%) | | |
| 3cyc sub II relay peaks | α | 30/6(20%) | | |
| | β | 22/3(14%) | | |
| | γ | 51/10(20%) | | |
| | δ | 18/0(0%) | | |
| | ε | 4/2(50%) | | |
| | all | 125/21(17%) | | |
| 3cyc sub II double relay peaks | α | 20/4(20%) | | |
| | β | 8/0(0%) | | |
| | γ | 0/0(0%) | | |
| | δ | 30/0(0%) | | |
| | ε | 4/2(50%) | | |
| | all | 72/6(0.08%) | | |

[a]i and i−1 denote two sequentially located amino acid residues. The first column provides (i) the name of the RD NMR experiment (in bold), (ii) the type of subspectrum (sub I and sub II corresponding to the subspectra containing peak pairs and central peaks, respectively), and, (iii) for the TOCSY experiments the mixing time (2cyc = 14 ms; 3cyc = 21 ms) and the type of peak (COSY-peaks, relay peaks and double relay peak). The second column indicates the atom position involved ("type" of correlation), the third column provides the detection yield (see text and the legend of FIG. 5), and the fourth column contains the average S/N ratio and the corresponding standard deviation for all cases where the detection yield (third column) was high. The right-most column affords the average S/N ratio divided by the square root of the measurement time (Table 2), i.e., the sensitivity. The sensitivity scaled relative to HACA(CO)NHN (number on the right) is also given. Rows labeled with an asterisk (*) contain the values used to create FIG. 5.

In principle, the relative sensitivities of NMR experiments can be estimated by calculating transfer amplitudes (Szyperski et al., *J. Biomol. NMR*, 11:387–405 (1998); Ernst et al., *Principles of Nuclear Magnetic Resonance in One and Two Dimensions*, Clarendon Press:Oxford (1987); Wittekind et al., *J. Magn. Reson.*, B 101:201–205 (1993); Buchler et al., *J. Magn. Reson.*, 125:34–42 (1997), which are hereby incorporated by reference in their entirety). However, these calculations rely on various assumptions such as knowledge about nuclear spin relaxation times, or neglect of $B_1$-inhomogeneity and imperfections of composite pulse decoupling sequences. Hence, an experimental approach is mandatory to obtain a thorough sensitivity assessment, in particular for the experiments employed for side chain resonance assignments.

The key yields of peak detection as well as the relative sensitivity of the NMR spectra recorded for the present study (Tables 1 and 2) are shown in FIG. 5. The S/N distribution analysis that was required to generate FIG. 5 is provided in Table 4. Since adiabatic $^{13}C^\beta$ decoupling (Kupce et al., *J. Magn. Reson., A* 115:273–277 (1995); Matsuo et al., *J. Magn. Reson.* B 113:190–194(1996), which are hereby incorporated by reference in their entirety) increased the sensitivity of 3D HNNCAHA by a factor of about 1.5 (FIG. 5; Table 4), only the decoupled spectrum was considered in this analysis. Among the group of experiments designed to yield sequential connectivities (FIG. 4), all of the expected peaks were detected for 3D HACA(CO)NHN (FIGS. 1B and 4) and 3D H$^{\alpha/\beta}$C$^{\alpha/\beta}$(CO)NHN (FIGS. 1A and 4). In spite of the rather long measurement time of 17 hours (Table 2), a substantial fraction of the expected cross peaks was not observed for 3D HC(C-TOCSY—CO)NHN (FIGS. 1C and 4). Evidently, losses due to rotating frame transverse relaxation and off-resonance effects during the C—C TOCSY relay are significantly larger than those encountered when implementing the C—C COSY step which expands 3D HACA(CO)NHN to 3D H$^{\alpha/\beta}$C$^{\alpha/\beta}$(CO)NHN. Moreover, due to the oscillatory nature of the spin modes associated with total correlation, (Ernst et al., *Principles of Nuclear Magnetic Resonance in One and Two Dimensions*, Clarendon Press:Oxford (1987), which is hereby incorporated by reference in its entirety) the average S/N ratio observed for a given atom position critically depends on the particular choice of the mixing time in 3D HC(C-TOCSY—CO)NHN (Table 4): e.g., several β-moiety signals are lost at the expense of detecting additional γ-, δ- or ε-moiety cross peaks for the long aliphatic side chains when increasing the mixing time from 14 ms to 21 ms (FIG. 4).

Figure 6A:
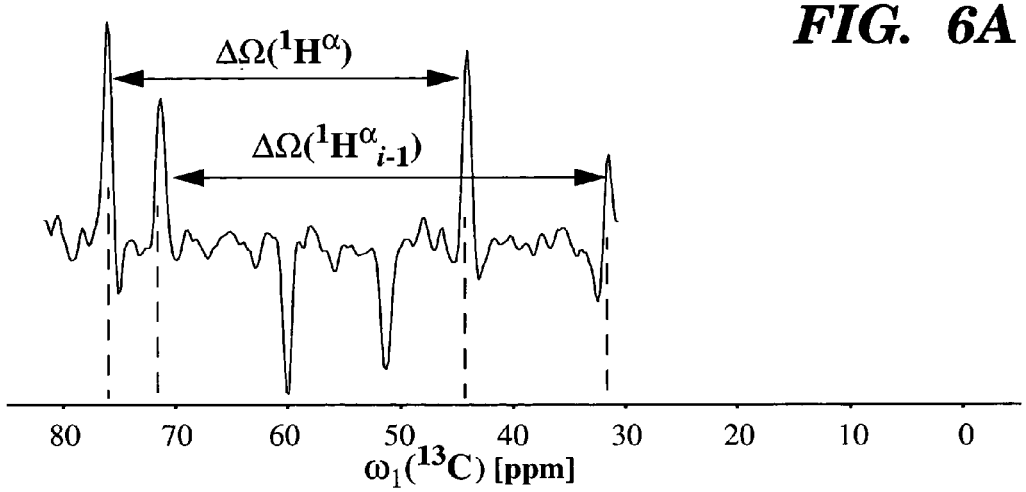
FIGS. 6A–C illustrate the intraresidue connections in RD NMR spectra: cross sections along $\omega_1$($^{13}$C) taken from 3D HNNC̲AHA (FIG. 6A), subspectrum I of 3D H$^{\alpha/\beta}$C̲$^{\alpha/\beta}$COHA (FIG. 6B) and subspectrum I of 3D H$^{\alpha/\beta}$C̲$^{\alpha/\beta}$NHN (FIG. 6C). The in-phase splittings encoding the $^1$H$^\alpha$ of Glu 24 an Asn 23 (FIG. 6A) and $^1$H$^\beta$ of Glu 24 (FIG. 6B) are indicated. Chemical shifts are given relative to DSS.
Figure 6B:
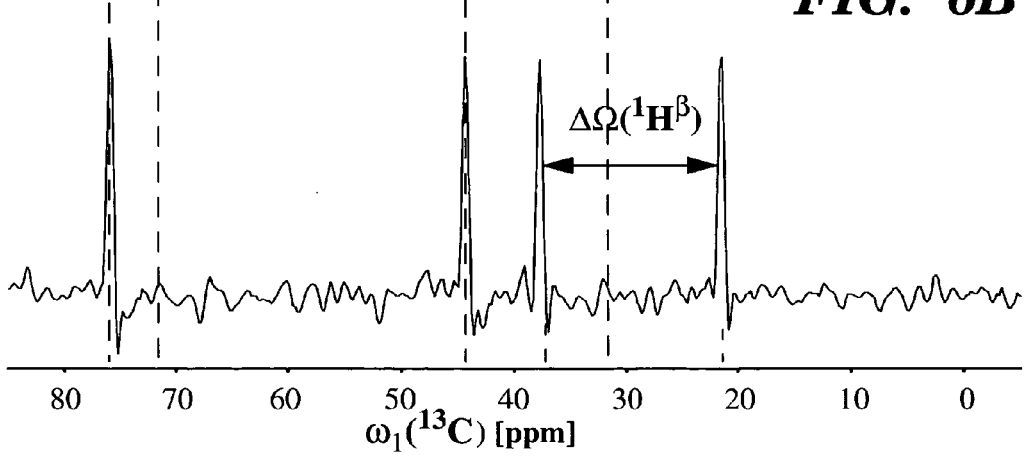
Figure 6C:
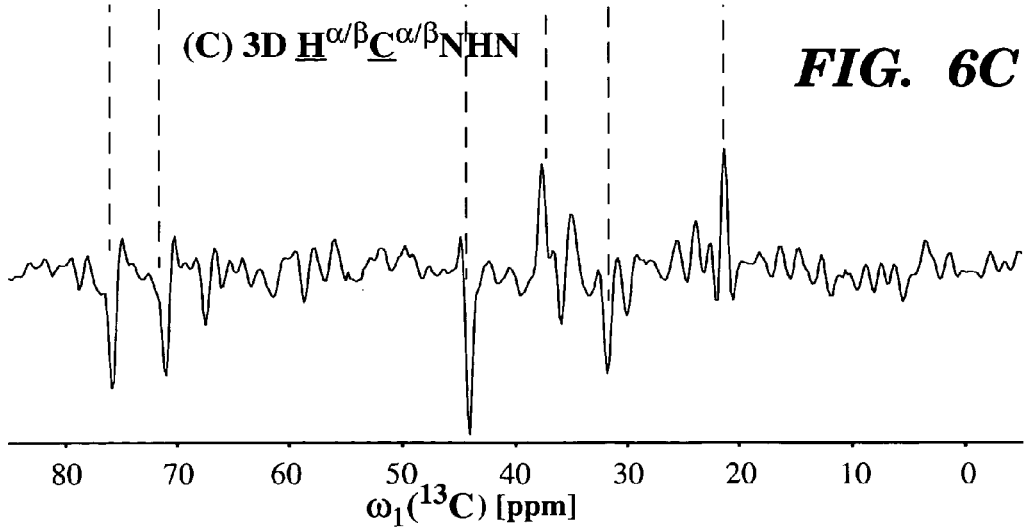

Among the experiments providing intraresidue connectivities (FIG. 6), HNNCAHA (FIGS. 1D and 6A) exhibited complete detection of expected peaks and a sensitivity which is comparable to H$^{\alpha/\beta}$C$^{\alpha/\beta}$(CO)NHN, but significantly higher than H$^{\alpha/\beta}$C$^{\alpha/\beta}$COHA (FIGS. 1E and 6B) and H$^{\alpha/\beta}$C$^{\alpha/\beta}$ NHN (FIGS. 1F and 6C). The latter experiment, designed in an 'out-and-stay fashion' as CBCANHN (Kay, *J. Am. Chem. Soc.*, 115:2055–2057 (1993), which is incorporated by reference in its entirety), is the least sensitive among the suite of RD NMR experiments studied here and can thus be expected to be primarily of use for smaller proteins. However, virtually all expected correlations were observed. Conventional HNNCACB is slightly more sensitive than HNN<u>CAHA</u> and equally sensitive as $\underline{H}^{\alpha/\beta}\underline{C}^{\alpha/\beta}$(CO)NHN. However, when considering symmetrization of [$\omega_1(^{13}C),\omega_3(^1H^N)$]-strips about central peaks along $\omega_1$, (Szyperski et al., *J. Magn. Reson.*, B 108: 197–203 (1995); Szyperski et al., *J. Biomol. NMR*, 11:387–405 (1998), which are hereby incorporated by reference in their entirety) HNN <u>CAHA</u> can be considered to be more sensitive than HNNCACB even for smaller proteins. HNN<<u>CO,CA</u>> (FIG. 1G) offers both intraresidue $^1H^N$—$^{13}C^\alpha$ (peak pairs) and sequential $^1H^N$—$^{13}C'$ (central peaks) connectivities. In accordance with the outstanding sensitivity of HNNCO, central peak detection in HNN<<u>CO,CA</u>> was by far the most sensitive observed in all spectra, while the sensitivity of corresponding peak pair detection was comparable to HNN <u>CAHA</u>. Hence, central peaks in 3D HNN<<u>CO,CA</u>> may be recruited for secure spin system identification (Zimmerman et al., *J. Mol. Biol.*, 269:592–610 (1997), which is hereby incorporated by reference in its entirety) in cases of overlap in 2D [$^{15}$N, $^1$H]—HSQC.

The sensitivity of peak pair detection in 3D <u>H</u>CCH COSY, required for aliphatic side chain assignment, was again comparable to 3D HNN<u>CAHA</u>, while detection of relayed COSY peaks in 3D <u>H</u>CCH TOCSY was slightly less sensitive. The incompleteness of relay peak detection was, however, to some extent due to signal overlap (Table 4). 2D <u>H</u>BCB(CDCG)HD and 2D $^1$H-TOCSY-relayed <u>H</u>CH—COSY, providing the aromatic spin system assignments, appeared to be rather sensitive. However, analysis for the Z-domain was biased by (i) the relatively small number of aromatic residues, and (ii) their partly flexibly disordered nature (His(−4), Phe 5 and Phe 13 exhibit local displacements that are well above the average for residues buried in the molecular core; protein data bank accession code: 2SPZ). When involving only those aromatic rings that are apparently not flexibly disordered, 2D <u>H</u>BCB(CDCG)HD appeared to be slightly less sensitive than 3D <u>H</u>CCH COSY.

Overall (FIG. 5), (i) outstanding sensitivity was found for 3D <u>H</u>ACA(CO)NHN, (ii) similar sensitivity was found for 3D $\underline{H}^{\alpha/\beta}\underline{C}^{\alpha/\beta}$(CO)NHN, 3D, HNN<u>CAHA</u>, 3D HNN<<u>CO,CA</u>>, 3D HNNCACB, 3D <u>H</u>CCH COSY and 2D $^1$H-TOCSY-related <u>H</u>CH—COSY, (iii) slightly reduced sensitivity was found for 3D $\underline{H}^{\alpha/\beta}\underline{C}^{\alpha/\beta}$COHA, 2D <u>H</u>BCB(CDCG)HD and relay peak detection in 3D <u>H</u>CCH TOCSY, and (iv) the lowest sensitivity was found for 3D <u>H</u>C(C-TOCSY—CO)NHN and 3D $\underline{H}^{\alpha/\beta}\underline{C}^{\alpha/\beta}$NHN. In the " $\underline{H}^{\alpha/\beta}\underline{C}^{\alpha/\beta}$-experiments, the averaged intensity of the α- and β-moiety peak pairs was quite similar (though the S/N distribution of the β-peaks was broader reflecting larger variations in transverse relaxation times), and the central peaks exhibited a sensitivity of about two thirds relative to the individual peaks of the peak pairs. However, since the non-selective $^{13}$C $T_1$-relaxation times are shorter than the $^1$H $T_1$-times at higher molecular weight (Abragam, *Principles of Nuclear Magnetism.*, Clarendon Press:Oxford (1986); Ernst et al., *Principles of Nuclear Magnetic Resonance in One and Two Dimensions*, Clarendon Press:Oxford (1987), which are hereby incorporated by reference in their entirety), the relative sensitivity of central peak detection using $^{13}$C-magnetization becomes more favorable for larger systems. Moreover, the relative sensitivity of the various experiments shifts relative to each other with increasing molecular weight (Buchler et al., *J. Magn. Reson.*, 125:34–42 (1997), which is hereby incorporated by reference in its entirety). In particular, 3D HNNCACB and 3D $\underline{H}^{\alpha/\beta}\underline{C}^{\alpha/\beta}$COHA can be expected to loose relative sensitivity for larger systems since transverse magnetization resides comparably long on rapidly relaxing $^{13}C^\alpha$.

Example 5

HTP Assignment Strategy: A "Standard Set" of RD NMR Experiments

The comprehensive analysis of the suite of multidimensional spectra recorded for the present study (FIG. 5; Tables 1 and 2) lays the foundation to devise strategies for RD NMR-based HTP resonance assignment of proteins.

Figure 7:
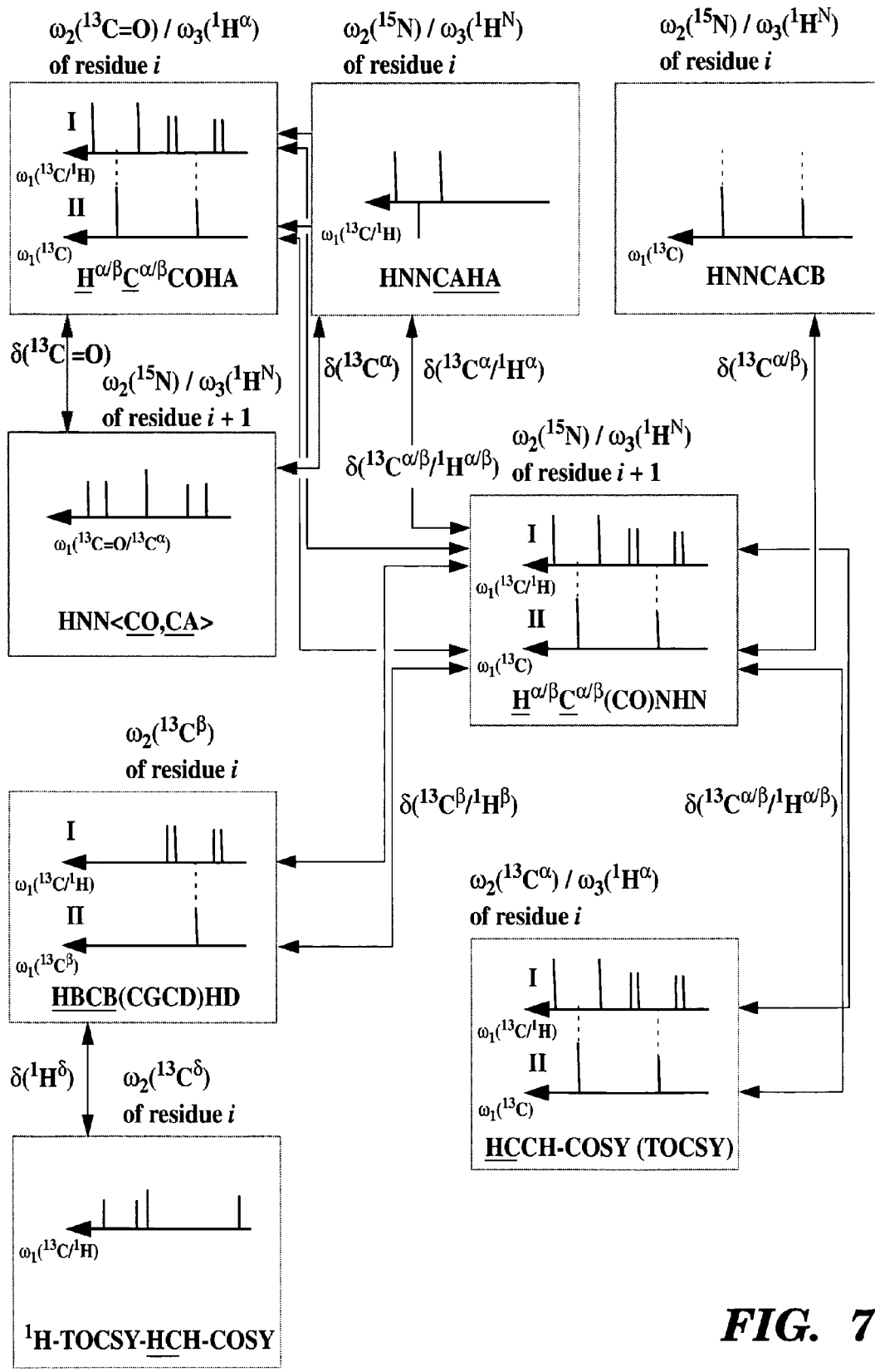
FIG. 7 is the schematic presentation of the RD NMR-based HTP resonance assignment strategy using the "standard set" of experiments identified in the framework of the present study. The central role of 3D H̲$^{\alpha/\beta}$C̲$^{\alpha/\beta}$(CO)NHN is shown for creating sequential connectivities via (i) $^{13}$C$^\alpha$ and $^1$H$^\alpha$ shift measurements (HNNC̲AHA.
Figure 8:
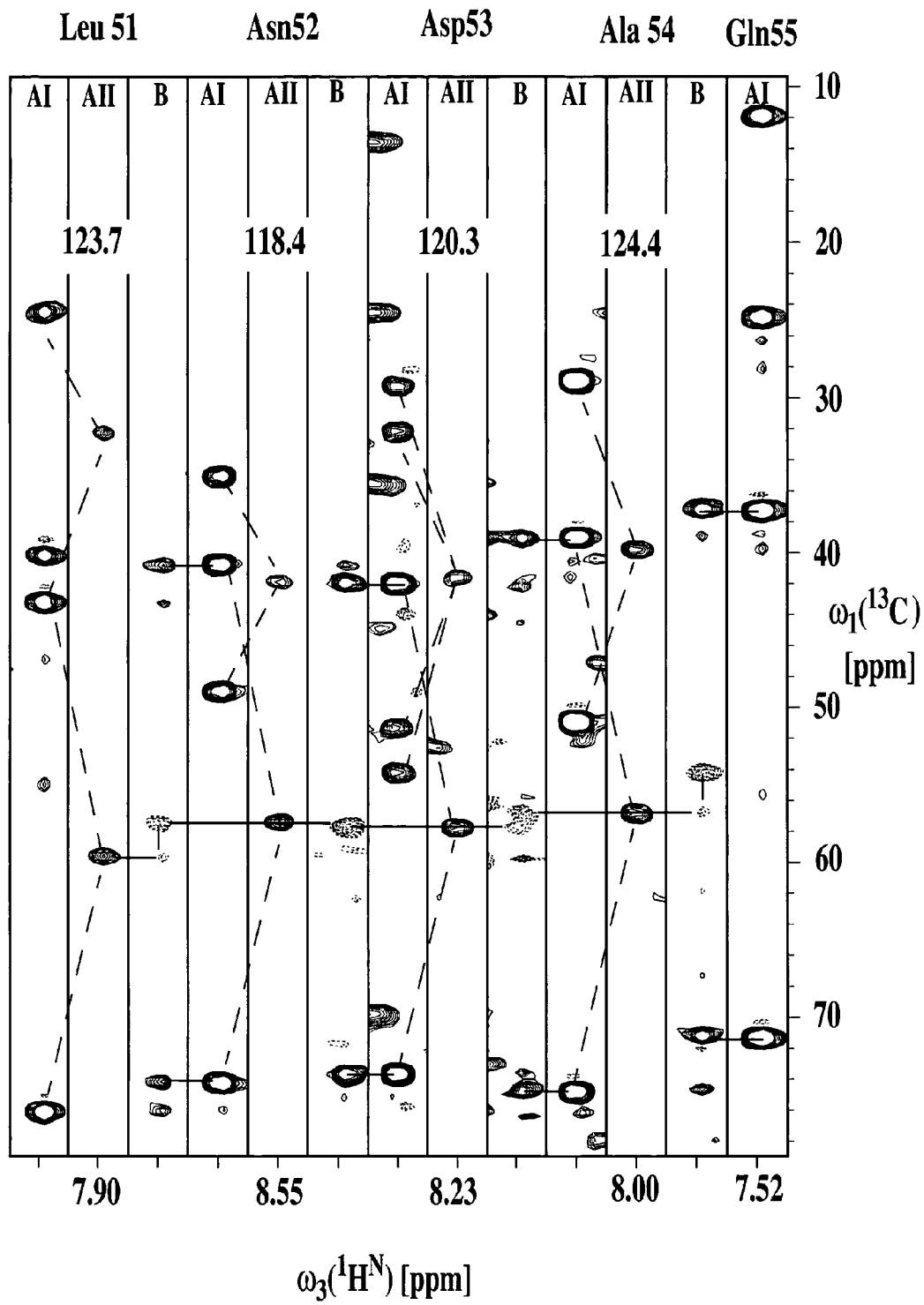
FIG. 8), via (ii) $^{13}$C$^\alpha$ and $^{13}$C$^\beta$ shift measurements (HNNCACB), and via (iii) $^{13}$C=O shift measurements (H̲$^{\alpha/\beta}$C̲$^{\alpha/\beta}$COHA/HNNC̲AHA and HNN<C̲O,CA>.
Figure 9A:
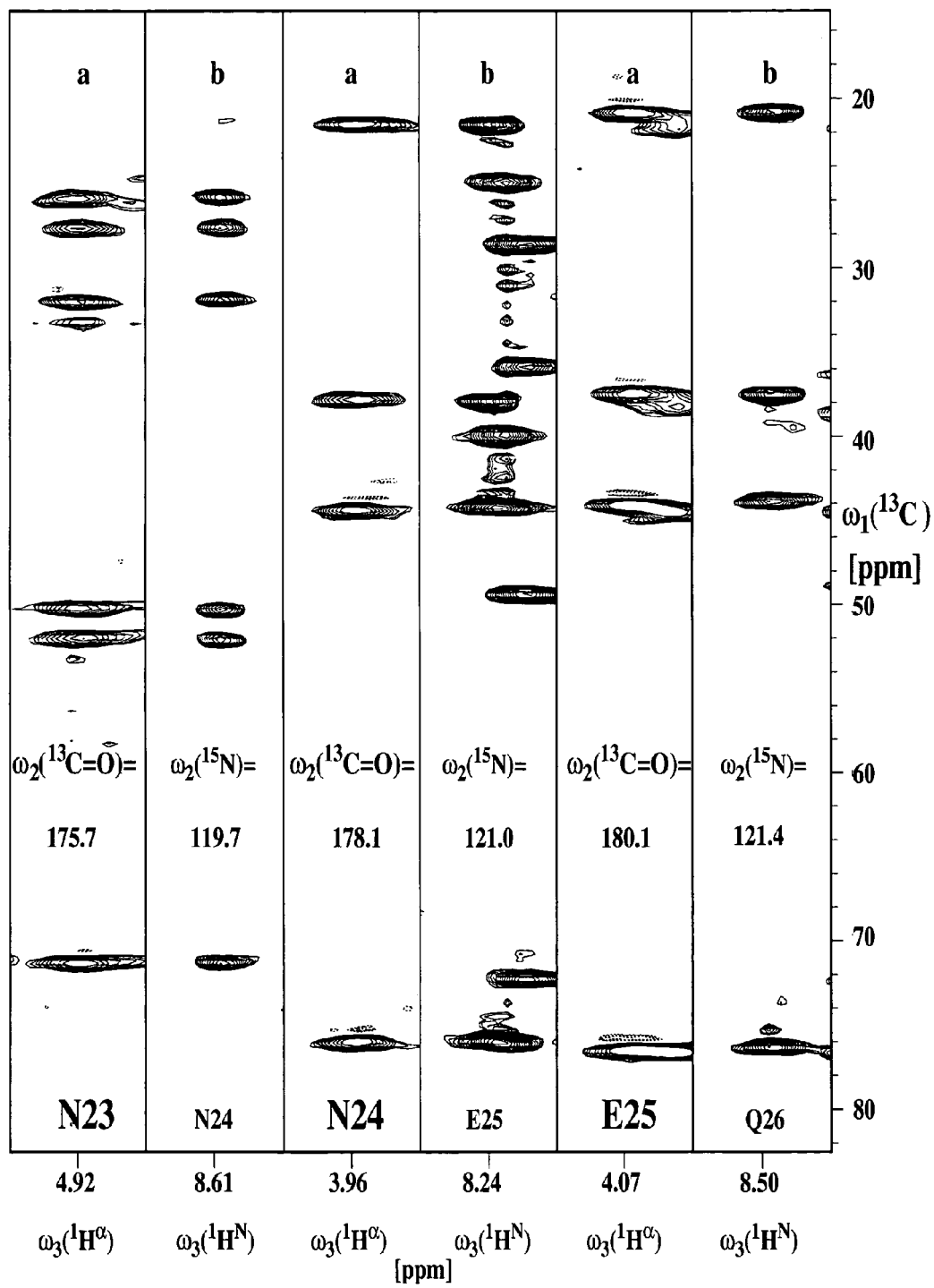
FIGS. 9A–B show the sequential resonance assignment based on 3D H̲$^{\alpha/\beta}$C̲$^{\alpha/\beta}$(CO)NHN/3D H̲$^{\alpha/\beta}$C̲$^{\alpha/\beta}$COHA combined with 3D HNN<CA,CO> (FIG. 7). The amino acid residue on which the NMR signal was detected is indicated at the bottom of the strips.
Figure 9B:
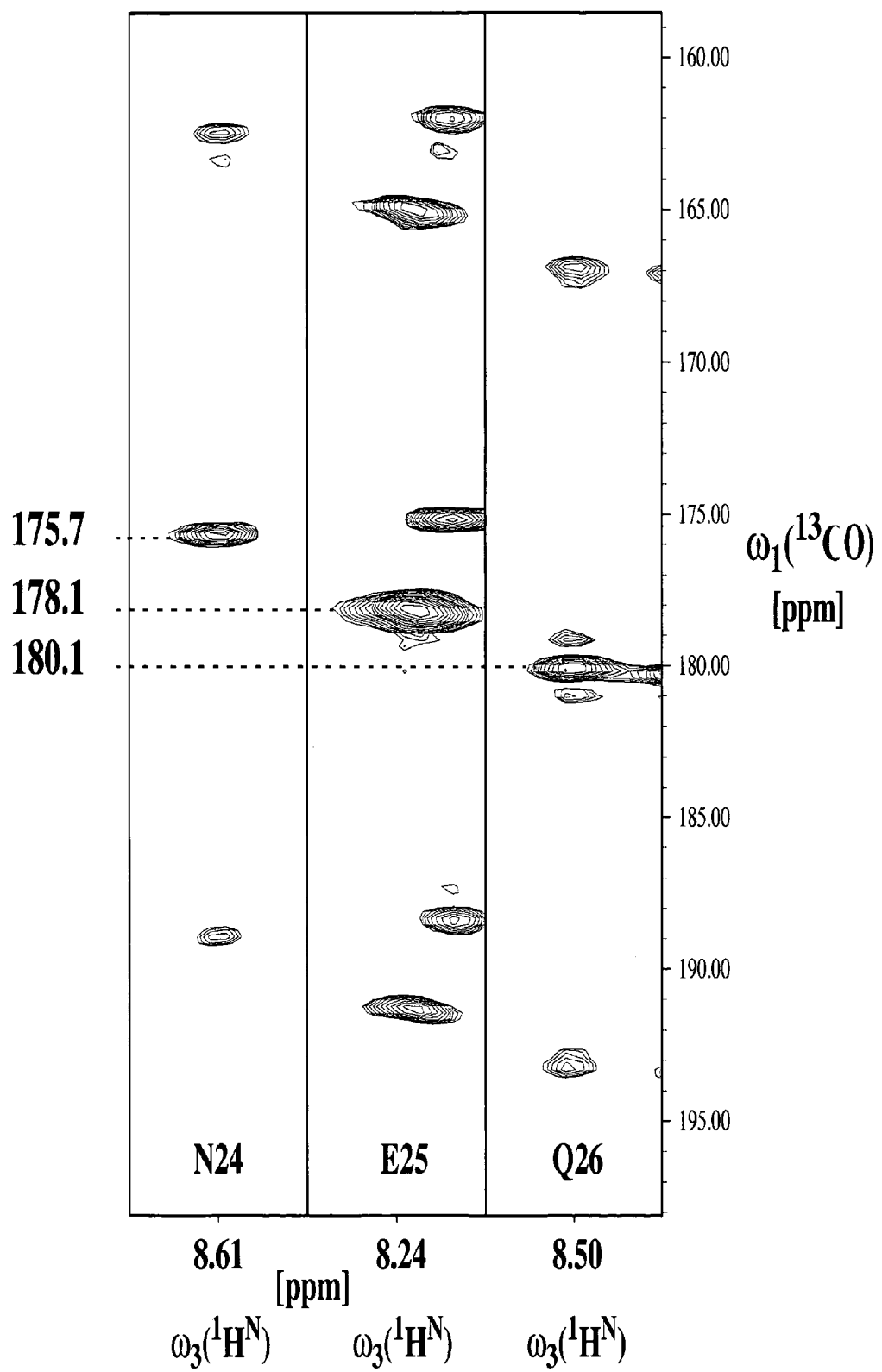
Figure 10C:
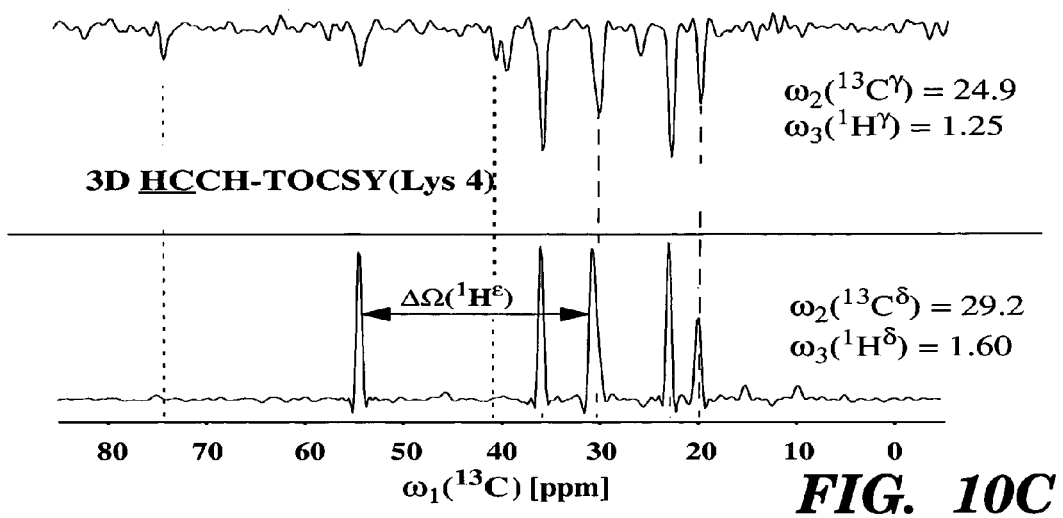
FIGS. 10A–C shows the assignment of aliphatic spin systems using 3D H̲$^{\alpha/\beta}$C̲$^{\alpha/\beta}$(CO)NHN/3D H̲CCH—COSY exemplified for Lys 4. Cross sections taken along $\omega_1$($^{13}$C)
Figure 10B:
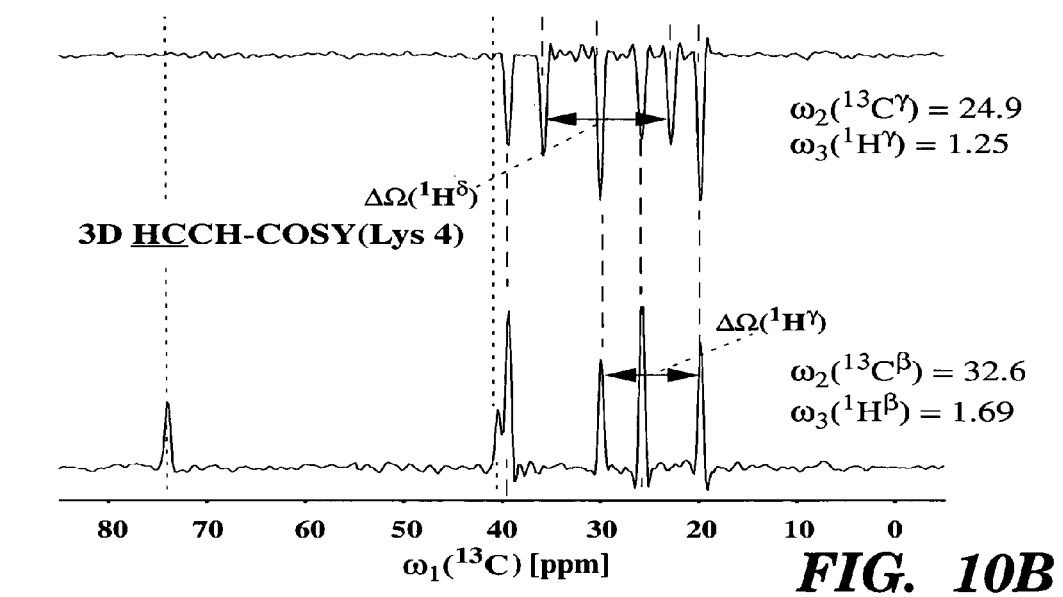
Figure 10A:
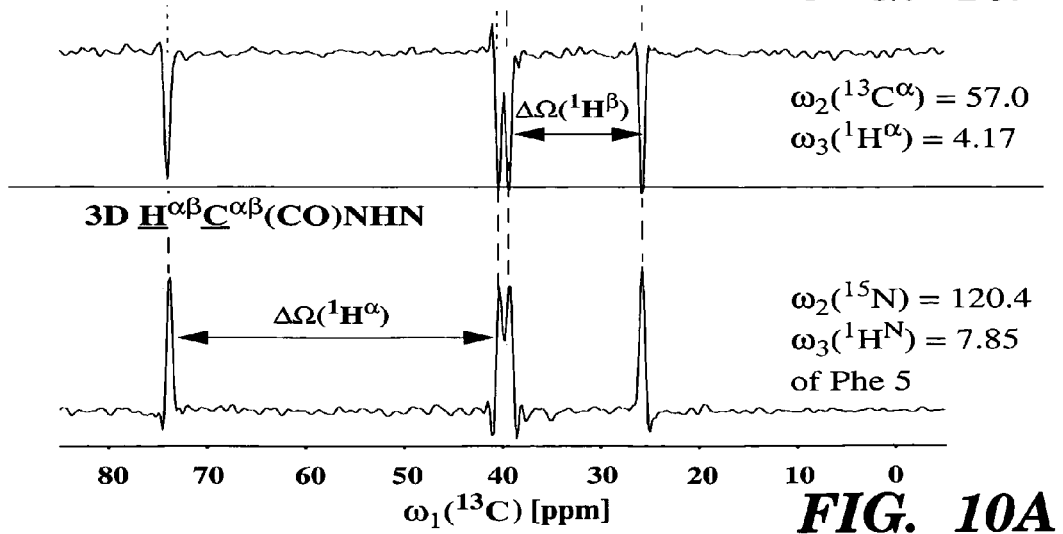
Figure 11C:
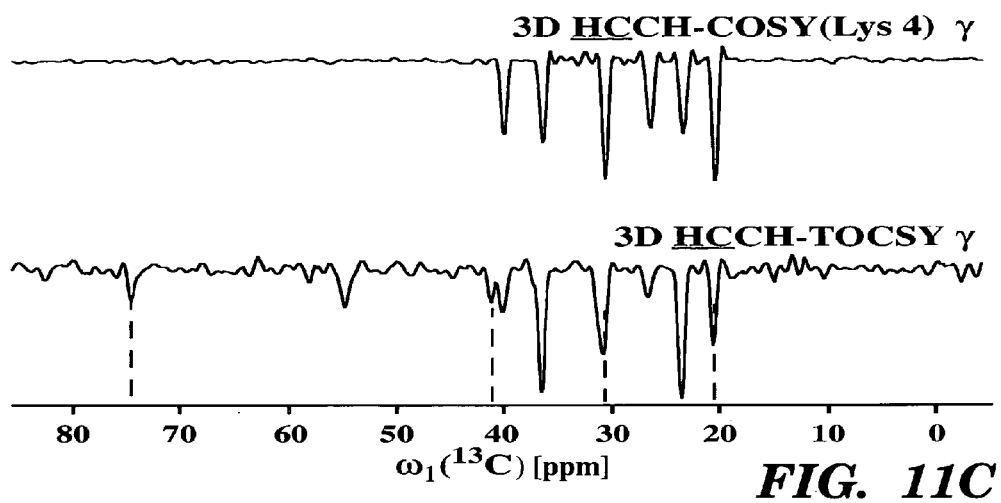
FIGS. 11A–C show the assignment of aliphatic side chains exemplified for Lys 4 (see also FIG. 12). Pairs of cross sections taken from 3D $\underline{HC}$CH—COSY and TOCSY are shown. These exhibit signals detected on $^{1}$H$^{\alpha}$ (FIG. 11A), $^{1}$H$^{\beta}$ (FIG. 11B) and $^{1}$H$^{\gamma}$ (FIG. 11C) of Lys 4, respectively. The crucial $^{\alpha}$CH—$^{\gamma}$CH relay connectivities, which resolve potential overlap in $\underline{HC}$CH—COSY, are indicated with vertical lines. Note that the peak signs vary because of aliasing along $\omega_2(^{13}C)$. The assignment of the peak pairs is shown in FIG. 10.
Figure 11B:
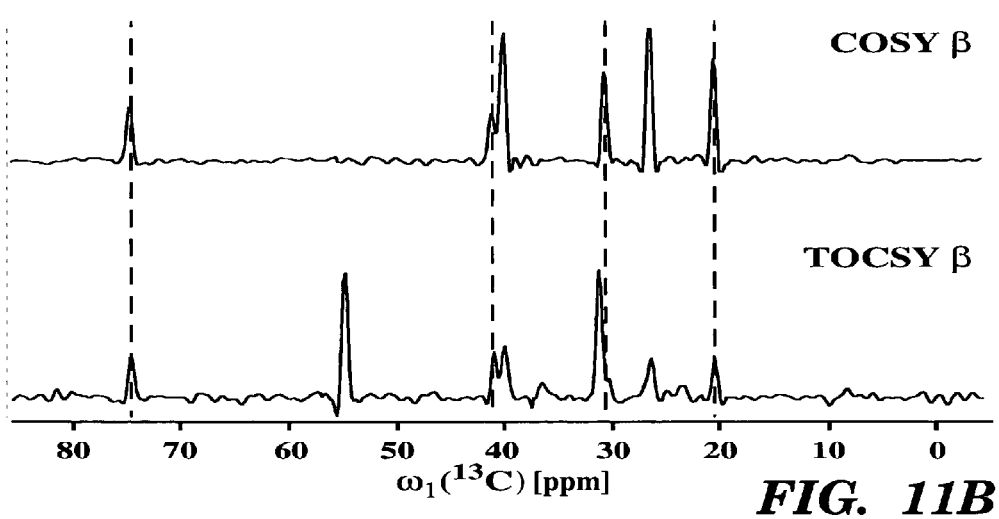
Figure 11A:
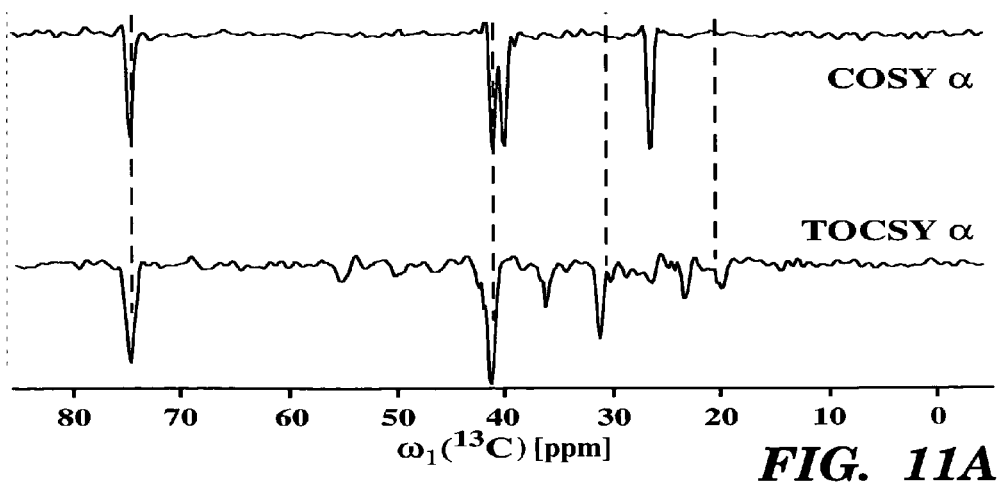

For proteins in the molecular weight range up to about 20 kDa, 3D $\underline{H}^{\alpha/\beta}\underline{C}^{\alpha/\beta}$(CO)NHN plays a pivotal role (FIG. 7). Firstly, the peak patterns observed along $\omega_1(^{13}C^{\alpha/\beta})$ in subspectra I and II enable sequential resonance assignment in combination with HNN<u>CAHA</u> and HNNCACB, respectively, by matching intraresidue and sequential $^1H^\alpha$, $^{13}C^\alpha$ and $^{13}C^\beta$ chemical shifts (FIG. 8). (When considering 'nuclear spin relaxation time labeling' of peak pairs, subspectrum II derived from $^{13}$C steady state magnetization provides largely redundant information when compared with subspectrum I. However, the observation of the central peaks allows direct matching of peak positions between subspectrum II, essentially a CBCA(CO)NHN spectrum, and HNNCACB (FIG. 6).) Moreover, this set of chemical shifts alone provides valuable information for amino acid type identification (Zimmerman et al., *J. Mol. Biol.*, 269: 592–610 (1997); Cavanagh et al., *Protein NMR Spectroscopy*, Academic Press, San Diego, (1996); Grzesiek et al., *J. Biomol. NMR*, 3:185–204 (1993), which are hereby incorporated by reference in their entirety). Complementary recording of 3D $\underline{H}^{\alpha/\beta}\underline{C}^{\alpha/\beta}$COHA and 3D HNN<<u>CO,CA</u>> contributes polypeptide backbone $^{13}$C=O chemical shift measurements for establishing sequential assignments: the intraresidue correlation is obtained by $\omega_1(^{13}C^{\alpha/\beta})$ peak pattern matching (FIGS. 9A–B) with 3D $\underline{H}^{\alpha/\beta}\underline{C}^{\alpha/\beta}$(CO)NHN, and the sequential correlation is inferred from $^{13}C^\alpha$, $^{15}$N and $^1H^N$ chemical shifts in 3D HNN<<u>CO,CA</u>> (Szyperski et al., *J. Biomol. NMR*, 11:387–405 (1998), which is hereby incorporated by reference in its entirety). Notably, even for medium-sized (non-deuterated) proteins this approach is superior to the use of a low sensitivity HNN<u>CACO</u>-type experiment (e.g., in combination with HNN<u>COCA</u>), where the magnetization transfer via rapidly relaxing $^{13}C^\alpha$ relies on the rather small $^{15}$N—$^{13}C^\alpha$ one-bond scalar coupling. Secondly, comparison of $\omega_1(^{13}C^{\alpha/\beta})$ peak patterns with 3D <u>H</u>CCH—COSY (FIG. 10) and TOCSY connects the $C^{\alpha/\beta}/H^{\alpha/\beta}$ chemical shifts with those of the aliphatic side chain spin systems (For Z-domain, complete side chain assignments were obtained for all but six residues using 3D <u>H</u>CCH—COSY only.) (FIGS. 10 and 11), while comparison of $\omega_1(^{13}C^\beta)$ peaks with 2D <u>H</u>BCB(CDCG)HD and subsequent linking with $^1H^\delta$ chemical shifts detected in 2D $^1$H-TOCSY-relayed <u>H</u>CH—COSY affords assignment of the aromatic spin systems (FIG. 12). Since for many amino acid residues the two β-protons exhibit non-degenerate chemical shifts, the connection of $\underline{H}^{\alpha/\beta}\underline{C}^{\alpha/\beta}$(CO)NHN and <u>H</u>BCB(CDCG)HD or <u>H</u>CCH—COSY/TOCSY (FIG. 7) may in fact often rely on comparison of three chemical shifts, i.e., $\delta(^1H^{\beta 2})$, $\delta(^1H^{\beta 3})$ and $\delta(^{13}C^\beta)$. This consideration underscores the potential of recruiting β-proton chemical shifts for establishing sequential resonance assignments.

The 'standard set' of nine experiments (labeled with asterisks in Table 2) as described in the above paragraph required 60 hours of instrument time for the Z-domain on our 600 MHz NMR system (Table 2). However, the minimal S/N ratios detected (Table 4) reveal that half of the measurement time would have been sufficient for backbone amide proton detected experiments, indicating that these spectra were still acquired in the sampling limited regime. (The lowest S/N peak ratios are around 5:1, which implies that a reduction of by could be afforded. A further indication of an inappropriately long measurement time is due to the fact that nearly all sequential connectivities relying on two-bond scalar couplings (Güntert et al., *J. Biomol. NMR,* 2:619–629 (1992), which is hereby incorporated by reference in its entirety) were observed in 3D HNN$\underline{CAHA}$ (FIG. 7): nearly all $^1H^N$, $^{15}N$, $^{13}C^\alpha$ and $^1H^\alpha$ backbone resonances of Z-domain could be assigned using this spectrum (Szyperski et al., *J. Biomol. NMR,* 11:387–405 (1998), which is hereby incorporated by reference in its entirety) alone.) Hence, a nearly complete resonance assignment of the Z-domain could have been obtained from the standard set in about 40 hours, if the RD backbone experiments were conducted with a single transient per acquired FID. (The suite of experiments in Table 1 may provide complete resonance assignments of proteins, excluding only the side chain $NH_n$ moieties, the $CH^\epsilon$ groups of histidinyl, and the $CH^{\epsilon 3}$, $CH^{\zeta 2,3}$ and $CH^{\eta 2}$ groups of tryptophanyl residues, which can be obtained as described in Yamazaki et al., *J. Am. Chem. Soc.,* 115:11054–11055 (1993), which is hereby incorporated by reference in its entirety. Notably, the protein studied here does not contain tryptophan residues.) This outstandingly short measurement time needs to be compared with 1–3 weeks of measurement time that are currently routinely invested to assign medium-sized proteins. Concomitantly, the high redundancy for establishing sequential connectivities using this suite of experiments (six projected 4D, one 3D and two projected 3D experiments) greatly supports robust automated assignment. Importantly, the information encoded in each projected 4D spectrum cannot be obtained by simply recording two 3D spectra: in cases of chemical shift degeneracy a chemical shift quartuple is not equivalent to two shift triples.

Example 6

Sensitivity Profile Within the "Standard Set" of NMR Experiments

It is desirable that the NMR experiments applied for protein resonance assignment in a high-throughput manner exhibit comparable sensitivity. This is because the prediction of the totally required measurement times is facilitated (roughly a multiple of the measurement time of an arbitrarily chosen single experiment) and the signal-to-noise ratios observed in the experiment conducted first allow one to readily adjust the (rather similar) measurement times of the remaining ones while the recording of the set of experiments is in progress. It is thus important to note that the sensitivity within the standard set of nine experiments (Table 2) varies by only about a factor of two when comparing peak pair detection in 3D $\underline{H}^{\alpha/\beta}\underline{C}^{\alpha/\beta}$(CO)NHN with relay COSY peak detection in 3D $\underline{H}$CCH-TOCSY (FIG. 5). Extraordinarily sensitive central peak detection in 3D HNN<$\underline{CO,CA}$> represents the sole exception. However, the availability of extremely sensitive detection of ($^1H^N$, $^{15}N$, $^{13}C$=O) chemical shift triples is of high value for identification of spin systems (Zimmerman et al., *J. Mol. Biol.,* 269:592–610 (1997), which is hereby incorporated by reference in its entirety). In fact, this apparent exception thus neatly complements the even sensitivity profile of the remaining experiments.

Example 7

A "Minimal Set" of RD NMR Experiments

For Z-domain, six RD NMR experiments were actually sufficient to provide the desired resonance assignments: 3D $\underline{H}^{\alpha/\beta}\underline{C}^{\alpha/\beta}$(CO)NHN, 3D HNN$\underline{CAHA}$, 3D $\underline{H}$CCH—COSY/TOCSY, 2D $\underline{HBCB}$(CDCG)HD and 2D $^1$H-TOCSY-relayed $\underline{H}$CH—COSY. This set of experiments was recorded within 36 hours of instrument time (Table 2), and can be considered as a 'minimal set' of RD NMR experiments for HTP resonance assignment of proteins up to around 10 kDa. For smaller proteins, the use of 3D $\underline{H}$C(C-TOCSY—CO)NHN, 3D $\underline{H}^{\alpha/\beta}\underline{C}^{\alpha/\beta}$NHN, 3D $\underline{H}$CCH—COSY, 2D $\underline{HBCB}$(CDCG)HD and 2D $^1$H-TOCSY-relayed $\underline{H}$CH—COSY represents a viable alternative to rapidly obtain assignments (Table 1).

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A method for obtaining rapid and complete assignments of chemical shift values of $^1$H, $^{13}$C and $^{15}$N of a protein molecule comprising:
   providing a $^{15}$N/$^{13}$C-labeled protein sample; and
   conducting four reduced dimensionality (RD) nuclear magnetic resonance (NMR) experiments on the protein sample, wherein (1) a first experiment is selected from the group consisting of a RD three-dimensional (3D) $\underline{H}^{\alpha/\beta}\underline{C}^{\alpha/\beta}$(CO)NHN NMR experiment, a RD 3D $\underline{H}$A, $\underline{C}$A,(CO),N,HN NMR experiment, and a RD 3D $\underline{H}$, $\underline{C}$,(C-TOCSY—CO),N,HN NMR experiment for obtaining sequential correlations of chemical shift values; (2) a second experiment is selected from the group consisting of a RD 3D HNN$\underline{CAHA}$ NMR experiment, a RD 3D $\underline{H}^{\alpha/\beta}$,$\underline{C}^{\alpha/\beta}$,N,HN NMR experiment, and a RD 3D HNN<$\underline{CO,CA}$> NMR experiment for obtaining intraresidue correlations of chemical shift values; (3) a third experiment is a RD 3D $\underline{H}$,$\underline{C}$,C,H—COSY NMR experiment for obtaining assignments of sidechain chemical shift values; and (4) a fourth experiment is a RD two-dimensional (2D) $\underline{HB,CB}$,(CG,CD),HD NMR experiment for obtaining assignments of aromatic sidechain chemical shift values.

2. The method according to claim 1 further comprising:
   subjecting the protein sample to a RD 2D $\underline{H}$,$\underline{C}$,H—COSY NMR experiment for obtaining assignments of sidechain chemical shift values.

3. The method according to claim 1, wherein the first experiment is the RD 3D $\underline{H}^{\alpha/\beta}\underline{C}^{\alpha/\beta}$(CO)NHN NMR experiment and the second experiment is the RD 3D HNN$\underline{CAHA}$ NMR experiment.

4. The method according to claim 3 further comprising:
   subjecting the protein sample to a RD 3D $\underline{H}$A, $\underline{C}$A,(CO),N,HN NMR experiment to distinguish between NMR signals for $^1H^\alpha/^{13}C^\alpha$ and $^1H^\beta/^{13}C^\beta$ from said RD 3D $\underline{H}^{\alpha/\beta}\underline{C}^{\alpha/\beta}$(CO)NHN NMR experiment.

5. The method according to claim 3 further comprising: subjecting the protein sample to a RD 3D $\underline{H},\underline{C},(C\text{-TOCSY}-CO),N,HN$ NMR experiment to obtain assignments of chemical shift values of $^1H^{ali}$ and $^{13}C^{ali}$.

6. The method according to claim 3 further comprising: subjecting the protein sample to a RD 3D $\underline{H}^{\alpha/\beta},\underline{C}^{\alpha/\beta},N,HN$ NMR experiment to obtain assignments of chemical shift values of $^1H^\beta$ and $^{13}C^\beta$.

7. The method according to claim 3 further comprising: subjecting the protein sample to a RD 3D HNN<$\underline{CO,CA}$> NMR experiment to obtain assignments of chemical shift values of polypeptide backbone carbonyl carbons, $^{13}C'$.

8. The method according to claim 3 further comprising: subjecting the protein sample to a RD 3D $\underline{H}^{\alpha/\beta},\underline{C}^{\alpha/\beta},CO,HA$ NMR experiment to obtain assignments of chemical shift values of polypeptide backbone carbonyl carbons, $^{13}C'$.

9. The method according to claim 3 further comprising: subjecting the protein sample to a RD 3D HNN<$\underline{CO,CA}$> NMR experiment and a RD 3D $\underline{H}^{\alpha/\beta},\underline{C}^{\alpha/\beta},CO,HA$ NMR experiment to obtain assignments of chemical shift values of $^{13}C'$.

10. The method according to claim 3 further comprising: subjecting the protein sample to a RD 3D $\underline{H},\underline{C},C,H$-TOCSY NMR experiment to obtain assignments of chemical shift values of $^1H$ and $^{13}C$ of aliphatic sidechains.

11. The method according to claim 3 further comprising: subjecting the protein sample to a RD 3D $\underline{H},\underline{C},C,H$-TOCSY NMR experiment to obtain assignments of chemical shift values of $^1H$ and $^{13}C$ of aromatic sidechains.

12. The method according to claim 3 further comprising: subjecting the protein sample to a 3D HNNCACB NMR experiment to obtain assignments of chemical shift values of $^{13}C^\beta$.

13. The method according to claim 3, wherein the first experiment is the RD 3D $\underline{H},\underline{C},(C\text{-TOCSY}-CO),N,HN$ NMR experiment and the second experiment is the RD 3D HNN$\underline{CAHA}$ NMR experiment.

14. The method according to claim 13 further comprising: subjecting the protein sample to a RD 3D $\underline{HA},\underline{CA},(CO),N,HN$ NMR experiment to identify NMR signals for $^1H^\alpha/^{13}C^\alpha$ in said RD 3D $\underline{H},\underline{C},(C\text{-TOCSY}-CO),N,HN$ NMR experiment.

15. The method according to claim 13 further comprising: subjecting the protein sample to a RD 3D $\underline{H}^{\alpha/\beta},\underline{C}^{\alpha/\beta},N,HN$ NMR experiment to obtain assignments of chemical shift values of $^1H^\beta$ and $^{13}C^\beta$.

16. The method according to claim 13 further comprising: subjecting the protein sample to a RD 3D HNN<$\underline{CO,CA}$> NMR experiment to obtain assignments of chemical shift values of polypeptide backbone carbonyl carbons, $^{13}C'$.

17. The method according to claim 13 further comprising: subjecting the protein sample to a RD 3D $\underline{H}^{\alpha/\beta},\underline{C}^{\alpha/\beta},CO,HA$ NMR experiment to obtain assignments of polypeptide backbone carbonyl carbons, $^{13}C'$.

18. The method according to claim 13 further comprising: subjecting the protein sample to a RD 3D HNN<$\underline{CO,CA}$> NMR experiment and a RD 3D $\underline{H}^{\alpha/\beta},\underline{C}^{\alpha/\beta},CO,HA$ NMR experiment to obtain assignments of chemical shift values of $^{13}C'$.

19. The method according to claim 13 further comprising: subjecting the protein sample to a RD 3D $\underline{H},\underline{C},C,H$-TOCSY NMR experiment to obtain assignments of chemical shift values of $^1H$ and $^{13}C$ of aliphatic sidechains.

20. The method according to claim 13 further comprising: subjecting the protein sample to a RD 3D $\underline{H},\underline{C},C,H$-TOCSY NMR experiment to obtain assignments of chemical shift values of $^1H$ and $^{13}C$ of aromatic sidechains.

21. The method according to claim 13 further comprising: subjecting the protein sample to a 3D HNNCACB NMR experiment to obtain assignments of chemical shift values of $^{13}C^\beta$.

22. The method according to claim 1, wherein the first experiment is the RD 3D $\underline{H},\underline{C},(C\text{-TOCSY}-CO),N,HN$ NMR experiment and the second experiment is the RD 3D $\underline{H}^{\alpha/\beta},\underline{C}^{\alpha/\beta},N,HN$ NMR experiment.

23. The method according to claim 22 further comprising: subjecting the protein sample to a RD 3D $\underline{HA},\underline{CA},(CO),N,HN$ NMR experiment to identify NMR signals for $^1H^\alpha$ and $^{13}C^\alpha$ in said RD 3D $\underline{H},\underline{C},(C\text{-TOCSY}-CO),N,HN$ NMR experiment.

24. The method according to claim 22 further comprising: subjecting the protein sample to a RD 3D $\underline{H}^{\alpha/\beta}\underline{C}^{\alpha/\beta}(CO)NHN$ NMR experiment to identify NMR signals for $^1H^{\alpha/\beta}$ and $^{13}C^{\alpha/\beta}$ in said RD 3D $\underline{H},\underline{C},(C\text{-TOCSY}-CO),N,HN$ NMR experiment.

25. The method according to claim 22 further comprising: subjecting the protein sample to a RD 3D HNN<$\underline{CO,CA}$> NMR experiment to obtain assignments of chemical shift values of polypeptide backbone carbonyl carbons, $^{13}C'$.

26. The method according to claim 22 further comprising: subjecting the protein sample to a RD 3D $\underline{H}^{\alpha/\beta},\underline{C}^{\alpha/\beta},CO,HA$ NMR experiment to obtain assignments of chemical shift values of polypeptide backbone carbonyl carbons, $^{13}C'$.

27. The method according to claim 22 further comprising: subjecting the protein sample to a RD 3D HNN<$\underline{CO,CA}$> NMR experiment and a RD 3D $\underline{H}^{\alpha/\beta},\underline{C}^{\alpha/\beta},CO,HA$ NMR experiment to obtain assignments of chemical shift values of $^{13}C'$.

28. The method according to claim 22 further comprising: subjecting the protein sample to a RD 3D $\underline{H},\underline{C},C,H$-TOCSY NMR experiment to obtain assignments of chemical shift values of $^1H$ and $^{13}C$ of aliphatic sidechains.

29. The method according to claim 22 further comprising: subjecting the protein sample to a RD 3D $\underline{H},\underline{C},C,H$-TOCSY NMR experiment to obtain assignments of chemical shift values of $^1H$ and $^{13}C$ of aromatic sidechains.

30. The method according to claim 22 further comprising: subjecting the protein sample to a 3D HNNCACB NMR experiment to obtain assignments of chemical shift values of $^{13}C^\beta$.

31. The method according to claim 1, wherein the first experiment is the RD 3D $\underline{H},\underline{C},(C\text{-TOCSY}-CO),N,HN$ NMR experiment and the second experiment is the RD 3D HNN<$\underline{CO,CA}$> NMR experiment.

32. The method according to claim 31 further comprising: subjecting the protein sample to a RD 3D $\underline{HA},\underline{CA},(CO),N,HN$ NMR experiment to identify NMR signals for $^1H^\alpha$ and $^{13}C^\alpha$ in said RD 3D $\underline{H},\underline{C},(C\text{-TOCSY}-CO),N,HN$ NMR experiment.

33. The method according to claim 31 further comprising:
subjecting the protein sample to a RD 3D $\underline{H}^{\alpha/\beta}$, $\underline{C}^{\alpha/\beta}$(CO)NHN NMR experiment to identify NMR signals for $^1H^{\alpha/\beta}$ and $^{13}C^{\alpha/\beta}$ in said RD 3D $\underline{H}$, $\underline{C}$,(C-TOCSY—CO),N,HN NMR experiment.

34. The method according to claim 31 further comprising: subjecting the protein sample to a RD 3D $\underline{H}^{\alpha/\beta}$, $\underline{C}^{\alpha/\beta}$CO,HA NMR experiment to obtain assignments of chemical shift values of polypeptide backbone carbonyl carbons, $^{13}C'$.

35. The method according to claim 31 further comprising: subjecting the protein sample to a RD 3D $\underline{H}$, $\underline{C}$,C,H-TOCSY NMR experiment to obtain assignments of chemical shift values of $^1H$ and $^{13}C$ of aliphatic sidechains.

36. The method according to claim 31 further comprising: subjecting the protein sample to a RD 3D $\underline{H}$, $\underline{C}$,C,H-TOCSY NMR experiment to obtain assignments of chemical shift values of $^1H$ and $^{13}C$ of aromatic sidechains.

37. The method according to claim 31 further comprising: subjecting the protein sample to a 3D HNNCACB NMR experiment to obtain assignments of chemical shift values of $^{13}C^\beta$.

38. The method according to claim 1 further comprising: subjecting the protein sample to nuclear Overhauser effect spectroscopy (NOESY) to deduce the tertiary structure of the protein molecule.

39. The method according to claim 1 further comprising: subjecting the protein sample to NMR experiments that measure scalar coupling constants to deduce the tertiary structure of the protein molecule.

40. The method according to claim 1 further comprising: subjecting the protein sample to NMR experiments that measure residual dipolar coupling constants to deduce the tertiary structure of the protein molecule.

41. The method according to claim 1, wherein said 3D $\underline{H}$, $\underline{C}$,H—COSY NMR experiment is conducted by a method of measuring the chemical shift values for $^1H^m$, $^{13}C^m$, $^1H^n$, and $^{13}C^n$ of a protein molecule wherein m and n indicate atom numbers of two CH, $CH_2$ or $CH_3$ groups that are linked by a single covalent carbon-carbon bond in an amino acid residue, said method comprising:

providing a protein sample;

applying radiofrequency pulses to the protein sample which effect a nuclear spin polarization transfer wherein the chemical shift evolutions of $^1H^m$ and $^{13}C^m$ are connected to the chemical shift evolutions of $^1H^n$ and $^{13}C^n$, under conditions effective (1) to generate NMR signals encoding the chemical shift values of $^{13}C^m$ and $^{13}C^n$ in a phase sensitive manner in two indirect time domain dimensions, $t_1(^{13}C^m)$ and $t_2(^{13}C^n)$, respectively, and the chemical shift value of $^1H^n$ in a direct time domain dimension, $t_3(^1H^n)$, and (2) to cosine modulate the chemical shift evolution of $^{13}C^m$ in $t_1(^{13}C^m)$ with the chemical shift evolution of $^1H_m$; and processing the NMR signals to generate a 3D NMR spectrum with peak pairs derived from said cosine modulating wherein (1) the chemical shift values of $^{13}C^n$ and $^1H^n$ are measured in two frequency domain dimensions, $\omega_2(^{13}C^n)$ and $\omega_3(^1H^n)$, respectively, and (2) the chemical shift values of $^1H^m$ and $^{13}C^m$ are measured in a frequency domain dimension, $\omega_1(^{13}C^m)$, by the frequency differences between the two peaks forming said peak pairs and the frequencies at the center of the two peaks, respectively.

42. The method according to claim 1, wherein said 2D $\underline{HB},\underline{CB}$,(CG,CD),HD MNMR experiment is conducted by a method of measuring the chemical shift values for the following nuclei of a protein molecule: (1) a β-proton of an amino acid residue with an aromatic side chain, $^1H^\beta$; a (2) β-carbon of an amino acid residue with an aromatic side chain, $^{13}C^\beta$; and (3) a δ-proton of an amino acid residue with an aromatic side chain, $^1H^\delta$, said method comprising:

providing a protein sample;

applying radiofrequency pulses to the protein sample which effect a nuclear spin polarization transfer wherein the chemical shift evolutions of $^1H^\beta$ and $^{13}C^\beta$ are connected to the chemical shift evolution of $^1H^\delta$, under conditions effective (1) to generate NMR signals encoding the chemical shift value of $^{13}C^\beta$ in a phase sensitive manner in an indirect time domain dimension, $t_1(^{13}C^\beta)$, and the chemical shift value of $^1H^\delta$ in a direct time domain dimension, $t_2(^1H^\delta)$, and (2) to cosine modulate the chemical shift evolution of $^{13}C^\beta$ in $t_1(^{13}C^\beta)$ with the chemical shift evolution of $^1H^\beta$; and processing the NMR signals to generate a 2D NMR spectrum with a peak pair derived from said cosine modulating wherein (1) the chemical shift value of $^1H^\delta$ is measured in a frequency domain dimension, $\omega_2(^1H^\delta)$, and (2) the chemical shift values of $^1H^\beta$ and $^{13}C^\beta$ are measured in a frequency domain dimension, $\omega_1(^{13}C^\beta)$, by the frequency difference between the two peaks forming said peak pair and the frequency at the center of the two peaks, respectively.

* * * * *

UNITED STATES PATENT AND TRADEMARK OFFICE
CERTIFICATE OF CORRECTION

PATENT NO. : 7,141,432 B2  Page 1 of 1
APPLICATION NO. : 09/897583
DATED : November 28, 2006
INVENTOR(S) : Thomas A. Szyperski It is certified that error appears in the above-identified patent and that said Letters Patent is hereby corrected as shown below:

In column 1, please insert the following text after the first paragraph of the specification and before the section labeled FIELD OF THE INVENTION:

-- This invention arose out of research sponsored by the National Science Foundation (Grant No. MCB 0075773). The United States Government may have certain rights in this invention.--

Signed and Sealed this

Twenty-seventh Day of March, 2007

JON W. DUDAS
*Director of the United States Patent and Trademark Office*